United States Patent
Cameron et al.

(10) Patent No.: US 7,065,695 B2
(45) Date of Patent: Jun. 20, 2006

(54) METRIC CALCULATION DESIGN FOR VARIABLE CODE RATE DECODING OF BROADBAND TRELLIS, TCM, OR TTCM

(75) Inventors: Kelly Brian Cameron, Irvine, CA (US); Ba-Zhong Shen, Irvine, CA (US); Hau Thien Tran, Irvine, CA (US); Linda K. Lau, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 564 days.

(21) Appl. No.: 10/264,647

(22) Filed: Oct. 4, 2002

(65) Prior Publication Data

US 2003/0226087 A1  Dec. 4, 2003

Related U.S. Application Data

(60) Provisional application No. 60/384,698, filed on May 31, 2002, provisional application No. 60/384,464, filed on May 31, 2002.

(51) Int. Cl.
*H03M 13/00* (2006.01)

(52) U.S. Cl. ..................... 714/755; 714/759; 714/792; 714/786; 714/794; 714/795; 714/796; 375/265; 375/262; 375/261; 375/341; 375/279

(58) Field of Classification Search ............... 714/755, 714/701, 786, 792, 794–796, 759; 375/262, 375/265, 261, 341, 279
See application file for complete search history.

(56) References Cited

U.S. PATENT DOCUMENTS

| | | | |
|---|---|---|---|
| 5,406,570 A | | 4/1995 | Berrou et al. |
| 5,446,747 A | | 8/1995 | Berrou |
| 5,563,897 A | | 10/1996 | Pyndiah et al. |
| 6,029,264 A | * | 2/2000 | Kobayashi et al. .......... 714/755 |
| 6,065,147 A | | 5/2000 | Pyndiah et al. |
| 6,119,264 A | | 9/2000 | Berrou et al. |
| 6,122,763 A | | 9/2000 | Pyndiah et al. |
| 6,215,813 B1 | * | 4/2001 | Jones et al. ................. 375/146 |
| 6,690,739 B1 | * | 2/2004 | Mui ........................... 375/265 |

FOREIGN PATENT DOCUMENTS

| | | |
|---|---|---|
| EP | 0 735 696 A2 | 10/1996 |
| EP | 0 735 696 A3 | 1/1999 |
| FR | 91 05278 A1 | 10/1992 |

* cited by examiner

*Primary Examiner*—Guy J. Lamarre
(74) *Attorney, Agent, or Firm*—Garlick Harrison & Markison LLP; Shayne X. Short

(57) ABSTRACT

Metric calculation design for variable code rate decoding of broadband trellis, TCM (trellis coded modulated), or TTCM (turbo trellis coded modulation). A single design can accommodate a large number of code rates by multiplexing the appropriate paths within the design. By controlling where to scale for any noise of a received symbol within a received signal, this adaptable design may be implemented in a manner that is very efficient in terms of performance, processing requirements (such as multipliers and gates), as well as real estate consumption. In supporting multiple code rates, appropriately selection of the coefficients of the various constellations employed, using the inherent redundancy and symmetry along the I and Q axes, can result in great savings of gates borrowing upon the inherent redundancy contained therein; in addition, no subtraction (but only summing) need be performed when capitalizing on this symmetry.

62 Claims, 78 Drawing Sheets

High Definition Television (HDTV) Communication System 200

Cellular Communication System 300

Point-to-Point Radio Communication System 600

Uni-directional TTCM Communication System 700

One to Many TTCM Communication System 900

Satellite Receiver Set-Top Box System 1000

Single Interleaver Embodiment of Turbo Encoder 1111

Dual Interleaver Embodiment of Turbo Encoder 1111

Systematic Encoder 1400

Non-Systematic Encoder 1500

Non-Systematic Encoder Using Puncturing and Rate Control Sequencer to Support Multiple Encoders 1600

Periodic Sequencing of Non-Systematic Encoder Using Puncturing and Rate Control Sequencer 1700

Generic Embodiment of Variable Puncturing, Constellations, and Mapping Using Single Encoder 1800

Rate 1/2 Recursive Convolutional Encoder with Non-Systematic Output 1900

Rate 2/5 Prototype Encoder 2000

Block Diagram of Rate 2/5 Systematic Prototype Encoder 2100

Block Diagram of Rate 2/5 Non-Systematic Prototype Encoder 2000

Trellis 2300 of Rate 2/5 Non-Systematic Prototype Encoder 2000
(Input: $i_0i_1$=input symbol's bits)

Non-Systematic Rate 2/5 Encoder 2000 Using Puncturing and Rate Control Sequencer 1150 to Support Multiple Encoders Non-Systematic Rate 2/5 Encoder Using 2000 Puncturing and Rate Control Sequencer 1150 to Support Multiple Encoders Non-Systematic Rate 2/5 Encoder 2000 Using Puncturing and Rate Control Sequencer 1150 to Support Multiple Encoders Periodic Sequencing of Non-Systematic Rate 2/5 Encoder 2000 Using Puncturing and Rate Control Sequencer 1150

Periodic Sequencing of Non-Systematic Rate 2/5 Encoder 2000 Using Puncturing and Rate Control Sequencer 1150

Periodic Sequencing of Non-Systematic Rate 2/5 Encoder 2000 Using Puncturing and Rate Control Sequencer 1150

Periodic Sequencing of Non-Systematic Rate 2/5 Encoder 2000 Using Puncturing and Rate Control Sequencer 1150

Rate Control Governed Symbol Mapping to 8 PSK Constellations

Rate Control Governed Symbol Mapping to QPSK Constellations

Rate Control Governed Symbol Mapping to QPSK Constellations
(Constellations Points Tilted With Respect to Axes)

Rate Control Governed Symbol Mapping to QPSK Constellations
(Distance from Origin to Const. Pts. may Differ for Various QPSKs)

Rate Control Governed Symbol Mapping to 16 QAM Constellation

Rate Control Governed Symbol Mapping to 16 APSK Constellations

Embodiment of Variable Puncturing, Constellations, and Mapping Using Single Non-Systematic Rate 2/5 Encoder 2000

TTCM Decoder System 3800

Alternative TTCM Decoder System 3900 That Recycles Single SISO (Receiving I,Q inputs)

Rx I,Q Mapping Based on RC

Metric Calculation Performed by Metric Generator 3733 (Embodiment Using RC 9)

Metric Mapping Functionality

SISO Calculations and Operations

Alpha, Beta, and Extrinsic Calculation Based on Trellis 2300 of Rate 2/5 Non-Systematic Prototype Encoder 2000

Final Output of Decoding

Embodiment of Variable Code Rate Codec (Encoder/Decoder) Servicing Channels of Various SNRs

| Rate Control= | \multicolumn{16}{c|}{Calculated-Metric Index (to be mapped to metric outputs)} | |
|---|---|---|---|---|---|---|---|---|---|---|---|---|---|---|---|---|
| Trellis Outputs (in octal) | 0 | 1 | 2 | 3 | 4 | 5 | 6 | 7 | 8 | 9 | A | B | C | D | E | F |
| 0143125 | 0642 | 0132 | 0132 | 0132 | 0642 | 04MM | 0132 | 02MM | 0MMM | 04MM | 02MM | 0642 | 0132 | 02MM | 0132 | 0132 |
| 3125014 | 4206 | 3201 | 3201 | 3201 | 4206 | MM04 | 3201 | MM02 | MM0M | MM04 | MM02 | 4206 | 3201 | MM02 | 3201 | 3201 |
| 1262337 | 5317 | 1023 | 1023 | 1023 | 5317 | 26MM | 1023 | 13MM | M2MM | 26MM | 13MM | 5317 | 1023 | 13MM | 1023 | 1023 |
| 2337126 | 1753 | 2310 | 2310 | 2310 | 1753 | MM26 | 2310 | MM13 | MMM2 | MM26 | MM13 | 1753 | 2310 | MM13 | 2310 | 2310 |
| 2430151 | 2460 | 2310 | 2310 | 2310 | 2460 | MM51 | 2310 | MM20 | MMM1 | MM51 | MM20 | 2460 | 2310 | MM20 | 2310 | 2310 |
| 1512430 | 6024 | 1023 | 1023 | 1023 | 6024 | 51MM | 1023 | 20MM | M1MM | 51MM | 20MM | 6024 | 1023 | 20MM | 1023 | 1023 |
| 3622713 | 7135 | 3201 | 3201 | 3201 | 7135 | MM73 | 3201 | MM31 | MM3M | MM73 | MM31 | 7135 | 3201 | MM31 | 3201 | 3201 |
| 7133622 | 3571 | 0132 | 0132 | 0132 | 3571 | 73MM | 0132 | 31MM | 3MMM | 73MM | 31MM | 3571 | 0132 | 31MM | 0132 | 0132 |

M = Maximum value to be used for metric

Trellis Output vs. Metric Index 4800

Fig. 48

| | Rate Control= | 0 | 1 | 2 | 3 | 4 | 6 | 7 | A | B | C | D | E | F |
|---|---|---|---|---|---|---|---|---|---|---|---|---|---|---|
| Trellis Outputs (in octal) | Metric Outputs | | | | | | | | | | | | | |
| 01 43 12 5 | 0642 | 0642 | 0132 | 0132 | 0132 | 0642 | 0132 | 02MM | 02MM | 0642 | 0132 | 02MM | 0132 | 0132 |
| 31 25 01 4 | 4206 | 4206 | 3201 | 3201 | 3201 | 4206 | 3201 | MM02 | MM02 | 4206 | 3201 | MM02 | 3201 | 3201 |
| 12 62 33 7 | 5317 | 5317 | 1023 | 1023 | 1023 | 5317 | 1023 | 13MM | 13MM | 5317 | 1023 | 13MM | 1023 | 1023 |
| 23 37 12 6 | 1753 | 1753 | 2310 | 2310 | 2310 | 1753 | 2310 | MM13 | MM13 | 1753 | 2310 | MM13 | 2310 | 2310 |
| 24 30 15 1 | 2460 | 2460 | 2310 | 2310 | 2310 | 2460 | 2310 | MM20 | MM20 | 2460 | 2310 | MM20 | 2310 | 2310 |
| 15 12 43 0 | 6024 | 6024 | 1023 | 1023 | 1023 | 6024 | 1023 | 20MM | 20MM | 6024 | 1023 | 20MM | 1023 | 1023 |
| 36 22 71 3 | 7135 | 7135 | 3201 | 3201 | 3201 | 7135 | 3201 | MM31 | MM31 | 7135 | 3201 | MM31 | 3201 | 3201 |
| 71 33 62 2 | 3571 | 3571 | 0132 | 0132 | 0132 | 3571 | 0132 | 31MM | 31MM | 3571 | 0132 | 31MM | 0132 | 0132 |

Calculated-Metric Index (to be mapped to metric outputs)

M = Maximum value to be used for metric

Trellis Outputs Mapped to Metric Outputs (without flags) 4900

Fig. 49

| Trellis Outputs (in octal) | Rate Control= Metric Outputs | Calculated-Metric Index (to be mapped to metric outputs) | | |
|---|---|---|---|---|
| | | 5 | 8 | 9 |
| 01 43 31 25 | 06MM | 04MM | 0MMM | 04MM |
| 31 25 01 4 | MM06 | MM04 | MM0M | MM04 |
| 12 62 33 7 | 53MM | 26MM | M2MM | 26MM |
| 23 37 12 6 | MM53 | MM26 | MMM2 | MM26 |
| 24 30 15 1 | MM71 | 51MM | MMM1 | MM51 |
| 15 12 43 0 | 71MM | MM51 | M1MM | 51MM |
| 36 22 77 13 | MM24 | MM73 | MM3M | MM73 |
| 71 33 62 2 | 24MM | 73MM | 3MMM | 73MM |
| Flags = | Rate_ctl_9=1 | Rate_ctl_8=1 | Rate_ctl_9=1 |

Trellis Outputs Mapped to Metric Outputs (with flags) 5000

Fig. 50

Metric Generator Functional Block Diagram (Embodiment 1) 5100

An Implementation of Metric Generator Functional Block Diagram (Embodiment 1) 5100

Metric Generator Functional Block Diagram (Embodiment 2) 5300

An Implementation of Metric Generator Functional Block Diagram (Embodiment 2) 5300

An Implementation of Metric Generator Functional Block Diagram (Embodiment 3) 5500

Metric Generator Constellation Coefficients 5700

| Rate Control | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| Coefficient_0 | P_0 | P_0 | P_0 | Q_0 | Q_0 | A_0 | X | X | X | P_0 | P_0 | A_0 | X | X | X | X |
| Coefficient_1 | P_1 | P_1 | P_1 | Q_1 | Q_1 | A_1 | Q_1 | X | P_1 | P_1 | P_1 | A_1 | X | P_1 | P_1 | X |
| Coefficient_2 | P_2 | P_2 | P_2 | Q_2 | Q_2 | A_2 | X | X | X | P_2 | P_2 | A_2 | X | X | X | X |
| Coefficient_3 | P_3 | P_3 | P_3 | Q_3 | Q_3 | A_3 | Q_3 | X | P_3 | P_3 | P_3 | A_3 | X | P_3 | P_3 | X |
| Coefficient_4 | X | X | X | X | X | A_4 | X | A_4 | X | X | X | A_4 | A_4 | X | X | X |
| Coefficient_5 | X | X | X | X | X | A_5 | X | X | X | X | X | A_5 | X | X | X | A_5 |
| Coefficient_6 | X | X | X | X | X | A_6 | X | A_6 | X | X | X | A_6 | A_6 | X | X | X |
| Coefficient_7 | X | X | X | X | X | A_7 | X | X | X | X | X | A_7 | X | X | X | A_7 |

Constellation Coefficient Selection 5800

Fig. 58

An Implementation of Constellation Coefficient Selection

Metric Generator Architecture (Embodiment 1) 6000

An Implementation of Metric Generator Architecture (Embodiment 1) 6000

Fig. 62 Metric Generator Architecture (Embodiment 2) 6200

An Implementation of Metric Generator Architecture (Embodiment 2) 6200

Metric Generator Architecture (Embodiment 3) 6400

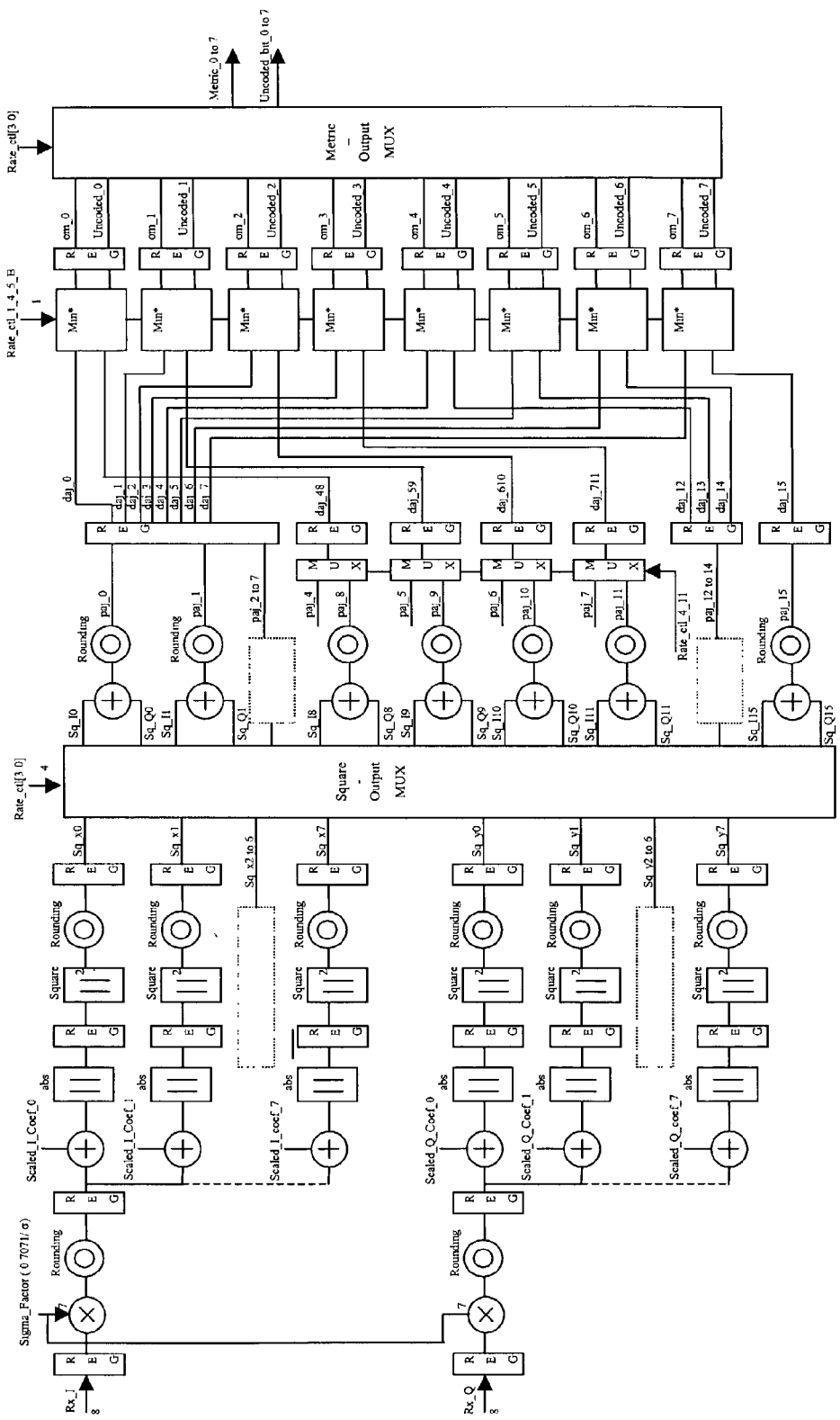
Fig. 65 An Implementation of Metric Generator Architecture (Embodiment 3) 6400

| Rate Control= Mux Outputs | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| Sq_I0 | Sq_x2 | Sq_x0 | Sq_x2 | Sq_x1 | Sq_x2 | Sq_x2 | Sq_x1 | Sq_x4 | Sq_x3 | Sq_x2 | Sq_x2 | Sq_x2 | Sq_x4 | Sq_x1 | Sq_x1 | Sq_x5 |
| Sq_Q0 | Sq_y3 | Sq_y3 | Sq_y3 | Sq_y0 | Sq_y3 | Sq_y3 | Sq_y1 | Sq_y4 | Sq_y1 | Sq_y3 | Sq_y3 | Sq_y3 | Sq_y4 | Sq_y1 | Sq_y1 | Sq_y5 |
| Sq_I1 | Sq_x1 | Sq_x3 | Sq_x3 | Sq_x2 | Sq_x1 | Sq_x6 | Sq_x3 | Sq_x6 | Sq_x1 | Sq_x3 | Sq_x1 | Sq_x1 | Sq_x6 | Sq_x3 | Sq_x3 | Sq_x7 |
| Sq_Q1 | Sq_y0 | Sq_y0 | Sq_y0 | Sq_y1 | Sq_y2 | Sq_y6 | Sq_y1 | Sq_y4 | Sq_y1 | Sq_y2 | Sq_y2 | Sq_y2 | Sq_y4 | Sq_y1 | Sq_y1 | Sq_y5 |
| Sq_I2 | Sq_x0 | Sq_x1 | Sq_x0 | Sq_x3 | Sq_x1 | Sq_x7 | Sq_x3 | Sq_x6 | Sq_x1 | Sq_x2 | Sq_x0 | Sq_x5 | Sq_x6 | Sq_x3 | Sq_x3 | Sq_x7 |
| Sq_Q2 | Sq_y1 | Sq_y0 | Sq_y1 | Sq_y2 | Sq_y3 | Sq_y7 | Sq_y3 | Sq_y6 | Sq_y3 | Sq_y1 | Sq_y1 | Sq_y7 | Sq_y6 | Sq_y3 | Sq_y3 | Sq_y7 |
| Sq_I3 | Sq_x3 | Sq_x0 | Sq_x1 | Sq_x0 | Sq_x2 | Sq_x3 | Sq_x1 | Sq_x4 | Sq_x3 | Sq_x3 | Sq_x3 | Sq_x6 | Sq_x4 | Sq_x1 | Sq_x1 | Sq_x5 |
| Sq_Q3 | Sq_y2 | Sq_y1 | Sq_y2 | Sq_y3 | Sq_y2 | Sq_y2 | Sq_y3 | Sq_y6 | Sq_y3 | Sq_y0 | Sq_y0 | Sq_y6 | Sq_y6 | Sq_y3 | Sq_y3 | Sq_y7 |
| Sq_I4 | Sq_x3 | Sq_x2 | X | X | Sq_x0 | Sq_x5 | X | X | X | Sq_x0 | X | Sq_x4 | X | X | X | X |
| Sq_Q4 | Sq_y0 | Sq_y1 | X | X | Sq_y2 | Sq_y7 | X | X | X | Sq_y1 | X | Sq_y6 | X | X | X | X |
| ... | ... | ... | ... | ... | ... | ... | ... | ... | ... | ... | ... | ... | ... | ... | ... | ... |
| Sq_I15 | X | X | X | X | Sq_x2 | Sq_x7 | X | X | X | X | X | Sq_x2 | X | X | X | X |
| Sq_Q15 | X | X | X | X | Sq_y1 | Sq_y5 | X | X | X | X | X | Sq_y1 | X | X | X | X |

X = Don't care

Example Embodiment of Square Output MUX Selections 6600

Fig. 66

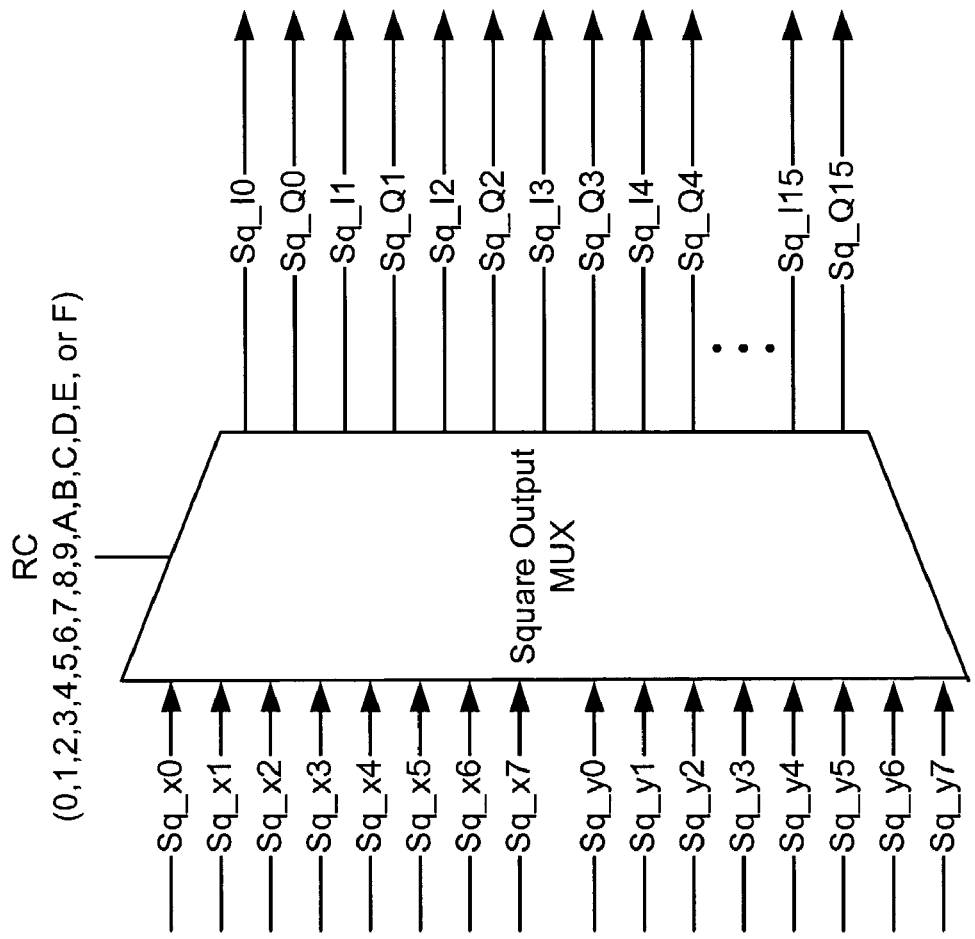
Fig. 67 An Implementation of Square Output MUX Selection

| Rate Control= | \multicolumn{16}{c|}{Calculated-Metric Om_0-7 and Uncoded_0-7 Index} |
|---|---|---|---|---|---|---|---|---|---|---|---|---|---|---|---|---|
| Metric Output | 0 | 1 | 2 | 3 | 4 | 5 | 6 | 7 | 8 | 9 | A | B | C | D | E | F |
| 0 | 0 | 0 | 0 | 0 | 0 | 0 | 0 | 0 | 0 | 0 | 0 | 0 | 0 | 0 | 0 | 0 |
| 1 | 1 | 2 | 2 | 2 | 1 | 1 | 2 | M | 1 | 1 | M | 1 | 2 | M | 2 | 2 |
| 2 | 2 | 2 | 2 | 2 | 2 | 7 | 2 | M | 3 | 7 | M | 2 | 2 | M | 2 | 2 |
| 3 | 3 | 0 | 0 | 0 | 3 | 6 | 0 | 3 | 2 | 6 | 3 | 3 | 0 | 3 | 0 | 0 |
| 4 | 4 | 3 | 3 | 3 | 4 | 3 | 3 | M | M | 3 | M | 4 | 3 | M | 3 | 3 |
| 5 | 5 | 1 | 1 | 1 | 5 | 2 | 1 | 1 | M | 2 | 1 | 5 | 1 | 1 | 1 | 1 |
| 6 | 6 | 1 | 1 | 1 | 6 | 4 | 1 | 2 | M | 4 | 2 | 6 | 1 | 2 | 1 | 1 |
| 7 | 7 | 3 | 3 | 3 | 7 | 5 | 3 | M | M | 5 | M | 7 | 3 | M | 3 | 3 |

M = Maximum value to be used for metric output

Embodiment of Metric Output MUX Selections 6800

Fig. 68

An Implementation of Metric Output MUX Selection

Metric min* Functional Block Diagram 7000

$\text{Min\_star}(A,B) = \text{minimum}(A,B) - \ln(1+e^{-|A-B|}) + 0.75$

| Delta[3:0] | Log(+value) | Log(-value) |
|---|---|---|
| 1111 | 11 | 01 |
| 1110 | 11 | 01 |
| 1101 | 11 | 01 |
| 1100 | 11 | 10 |
| 1011 | 11 | 10 |
| 1010 | 11 | 10 |
| 1001 | 10 | 10 |
| 1000 | 10 | 11 |
| 0111 | 10 | 11 |
| 0110 | 10 | 11 |
| 0101 | 10 | 11 |
| 0100 | 01 | 11 |
| 0011 | 01 | 11 |
| 0010 | 01 | 11 |
| 0001 | 00 | 11 |
| 0000 | | |

Log Table (includes constant offset of 0.75)

Fig. 71

Metric Generator Method 7300

Metric Generator Method 7400

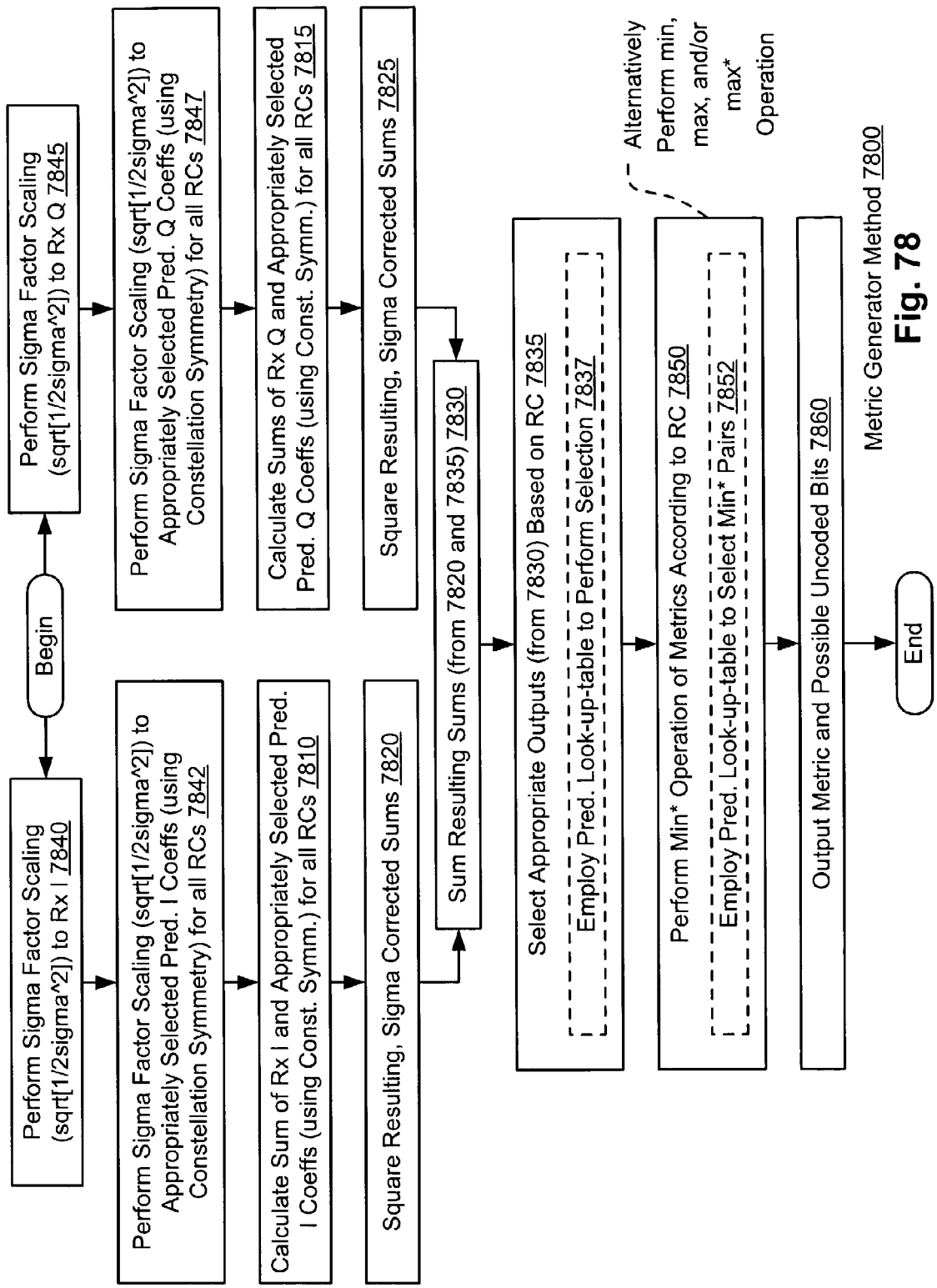

METRIC CALCULATION DESIGN FOR VARIABLE CODE RATE DECODING OF BROADBAND TRELLIS, TCM, OR TTCM

CROSS REFERENCE TO RELATED PATENTS/PATENT APPLICATIONS

The present U.S. Utility Patent Application claims priority pursuant to 35 U.S.C. § 119(e) to the following U.S. Provisional Patent Applications which are hereby incorporated herein by reference in their entirety and are made part of the present U.S. Utility Patent Application for all purposes:

1. U.S. Provisional Patent Application Ser. No. 60/384,698, entitled "VARIABLE CODE RATE AND SIGNAL CONSTELLATION TURBO TRELLIS CODED MODULATION CODEC," filed May 31, 2002, pending.

2. U.S. Provisional Application Ser. No. 60/384,464, entitled "METRIC CALCULATION DESIGN FOR VARIABLE CODE RATE DECODING OF BROADBAND TRELLIS, TCM, OR TTCM," filed May 31, 2002, pending.

The following U.S. Utility Patent Application, being filed concurrently, is hereby incorporated herein by reference in its entirety and made part of the present U.S. Utility Patent Application for all purposes:

1. U.S. Utility Patent Application Ser. No. 10/264,486, entitled "VARIABLE CODE RATE AND SIGNAL CONSTELLATION TURBO TRELLIS CODED MODULATION CODEC," filed Oct. 4, 2002, pending.

BACKGROUND OF THE INVENTION

1. Technical Field of the Invention

The invention relates generally to communication systems; and, more particularly, it relates to turbo trellis coded modulation (TTCM) communication systems and/or parallel concatenated turbo code modulated (PC-TCM) communication systems.

2. Description of Related Art

Turbo code and variants thereof have been the focus of a great deal of interest in the recent years. A primary directive in this area of development has been to try continually to lower the error floor within a communication system. The ideal goal has been to try reach Shannon's limit in a communication channel. Shannon's limit may be viewed as being the data rate that is used in a communication channel, having a particular signal to noise ratio (SNR), that will achieve error free transmission through the channel. In other words, the Shannon limit is the theoretical bound for channel capacity for a given modulation and code rate. The code rate is the ratio of information bits over the total number of bits transmitted within the communication system. In the turbo code context, it is common to refer to code rate of n/m, where n is the number of information bits and m is the total number of bits, and where m>n. The difference between m and n typically being referred to as the number of redundant bits. Turbo codes typically introduce a degree of redundancy to at least a portion of data prior to transmission through a communication channel. This is generally referred to as forward error correction (FEC) coding.

Although there has been much development within the context of turbo code and related coding applications with increased interest recently, this focus has been primarily towards achieving very low bit error rates (BERs) across relatively noisy communication channels. As such, these prior art turbo codes largely operate at relatively low rates across the noisy communication channels. The area of turbo code and variants thereof is still an area of relative immaturity in the technological development sense. While there has no doubt been a great amount of progress achieved this far, there still remains a great deal of development and improvement that can be done. This is a technology area where industry-wide consensus has certainly not yet been achieved, and there are many competing viewpoint within the industry as to which direction effort should be directed.

The use of turbo codes providing such low error, while operating at relatively low rates, has largely been in the context of communication systems having a large degree of noise within the communication channel and where substantially error free communication is held at the highest premium. Some of the earliest application arenas for turbo coding were space related where accurate (ideally error free) communication is often deemed an essential design criterion. The direction of development then moved towards developing terrestrial-applicable and consumer-related applications. Still, the focus of effort here has continued to be achieving low error floors, and not specifically towards reaching higher throughput.

As such, there exists a need in the art to develop turbo code related coding that is operable to support higher amounts of throughput while still preserving the relatively low error floors offered within the turbo code context. Whereas the development of turbo code related technology has primarily been directed towards relatively low rates across noisy communication channels, there exists a need to overcome the many hurdles that prevent the application of turbo code to higher data rate applications. In doing so, these higher data rate applications may benefit from the low BERs offered by turbo codes.

There are many bottlenecks that have prevented the implementation of turbo code within communication applications that operate at high data rates. Many of these bottlenecks are computational in nature and simply require such significant processing resources that they cannot be implemented to support high data rate applications. One of the problematic areas within the turbo code context is the relatively extensive calculation of values that are needed to perform turbo decoding. One such calculation that can be computationally consumptive of processing resources is the calculation of metrics employed during this decoding process. There exists a need to provide for a metric calculation design that will sufficiently reduce the processing resource requirements while being operable at high data rate operations thereby enabling the use of turbo code. In providing a solution to these problems, the turbo code could be adapted to communication applications at high data rates thereby significantly enhancing performance.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 48 is a table illustrating an embodiment of a mapping of trellis metrics vs. metric index according to the present invention.

FIG. 49 is a table illustrating an embodiment of trellis outputs mapped to metric outputs (without flags) according to the present invention.

FIG. 50 is a table illustrating an embodiment of trellis outputs mapped to metric outputs (with flags) according to the present invention.

FIG. 58 is a table illustrating an embodiment of constellation coefficient selection based on RC according to the invention.

FIG. 65 is a diagram illustrating a possible implementation of the metric generator architecture (embodiment 3) shown within the FIG. 64.

FIG. 66 is a table illustrating an embodiment of square output MUX selections that may be made according to the invention.

FIG. 67 is a diagram illustrating an implementation of square output MUX selection, based on the table of the FIG. 66, that is performed according to certain aspects the invention.

FIG. 68 is a table illustrating an embodiment of metric output MUX selections that may be made according to the invention.

FIG. 71 is a log table illustrating an embodiment of log(+value) and log(−value) values that may be used according to the invention.

FIG. 78 is an operational flow diagram illustrating another embodiment of metric generator method that is performed according to the invention.

DETAILED DESCRIPTION OF THE INVENTION

The variable code rate functionality of the invention may properly be described as being within the context of turbo trellis coded modulation (TTCM) communication systems. TTCM coding may also be viewed as a hybrid combination of turbo coding and trellis coded modulated (TCM). Some of the particular embodiments of the invention are performed within communication systems that may more properly be categorized as being parallel concatenated turbo code modulated (PC-TCM) communication systems.

FIGS. 1–9 illustrate a number of communication systems context embodiments where certain aspects of the invention may be implemented.

Figure 1:
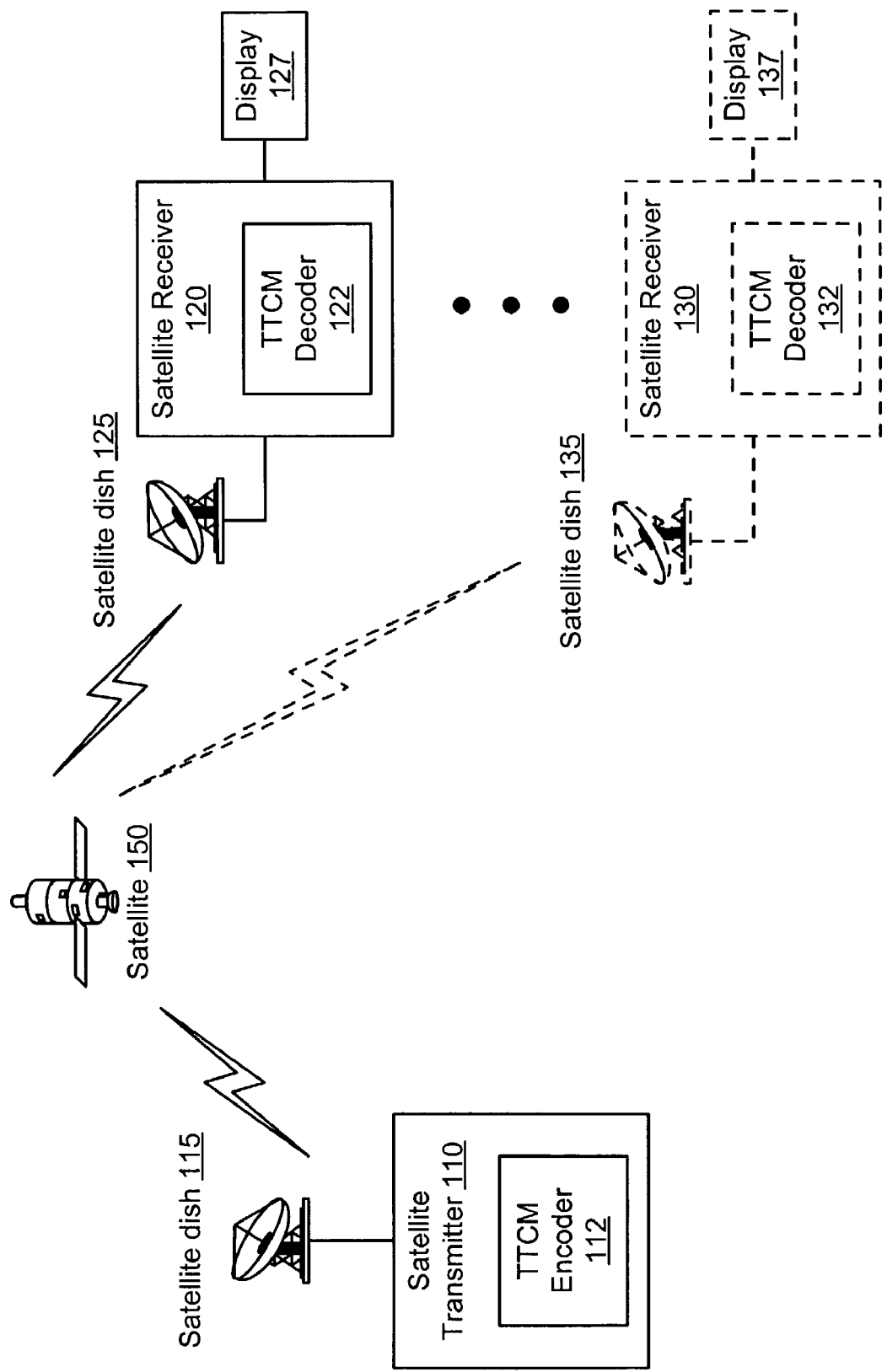
FIG. 1 is a system diagram illustrating an embodiment of a satellite communication system that is built according to the invention.

FIG. 1 is a system diagram illustrating an embodiment of a satellite communication system 100 that is built according to the invention. A satellite transmitter 110 includes a TTCM encoder 112. The TTCM encoder 112 is one of several possible embodiments that are described herein. The TTCM encoder 112 is operable to encode data that is to be transmitted by the satellite transmitter 110. The satellite transmitter 110 is communicatively coupled to a satellite dish 115 that is operable to communicate with a satellite 150. The satellite transmitter 110 may also be communicatively coupled to a wired network. This wired network may include any number of networks including the Internet, proprietary networks, and other wired networks. The satellite transmitter 110 employs the satellite dish 115 to communicate to the satellite 150 via a wireless communication channel. The satellite 150 is able to communicate with one or more satellite receivers, shown as a satellite receiver 120 (having a satellite dish 125), . . . , and a satellite receiver 130 (having a satellite dish 135). Each of the satellite receiver 120 and the satellite receiver 130 includes a TTCM decoder; specifically, the satellite receiver 120 includes a TTCM decoder 122, and the satellite receiver 130 includes a TTCM decoder 132. Each of the satellite receiver 120 and the satellite receiver 130 may also be communicatively coupled to a display. Again, specifically, the satellite receiver 120 may be communicatively coupled to a display 127, and the satellite receiver 130 may be communicatively coupled to a display 137. Various and further details will be provided below regarding the various embodiments in which the TTCM encoder 112, and the TTCM decoders 122 and 132 may be implemented.

Here, the communication to and from the satellite 150 may cooperatively be viewed as being a wireless communication channel, or each of the communication to and from the satellite 150 may be viewed as being two distinct wireless communication channels.

For example, the wireless communication "channel" may be viewed as not including multiple wireless hops in one embodiment. In other embodiments, the satellite 150 receives a signal received from the satellite transmitter 110 (via its satellite dish 115), amplifies it, and relays it to the satellite receiver 120 (via its satellite dish 125); the satellite receiver 120 may also be implemented using terrestrial receivers such as satellite receivers, satellite based telephones, and satellite based Internet receivers, among other receiver types. In the case where the satellite 150 receives a signal received from the satellite transmitter 110 (via its satellite dish 115), amplifies it, and relays it, the satellite 150 may be viewed as being a "transponder." In addition, other satellites may exist that perform both receiver and transmitter operations in cooperation with the satellite 150. In this case, each leg of an up-down transmission via the wireless communication channel would be considered separately.

In whichever embodiment, the satellite 150 communicates with the satellite receiver 120. The satellite receiver 120 may be viewed as being a mobile unit in certain embodiments (employing a local antenna); alternatively, the satellite receiver 120 may be viewed as being a satellite earth station that may be communicatively coupled to a wired network in a similar manner in which the satellite transmitter 110 may also be communicatively coupled to a wired network. In both situations, the satellite receiver 110 and the satellite receiver 120 are each operable to support the TTCM encoder 112 and the TTCM decoder 122 contained therein. The FIG. 1 shows one of the many embodiments where TTCM coding (TTCM encoding and TTCM decoding) may be performed according to any one or more of the various embodiments of the invention.

Figure 2:
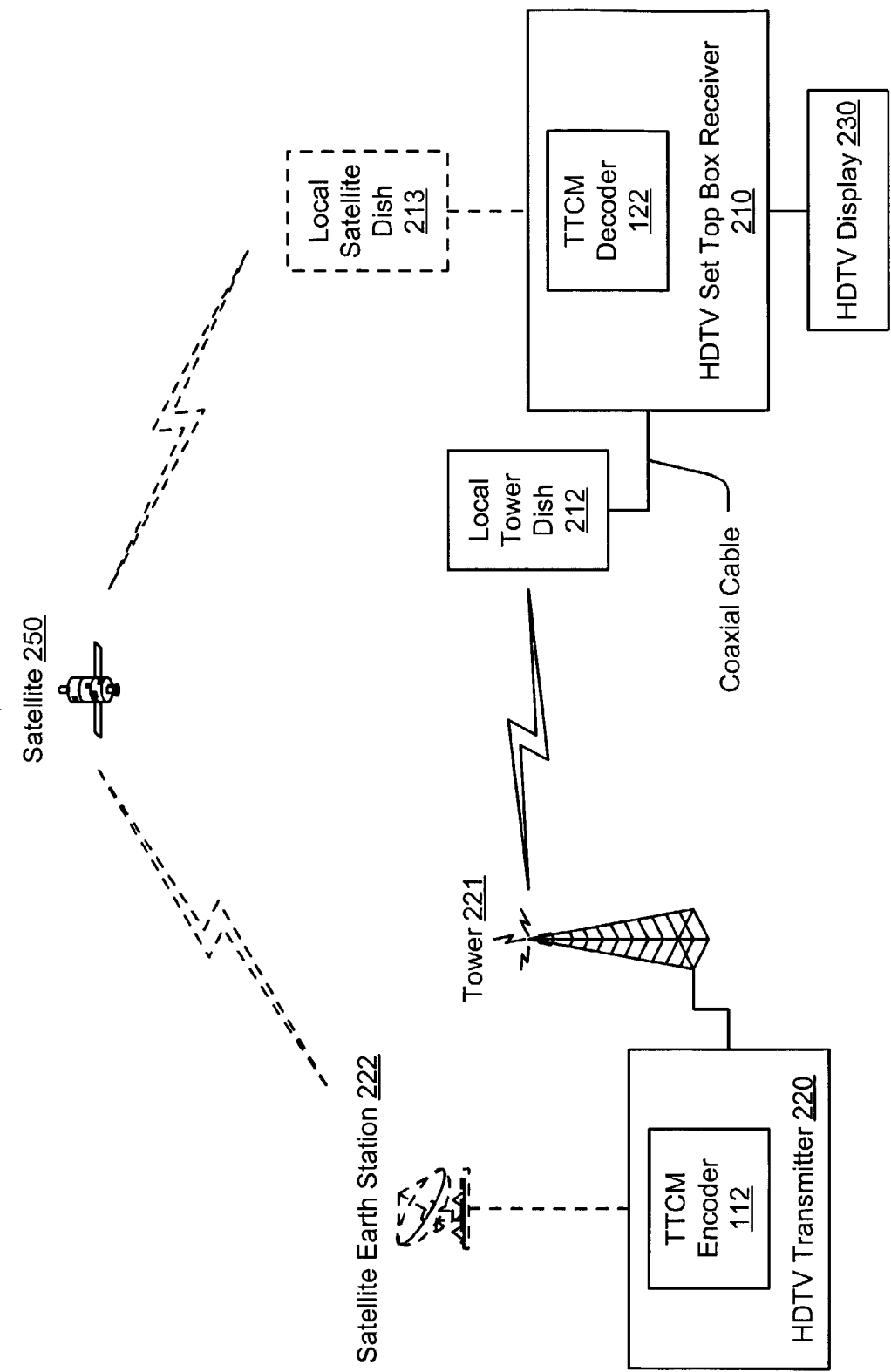
FIG. 2 is a system diagram illustrating an embodiment of a HDTV communication system that is built according to the invention.

FIG. 2 is a system diagram illustrating an embodiment of a HDTV communication system 200 that is built according to the invention. An HDTV transmitter 220 is communicatively coupled to a tower 221. The HDTV transmitter 220, using its tower 221, transmits a signal to a local tower dish 212 via a wireless communication channel. The local tower dish 212 communicatively couples to an HDTV set top box receiver 210 via a coaxial cable. The HDTV set top box receiver 210 includes the functionality to receive the wireless transmitted signal that has been received by the local tower dish 212; this may include any transformation and/or down-converting as well to accommodate any up-converting that may have been performed before and during transmission of the signal from the HDTV transmitter 220 and its tower 221.

The HDTV set top box receiver 210 is also communicatively coupled to an HDTV display 230 that is able to display the demodulated and decoded wireless transmitted signals received by the HDTV set top box receiver 210 and its local tower dish 212. The HDTV transmitter 220 (via its tower 221) transmits a signal directly to the local tower dish 412 via the wireless communication channel in this embodiment. In alternative embodiments, the HDTV transmitter 220 may first receive a signal from a satellite 250, using a satellite earth station 222 that is communicatively coupled to the HDTV transmitter 220, and then transmit this received signal to the to the local tower dish 212 via the wireless communication channel. In this situation, the HDTV transmitter 220 operates as a relaying element to transfer a signal originally provided by the satellite 250 that is destined for the HDTV set top box receiver 210. For example, another satellite earth station may first transmit a signal to the satellite 250 from another location, and the satellite 250 may relay this signal to the satellite earth station 222 that is communicatively coupled to the HDTV transmitter 220. The HDTV transmitter 220 performs receiver functionality and then transmits its received signal to the local tower dish 212.

In even other embodiments, the HDTV transmitter 220 employs the satellite earth station 222 to communicate to the satellite 250 via a wireless communication channel. The satellite 250 is able to communicate with a local satellite dish 213; the local satellite dish 213 communicatively couples to the HDTV set top box receiver 210 via a coaxial cable. This path of transmission shows yet another communication path where the HDTV set top box receiver 210 may communicate with the HDTV transmitter 220.

In whichever embodiment and whichever signal path the HDTV transmitter 220 employs to communicate with the HDTV set top box receiver 210, the HDTV set top box receiver 210 is operable to receive communication transmissions from the HDTV transmitter 220.

The HDTV transmitter 220 includes an embodiment of the TTCM encoder 112 described above. Similarly, the HDTV set top box receiver 210 includes an embodiment of the TTCM decoder 122 described above. Cooperatively, the TTCM encoder 112 and the TTCM decoder 122 form a TTCM codec according to the invention. The FIG. 2 shows yet another of the many embodiments where TTCM coding (TTCM encoding and TTCM decoding) may be performed according to any one or more of the various embodiments of the invention.

Figure 3:
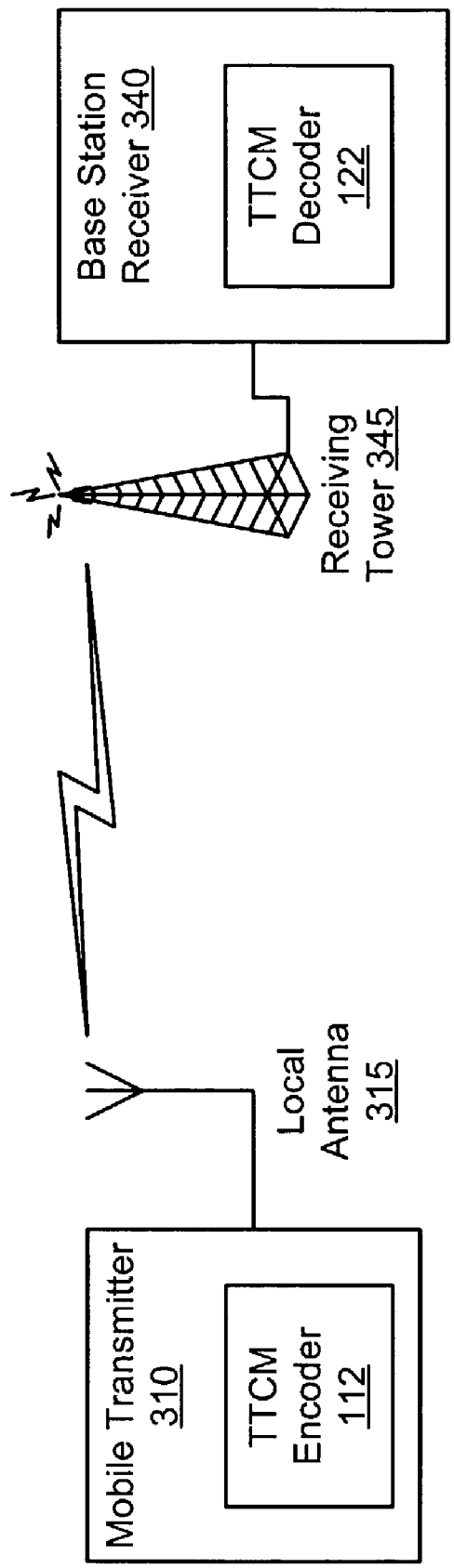
FIG. 3 is a system diagram illustrating an embodiment of a cellular communication system that is built according to the invention.

FIG. 3 is a system diagram illustrating an embodiment of a cellular communication system 300 that is built according to the invention. A mobile transmitter 310 includes a local antenna 315 communicatively coupled thereto. The mobile transmitter 310 may be any number of types of transmitters including a cellular telephone, a wireless pager unit, a mobile computer having transmit functionality, or any other type of mobile transmitter. The mobile transmitter 310 transmits a signal, using its local antenna 315, to a receiving tower 345 via a wireless communication channel. The receiving tower 345 is communicatively coupled to a base station receiver 340; the receiving tower 345 is operable to receive data transmission from the local antenna 315 of the mobile transmitter 310 that have been communicated via the wireless communication channel. The receiving tower 345 communicatively couples the received signal to the base station receiver 340.

The mobile transmitter 310 includes an embodiment of the TTCM encoder 112 described above. Similarly, the base station receiver 340 includes an embodiment of the TTCM decoder 122 described above. Cooperatively, the TTCM encoder 112 and the TTCM decoder 122 form a TTCM codec according to the invention. The FIG. 3 shows yet another of the many embodiments where TTCM coding (TTCM encoding and TTCM decoding) may be performed according to any one or more of the various embodiments of the invention.

Figure 4:
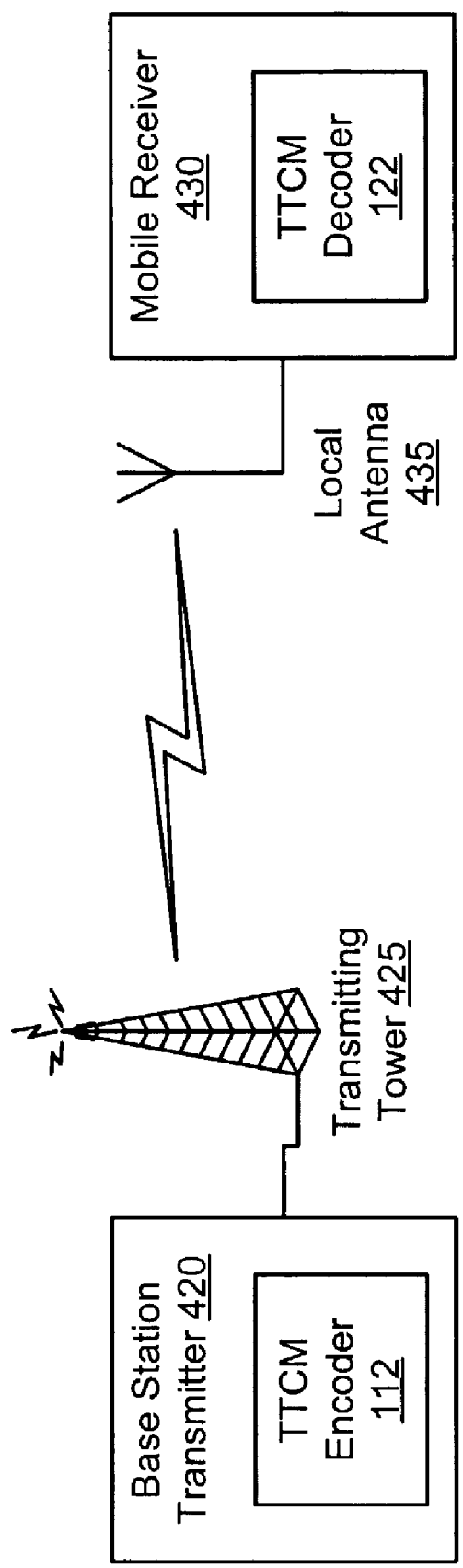
FIG. 4 is a system diagram illustrating another embodiment of a cellular communication system that is built according to the invention.

FIG. 4 is a system diagram illustrating another embodiment of a cellular communication system 400 that is built according to the invention. From certain perspectives, the cellular communication system 400 of the FIG. 4 may be viewed as being the reverse transmission operation of the cellular communication system 300 of the FIG. 3. A base station transmitter 420 is communicatively coupled to a transmitting tower 425. The base station transmitter 420, using its transmitting tower 425, transmits a signal to a local antenna 435 via a wireless communication channel. A mobile receiver 430 includes the local antenna 435 communicatively coupled thereto. The local antenna 435 is communicatively coupled to a mobile receiver 430 so that the mobile receiver 430 may receive transmission from the transmitting tower 435 of the base station transmitter 420 that have been communicated via the wireless communication channel. The local antenna 435 communicatively couples the received signal to the mobile receiver 430. It is noted that the mobile receiver 430 may be any number of types of receivers including a cellular telephone, a wireless pager unit, a mobile computer having receive functionality, or any other type of mobile receiver.

The base station transmitter 420 includes an embodiment of the TTCM encoder 112 described above. Similarly, the mobile receiver 430 includes an embodiment of the TTCM decoder 122 described above. Cooperatively, the TTCM encoder 112 and the TTCM decoder 122 form a TTCM codec according to the invention. The FIG. 4 shows yet another of the many embodiments where TTCM coding (TTCM encoding and TTCM decoding) may be performed according to any one or more of the various embodiments of the invention.

Figure 5:
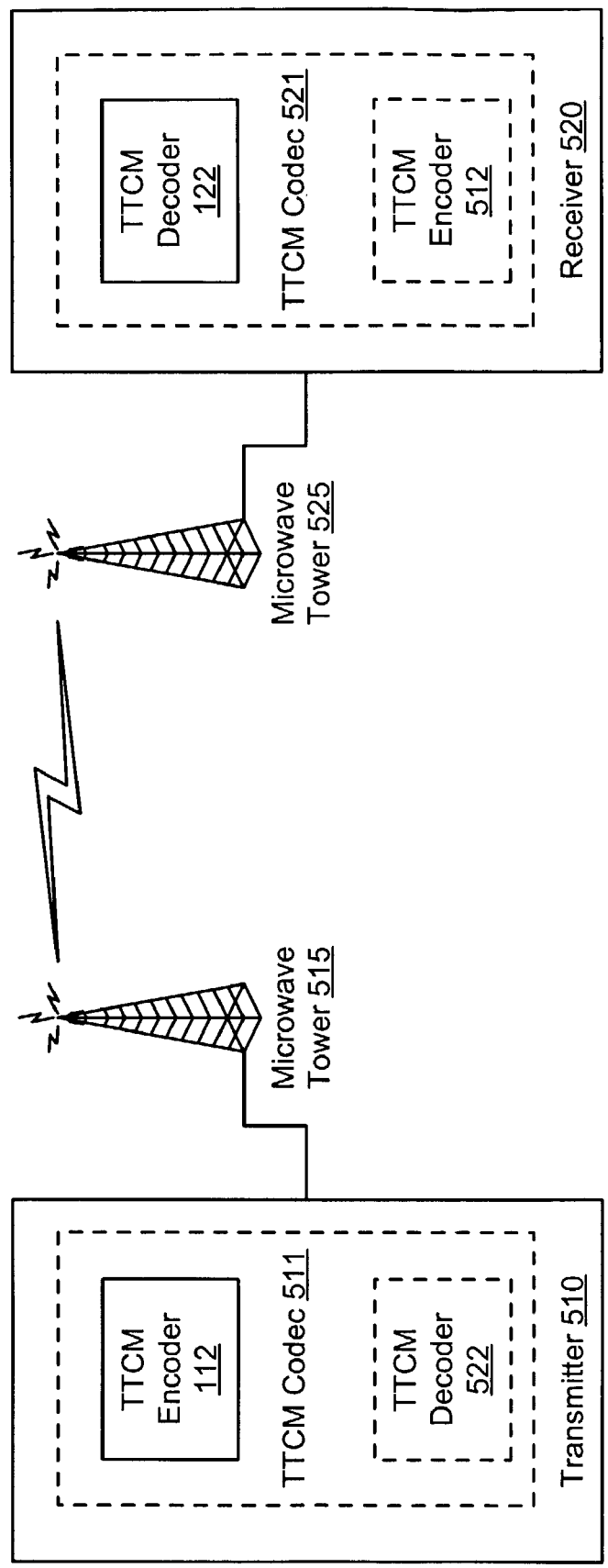
FIG. 5 is a system diagram illustrating an embodiment of a microwave communication system that is built according to the invention.

FIG. 5 is a system diagram illustrating an embodiment of a microwave communication system 500 that is built according to the invention. A transmitter 510 is communicatively coupled to a microwave tower 515. The transmitter 510, using its microwave tower 515, transmits a signal to a microwave tower 525 via a wireless communication channel. A receiver 520 is communicatively coupled to the microwave tower 525. The microwave tower 525 is able to receive transmissions from the microwave tower 515 that have been communicated via the wireless communication channel.

The transmitter 510 includes an embodiment of the TTCM encoder 112 described above. Similarly, the receiver 520 includes an embodiment of the TTCM decoder 122 described above. Cooperatively, the TTCM encoder 112 and the TTCM decoder 122 form a TTCM codec according to a uni-directional communication implementation of the invention.

However, in a bi-directional communication implementation of the invention, the transmitter 510 also includes an embodiment of a TTCM decoder 522; the embodiment of the TTCM decoder 522 may be viewed as being duplicative of the TTCM decoder 122 within the receiver 520. The TTCM encoder 112 and the TTCM decoder 522 together form a TTCM codec 511 within the transmitter 510. The receiver 520 also includes an embodiment of a TTCM encoder 512; the embodiment of the TTCM encoder 512 may be viewed as being duplicative of the TTCM encoder 112 within the transmitter 510. The TTCM decoder 122 and the TTCM encoder 512 together form a TTCM codec 521 within the receiver 520.

The embodiment of the invention described within the FIG. 5 shows an embodiment where a TTCM codec, built according to the invention, may be viewed as within a single device (such as the TTCM codec 511 within the transmitter 510 or the TTCM codec 521 within the receiver 520) or as being distributed across two separate devices, namely, the transmitter 510 and the receiver 520.

The FIG. 5 shows yet another of the many embodiments where TTCM coding (TTCM encoding and TTCM decoding) may be performed according to any one or more of the various embodiments of the invention.

Figure 6:
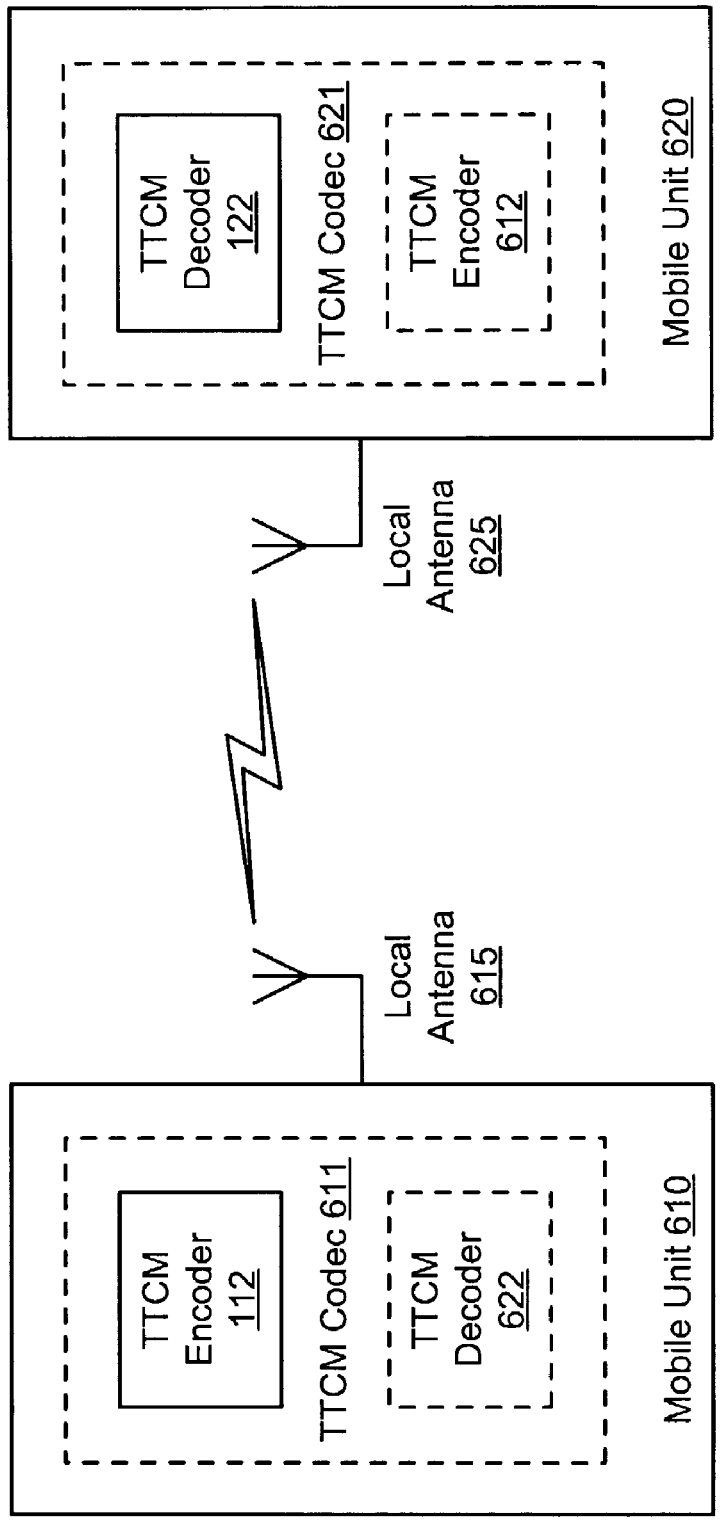
FIG. 6 is a system diagram illustrating an embodiment of a point-to-point communication system that is built according to the invention.

FIG. 6 is a system diagram illustrating an embodiment of a point-to-point communication system 600 that is built according to the invention. A mobile unit 610 includes a local antenna 615 communicatively coupled thereto. The mobile unit 610, using its local antenna 615, transmits a signal to a local antenna 625 via a wireless communication channel. A mobile unit 620 includes the local antenna 625 communicatively coupled thereto. The mobile unit 620 may receive transmissions from the mobile unit 610 that have been communicated via the wireless communication channel.

The mobile unit 610 includes an embodiment of the TTCM encoder 112 described above. Similarly, the mobile unit 620 includes an embodiment of the TTCM decoder 122 described above. Cooperatively, the TTCM encoder 112 and the TTCM decoder 122 form a TTCM codec according to a uni-directional communication implementation of the invention.

However, in a bi-directional communication implementation of the invention, the mobile unit 610 also includes an embodiment of a TTCM decoder 622; the embodiment of the TTCM decoder 622 may be viewed as being duplicative of the TTCM decoder 122 within the mobile unit 620. The TTCM encoder 112 and the TTCM decoder 622 together form a TTCM codec 611 within the mobile unit 610. The mobile unit 620 also includes an embodiment of a TTCM encoder 612; the embodiment of the TTCM encoder 612 may be viewed as being duplicative of the TTCM encoder 112 within the mobile unit 610. The TTCM decoder 122 and the TTCM encoder 612 together form a TTCM codec 621 within the mobile unit 620.

The embodiment of the invention described within the FIG. 6 shows an embodiment where a TTCM codec, built according to the invention, may be viewed as within a single device (such as the TTCM codec 611 within the mobile unit 610 or the TTCM codec 621 within the mobile unit 610) or as being distributed across two separate devices, namely, the mobile unit 610 and the mobile unit 620.

The FIG. 6 shows yet another of the many embodiments where TTCM coding (TTCM encoding and TTCM decoding) may be performed according to any one or more of the various embodiments of the invention.

Figure 7:
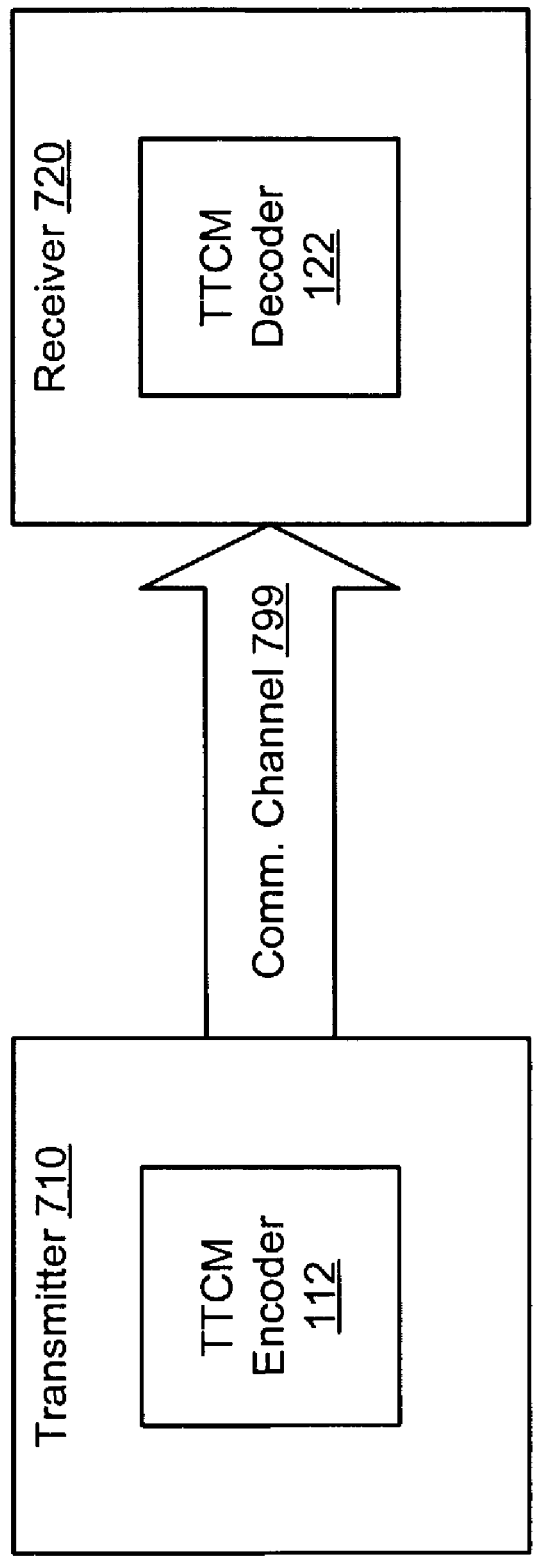
FIG. 7 is a system diagram illustrating an embodiment of a uni-directional TTCM communication system that is built according to the invention.

FIG. 7 is a system diagram illustrating an embodiment of a uni-directional TTCM communication system 700 that is built according to the invention. A transmitter 710 communicates with a receiver 720 via a uni-directional communication channel 799. The uni-directional communication channel 799 may be a wireline (or wired) communication channel or a wireless communication channel without departing from the scope and spirit of the invention. The wired media by which the uni-directional communication channel 799 may be implemented are varied, including coaxial cable, fiber-optic cabling, and copper cabling, among other types of "wiring." Similarly, the wireless manners in which the uni-directional communication channel 799 may be implemented are varied, including satellite communication, cellular communication, microwave communication, and radio communication, among other types of wireless communication.

The transmitter 710 includes an embodiment of the TTCM encoder 112. Similarly, the receiver 720 includes an embodiment of the TTCM decoder 122. Cooperatively, the TTCM encoder 112 and the TTCM decoder 122 form a TTCM codec according to the invention. The FIG. 7 shows yet another of the many embodiments where TTCM coding (TTCM encoding and TTCM decoding) may be performed according to any one or more of the various embodiments of the invention.

Figure 8:
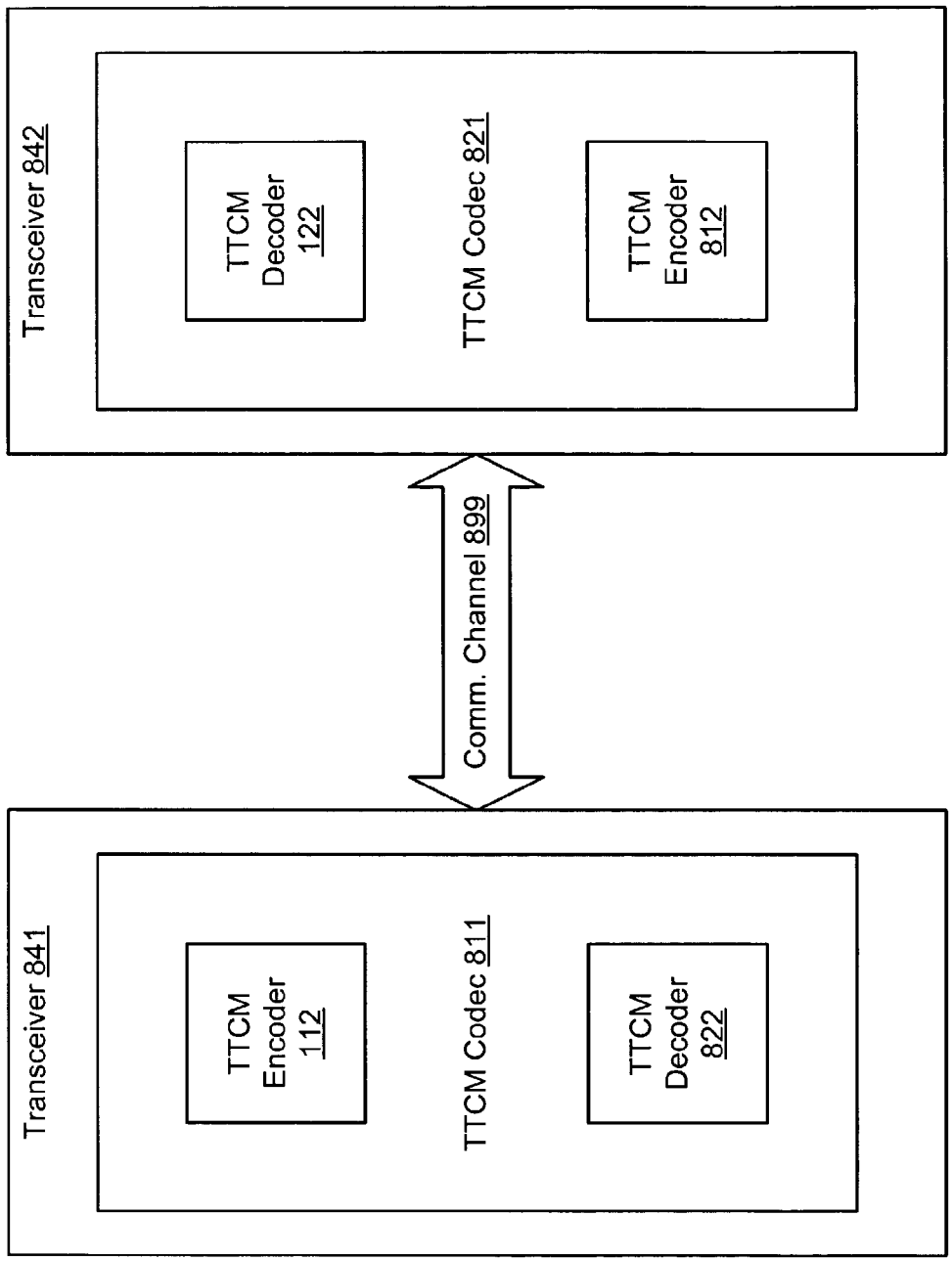
FIG. 8 is a system diagram illustrating an embodiment of a bi-directional TTCM communication system that is built according to the invention.

FIG. 8 is a system diagram illustrating an embodiment of a bi-directional TTCM communication system 800 that is built according to the invention. A transceiver 841 and a transceiver 842 are able to communicate with one another via a bi-directional communication channel 899. The bi-directional communication channel 899 may be a wireline (or wired) communication channel or a wireless communication channel without departing from the scope and spirit of the invention. The wired media by which the bi-directional communication channel 899 may be implemented are varied, including coaxial cable, fiber-optic cabling, and copper cabling, among other types of "wiring." Similarly, the wireless manners in which the bi-directional communication channel 899 may be implemented are varied, including satellite communication, cellular communication, microwave communication, and radio communication, among other types of wireless communication.

The transceiver 841 includes a TTCM codec 811 that includes a TTCM encoder 112 and a TTCM decoder 822. Similarly, transceiver 842 includes a TTCM codec 821 that includes a TTCM decoder 122 and a TTCM encoder 812. The TTCM codec 811 and the TTCM codec 821 may be viewed as being duplicative of one another within the transceivers 841 and 842.

The FIG. 8 shows yet another of the many embodiments where TTCM coding (TTCM encoding and TTCM decoding) may be performed according to any one or more of the various embodiments of the invention.

Figure 9:
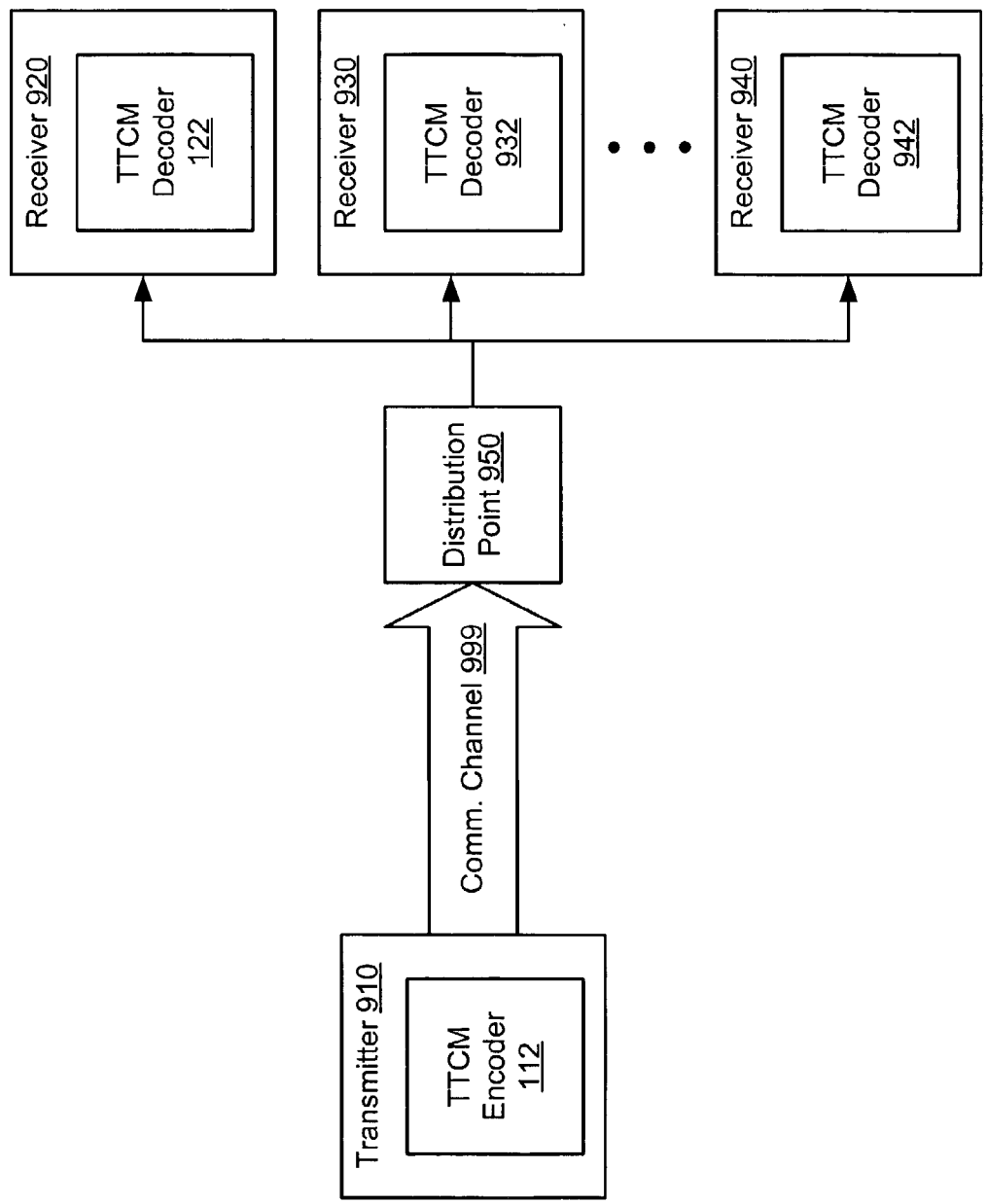
FIG. 9 is a system diagram illustrating an embodiment of a one to many TTCM communication system that is built according to the invention.

FIG. 9 is a system diagram illustrating an embodiment of a one to many TTCM communication system 900 that is built according to the invention. A transmitter 910 is able to communicate, via broadcast in certain embodiments, with a number of receivers, shown as receivers 910, 920, ..., and 940 via a uni-directional communication channel 999. The uni-directional communication channel 999 may be a wireline (or wired) communication channel or a wireless communication channel without departing from the scope and spirit of the invention. The wired media by which the bi-directional communication channel 999 may be implemented are varied, including coaxial cable, fiber-optic cabling, and copper cabling, among other types of "wiring." Similarly, the wireless manners in which the bi-directional communication channel 999 may be implemented are varied, including satellite communication, cellular communication, microwave communication, and radio communication, among other types of wireless communication.

A distribution point 950 is employed within the one to many TTCM communication system 900 to provide the appropriate communication to the receivers 910, 920, ..., and 940. In certain embodiments, the receivers 910, 920, ..., and 940 each receive the same communication and individually discern which portion of the total communication is intended for themselves.

The transmitter 910 includes an embodiment of the TTCM encoder 112. Similarly, each of the receivers 910, 920, ..., and 940 includes an embodiment of the TTCM decoder; specifically, the receiver 920 includes an embodiment of the TTCM decoder 122; the receiver 930 includes an embodiment of the TTCM decoder 932; and the receiver 940 includes an embodiment of the TTCM decoder 942. Cooperatively, the TTCM encoder 112 and each of the TTCM decoders 122, 932, ..., and 942 form TTCM codecs according to the invention. The FIG. 9 shows yet another of the many embodiments where TTCM coding (TTCM encoding and TTCM decoding) may be performed according to any one or more of the various embodiments of the invention.

Figure 10:
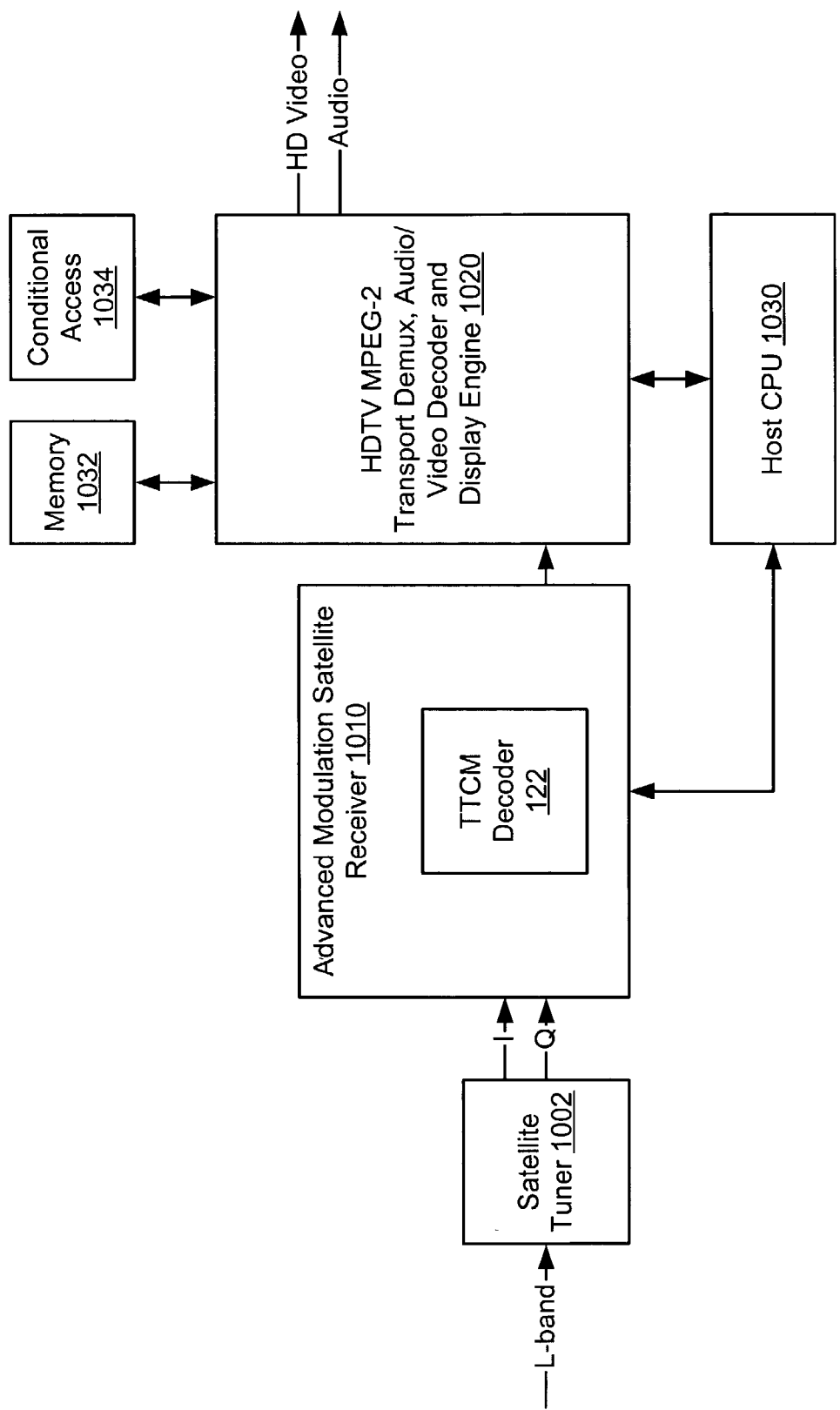
FIG. 10 is a system diagram illustrating an embodiment of a satellite receiver set-top box system that is built according to the invention.

FIG. 10 is a system diagram illustrating an embodiment of a satellite receiver set-top box system 1000 that is built according to the invention. The satellite receiver set-top box system 1000 includes an advanced modulation satellite receiver 1010 that is implemented in an all digital architecture. The satellite receiver set-top box system 1000 includes a satellite tuner 1002 that receives a signal via the L-band. The satellite tuner 1002 extracts I,Q (in-phase and quadrature) components from a signal received from the L-band and provides them to the advanced modulation satellite receiver 1010. The advanced modulation satellite receiver 1010 includes an embodiment of the TTCM decoder 112. The advanced modulation satellite receiver 1010 communicatively couples to an HDTV MPEG-2 (Motion Picture Expert Group) transport de-mux, audio/video decoder and display engine 1020. Both the advanced modulation satellite receiver 1010 and the HDTV MPEG-2 transport de-mux, audio/video decoder and display engine 1020 communicatively couple to a host central processing unit (CPU) 1030. The HDTV MPEG-2 transport de-mux, audio/video decoder and display engine 1020 also communicatively couples to a memory module 1032 and a conditional access functional block 1034. The HDTV MPEG-2 transport de-mux, audio/video decoder and display engine 1020 provides HD video and audio output that may be provided to an HDTV display.

The advanced modulation satellite receiver 1010 is a single-chip digital satellite receiver supporting the TTCM decoder 122 and variable code rate operation. Several of the many embodiments of the variable code rate operation are described in even more detail below. Multiple modulations (constellations and mappings) are supported with iteratively (turbo) decoded error correction coding within the TTCM decoder 122. The advanced modulation satellite receiver 1010 is operable to receive communication provided to it from a transmitter device that includes a TTCM encoder according to the invention.

It is noted that each of the various embodiments described above in which TTCM coding (TTCM encoding and/or TTCM decoding) is performed is operable to support variable code rate coding according to the invention. As will be described in the various embodiments below, this variable code rate functionality may include rotating through a number of various modulations (of different constellations) and mapping for those various modulations.

Figure 11:
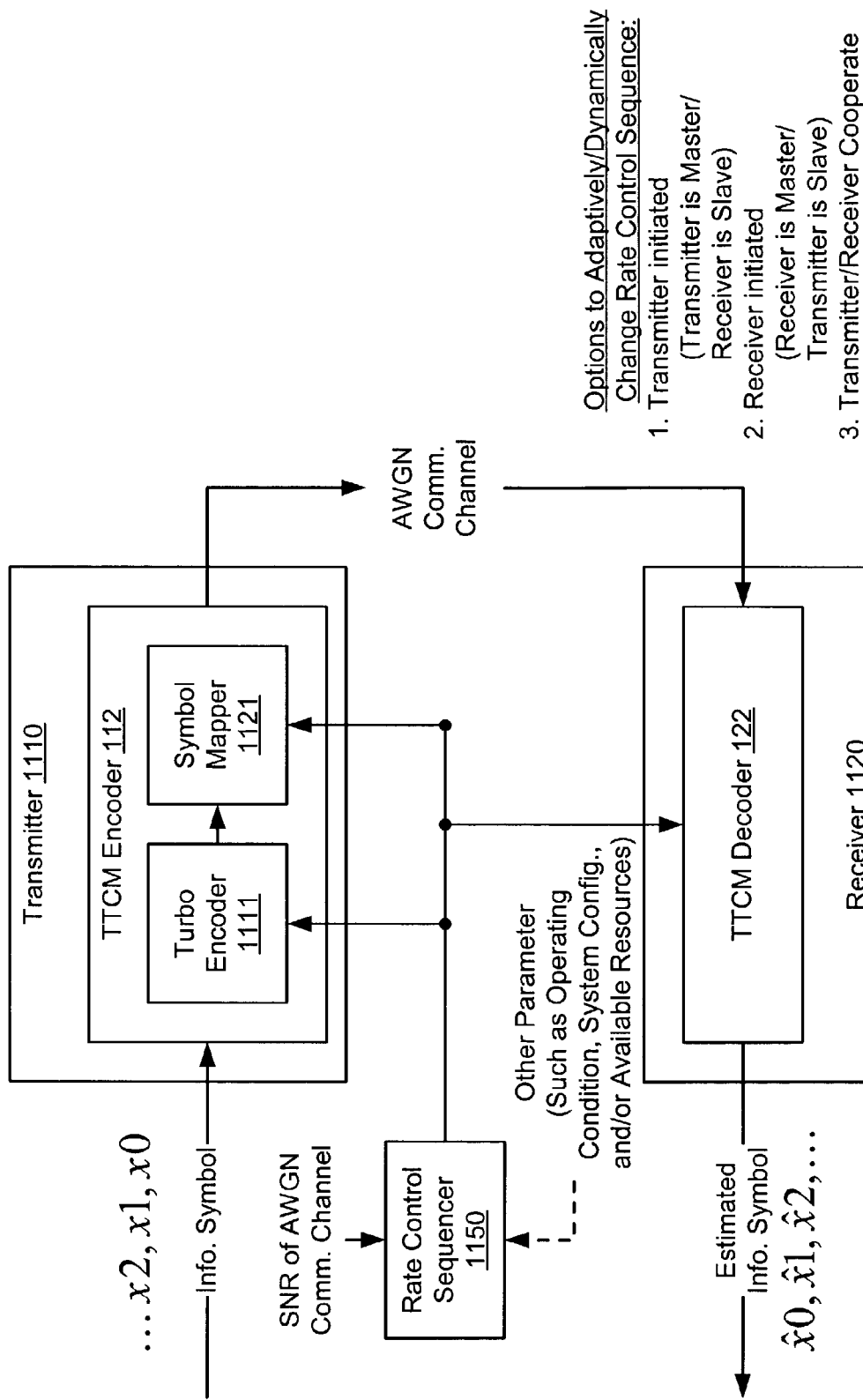
FIG. 11 is a system diagram illustrating an embodiment of a TTCM communication system that is built according to the invention.

FIG. 11 is a system diagram illustrating an embodiment of a TTCM communication system 1100 that is built according to the invention. The TTCM communication system 1100 includes a transmitter 1110 and a receiver 1120 that are communicatively coupled to one another via a communication channel that introduces Additive White Gaussian Noise (AWGN) to the signal. The communication channel may be wireline or wireless according to the invention. The AWGN communication channel may be viewed as being a relatively noisy communication channel.

The transmitter 1110 includes a TTCM encoder 112 that encodes one or more information symbols and then modulates those encoded symbols according to a constellation and a mapping. The transmitter 1110 then prepares this signal for transmission across the communication channel. At the other end of the communication channel, the receiver 1120 includes a TTCM decoder 122 that receives and estimates the encoded symbols that have been transmitted across the communication channel. Further details of the operation of the various functional blocks contained within the TTCM encoder 112 and the TTCM decoder 122 are described in more detail below.

In addition, a rate control sequencer 1150 provides one or more rate controls to the turbo encoder 1111 and the symbol mapper 1121 of the TTCM encoder 112 and to the TTCM decoder 122. This rate control sequencer 1150 provides rate control sequences (which may include as few as one rate control (RC) and as many as several RCs). Each RC includes one or more modulations (constellations and mappings).

Each modulation provides a bandwidth efficiency that may be viewed as being a total number of information bits per symbol that is encoded; a number of redundancy bits contained therein. Each of the TTCM encoder 112 and the TTCM decoder 122 is operable to cycle through the rate control sequence at their respective locations when performing encoding and decoding of symbols, respectively.

Generally speaking within the TTCM encoder 112, the turbo encoder 1111 performs the symbol encoding and the symbol mapper 1121 maps those encoded symbols to the appropriate modulation according to the rate control sequence provided by the rate control sequencer 1150. Similarly, generally speaking within the TTCM decoder 122, the TTCM decoder 122 performs calculations that are employed to perform decoding of the received symbols according to the rate control sequence provided by the rate control sequencer 1150. There are a whole host of various embodiments in which various modulations (having various modulations and various mappings), and various periodic sequencing of rate control sequence may be used to perform the encoding and decoding of data using the TTCM techniques described herein. In some embodiments, the rate control sequence is adaptively changed during operation to provide for improved performance. In other embodiments, predetermined rate control sequences are employed.

In adaptive embodiments, certain operating conditions may be employed, such as a measurement of the communication channel's SNR, to direct the changing of the rate control sequence or rate control sequences to be used by both the TTCM encoder 112 and the TTCM decoder 122. It is understood that either one or both of the TTCM encoder 112 and the TTCM decoder 122 may perform the measurement of such operating conditions and direct the TTCM communication system 1100 to change rate control sequences. In some embodiments, such as a uni-directional communication system embodiment, it may make more sense for the transmitter to perform such measurement and direction, whereas within bi-directional communication system embodiments, either of the transceivers may provide such functionality. The particular implementation may be left to one who implements the invention in a particular application. There exist several options that may be employed to adaptively/dynamically change the rate control sequence.

For example, one embodiment operates such that the transmitter is a master to the receiver (which operates as a slave). The transmitter determines some operational parameter, such as the Signal to Noise Ratio (SNR) of the AWGN communication channel (or some other parameter including, but not limited to, an operating condition of the communication system, the system's configuration, and/or the available resources of the communication system), and then the transmitter directs the rate control sequencer 1150 so that both the transmitter and the receiver change to a new rate control sequence synchronously.

In another embodiment, the transmitter is a slave to the receiver (which operates as a master). The receiver determines some operational parameter, such as the Signal to Noise Ratio (SNR) of the AWGN communication channel (or some other parameter including, but not limited to, an operating condition of the communication system, the system's configuration, and/or the available resources of the communication system), and then the receiver directs the rate control sequencer 1150 so that both the transmitter and the receiver change to a new rate control sequence synchronously.

In even other embodiments, the transmitter and the receiver operate cooperatively to perform any changing to a new rate control sequence.

It is also understood that a variety of means of modulation, transmission, receipt, and demodulation may be performed to generate the analog signals to be transmitted across the communication channel without departing from the scope and spirit thereof. Each and any such means may be practiced according to the invention while performing the TTCM encoding/decoding described herein.

Figure 12:
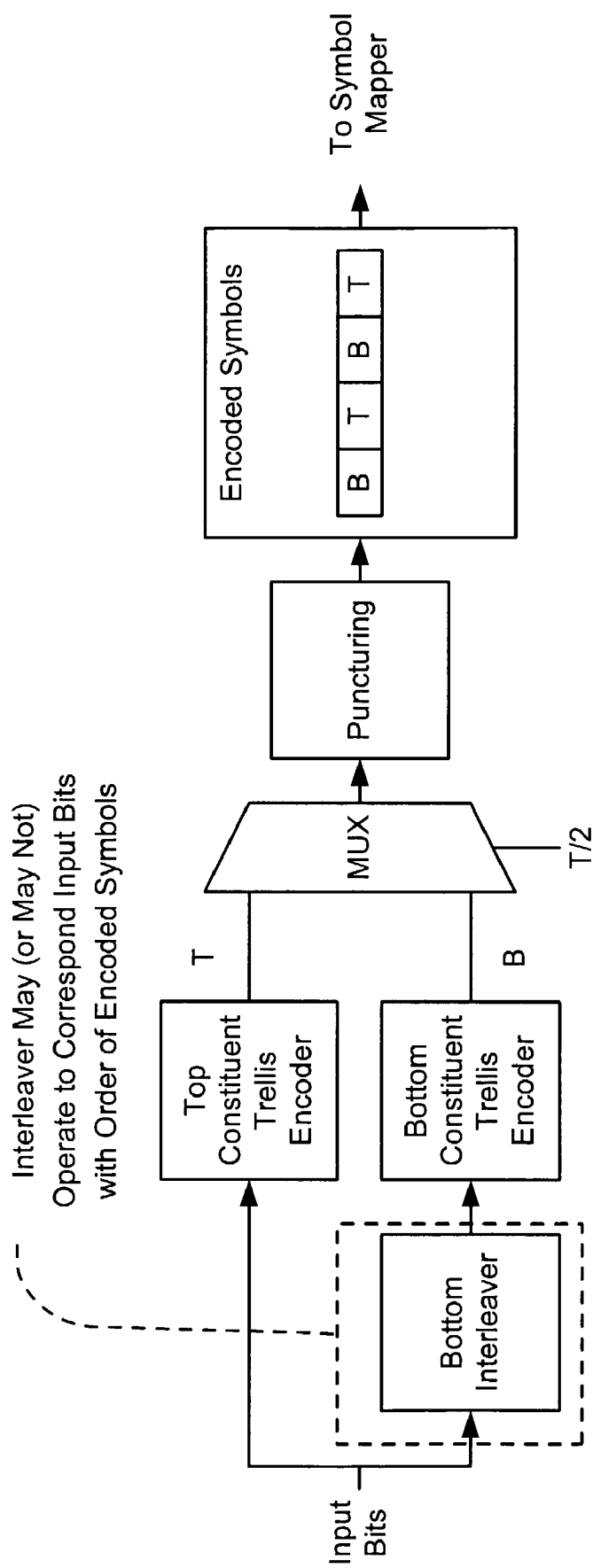
FIG. 12 is a diagram illustrating a single interleaver embodiment of the turbo encoder of the FIG. 11.

FIG. 12 is a diagram illustrating a single interleaver embodiment of the turbo encoder 1111 of the FIG. 11. The variable code rate functionality described herein may be performed within this single interleaver embodiment of the turbo encoder 1111. Input bits are provided simultaneously to a top path and a bottom path. The top path includes a top constituent trellis encoder, and the bottom path includes a bottom interleaver communicatively coupled to a bottom constituent trellis encode. A variety of interleaves may be performed as selected for the particular application within the bottom interleaver. The outputs from the top and bottom paths are provided to a multiplexor (MUX) whose selection is provided by a clock signal that is clocked at 1/2 the rate at which the input bits are provided to the top and bottom paths. This way, the output of the MUX will alternatively select the outputs from the top and bottom paths.

These output bits are then output to a puncturing functional block. In certain embodiments, no puncturing is performed on the bits output from the MUX; they are all simply passed as output from the puncturing functional block. However, in other embodiments, puncturing is performed according to the rate control sequence provided by the rate control sequencer 1150. A variety of encoded symbols may then be then generated according to the outputs from the top and bottom paths; the bottom path being an interleaved path. These encoded symbols are then passed to the symbol mapper according to the invention where the symbols are mapped according to the appropriate modulation (constellation and mapping) as governed by the rate control sequence provided by the rate control sequencer 1150. The single interleaver embodiment of the turbo encoder 1111 shows just one of the many embodiments in which TTCM encoding may be performed. Other turbo encoding embodiments are also envisioned within the scope and spirit of the invention to support the variable code rate functionality described herein.

It is noted that the interleaver within the FIG. 12 may be implemented such that it operates to correspond the order of the input bits with the order in which the encoded symbols are output from this embodiment of the turbo encoder. That is to say, the first output, encoded symbol corresponds to the first group of input bits (or first input symbol); the second output, encoded symbol corresponds to the second group of input bits (or second input symbol). Alternatively, the interleaver may be implemented such that corresponding the order of the input bits (or symbols) need not necessarily correspond to the output order of the encoded symbols to the input order of the groups of input bits (or input symbols).

Figure 13:
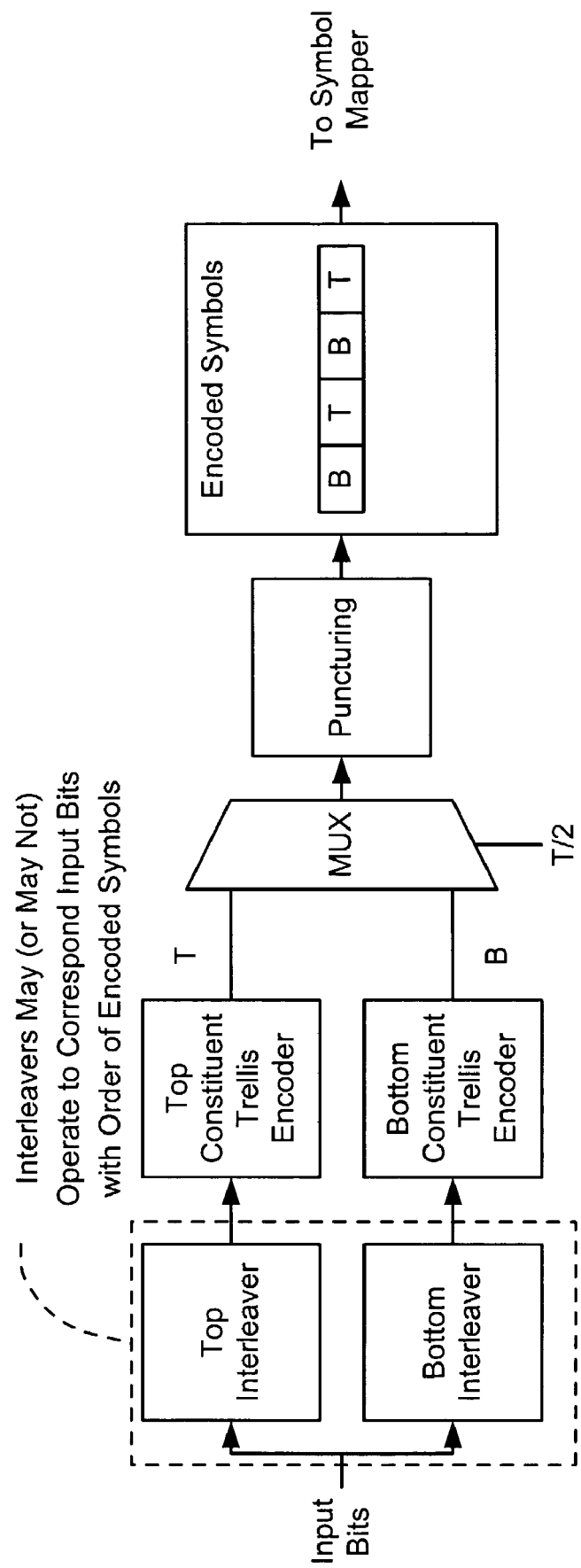
FIG. 13 is a diagram illustrating a dual interleaver embodiment of the turbo encoder of the FIG. 11.

FIG. 13 is a diagram illustrating a dual interleaver embodiment of the turbo encoder 1111 of the FIG. 11. Similar to the embodiment of the FIG. 12, the variable code rate functionality described herein may be performed within this dual interleaver embodiment of the turbo encoder 1111. Input bits are provided simultaneously to a top path and a bottom path. The top path includes a top interleaver communicatively coupled to a top constituent trellis encoder, and the bottom path includes a bottom interleaver communicatively coupled to a bottom constituent trellis encoder.

It is also noted here (similar to FIG. 12) that the interleavers within the FIG. 13 may be implemented such that they operate to correspond the order of the input bits with the order in which the encoded symbols are output from this embodiment of the turbo encoder. That is to say, the first output, encoded symbol corresponds to the first group of input bits (or first input symbol); the second output, encoded symbol corresponds to the second group of input bits (or second input symbol). Alternatively, the interleaver may be implemented such that corresponding the order of the input bits (or symbols) need not necessarily correspond to the output order of the encoded symbols to the input order of the groups of input bits (or input symbols).

The outputs from the top and bottom paths are provided to a multiplexor (MUX) whose selection is provided by a clock signal that is clocked at 1/2 the rate at which the input bits are provided to the top and bottom paths. This way, the output of the MUX will alternatively select the outputs from the top and bottom paths.

As with the embodiment described above in the FIG. 12 for the interleaving performed by the bottom interleaver, a variety of interleaves may be performed as selected for the particular application. The following example shows one embodiment of how the interleaving may be performed for the top interleaver and the bottom interleaver.

For each of the top interleaver and the bottom interleaver, we let $\pi_0$ and $\pi_1$ be the interleaves for each bit within the two bit input symbol, $i_0 i_1$. According to the FIG. 13, we employ the following modified interleavers (Top interleaver and Bottom interleaver) within the encoding process; these modified interleavers are each variants of the interleaver, $\pi_I$, as defined below. There are, in effect, two interleaves that are functionally performed within the Top interleaver, and two interleaves are functionally performed within the Bottom interleaver. A total of four interleaves are performed by the Top interleaver and Bottom interleaver in this embodiment. These interleaves are performed independently for each bit within the two bit input symbol, $i_0 i_1$. The decoding process, described in more detail below, may employ the modified interleaving/de-interleaving shown here during initialization; however, when performing actual decoding of a received symbol's bits, it only employs the non-modified interleaver, $\pi_I$, and the de-interleaver, $\pi_I^{-1}$. Within this dual interleaver embodiment of the turbo encoder 1111, the modified interleaving is performed as follows:

Top interleaver=i for i mod 2=0 (for even positions)
Top interleaver=$\pi_I^{-1}$(i) for i mod 2=1 (for odd positions)
Bottom interleaver=$\pi_I$(i) for i mod 2=0
Bottom interleaver=i for i mod 2=1
Where, l=0,1 for two bit input symbol, $i_0 i_1$.

This modified interleaving is performed to ensure the following: when we input a symbol sequence, $S_1 S_2 S_3 S_4$, then we want encoded corresponding output from those symbols to be in the same order, namely, the encoded output for $S_1$, followed by the encoded output for $S_2$, followed by the encoded output for $S_3$, and finally followed by the encoded output for $S_4$. The output encoded symbol sequence, shown as BTBT, will maintain this sequential order (based on the order of the input symbols) because of the modified interleaving performed herein.

In other words, the input symbols (or input bits) come into the encoder according to a particular sequence, and the encoded symbols that are output from the TTCM encoder leave according to that same sequence.

Again, this interleaving shows just one example of how interleaving may be performed according to the invention. Other interleaves may also be designed for a particular application. This particular interleaving is used to illustrate the functionality of the invention in several embodiments of the invention in the various Figures and written description.

These output bits, after having undergone interleaving and encoding, are then output to a puncturing functional block. In certain embodiments, no puncturing is performed on the bits output from the MUX. However, in other embodiments, puncturing is performed according to the rate control sequence provided by the rate control sequencer 1150. A variety of encoded symbols may then be generated according to the outputs from the top and bottom paths. These encoded symbols are then passed to the symbol mapper according to the invention where the symbols are mapped according to the appropriate modulation (constellation and mapping) as governed by the rate control sequence provided by the rate control sequencer 1150. The dual interleaver embodiment of the turbo encoder 1111 shows yet another of the many embodiments in which TTCM encoding may be performed. It is noted that other turbo encoding embodiments are also envisioned within the scope and spirit of the invention to support the variable code rate functionality described herein.

Figure 14:
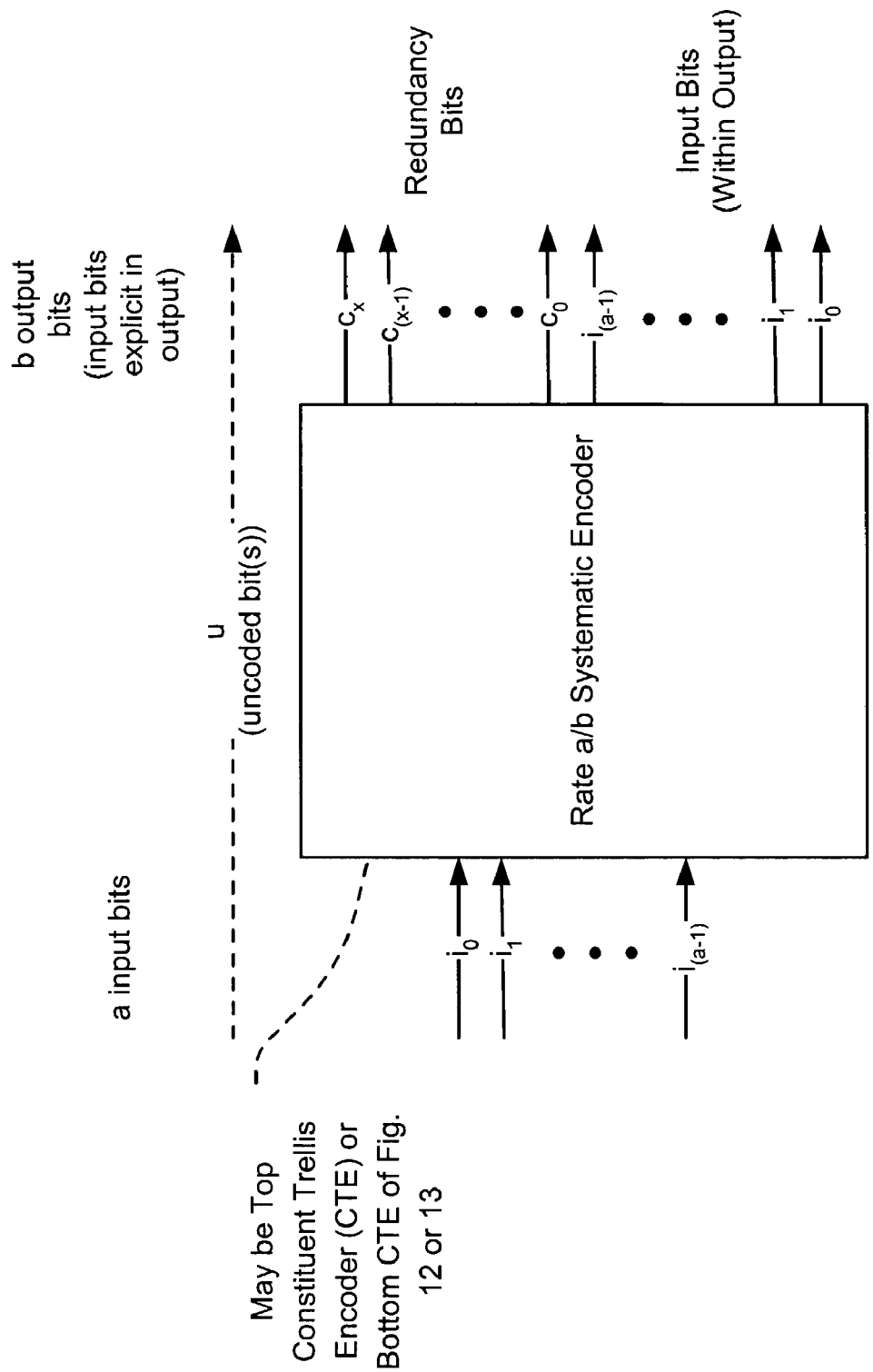
FIG. 14 is a diagram illustrating an embodiment of a systematic encoder that is built according to the invention.

FIG. 14 is a diagram illustrating an embodiment of a systematic encoder 1400 that is built according to the invention. In general terms, the systematic encoder 1400 shows an encoder that encodes "a" input bits (shown as $i_0$, $i_1$, . . . , and $i_{(a-1)}$). The systematic encoder 1400 is a rate a/b encoder where "a" input bits are provided and "b" output bits are output. The "b" output bits include "x" number of redundancy bits (shown as $c_x$, $c_{(x-1)}$, . . . , and $c_0$) that are coded as a function of one or more of the "a" input bits as well as each of the "a" input bits themselves. A systematic encoder may be viewed as being an encoder where the input bits are explicitly represented and available in the output of the encoder. In addition, one or more uncoded bits u may be provided as output of the encoder without having undergone any encoding at all. It is noted that sum of the total number of coded bits "x" and the "a" input bits is equal to the number of output bits "b" in this rate a/b encoder.

It is also noted that one or both of the top constituent trellis encoder and the bottom constituent trellis encoder in the FIG. 12 or 13 may be implemented using the systematic encoder 1400 of the FIG. 14.

Figure 15:
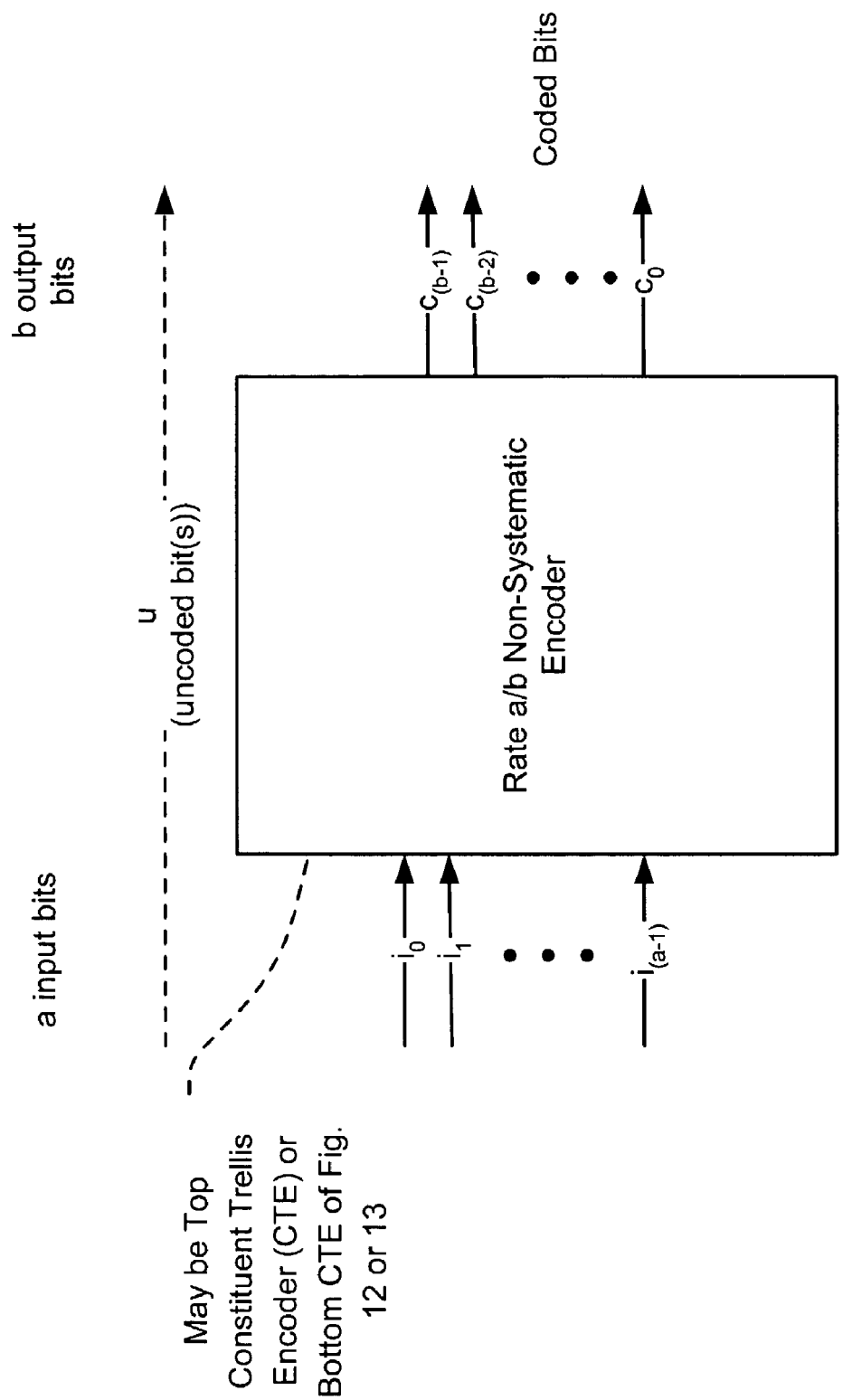
FIG. 15 is a diagram illustrating an embodiment of a non-systematic encoder that is built according to the invention.

FIG. 15 is a diagram illustrating an embodiment of a non-systematic encoder 1500 that is built according to the invention. In general terms, the non-systematic encoder 1500 shows an encoder that encodes "a" input bits (shown as $i_0$, $i_1$, . . . , and $i_{(a-1)}$) to provide "b" output bits (shown as $c_{(b-1)}$, $c_{(b-2)}$, . . . , and $c_0$). A non-systematic encoder may be viewed as being an encoder where the input bits are not explicitly represented and available in the output of the encoder. In addition, one or more uncoded bits u may be provided as output of the encoder without having undergone any encoding at all. While the invention envisions employing either systematic or non-systematic encoding, a non-systematic encoder is employed to illustrate the invention's variable code rate functionality in many of the various Figures and description. It will be understood that systematic encoding may also be employed to perform the various aspects of the invention as well.

It is also noted that one or both of the top constituent trellis encoder and the bottom constituent trellis encoder in the FIG. 12 or 13 may be implemented using the non-systematic encoder 1500 of the FIG. 15.

Figure 16:
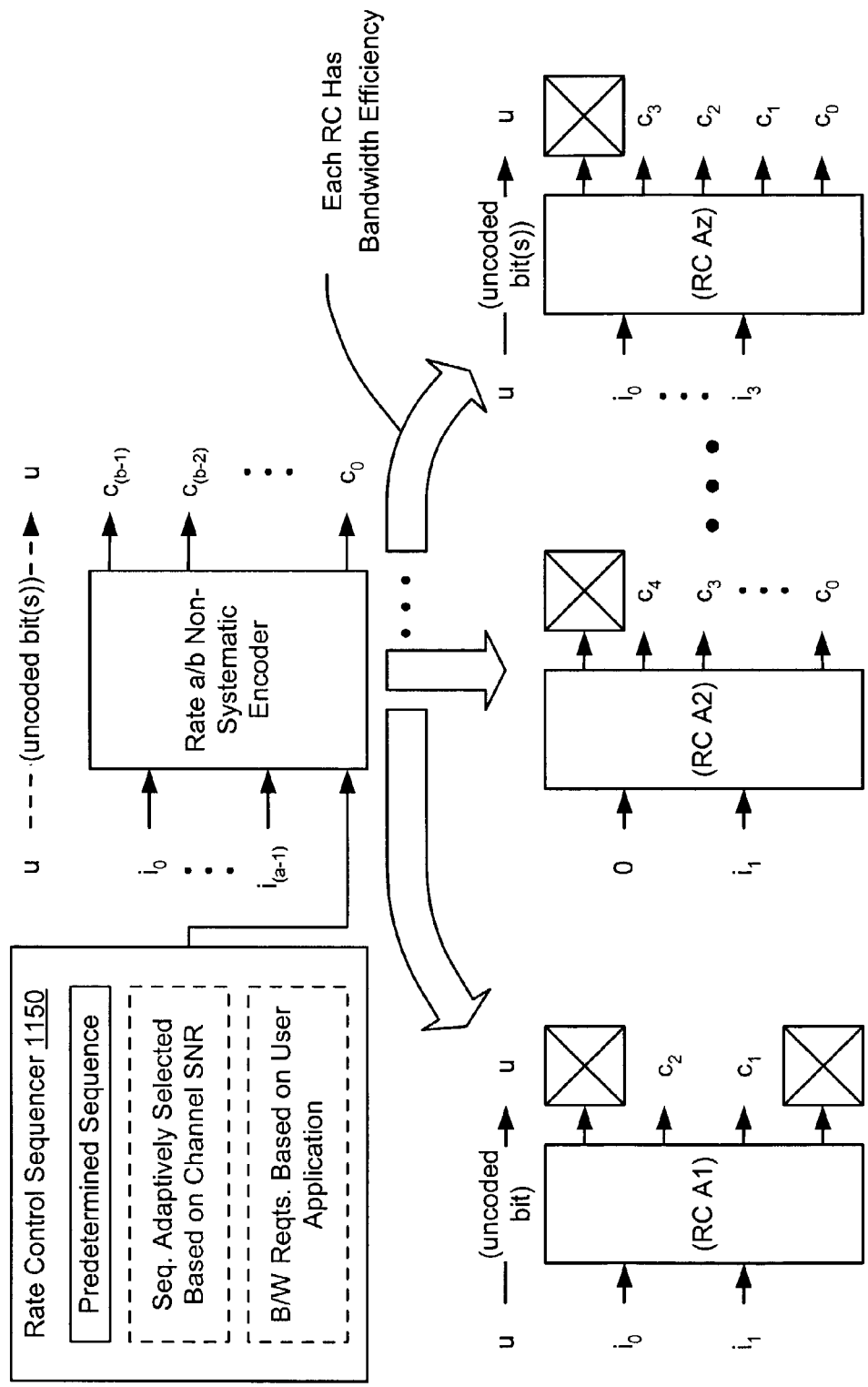
FIG. 16 is a diagram illustrating an embodiment of a non-systematic encoder using puncturing and rate control sequencer to support multiple encoders according to the invention.

FIG. 16 is a diagram illustrating an embodiment of a non-systematic encoder using puncturing and rate control sequencer to support multiple encoders 1600 according to the invention. Here, a single non-systematic encoder is implemented to perform the functionality of multiple encoders. A single hardware implementation may be used to support the functionality of each of a number of encoders. We illustrate the non-systematic encoder as being a rate a/b non-systematic encoder that that encodes "a" input bits (shown as $i_0, i_1, \ldots,$ and $i_{(a-1)}$) to provide "b" output bits (shown as $c_{(b-1)}, c_{(b-2)}, \ldots,$ and $c_0$). As mentioned above, one or more uncoded bits may also be used. Each of the rate control sequences provided by the rate control sequencer 1150 may select none, some, or all of the "a" input bits and generate none, some, or all of the "b" output bits as well as selecting none, some, or all of a number of available uncoded bits. Puncturing is performed on the output bits of the encoder to generate the various options of encoded symbols that include encoded bits and/or uncoded bits.

To show the generic applicability of the variable code rate functionality of the invention, the rate a/b non-systematic encoder cycles through a number of rate controls (that constitute a rate control sequence—shown as a RC A1, a RC A2, . . . , and a RC Az). Each of the RCs has a particular bandwidth efficiency. Cooperatively, the bandwidth efficiencies of the individual RCs (RC A1, RC A2, . . . , and RC Az) define the rate control sequence provide an average bandwidth efficiency across the entire rate control sequence. These RCs are shown generically to illustrate the wide applicability of the variable code rate functionality of the invention.

The rate control sequencer 1150 may cycle through a predetermined rate control sequence; it may adaptively select one or more new rate control sequences based on operating conditions such as a communication channel's SNR, bandwidth requirements based on various user applications, or according to some other consideration as well.

The rate control sequence as illustrated within the example embodiment shown in the FIG. 16 may be described as follows:

Within the encoder as implemented according to RC A1, two information bits ($i_0$ and $i_1$) and one uncoded bit u are input to the encoder. The output of the encoder punctures all of the coded bits except for $c_2$ and $c_1$, and the uncoded bit u; these remaining bits are then used to generate a 3 bit symbol that will be mapped according to a 3 bit symbol modulation (constellation and mapping) as defined by RC A1.

Within the encoder as implemented according to RC A2, one information bits ($i_1$) is input to the encoder. The output of the encoder punctures all of the coded bits except for $c_4$, $c_3, \ldots c_0$; these remaining bits are then used to generate a 5 bit symbol that will be mapped according to a 5 bit symbol modulation (constellation and mapping) as defined by RC A2.

Within the encoder as implemented according to RC Az, four information bits ($i_0, i_1, i_2, i_3$) and one uncoded bit u are input to the encoder. The output of the encoder punctures all of the coded bits except for $c_3, c_2, c_1, c_0$, and the uncoded bit u; these remaining bits and the uncoded bit are then used to generate a 5 bit symbol that will be mapped according to a 5 bit symbol modulation (constellation and mapping) as defined by RC Az. While the RC A2 and RC Az both employ 5 bit symbols, they may nevertheless employ different modulations (different constellations and different mappings) without departing from the scope and spirit of the invention.

The rate a/b non-systematic encoder may then cycle through the rate control sequence defined by the (RC A1, RC A2, . . . , and RC Az) a predetermined number of times within a data frame. Alternatively, the rate a/b non-systematic encoder may adaptively select a new rate control sequence based on operating conditions of the communication system in which the rate a/b non-systematic encoder is implemented. Each of the individual RCs may be viewed as being functionality supported by distinct encoders.

Figure 17:
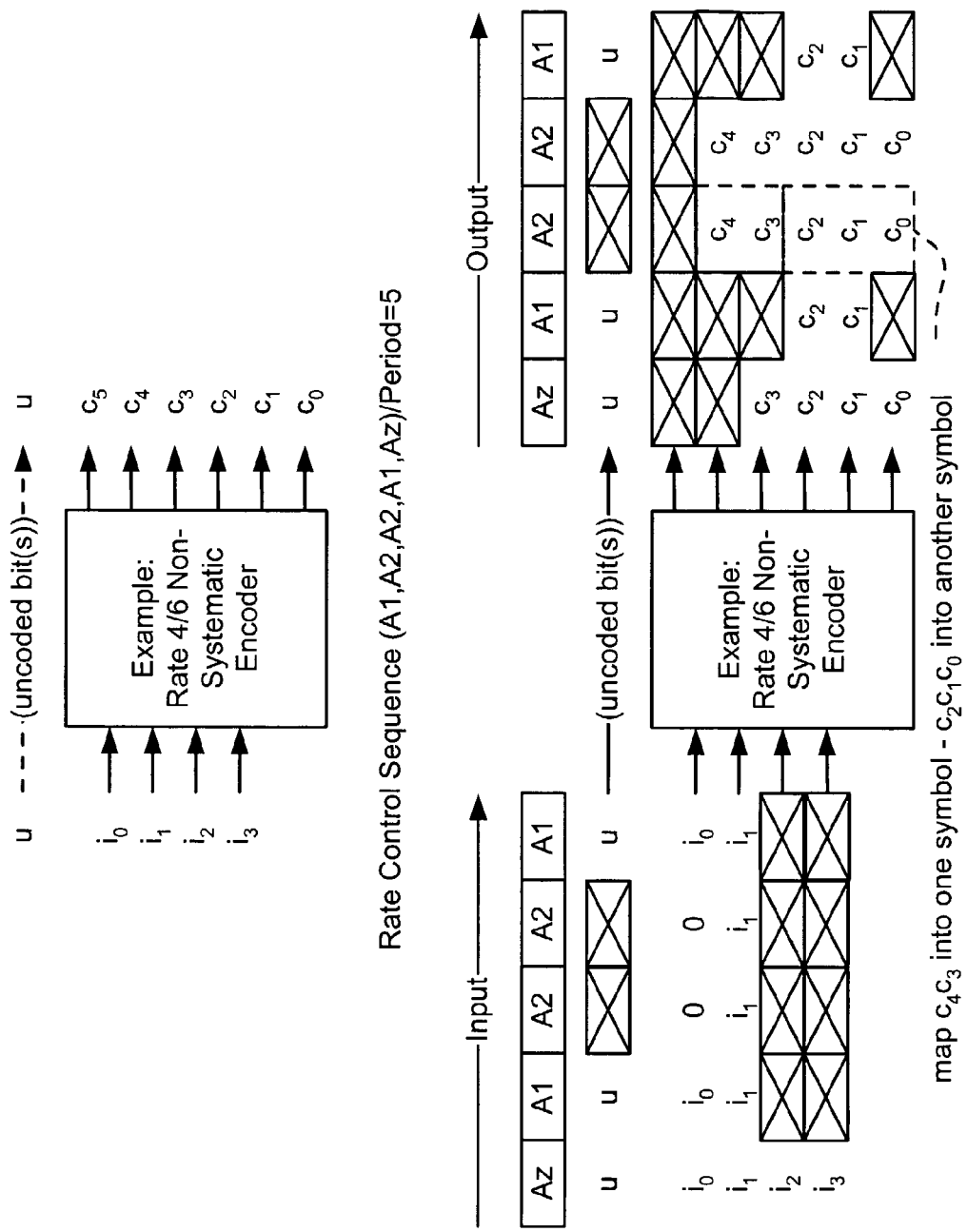
FIG. 17 is a diagram illustrating an embodiment of periodic sequencing of a non-systematic encoder using puncturing and rate control sequencer according to the invention.

FIG. 17 is a diagram illustrating an embodiment of periodic sequencing of a non-systematic encoder using puncturing and rate control sequencer 1700 according to the invention. In this example to show the periodic sequencing, a rate 4/6 non-systematic encoder is employed. The rate control sequence in this embodiment includes the RCs (RC A1, RC A2, RC A2, RC A1, and RC Az) having a period of 5 RCs.

The available input of this exemplary rate 4/6 non-systematic encoder is ($i_0, i_1, i_2, i_3$) and the uncoded bit, and the available output is ($c_5, c_4, c_3, c_2, c_1, c_0$) as well as the uncoded bit. Puncturing is performed to select a predetermined sub-set of all of the available input and output bits of the rate 4/6 non-systematic encoder. The input cycles through the period of 5 RCs described above. The inputs bits cycle through the following sequence according to this particular period:

RC A1: $ui_0i_1$
RC A1: $ui_0i_1$
RC A2: $0i_1$
RC A2: $0i_1$
RC Az: $ui_0i_1i_2i_3$

The output bits of this period of RCs is as follows:
RC A1: $uc_2c_1$
RC A1: $uc_2c_1$
RC A2: $c_4c_3c_2c_1c_0$
RC A2: $c_4c_3c_2c_1c_0$
RC Az: $uc_3c_2c_1c_0$ Clearly, additional rate control sequences that include different RCs may also be employed to perform and support the functionality described herein. The generic embodiment of FIG. 17 shows how different constellations (3 bit symbols and 5 bit symbols in this example) may be used within a single rate control sequence. This means that various modulations, each having different numbers of total constellation points, may be used in a single rate control sequence.

In another embodiment of the invention, the encoder of the FIG. 17 is implemented such that the remaining bits, output from the encoder, may be groups to support multiple modulations. For example, for one of the groups of output bits for one of the RCs, the remaining output bits $c_4c_3$ are used for one modulation (such as a QPSK or APSK type constellation and mapping that employs 2 bits), and the other bits are $c_2c_1c_0$ are used for another modulation (such as an 8 PSK type constellation and mapping that employs 3 bits). Other variations may also be employed as well, such as those that operate using 6 available encoded bits. In such a possible embodiment, 4 of the bits may be used for one modulation (such as a 16 QAM or 16 APSK type constellation and mapping that employs 4 bits), and the other 2 bits may be used for another modulation (such as a QPSK or APSK type constellation and mapping that employs 2 bits).

Figure 18:
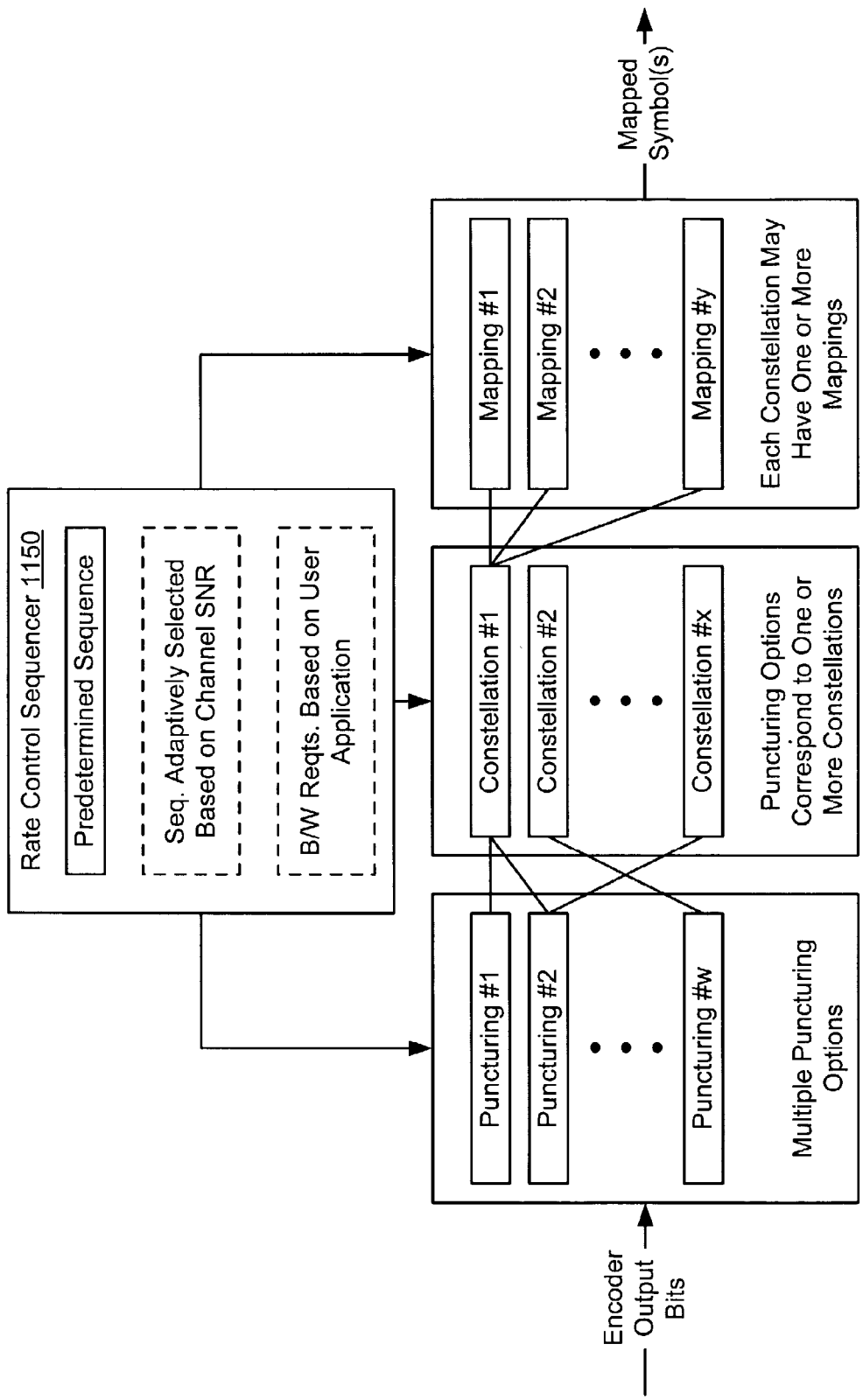
FIG. 18 is a diagram illustrating a generic embodiment of variable puncturing, constellation, and mapping using a single encoder according to the invention.

FIG. 18 is a diagram illustrating a generic embodiment of variable puncturing, constellations, and mapping using a single encoder 1800 according to the invention. The FIG. 18 particularly shows how encoder output bits are punctured, and how the remaining bits are associated with one or more particular constellations and how each of those constellations may have a unique mapping. The control of the puncturing, the constellation, and the mapping are all governed by the rate control sequencer 1150. Again, the rate control sequencer 1150 may cycle through a predetermined rate control sequence; it may adaptively select one or more new rate control sequence based on operating conditions such as a communication channel's SNR, bandwidth requirements based on various user applications, or according to some other consideration as well.

The available encoder output bits are provided to a functional block that may employ one or more of a number of multiple puncturing options. These puncturing options are shown generically as puncturing #1, puncturing #2, . . . , and puncturing #w. Each of these puncturing options is associated with one or more constellations (shown as constellation #1, constellation #2, . . . , and constellation #x). For example, the output bits remaining after having performed the puncturing #1 are then associated with the constellation #1. The output bits remaining after having performed the puncturing #2 may then be associated with either the constellation #1 or the constellation #x. The output bits remaining after having performed the puncturing #w are then associated with the constellation #2.

Each constellation is associated with one or more mappings, shown as mapping #1, mapping #2, . . . mapping #y. As an example, the constellation #1 is associated with more than one mapping, namely, mapping #1, mapping #2, and mapping #y. The other constellations may also be associated with various mappings as well. The encoding process includes performing encoding, puncturing, selection of a modulation (constellation and mapping).

As mentioned above, a number of types of encoders may be employed according to the invention, and the following examples of encoders show just some of the possible encoder types that may be used.

Figure 19:
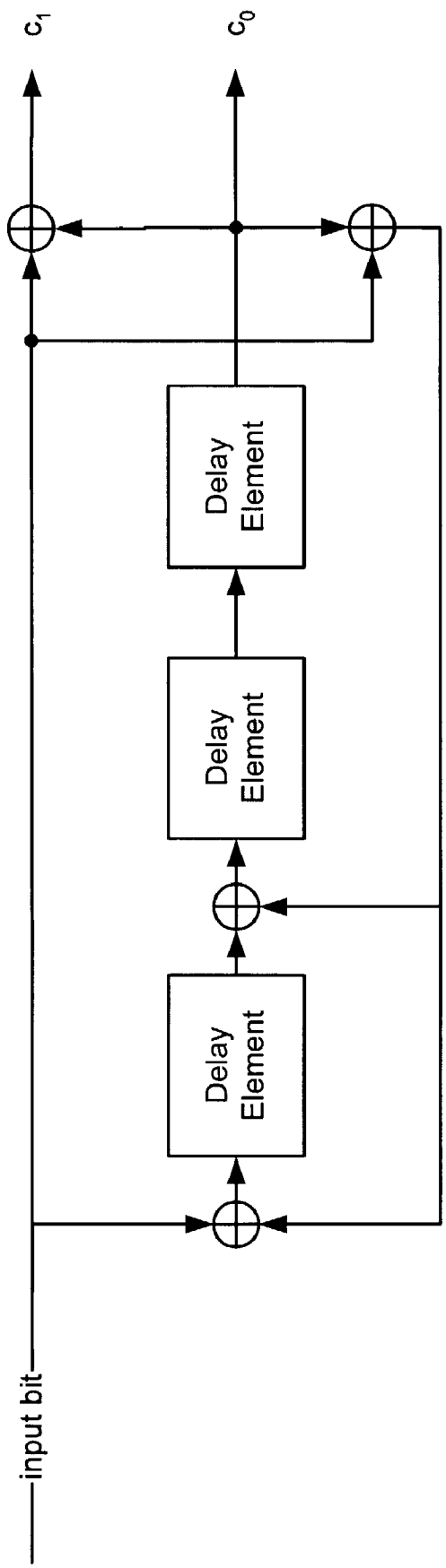
FIG. 19 is a diagram illustrating an embodiment of a rate 1/2 recursive convolutional encoder with non-systematic output that is built according to the invention.

FIG. 19 is a diagram illustrating an embodiment of a rate 1/2 recursive convolutional encoder with non-systematic output 1900 that is built according to the invention. The rate is 1/2 as there is one input information bit and two output encoded bits. The encoder receives a single input bit and generates two encoded bits ($c_1$, $c_0$). The recursive operation of the encoder in the FIG. 19 may be viewed as follows. The input bit is selectively summed with delayed versions of itself to generate the two encoded bits.

This encoder circuit represents one way to encode an input bit to generate two encoded bits. Clearly, the invention envisions other embodiments and types of encoders as well. This particular example of the rate 1/2 recursive convolutional encoder with non-systematic output 1900 is used to illustrate the scalability and extendibility of the invention across a number of encoding schemes. This rate 1/2 recursive convolutional encoder with non-systematic output 1900 will be used as one building block to generate a rate 2/5 encoder as will be described below in FIG. 20.

Figure 20:
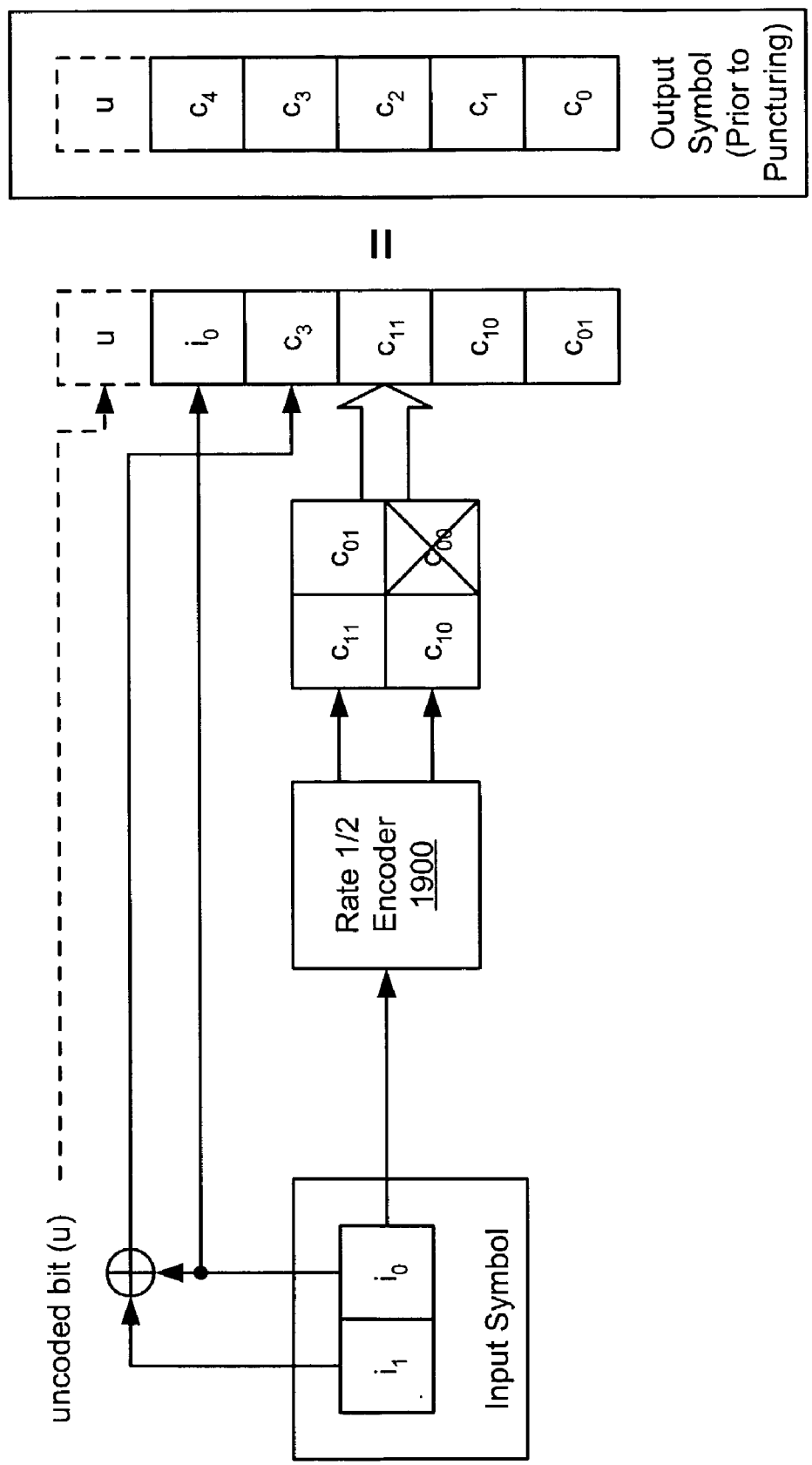
FIG. 20 is a diagram illustrating an embodiment of a rate 2/5 prototype encoder that is built according to the invention.

FIG. 20 is a diagram illustrating an embodiment of a rate 2/5 prototype encoder 2000 that is built according to the invention. Two bits are provided at a time as an input symbol (having input bits $i_1 i_0$) to the rate 2/5 prototype encoder 2000. These two bits may be provided to the rate 2/5 prototype encoder 2000 serially, or alternatively, in a parallel manner. The input of the rate 2/5 prototype encoder 2000 includes both of these input bits. One of the bits of the input symbol is provided as output of the encoder, $i_0$, but because both input bits $i_1 i_0$ are not available in the form in which they are provided, the encoder may be viewed as a non-systematic encoder. In certain situations as will be seen below, an uncoded bit may also be employed during the encoding.

The two binary consecutive inputs that are provided to the encoder may be viewed as ($i_0, i_1$). These two binary consecutive inputs are provided to the rate 1/2 encoder of the FIG. 19 above. Two consecutive cycles are employed, by providing inputs $i_0$ (first) and then $i_1$ (second), to generate the following outputs of the rate 1/2 encoder (($c_{0,1}$, $c_{1,0}$) and ($c_{1,1}$, $c_{1,0}$)). Three of these values are selected and are set to be the coded bits ($c_{1,1}=c_2$, $c_{1,0}=c_1$, $c_{0,1}=c_0$). The coded output bit $c_3$ is taken as the sum of the two binary consecutive inputs, namely $i_0$ and $i_1$. The final output coded bit $c_4$ is taken as the second of the two binary consecutive inputs, namely, $i_0$. This particular encoder is used to perform illustration of one example of the invention's operation within many of the embodiments described below.

The encoding/decoding of bits put into the rate 2/5 prototype encoder 2000 may be described mathematically as follows. We begin by establishing the following notation.

1. $S^n(m, i_0, i_1)$: the next state after inputting the symbol, $i_0$, $i_1$, to the rate 2/5 prototype encoder 2000 with the current state m.

2. $S^p(m, i_0, i_1)$: the previous state after inputting the symbol, $i_0$, $i_1$, to the rate 2/5 prototype encoder 2000 with the current state m.

3. $c^n(m, i_0, i_1)$: the output of a selected trellis used to perform the encoding/decoding by inputting the symbol, $i_0, i_1$, to the rate 2/5 prototype encoder 2000 with the current state m.

4. $c^p(m, i_0, i_1)$: the output of a selected trellis used to perform the encoding/decoding by inputting the symbol, $i_0, i_1$, to the rate 2/5 prototype encoder 2000 with the previous state m.

5. app denotes using "a priori" probability. For example, $app_{0,50}(1)$ is the app of $i_0=1$ for the $50^{th}$ symbol in a frame of data.

6. met denotes using metric of the index provided within the parentheses.

It is noted that any selected trellis may be employed to do this encoding. One particular embodiment of a trellis is described in detail below in the FIG. 23, yet other trellises could similarly be used without departing from the scope and spirit of the invention.

Within many of the following notations, the use of Greek letter and English equivalent is understood as being the same element. For example, alpha=$\alpha$; alpha_0=$\alpha_0$; beta=$\beta$; beta_0=$\beta_0$; and so on.

The decoding process employs forward metrics (alphas) and backward metrics (betas), and extrinsic values according to the trellis employed. Each of these alphas, beta, and extrinsics are calculated as shown in the generic manner described below.

$$\alpha_k(s) = \min^*_{(i_0, i_1)=0,\ldots,3}[\alpha_{k-1}(S^p(s,i_0,i_1)) + app_{0,k-1}(i_0) + app_{1,k-1}(i_1) + met_{t,k-1}(c^p(s,i_0,i_1))]$$

$$\beta_k(s) = \min^*_{(i_0, i_1)=0,\ldots,3}[\beta_{k+1}(S^n(s,i_0,i_1)) + app_{0,k+1}(i_0) + app_{1,k+1}(i_1) + met_{t,k+1}(c^n(s,i_0,i_1))]$$

It is noted that the variable "s" identifies the trellis state that varies from 0=000, 1=001, . . . , to 7=111.

We then calculate the following intermediate variables, $E_m(s,i)$ and $E_f(s,i)$, before calculating the extrinsic values (ext) that will be used to perform the final decoding.

$$E_0(s,i) = \min^*_{j=0,1}(met_{t,k}(c^n(s,i,j)) + \beta_k(S^n(s,i,j)) + app_{1,k}(j))$$

$$ext_{0,k}(i) = \min^*_{s=0,\ldots,7}\{\alpha_k(s) + E_0(s,i)\}$$

We also calculate the following ext.

$$E_1(s,i)=\min^*_{j=0,1}(\text{met}_{t,k}(c^n(s,j,i))+\beta_k(S^n(s,j,i))+\text{app}_{0,k}(j))$$

$$\text{ext}_{1,k}(i)=\min^*_{s=0,\ldots,7}\{\alpha_k(s)+E_1(s,i)\}$$

It is noted that the value of i (i=0 or i=1) is the possible value for the denoted decoded bit. After performing these above calculations, we then use the following comparisons to make estimates of the input bits ($i_{k,m}$, $i_{k,l}$).

$\hat{i}_{0,k}=0$, if we find that $\text{ext}_{0,k}(1)+\text{app}_{0,k}(1)>\text{ext}_{0,k}(0)+\text{app}_{0,k}(0)$ $\hat{i}_{0,k}=1$, if we find that $\text{ext}_{0,k}(1)+\text{app}_{0,k}(1)<\text{ext}_{0,k}(0)+\text{app}_{0,k}(0)$ $\hat{i}_{1,k}=0$, if we find that $\text{ext}_{1,k}(1)+\text{app}_{1,k}(1)>\text{ext}_{1,k}(0)+\text{app}_{1,k}(0)$ $\hat{i}_{1,k}=1$, if we find that $\text{ext}_{1,k}(1)+\text{app}_{1,k}(1)<\text{ext}_{1,k}(0)+\text{app}_{1,k}(0)$ These equations show the generic applicability of how to perform decoding of encoded bits according to one embodiment of the invention. Specific examples are also shown below of how the encoding/decoding may be performed according to the invention while supporting variable code rate functionality in accordance with the invention. It is also noted, however, that other encoders may also be employed (besides the rate 2/5 prototype encoder 2000) without departing from the scope and spirit of the invention.

Figure 21:
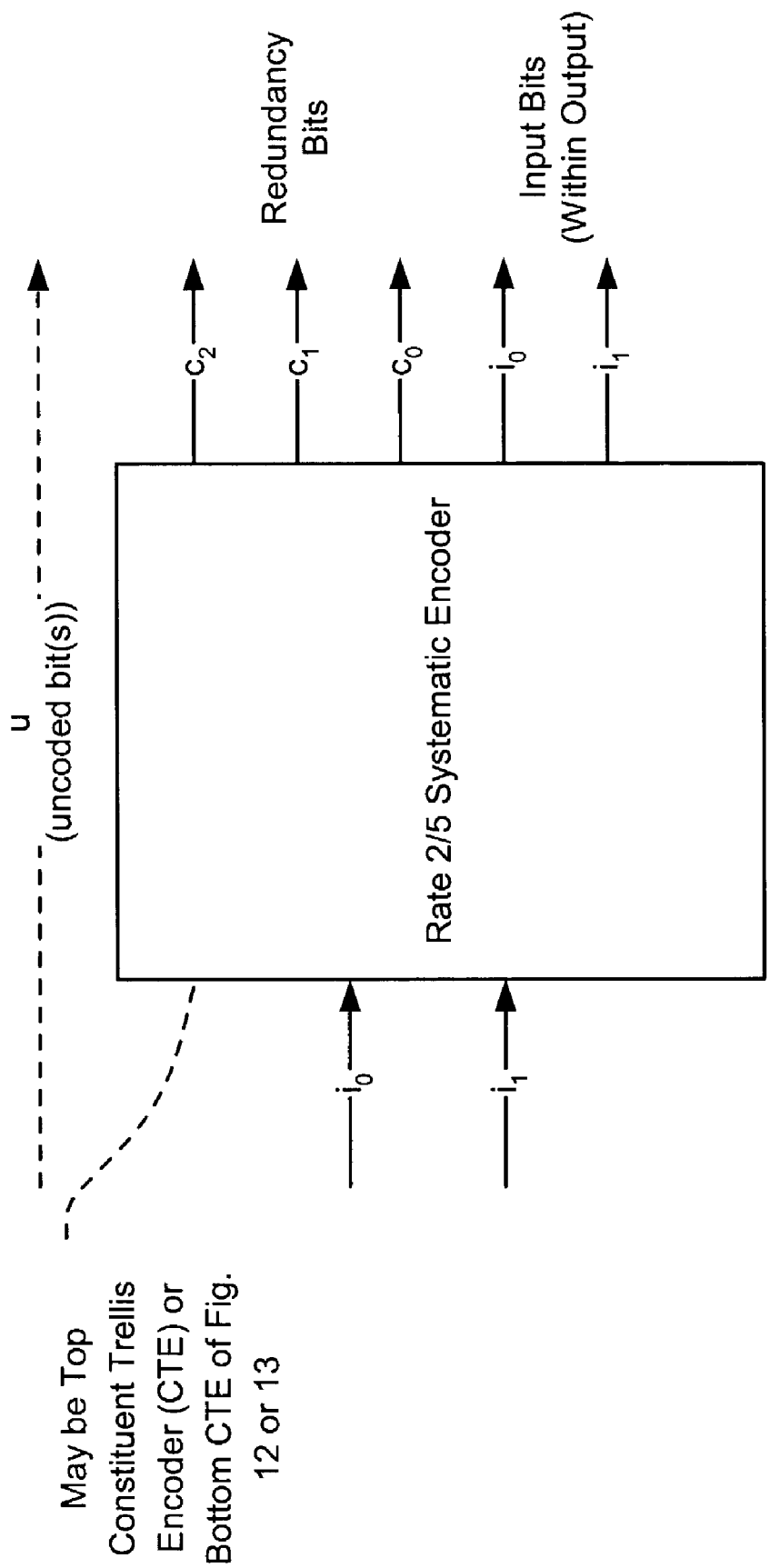
FIG. 21 is a block diagram of a rate 2/5 systematic prototype encoder that is built according to the invention.

FIG. 21 is a block diagram of a rate 2/5 systematic prototype encoder 2100 that is built according to the invention. In general terms, the rate 2/5 systematic prototype encoder 2100 encodes "2" input bits (shown as $i_0$ and $i_1$) and generates "3" redundancy output bits (shown as $c_2$, $c_1$, $c_0$) as well as explicitly providing the input bits ($i_0$ and $i_1$). In addition, one or more uncoded bits u may be provided as output of the encoder without having undergone any encoding at all. The rate 2/5 systematic prototype encoder 2100 may be viewed as being just one of many possible embodiments of the rate a/b systematic prototype encoder 1400 of the FIG. 14. It is also noted that the total rate of the rate 2/5 systematic prototype encoder 2100 may be modified when employing an uncoded bit; a rate of 3/6 may be achieved when employing both input bits ($i_0$ and $i_1$) and the uncoded bit as input and when performing no puncturing of any bits at all.

Figure 22:
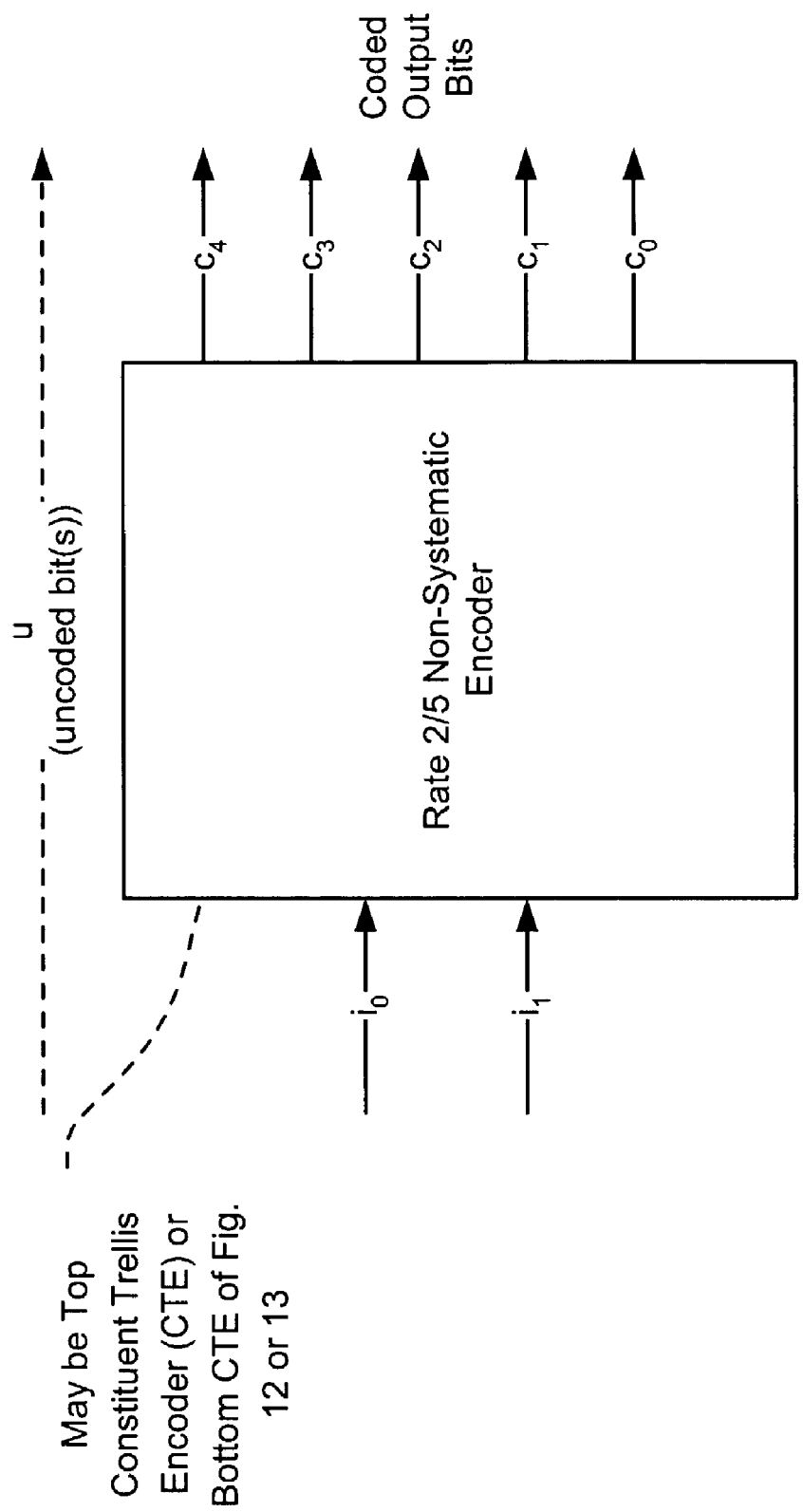
FIG. 22 is a block diagram of the rate 2/5 non-systematic prototype encoder of the FIG. 20.

FIG. 22 is a block diagram of the rate 2/5 non-systematic prototype encoder 2000 of the FIG. 20 that is built according to the invention. In general terms, the rate 2/5 non-systematic prototype encoder 2000 encodes "2" input bits (shown as $i_0$ and $i_1$) and generates "5" coded output bits (shown as $c_4$, $c_3$, $c_2$, $c_1$, $c_0$). In addition, one or more uncoded bits u may be provided as output of the encoder without having undergone any encoding at all. This illustration may be viewed as being a prototype encoder from which many various types of encoding may be performed. The rate 2/5 non-systematic prototype encoder 2000 may be viewed as being just one of many possible embodiments of the rate a/b non-systematic prototype encoder 1500 of the FIG. 15. It is also noted that the total rate of the rate 2/5 non-systematic prototype encoder 2200 may be modified when employing an uncoded bit; a rate of 3/6 may be achieved when employing the "2" input bits (shown as $i_0$ and $i_1$) and the uncoded bit and when performing no puncturing of any bits at all.

Figure 23:
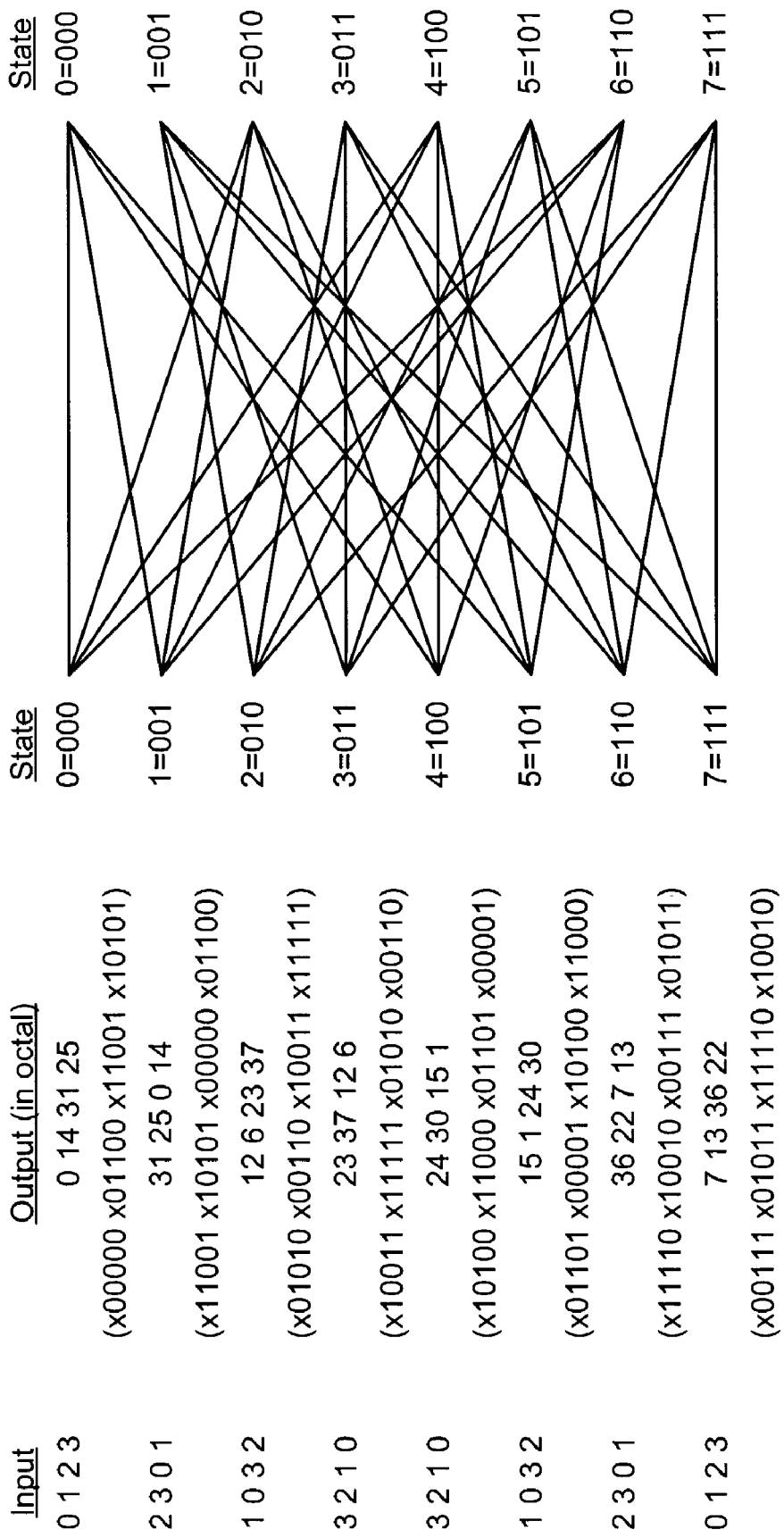
FIG. 23 is a trellis diagram of a trellis employed by the rate 2/5 non-systematic prototype encoder of the FIG. 20.

FIG. 23 is a trellis diagram of a trellis 2300 employed by the rate 2/5 non-systematic prototype encoder 2000 of the FIG. 20 that is built according to the invention. It is noted that the trellis 2300 is selected offline and employed for all of the encoding/decoding in this particular embodiment. The trellis 2300 is an 8 state (3 register) trellis whose input/output trellis transfer function is shown within the FIG. 23. Each of the inputs is shown in symbol form of the 4 possible inputs: 0 is for $i_0i_1$=00, 1 is for $i_0i_1$=01, 2 is for $i_0i_1$=10, and 3 is for $i_0i_1$=11. The outputs are shown in octal; however, only the first 5 bits are employed in this embodiment. Again, the rate 2/5 non-systematic prototype encoder 2000 of the FIG. 20 employs the trellis 2300, so only five coded output bits are available. It is noted that all of the metrics according to the trellis 2300 may be represented by 16 unique metrics. Although there are 5 available bits as the output of the rate 2/5 non-systematic prototype encoder 2000, when considering the number of options as being $2^5$=32, it is seen that this particular trellis design may be represented with 16 distinct metrics. Moreover, an efficient hardware implementation allows these 16 distinct metrics to be represented with 8 distinct metric values.

The 6$^{th}$ bit is simply not existent in the rate 2/5 encoder described here; the outputs may be viewed, in octal form, as being $xc_4c_3c_2c_1c_0$, where x represents the unused bit. It is noted, however, that some other embodiments (say, in a rate 2/6 encoder) may employ all 6 output bits when performing a rate 2/6 encoder.

For example, following the operation and function of the trellis, starting from the state of 0=000, the following transitions may be achieved:

When the encoder is in the state 0=000, and when the input $i_0i_1$=00=0, then the state of the encoder will transition to state 0=000, and the output will be $xc_4c_3c_2c_1c_0$=x00000=0. When the encoder is in the state 0=000, and when the input $i_0i_1$=01=1, then the state of the encoder will transition to state 2=010, and the output will be $xc_4c_3c_2c_1c_0$=x01100=14. When the encoder is in the state 0=000, and when the input $i_0i_1$=10=2, then the state of the encoder will transition to state 4=100, and the output will be $xc_4c_3c_2c_1c_0$=x011001=31. When the encoder is in the state 0=000, and when the input $i_0i_1$=11=3, then the state of the encoder will transition to state 6=110, and the output will be $xc_4c_3c_2c_1c_0$=x10101=25.

The transitions from other initial states may similarly be followed according to the trellis 2300. It is here noted that the trellis 2300 represents one such trellis that may be employed to perform TTCM encoding. Other trellises may similarly be employed without departing from the scope and spirit of the invention. The encoding employs this trellis when performing each of the various rate control sequences provided by the rate control sequencer 1150 to the rate 2/5 non-systematic prototype encoder 2000. As will be seen below as well, this same trellis 2300 is also employed to performing decoding of data for each of the various rate control sequences provided by the rate control sequencer 1150.

Figure 24:
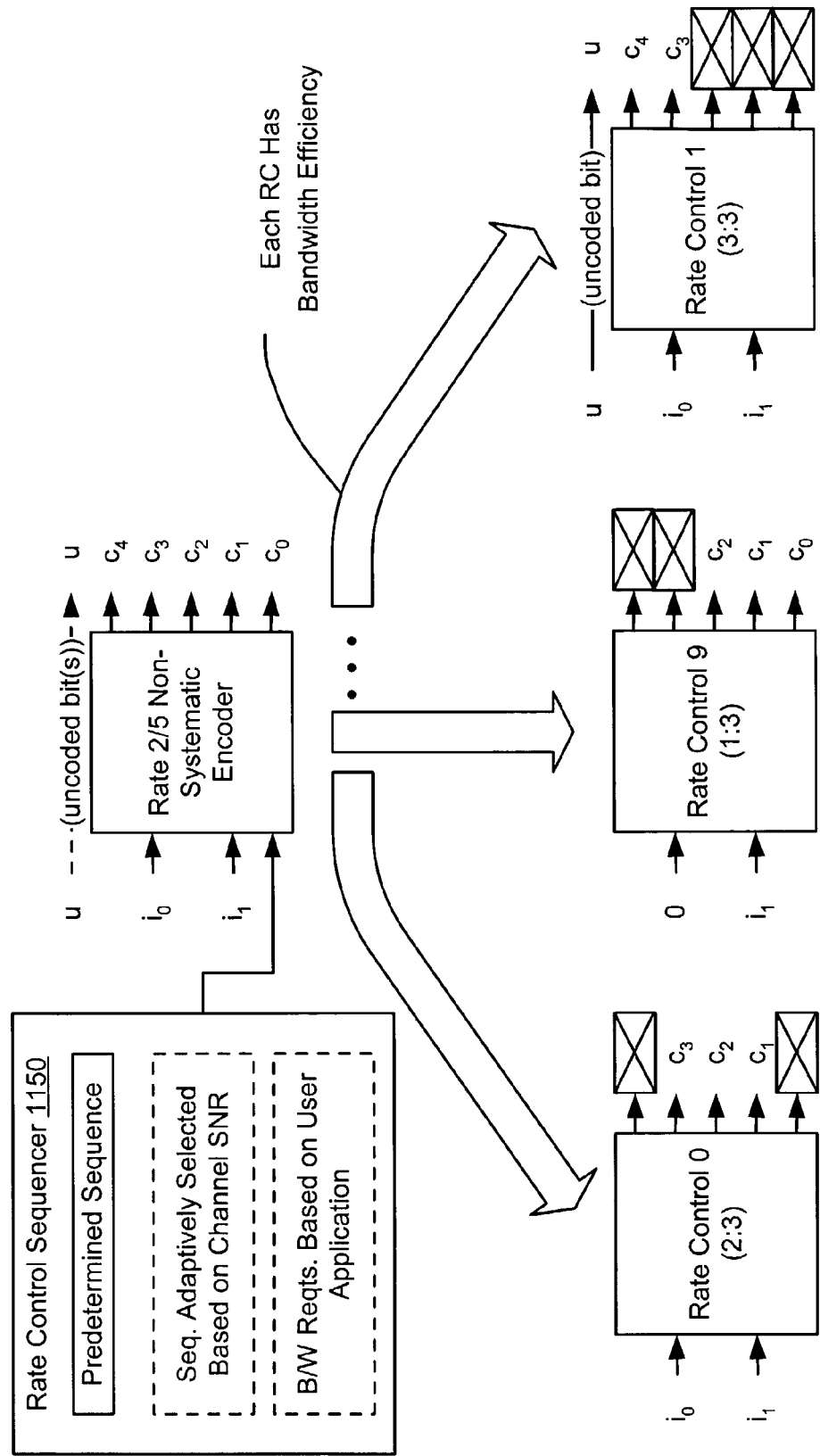
FIG. 24 is a diagram illustrating the functional operation the non-systematic rate 2/5 encoder of the FIG. 20 using puncturing and rate control sequencer to support multiple encoders performing various rate controls according to the invention.

FIG. 24 is a diagram illustrating the functional operation of the non-systematic rate 2/5 encoder 2000 using puncturing and rate control sequencer 1150 to support multiple encoders performing various rate controls according to the invention. Here, the non-systematic rate 2/5 encoder 2000 is implemented to perform the functionality of multiple encoders. Puncturing is performed on the output bits of the encoder to generate the various options of encoded symbols that include encoded bits and/or uncoded bits. The variable code rate functionality of the invention, shown in the context of the non-systematic rate 2/5 encoder 2000 cycles through a number of rate controls (that constitute a rate control sequence—shown as a RC 0, a RC 9, and RC 1) in the FIG. 24. Each of these RCs has a particular bandwidth efficiency.

Cooperatively, the bandwidth efficiencies of the individual RCs (RC 0, a RC 9, and RC 1) define the rate control sequence provide an average bandwidth efficiency across this entire rate control sequence.

The rate control sequencer 1150 may cycle through a predetermined rate control sequence; it may adaptively select one or more new rate control sequences based on operating conditions such as a communication channel's SNR, bandwidth requirements based on various user applications, or according to some other consideration as well.

The rate control sequence as illustrated within the example embodiment shown in the FIG. 24 may be described as follows:

Within the non-systematic rate 2/5 encoder 2000 as implemented according to RC 0, a rate 2/3 encoder is achieved. Two information bits ($i_0$ and $i_1$) are input to the non-systematic rate 2/5 encoder 2000. The output of encoding punctures all of the coded bits except for $c_3c_2c_1$; these remaining bits are then used to generate a 3 bit symbol that will be mapped according to a 3 bit symbol modulation (constellation and mapping) as defined by RC 0.

Within the encoder as implemented according to RC 9, a rate 1/3 encoder is achieved. One information bits ($i_1$) is input to the encoder. The output of the encoder punctures all of the coded bits except for $c_2c_1c_0$; these remaining bits are then used to generate a 3 bit symbol that will be mapped according to a 3 bit symbol modulation (constellation and mapping) as defined by RC 9.

Within the encoder as implemented according to RC 1, a rate 3/3 encoder is achieved. Two information bits ($i_0$ and $i_1$) and one uncoded bit u are input to the encoder. The output of the encoder punctures all of the coded bits except for $c_4c_3$ and the uncoded bit u; these remaining bits and the uncoded bit ($uc_4c_3$) are then used to generate a 3 bit symbol that will be mapped according to a 3 bit symbol modulation (constellation and mapping) as defined by RC A1.

The non-systematic rate 2/5 encoder 2000 may then cycle through the rate control sequence defined by the (RC 0, a RC 9, and RC 1) a predetermined number of times within a data frame. Alternatively, the non-systematic rate 2/5 encoder 2000 may adaptively select a new rate control sequence based on operating conditions of the communication system in which the non-systematic rate 2/5 encoder 2000 is implemented. Each of the individual RCs may be viewed as being functionality supported by distinct encoders, yet a single device is operable to support all of these encoders according to the variable code rate functionality described herein. The above-referenced comments are also applicable to the cases presented below in the FIGS. 25 and 26.

Figure 25:
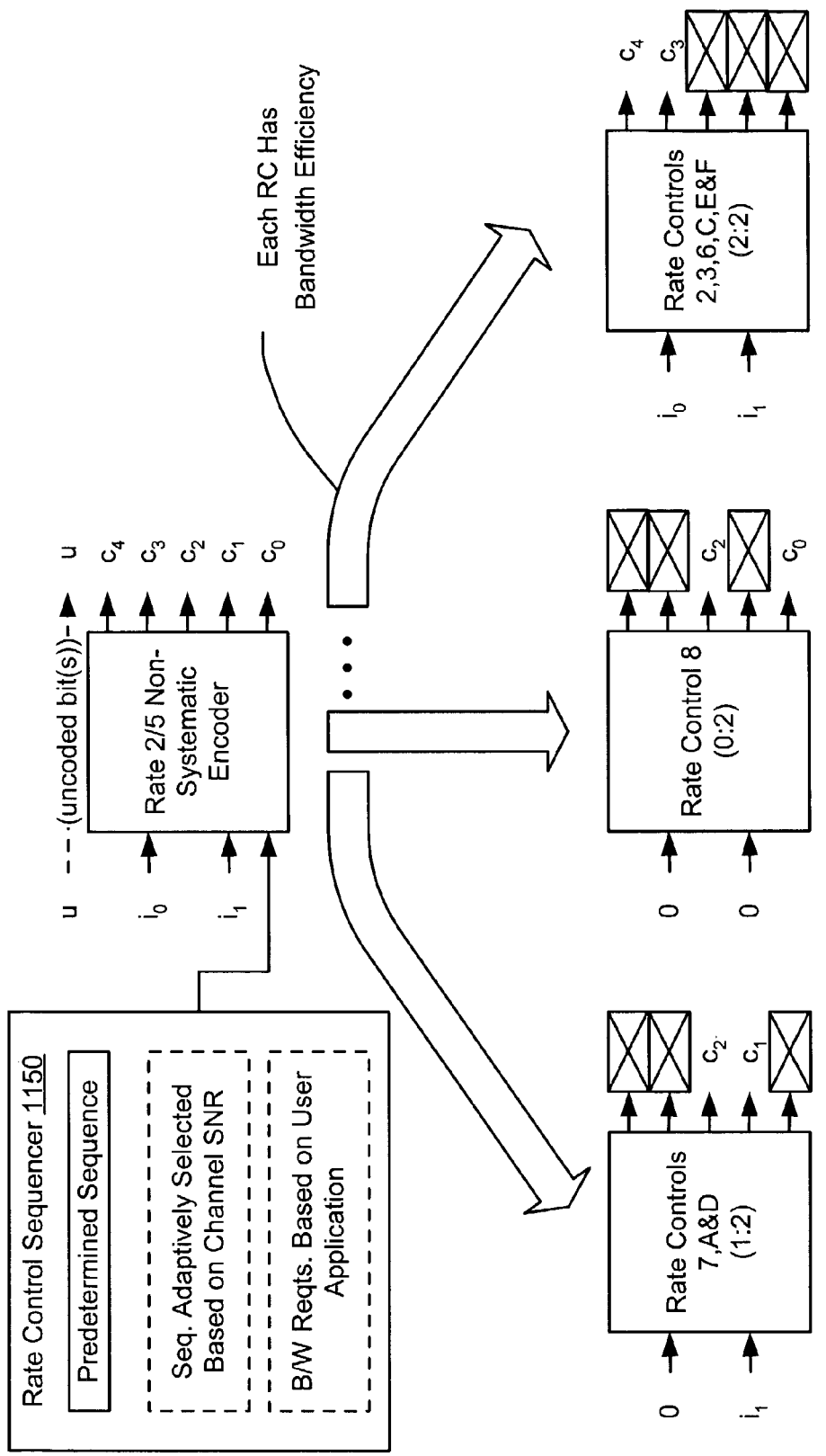
FIG. 25 shows additional rate controls supported by the non-systematic rate 2/5 encoder of the FIG. 20.

FIG. 25 shows additional rate controls supported by the non-systematic rate 2/5 encoder 2000 of the FIG. 20. Within the non-systematic rate 2/5 encoder 2000 as implemented according to RCs 7,A&D, a rate 1/2 encoder is achieved. One information bit ($i_1$) is input to the non-systematic rate 2/5 encoder 2000. The output of encoding punctures all of the coded bits except for $c_2c_1$; these remaining bits are then used to generate a 2 bit symbol that will be mapped according to the appropriate 2 bit symbol modulation (constellation and mapping) as defined by one of the RCs 7,A&D.

Within the encoder as implemented according to RC 8, a rate 0/2 encoder is achieved. No information bits are input to the encoder. The output of the encoder punctures all of the coded bits except for $c_2c_0$; these remaining bits are then used to generate a 2 bit symbol that will be mapped according to a 2 bit symbol modulation (constellation and mapping) as defined by RC 8.

Within the encoder as implemented according to RCs 2,3,6,C,E&F, a rate 2/2 encoder is achieved. Two information bits ($i_0$ and $i_1$) are input to the encoder. The output of the encoder punctures all of the coded bits except for $c_4c_3$; these remaining bits ($c_4c_3$) are then used to generate a 2 bit symbol that will be mapped according to the appropriate 2 bit symbol modulation (constellation and mapping) as defined by one of the RCs 2,3,6,C,E&F.

Figure 26:
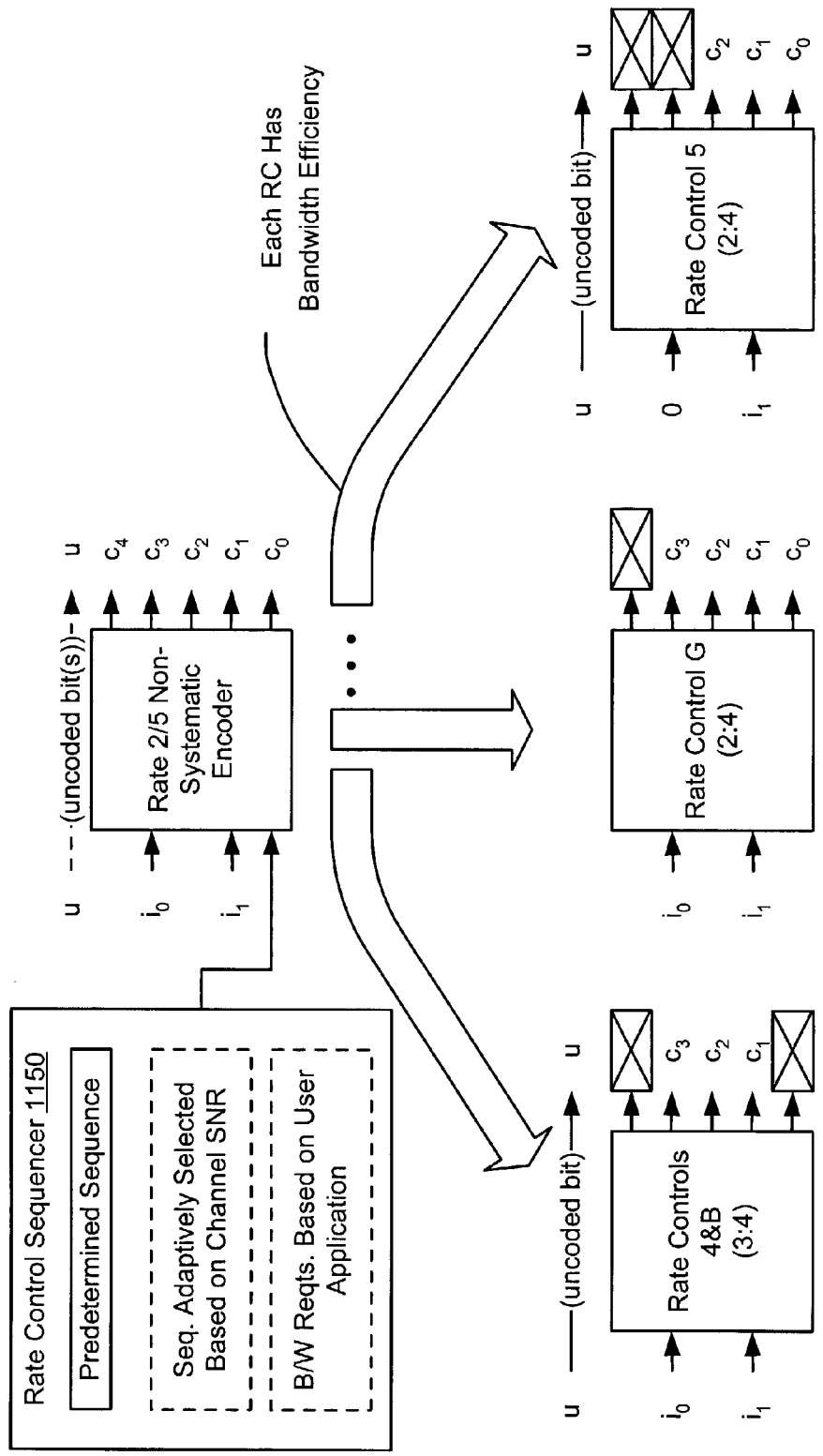
FIG. 26 shows yet additional rate controls supported by the non-systematic rate 2/5 encoder of the FIG. 20.

FIG. 26 shows yet additional rate controls supported by the non-systematic rate 2/5 encoder 2000 of the FIG. 20. Within the non-systematic rate 2/5 encoder 2000 as implemented according to RCs 4&B, a rate 3/4 encoder is achieved. Two information bits ($i_0$ and $i_1$) and one uncoded bit u are input to the non-systematic rate 2/5 encoder 2000. The output of encoding punctures all of the coded bits except for $c_3c_2c_1$ and the uncoded bit u, leaving $uc_3c_2c_1$; these remaining bits are then used to generate a 4 bit symbol that will be mapped according to the appropriate 4 bit symbol modulation (constellation and mapping) as defined one of the RCs 4&B.

Within the non-systematic rate 2/5 encoder 2000 as implemented according to RC G, a rate 2/4 encoder is achieved. Two information bits ($i_0$ and $i_1$) are input to the non-systematic rate 2/5 encoder 2000. The output of encoding punctures all of the coded bits except for $c_3c_2c_1c_0$; these remaining bits are then used to generate a 4 bit symbol that will be mapped according to a 4 bit symbol modulation (constellation and mapping) as defined by RC G.

Within the non-systematic rate 2/5 encoder 2000 as implemented according to RC 5, a rate 2/4 encoder is achieved. One information bit ($i_1$) and one uncoded bit u are input to the non-systematic rate 2/5 encoder 2000. The output of encoding punctures all of the coded bits except for $c_2c_1c_0$ and the uncoded bit u, leaving $uc_2c_1c_0$; these remaining bits are then used to generate a 4 bit symbol that will be mapped according to a 4 bit symbol modulation (constellation and mapping) as defined by RC 5.

Figure 27:
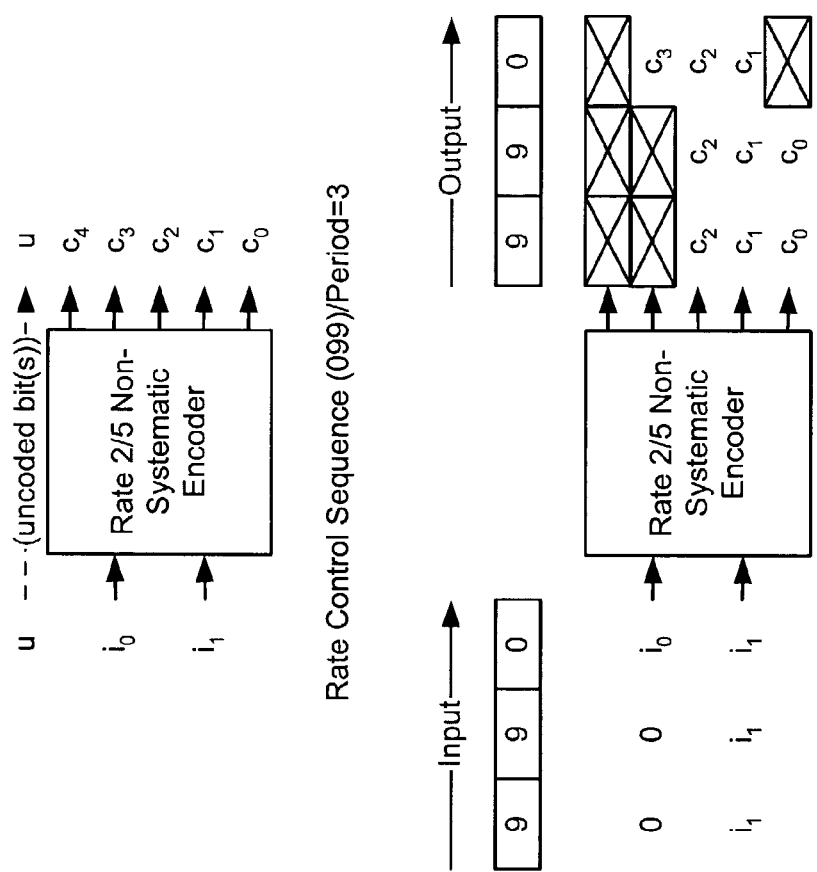
FIGS. 27, 28, 29, and 30 are diagrams illustrating embodiments of periodic sequencing of the non-systematic rate 2/5 encoder of the FIG. 20 using puncturing and rate control sequencer according to the invention.

FIG. 27 is a diagram illustrating an embodiment of periodic sequencing of a non-systematic rate 2/5 encoder 2000 using puncturing and rate control sequencer 1150 according to the invention. The rate control sequence in this embodiment includes the RCs (RC 0, RC 9, and RC 9) having a period of 3 RCs.

The available input of this non-systematic rate 2/5 encoder 2000 is ($i_0i_1$) as well as the uncoded bit, and the available output is ($c_4c_3c_2c_1c_0$) as well as the uncoded bit u, leaving the possible output to be $uc_4c_3c_2c_1c_0$. Puncturing is performed to select a predetermined sub-set of all of the available input and output bits of this non-systematic rate 2/5 encoder 2000. The input cycles through the period of 3 RCs described above. The inputs bits cycle through the following sequence according to this particular period:

RC 0: $i_0i_1$,
RC 9: $0i_1$;
RC 9: $0i_1$;

The output bits of this period of RCs is as follows:

RC 0: $c_3c_2c_1$;
RC 9: $c_2c_1c_0$;
RC 9: $c_2c_1c_0$.

Clearly, additional rate control sequences that include different RCs may also be employed to perform and support the functionality described herein.

Figure 28:
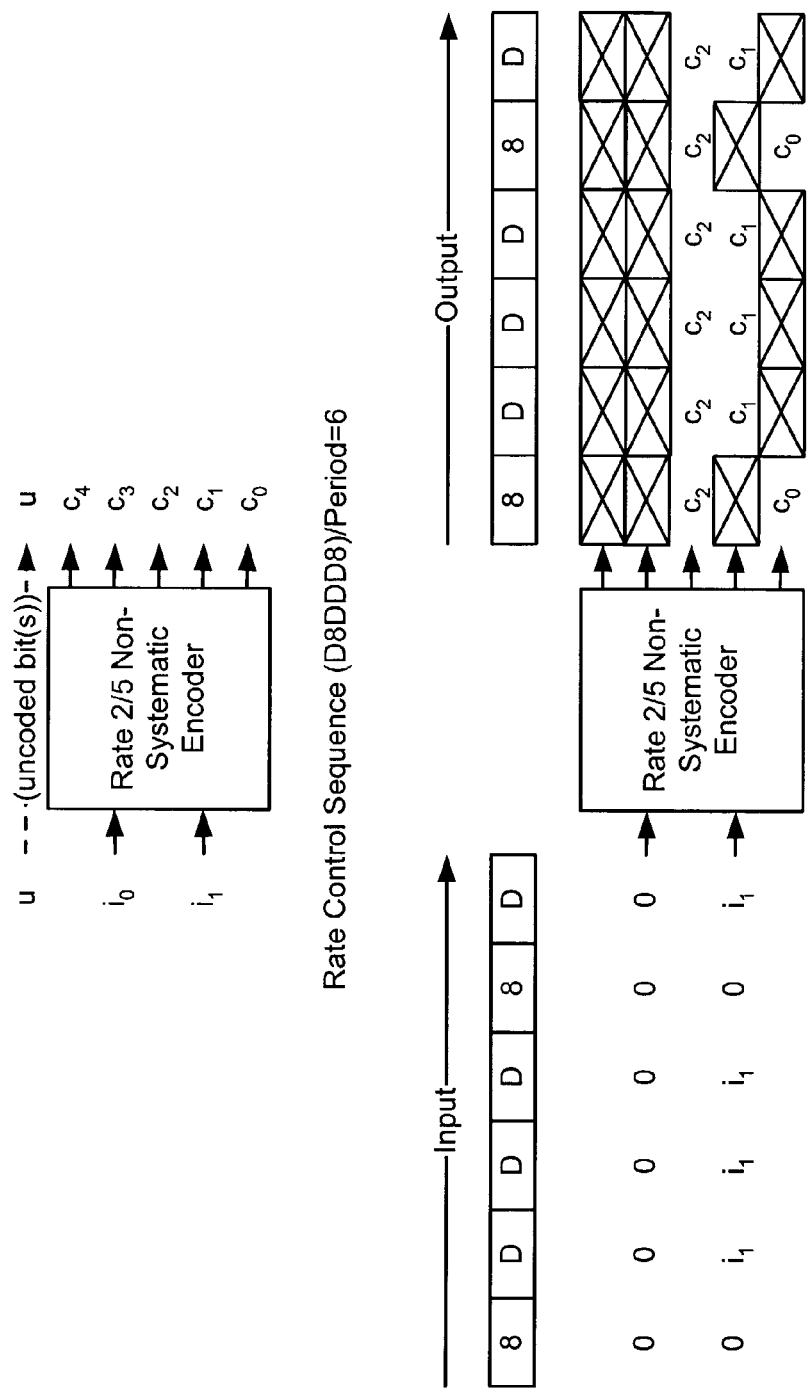

FIG. 28 shows additional periodic sequencing of rate controls supported by the non-systematic rate 2/5 encoder 2000 of the FIG. 20. The rate control sequence in this embodiment includes the RCs (RC D, RC 8, RC D, RC D, RC D, and RC 8) having a period of 6 RCs. Within the FIG.

28, the inputs bits cycle through the following sequence according to this particular period:

RC D: $0i_1$
RC 8: 00
RC D: $0i_1$
RC D: $0i_1$
RC D: $0i_1$
RC 8: 00

The output bits of this period of RCs is as follows:

RC D: $c_2c_1$
RC 8: $c_2c_0$
RC D: $c_2c_1$
RC D: $c_2c_1$
RC D: $c_2c_1$
RC 8: $c_2c_0$

Figure 29:
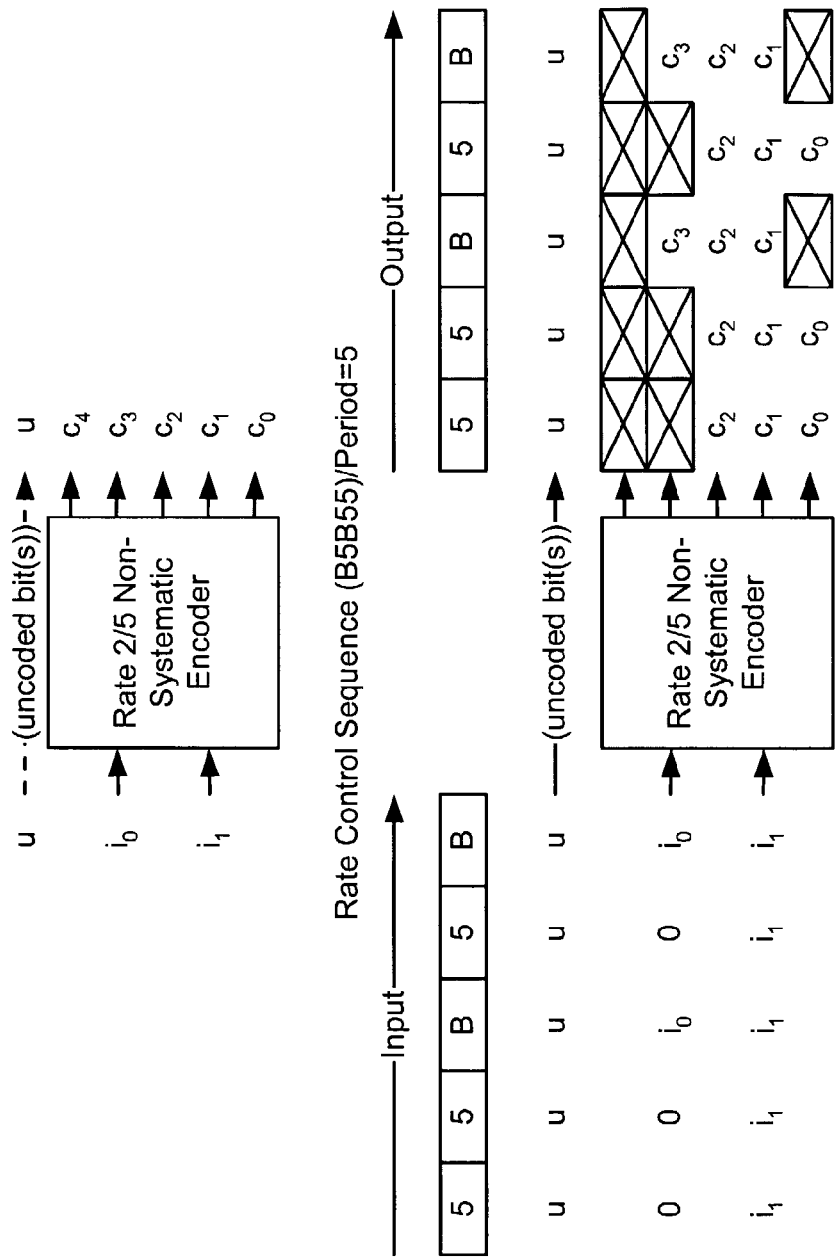

FIG. 29 shows yet additional periodic sequencing of rate controls supported by the non-systematic rate 2/5 encoder 2000 of the FIG. 20. The rate control sequence in this embodiment includes the RCs (RC B, RC 5, RC B, RC 5, and RC 5) having a period of 5 RCs. Within the FIG. 29, the inputs bits cycle through the following sequence according to this particular period:

RC B: $ui_0i_1$
RC 5: $u0i_1$
RC B: $ui_0i_1$
RC 5: $u0i_1$
RC 5: $u0i_1$

The output bits of this period of RCs is as follows:

RC B: $uc_3c_2c_1$
RC 5: $uc_2c_1c_0$
RC B: $uc_3c_2c_1$
RC 5: $uc_2c_1c_0$
RC 5: $uc_2c_1c_0$

Figure 30:
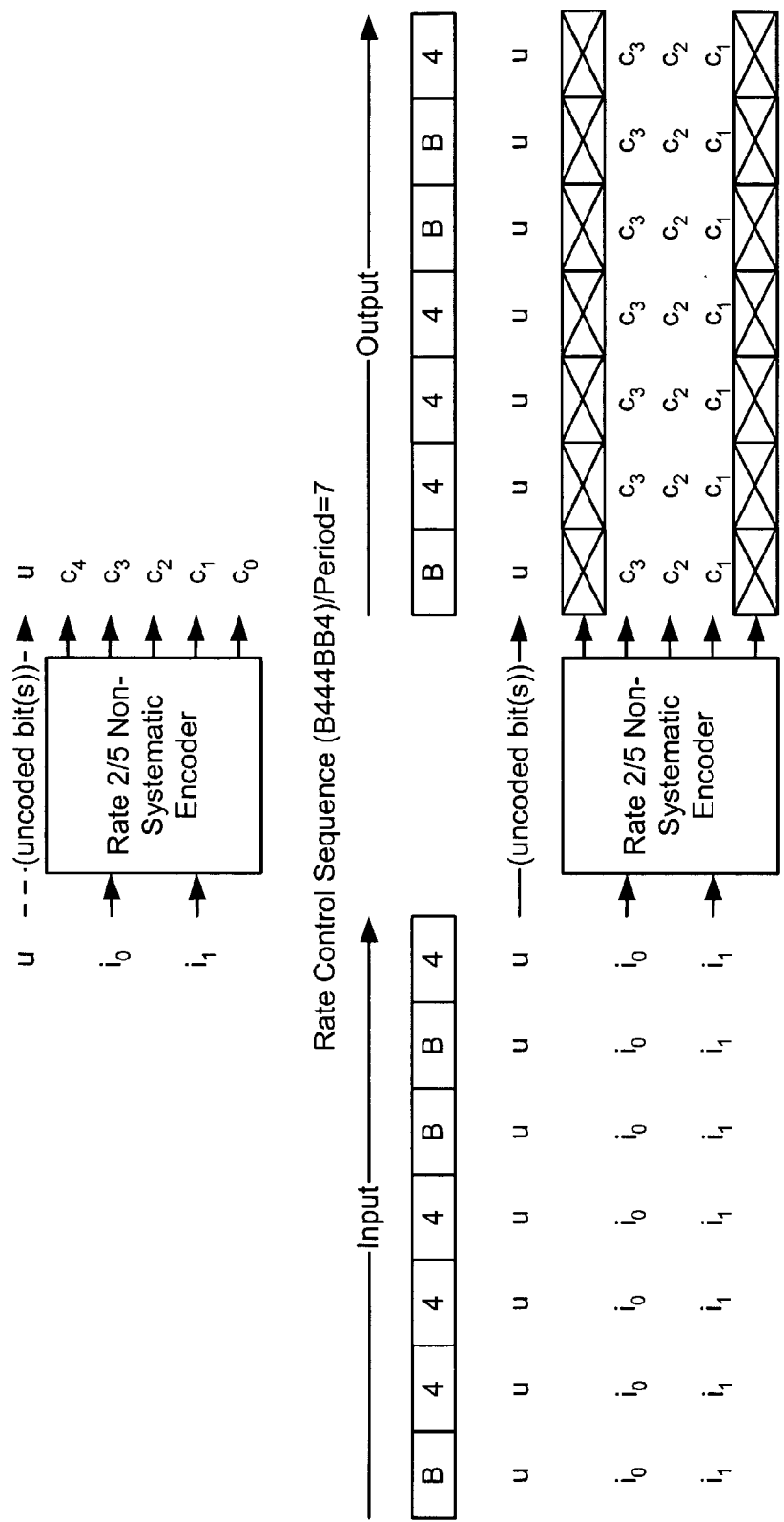

FIG. 30 shows yet additional periodic sequencing of rate controls supported by the non-systematic rate 2/5 encoder 2000 of the FIG. 20. The rate control sequence in this embodiment includes the RCs (RC B, RC 4, RC 4, RC 4, RC B, RC B, and RC 4) having a period of 7 RCs. Within the FIG. 30, the inputs bits cycle through the following sequence according to this particular period:

RC B: $ui_0i_1$
RC 4: $ui_0i_1$
RC 4: $ui_0i_1$
RC 4: $ui_0i_1$
RC B: $ui_0i_1$
RC B: $ui_0i_1$
RC 4: $ui_0i_1$

The output bits of this period of RCs is as follows:

RC B: $uc_3c_2c_1$
RC 4: $uc_3c_2c_1$
RC 4: $uc_3c_2c_1$
RC 4: $uc_3c_2c_1$
RC B: $uc_3c_2c_1$
RC B: $uc_3c_2c_1$
RC 4: $uc_3c_2c_1$

The FIG. 30 shows one of the many possible examples of where different modulations are employed within the same rate control sequence. This particular example shows the mixing of 16 APSK and 16 QAM modulations. Each of the modulations of these two RCs 4 and B employs different constellations altogether. It is understood that other modulations may also be mixed together within a rate control sequence without departing from the scope and spirit of the invention.

The FIGS. 31, 32, 33, 34, 35 and 36 are examples of some of the possible modulations (constellations and mappings) that may be employed in accordance with the invention. It is noted that any number and types of modulations may be used (provided there are sufficient bits available in the encoding). Some examples of modulations include BPSK (Binary Phase Shift Keying), QPSK (Quadrature Phase Shift Keying), QAM (Quadrature Amplitude Modulation), APSK (Amplitude Phase Shift Keying), and variants thereof including 8 PSK, and higher orders of PSK, 16 QAM, and other higher orders of QAM (such as 64 QAM, 256 QAM, 1024 QAM), among other types of modulation.

Figure 31:
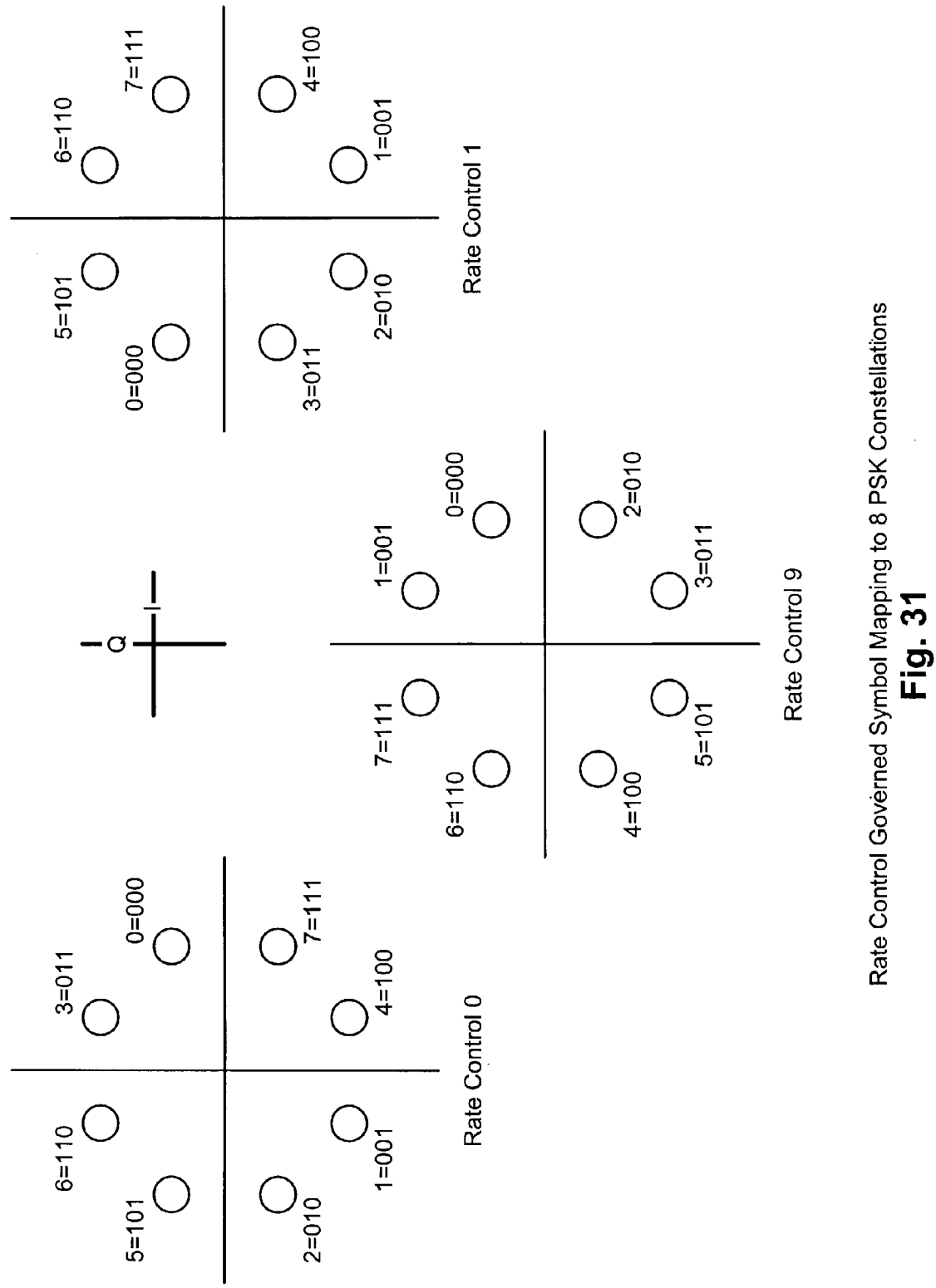
FIG. 31 is a constellation diagram illustrating an embodiment of rate control governed mapping to 8 PSK constellations according to the invention.

FIG. 31 is a constellation diagram illustrating an embodiment of rate control governed mapping to 8 PSK constellations according to the invention. The FIG. 31 shows modulations (constellations and mappings) that may be performed according to the 3 bit symbols generated during encoding and puncturing. Depending on the RCs employed within a rate control sequence, when an 8 PSK modulation is selected, then one of these appropriate mappings may be selected. In one embodiment, these three modulations and their respective mappings are used to perform the final symbol mapping. The non-systematic rate 2/5 encoder 2000 employs these modulations (constellations and their mappings) when employing the RCs (RC 0, RC 9, and RC 1). It is noted that these RCs are exemplary and that other 3 bit symbol modulations and different mappings of those 3 bit symbols modulations may also be employed without departing from the scope and spirit of the invention.

Figure 32:
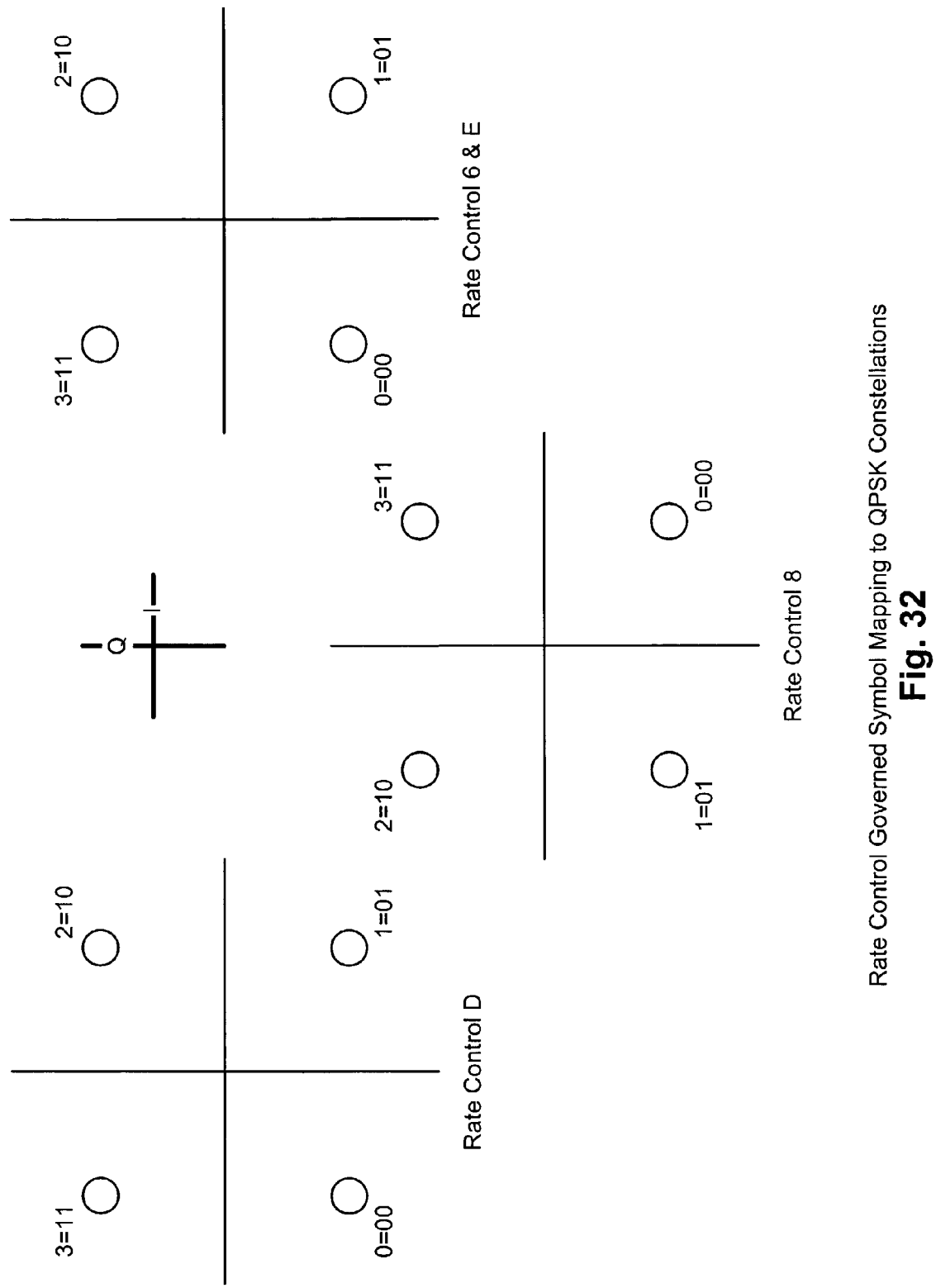
FIGS. 32, 33, and 34 are constellation diagrams illustrating embodiments of rate control governed mapping to QPSK constellations according to the invention.
Figure 33:
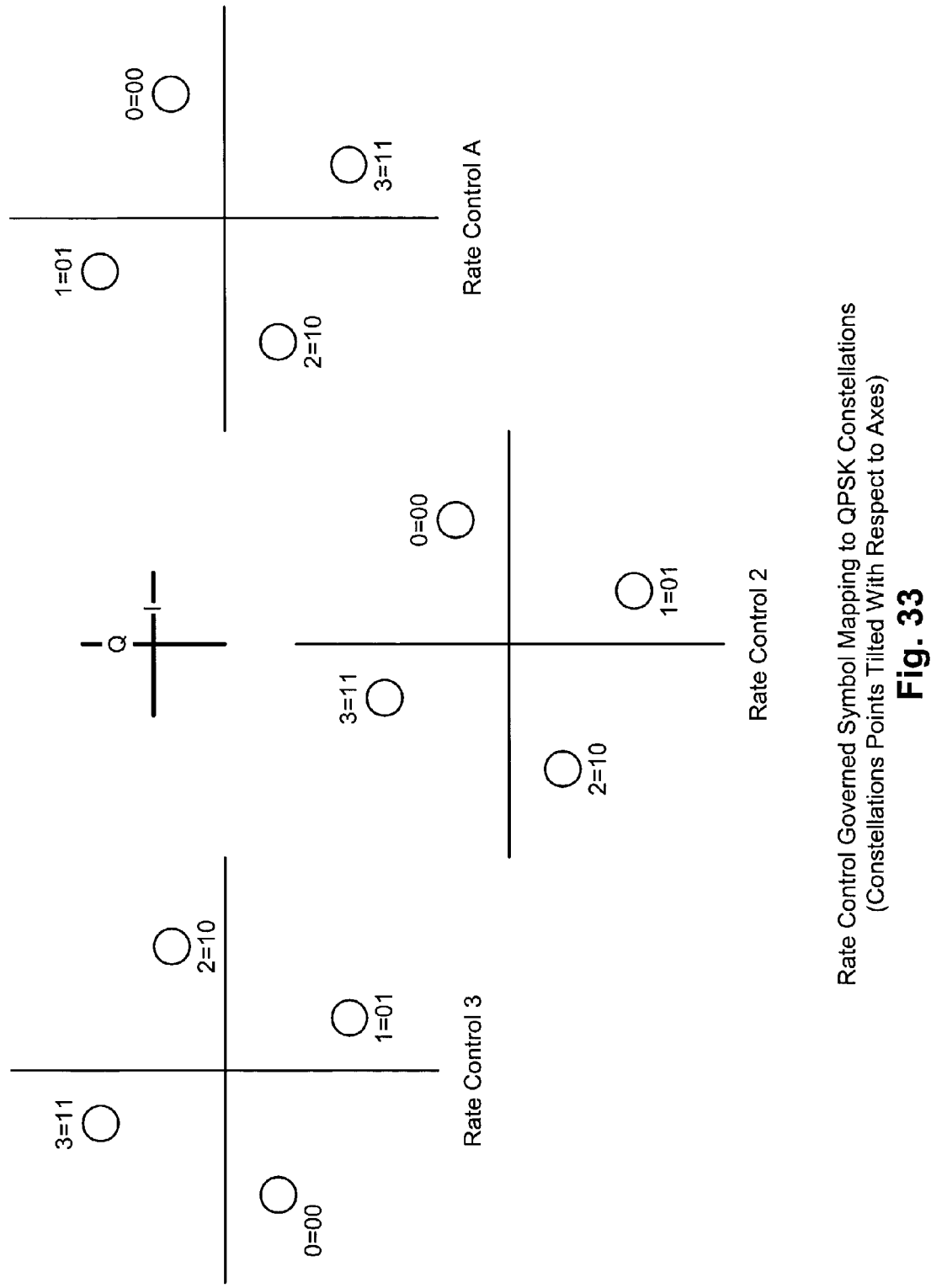
Figure 34:
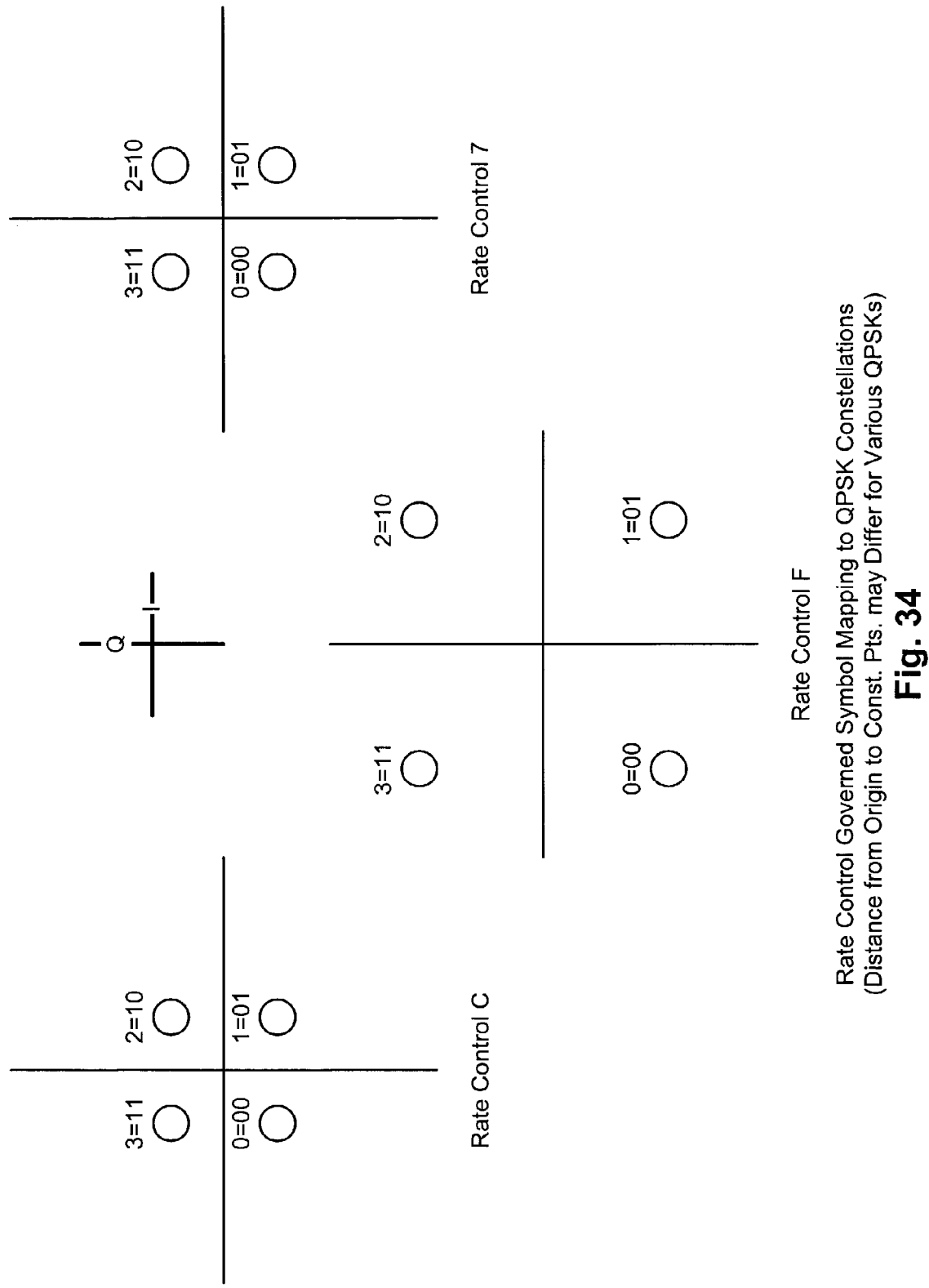

FIGS. 32, 33, and 34 are constellation diagrams illustrating embodiments of rate control governed mapping to QPSK constellations according to the invention. These FIGS. 32, 33, and 34 show modulations (constellations and mappings) that may be performed according to the 2 bit symbols generated during encoding and puncturing. It is noted that a variety of QPSK modulations may be employed. The RCs 3,2,A within the FIG. 33 show modulations whose constellations points are titled with respect to the I,Q axes. The RCs C,F,&7 within the FIG. 34 show modulations whose constellations points have different distances from the origin of the I,Q plane. A variety of modulations may performed according to QPSK, including embodiments where the constellation points align along the I,Q axes themselves and those whose constellation points are not equidistantly spaces with respect to the origin of the I,Q plane. These statements are also true for the other modulations employed as well. The invention envisions any number of modulations without departing from the scope and spirit of the invention.

Figure 35:
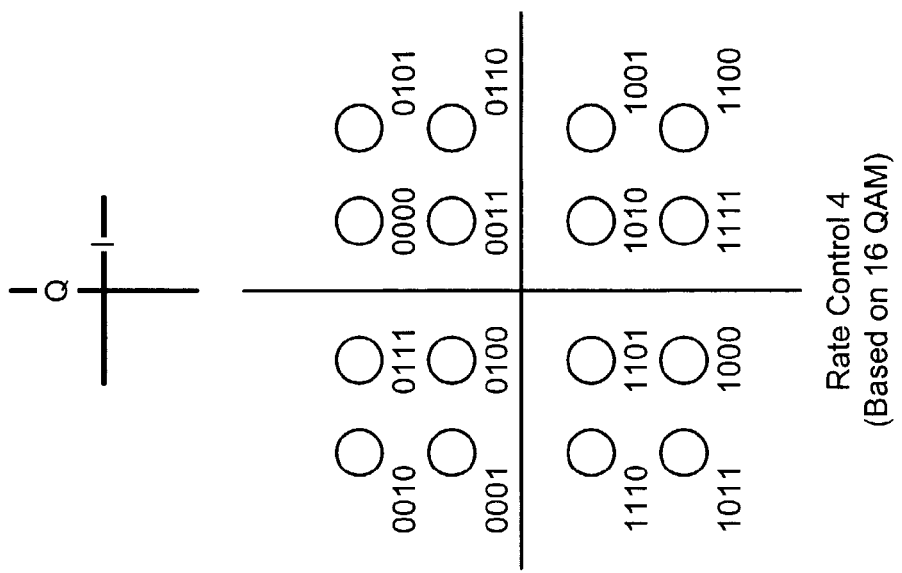
FIG. 35 is a constellation diagram illustrating an embodiment of rate control governed mapping to a 16 QAM constellation according to the invention.

FIG. 35 is a constellation diagram illustrating an embodiment of rate control governed mapping to a 16 QAM constellation according to the invention. The FIG. 35 shows the modulation for RC 4 that corresponds to a 16 QAM constellation having a particular mapping.

Figure 36:
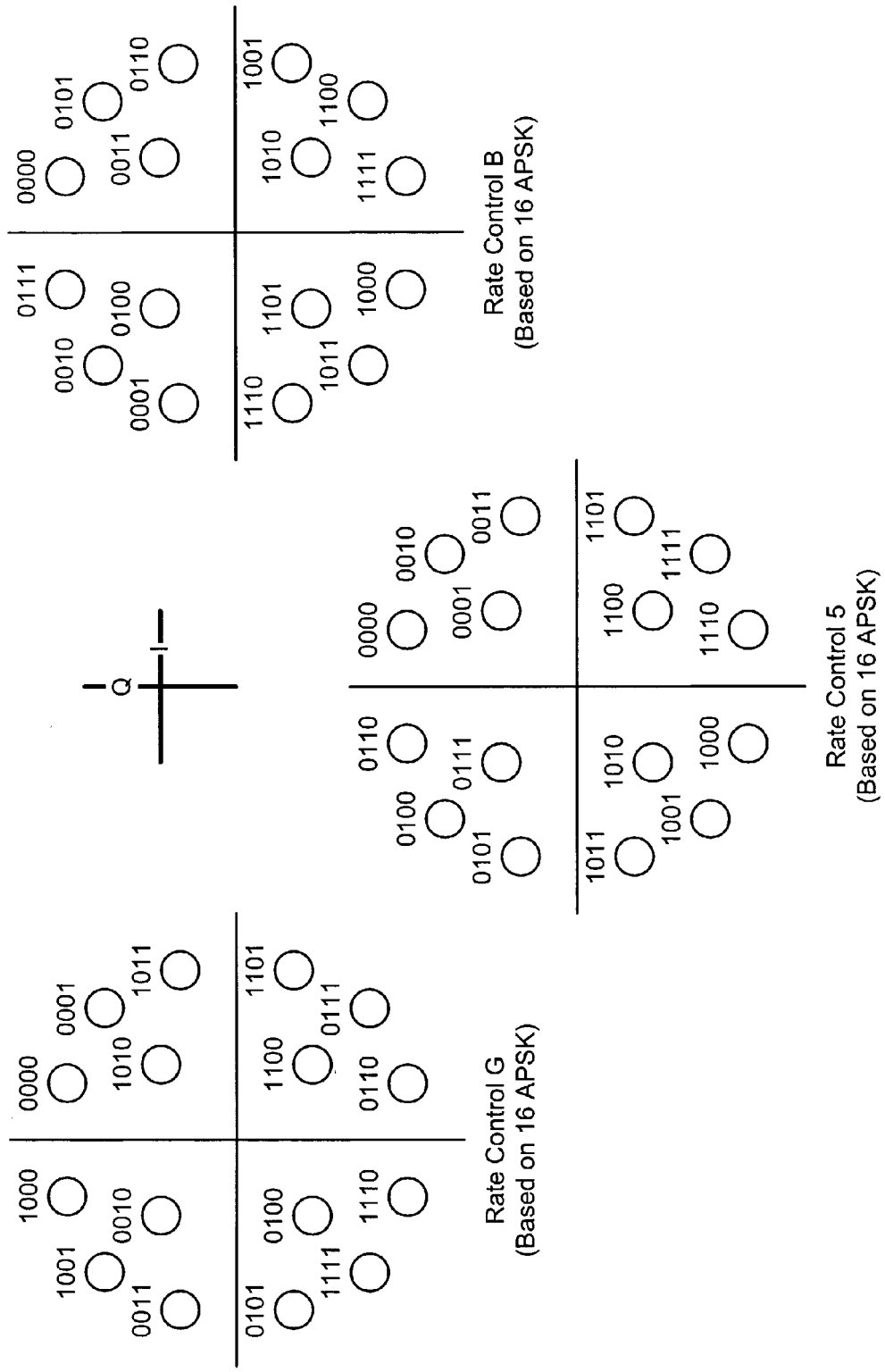
FIG. 36 is a constellation diagram illustrating an embodiment of rate control governed mapping to 16 APSK constellations according to the invention.

FIG. 36 is a constellation diagram illustrating an embodiment of rate control governed mapping to 16 APSK constellations according to the invention. The FIG. 36 shows the modulations for RCs G,5&B that corresponds to a 16 APSK constellation having a particular mapping.

The following table shows some examples of different rate control sequences that may be supported by the non-systematic rate 2/5 encoder 2000 and the rate control sequencer 1150. These are exemplary, and variations thereof may be implemented without departing from the scope and spirit of the invention. For example, other rate control sequence may also be determined to operate within a given bandwidth of a communication channel. In addition, it is also noted that the particular order of the RCs within the following table may also be permutated without departing from the scope and spirit of the invention. However, this permutation of the RCs within a rate control sequence may affect performance in some cases.

This table shows embodiments of how to generate various rate control sequences, according to various bandwidth efficiencies and periods, using the RCs described within the FIGS. 31, 32, 33, 34, 35 and 36.

| Constellation | Bandwidth efficiency (bits/second/Hz) | Rate control sequence | period |
|---|---|---|---|
| 8 PSK | 1.3333 (4/3) | 099 | 3 |
| | 1.5 (3/2) | 09 | 2 |
| | 1.6 (8/5) | 00909 | 5 |
| | 1.6667 (5/3) | 009 | 3 |
| | 1.7143 (12/7) | 0009009 | 7 |
| | 1.75 (7/4) | 0009 | 4 |
| | 2 | 0 | 1 |
| | 2.1 (21/10) | 0000000001 | 10 |
| | 2.2 (11/5) | 00001 | 5 |
| | 2.25 (9/4) | 0001 | 4 |
| | 2.3 (23/10) | 0001001001 | 10 |
| | 2.4 (12/5) | 00101 | 5 |
| | 2.5 (5/2) | 01 | 2 |
| QPSK | 0.6667 (2/3) | D8DDD8 | 6 |
| | 1 | D | 1 |
| | 1.3333 (4/3) | DDE | 3 |
| | 1.5 (3/2) | DDEE | 4 |
| | 1.6 (8/5) | DEE DEE DEE D | 10 |
| | 1.6667 (5/3) | DEEEED | 6 |
| | 1.7143 (12/7) | DDEEEDDEEEEEEEEEDDEEE | 21 |
| | 1.75 (7/4) | DDEEEEEE | 8 |
| | 1.7778 (16/9) | DDEEEEEEE | 9 |
| | 1.8 (9/5) | EEDEE | 5 |
| | 1.8182 (20/11) | EEEEEDEEEED | 11 |
| | 1.8333 (11/6) | EEDEEEEEEDEE | 12 |
| | 1.8462 (24/13) | DEEDEEEEEEEE | 13 |
| | 1.8571 (13/7) | EDDEEEEEEEEEEDEEEEEEE | 21 |
| 16 QAM | 3 | 4 | 1 |
| 16 APSK | 3 | B | 1 |
| | 2.8 (14/5) | BBBB5 | 5 |
| | 2.7 (27/10) | BBB5BB5BB5 | 10 |
| | 2.6 (13/5) | BB5B5 | 5 |
| | 2.5 (5/2) | B5 | 2 |
| | 2.4 (12/5) | B5B55 | 5 |
| | 2.3 (23/10) | B555B55B55 | 10 |
| | 2.25 (9/4) | B555 | 4 |
| | 2.2 (11/5) | B5555 | 5 |
| | 2.1 (21/10) | B555555555 | 10 |
| | 2 | 5 | 1 |

Figure 37:
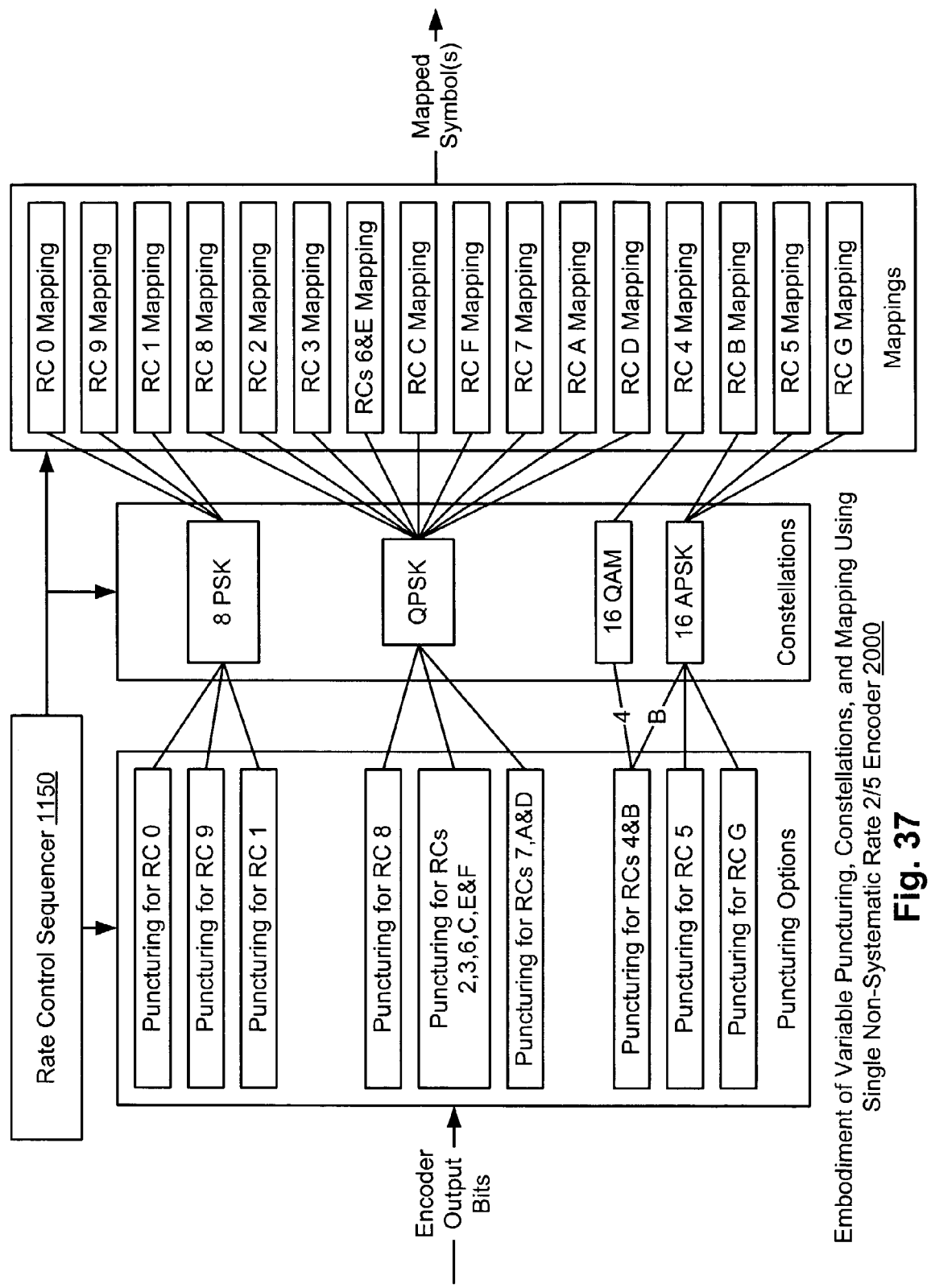
FIG. 37 is a diagram illustrating an embodiment of variable puncturing, modulation, and mapping using the single non-systematic rate 2/5 encoder of the FIG. 20 according to the invention.

FIG. 37 is a diagram illustrating an embodiment of variable puncturing, constellations, and mapping using the single non-systematic rate 2/5 encoder 2000 according to the invention. The FIG. 37 particularly shows how encoder output bits are punctured, and how the remaining bits are associated with one or more particular constellations and how each of those constellations may have a unique mapping. The control of the puncturing, the constellations, and the mapping are all governed by the rate control sequencer 1150. The rate control sequencer 1150 may cycle through a predetermined rate control sequence; it may adaptively select one or more new rate control sequence based on operating conditions such as a communication channel's SNR, bandwidth requirements based on various user applications, or according to some other consideration as well.

The available encoder output bits are provided to a functional block that may employ one or more of a number of multiple puncturing options. In this embodiment, these puncturing options are shown as puncturing for the following RCs: 0,9,1,8,2,3,6,C,E,F,7,A,D,4,B,5&G. Each of these puncturing options is associated with one or more constellations (the constellations being of the form of 8 PSK, QPSK, 16 QAM, and 16 APSK).

In this embodiment, the output bits remaining after having performed the puncturing for RCs 0, 9, and 1 are then associated with the 8 PSK constellation. The output bits remaining after having performed the puncturing for RCs 8,2,3,6,C,E,F,7,A&D are then associated with the QPSK constellation. The output bits remaining after having performed the puncturing for RC 4 are then associated with the 16 QAM modulation. The output bits remaining after having performed the puncturing for RCs 4,B,5&G are then associated with the 16 APSK constellation.

The RC for each particular puncturing is not only associated with a constellation, but also with a mapping for that constellation. For example, even though each of the RCs 0, 9, and 1 is associated with the 8 PSK constellation, each of them has a unique mapping. Similarly, even though each of the 8,2,3,6,C,E,F,7,A&D is associated with the QPSK modulation, each of them has a unique mapping. Similarly, even though each of the RCs B,5,&G is associated with the 16 APSK modulation, each of them has a unique mapping.

Figure 38:
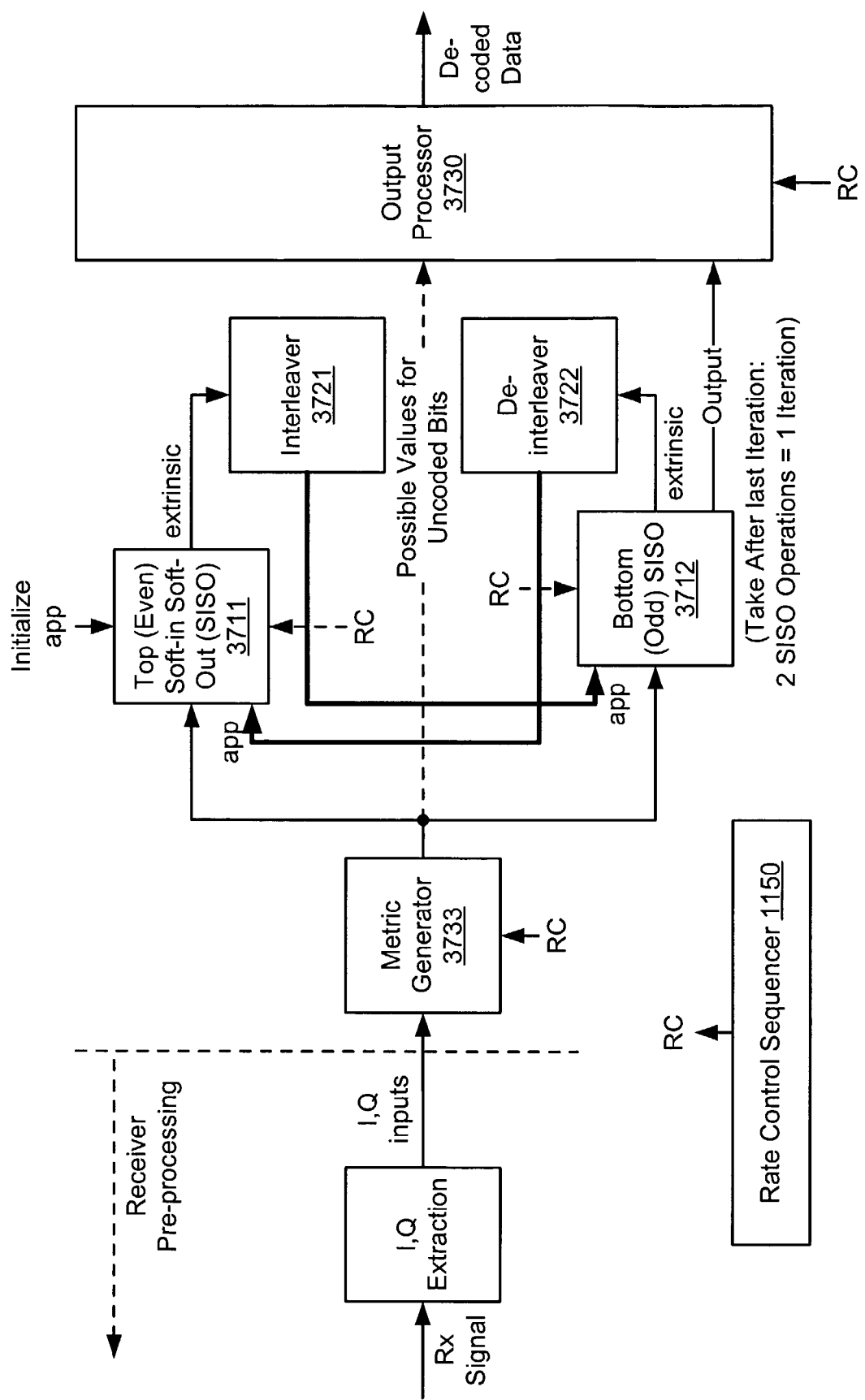
FIG. 38 is a system diagram illustrating an embodiment of a TTCM decoder system that is built according to the invention.

FIG. 38 is a system diagram illustrating an embodiment of a TTCM decoder system 3800 that is built according to the invention. A received signal is provided to an I,Q extraction functional block that extracts the I,Q (in-phase and quadrature) components from the received signal that are mapped according to a RC as determined by the rate control sequencer 1150. This may be viewed as being receiver pre-processing. The I,Q is then mapped according to the modulation's appropriate constellation and mapping. Then, the mapped I,Q is passed to a metric generator 3733 that also receives the RC input from the rate control sequencer 1150. The metric generator 3733 generates the appropriate metrics that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

We then compare the metric associated with uncoded bit (u=0) with the metric associated with uncoded bit (u=1), and we select the smaller metric value. The smaller metric value is deemed a higher likelihood than the larger metric value according to this embodiment's convention. We also select value of u based on which metric has the smaller value. We select the possible value of the uncoded bit u to be 1 or 0 as determined by which of the associated metrics has the smaller value (metric associated with uncoded bit (u=0) or the metric associated with uncoded bit (u=1)). In certain embodiments, we may perform a min* operation that includes a logarithmic correction in selecting the smaller metric. Alternatively, we may perform a max* operation that includes a logarithmic correction in selecting the smaller metric. It is noted that the various embodiments of the invention may be implemented using the max* operations in lieu of the min* operation when preferred in a given implementation.

The min* calculation may be expressed as follows:

$$\min{}^*(A,B) = \min(A,B) - \ln(1+e^{-|A-B|})$$

The max* calculation may be expressed as follows:

$$\max{}^*(A,B) = \max(A,B) + \ln(1+e^{-|A-B|})$$

As an example of this operation, let us assume that we are using RC 5, whose punctured encoder output is in the form of $uc_2c_1c_0$. We then set u=1 and then u=0 for every combination (looking at $c_2c_1c_0$=111 as an example), so we deal with the two possible values for $uc_2c_1c_0$=0111 and $uc_2c_1c_0$=1111. We then compare the location of the received symbol, as mapped within the constellation, to the two constellation points indexed by 0111 and 1111. We then select from these two constellation points indexed by 0111 and 1111 based on which one has the smaller valued metric. So, in the RC 5 example used here, we reduce the total number of 16 metrics down to 8. We then store these 8 metric values and 8 possible uncoded bit values (indexed by the metrics indices for each symbol in a received frame), for subsequent use in decoding the uncoded bit after we have decoded the input bits, $i_0i_1$. After we perform decoding of the input bits, $i_0i_1$, then we will know with certainty what the bits $c_2c_1c_0$ are, and then we may directly determine the uncoded bit value u based on these 8 possible uncoded bit values that we have stored.

Continuing on with the decoding process and functionality, the metrics that are calculated by the metric generator 3733 are then provided to a top (even) SISO 3711 and simultaneously to a bottom (odd) SISO 3712. Each of these SISOs 3711 and 3712 calculates forward metrics (alphas) and backward metrics (betas), and extrinsic values according to the trellis employed (such as the trellis 2300). The calculation of exactly how to calculate these alphas, betas, and extrinsics according to the trellis is performed within the TTCM decoder 122. These alphas, betas, and extrinsics are all calculated for each symbol within a frame that is to be decoded. These calculations of alphas, betas, and extrinsics are all based on the trellis and according to the RC provided by the RC input from the rate control sequencer 1150. Starting with the top SISO 3711, after the extrinsic values have been calculated, they are passed to an interleaver 3721 after which it is passed to the bottom SISO 3712 as "a priori probability" (app) information. Similarly, after extrinsic values have been calculated within the bottom SISO 3712, they are passed to an interleaver 3722 after which it is passed to the top SISO 3711 as "a priori probability" (app) information. It is noted that a single decoding iteration, within the iterative decoding process of the TTCM decoder system 3800 consists of performing two SISO operations; that is to say, the iterative decoding process must pass through both the top (even) SISO 3711 and through the bottom (odd) SISO 3712.

After a significant level of confidence has been achieved and a solution is being converged upon, or after a predetermined number of decoding iterations have been performed, then the output from the bottom (odd) SISO 3712 is passed as output to an output processor 3730. The operation of the SISOs 3711 and 3712 may generally be referred to as calculating soft symbol decisions of the symbol contained within the received symbol. These soft symbol decisions may be performed on a true bit level in certain embodiments. The output processor 3730 uses these soft symbol decisions to generate hard symbol decisions for the input bits $i_0i_1$ of the input symbol and to provide decoded output data.

Moreover, in the situation where we have uncoded bits u that result from the coding of the input bits, $i_0i_1$, we then also need to use as many as 8 possible uncoded bit values (indexed by the metrics indices), so that we can directly determine the value of the uncoded bit. Even greater detail is provided below in the discussion associated with FIG. 43 that continues on with the example embodiment of RC 5.

It is also noted that the app sequence for the top (even) SISO 3711 must be initialized before beginning the iterative decoding. The notation for the app sequence app[i][j][k] is as follows:

1. i represents the possible binary value of the estimated bit
2. The positions of the estimated bit are denoted as follows: (j=0 refers the first bit into the encoder and j=1 refers the second bit into the encoder)
3. k is the index of the symbol's location within the data block (or frame).

More specifically, k represents the symbol index of the symbols in a frame of data, j is the bit index (j=0 for bit $i_1$ and j=1 for bit $i_0$), and i is the bit value (i=0 or 1). For example, app[1][0][50] represents the app for bit $i_1$ of the 50$^{th}$ symbol being a value of 1.

At least two ways to initialize app[i][j][k] are described below:

1. app[i][j][k]=0.0,i,j$\in$ {0,1}, k$\in$ {0, ..., N–1}. Each and every TTCM coding, using any of the possible combination of RCs for a rate control sequence may use this initialization.
2. The TTCM coding with RC sequence 8 can have different initialization defined as follows.
   app[0][1][k]=0.0
   app[1][1][k]=MAX, for all possible k.
   app[0][0][k]=0.0

For the sequence app[0][0][k], we may first define the sequence based on the rate control sequence using the intermediate variable pP and pP* (which denotes the interleaved version of pP).
   pP[1][0][k]=MAX for RC 8
   pP[1][0][k]=0.0 otherwise Then, we interleave this sequence with de-interleave $\pi^{-1}$ is employed to generate the sequence pP*[1][0][k]. Finally, we define the initial app[1][0][k] as follows:
   app[1][0][k]=pP[1][0][k] if k mod2=0
   app[1][0][k]=pP*[1][0][k] if k mod2=1

Moreover, by using the interleaving $\pi$, we can directly define the app[1][0][k] as follows:
   app[1][0][k]=MAX if RC [$\hat{\pi}(k)$]=8
   app[1][0][k]=0.0 otherwise Further detail of the TTCM decoding functionality and operation is provided within several of the following Figures.

Figure 39:
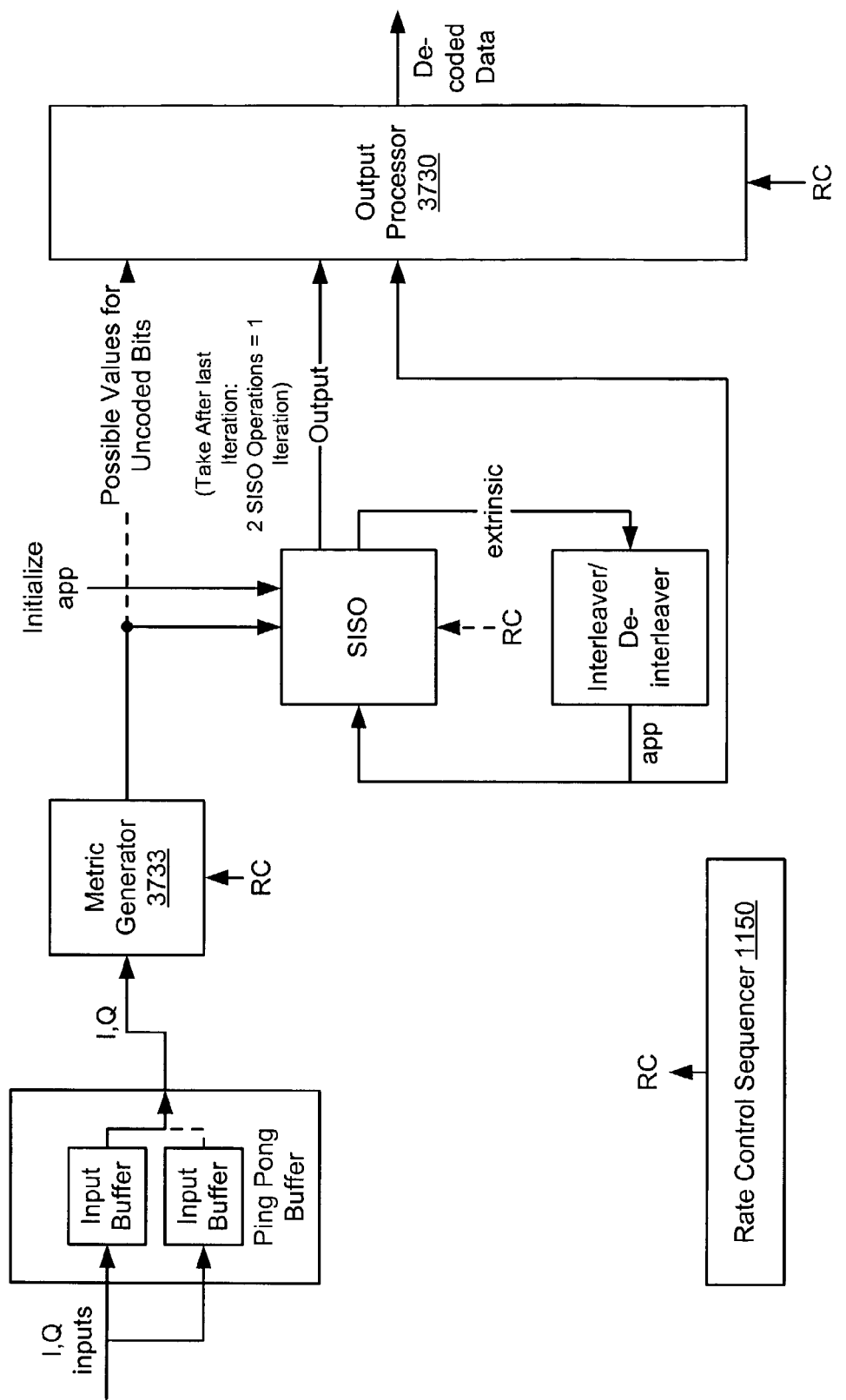
FIG. 39 is a system diagram illustrating an embodiment of an alternative TTCM decoder system that recycles a single SISO according to the invention.

FIG. 39 is a system diagram illustrating an embodiment of an alternative TTCM decoder system 3900 that recycles a single SISO according to the invention. The alternative TTCM decoder system 3900 receives as input the I,Q from a received signal. Similar to the embodiment of the FIG. 34, an I,Q extraction functional block may also be employed to extract these I,Q inputs within the FIG. 39 as well when performing receiver pre-processing. A ping pong buffer, employing two input buffers, is employed for efficient buffering of the I,Q inputs. The I,Q inputs are then passed to the metric generator 3733. The functionality of the metric generator 3733 may be similar in both the FIG. 38 and the FIG. 39.

The output of the metric generator 3733 is passed to the single SISO; the information necessary to perform decoding of any possible uncoded bits will be passed to the output processor 3730. The SISO calculates forward metrics (alphas), backward metrics (betas), and extrinsic values (exts) according to the trellis employed (such as the trellis 2300) and provides them to a functional block that is operable to perform both interleaving and de-interleaving (depending upon which SISO operation is being performed). The output of the interleaver/de-interleaver functional block is passed back to the SISO as app.

Similar to the embodiment of FIG. 38, it is noted that a single decoding iteration, within the iterative decoding process of the alternative TTCM decoder system 3900 consists of performing two SISO operations; that is to say, the iterative decoding process must pass through both the SISO once (when the SISO performs the top SISO functionality) and through the SISO again (when the SISO performs the bottom SISO functionality).

After a significant level of confidence for the soft symbol decisions within the SISO have been achieved and a solution is being converged upon, or after a predetermined number of decoding iterations have been performed, then the output from the SISO is passed as output to the output processor 3730. These soft symbol decisions may also be performed on a true bit level in certain embodiments. The output processor 3730 uses these soft symbol decisions to generate hard symbol decisions and to provide decoded output data. It is also noted that a similar app initialization of the FIG. 38 may be used within the FIG. 39.

Figure 40:
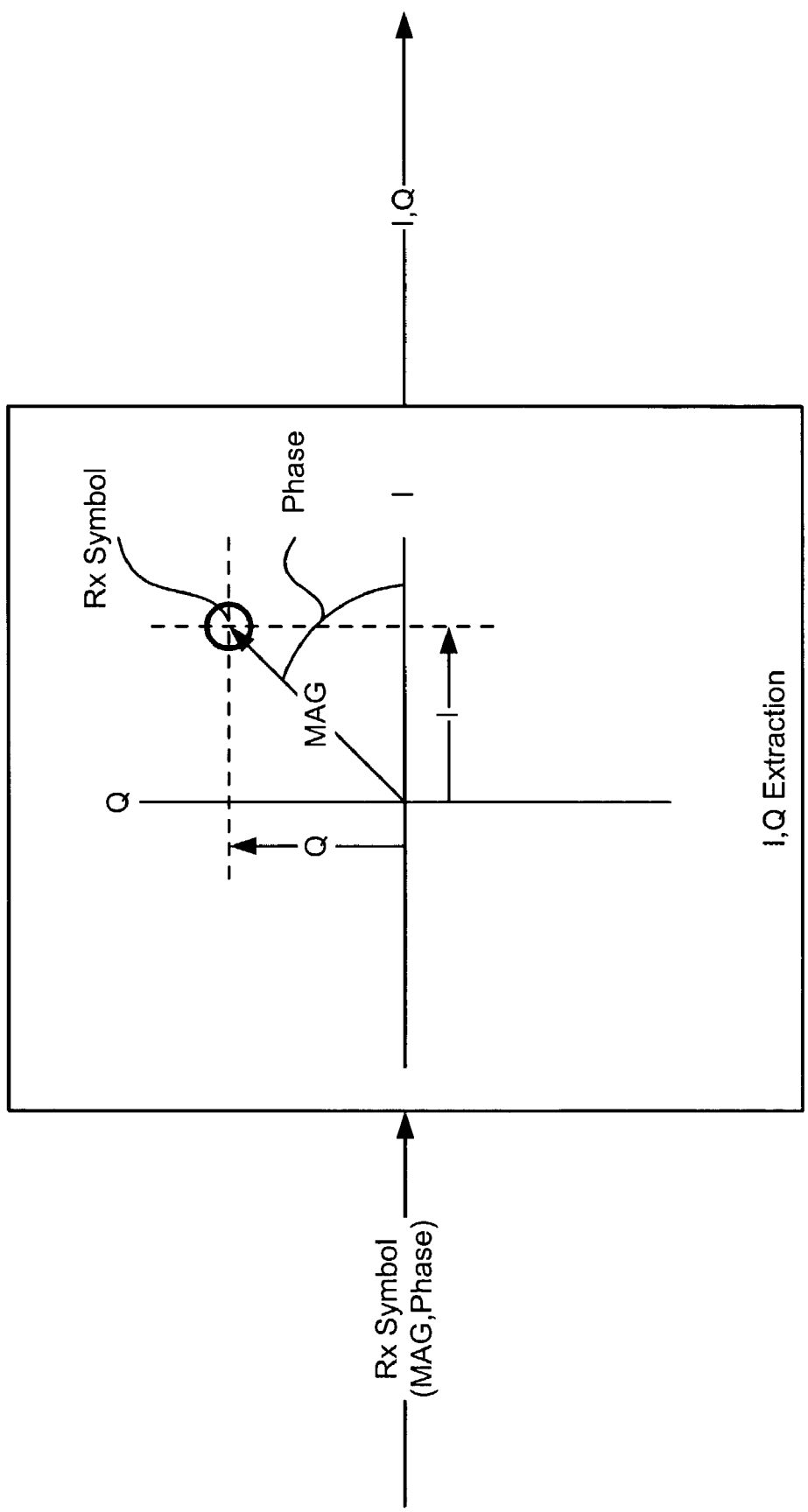
FIG. 40 is a diagram illustrating an embodiment of I,Q extraction that is performed according to the invention.

FIG. 40 is a diagram illustrating an embodiment of I,Q extraction that is performed according to the invention. A received symbol, having a magnitude and phase is provided to an I,Q extraction block. This symbol (or signal) is mapped in a two dimensional space such that an in-phase and a quadrature component. This in-phase measurement and the quadrature component are provided as output from the I,Q extraction functional block.

Figure 41:
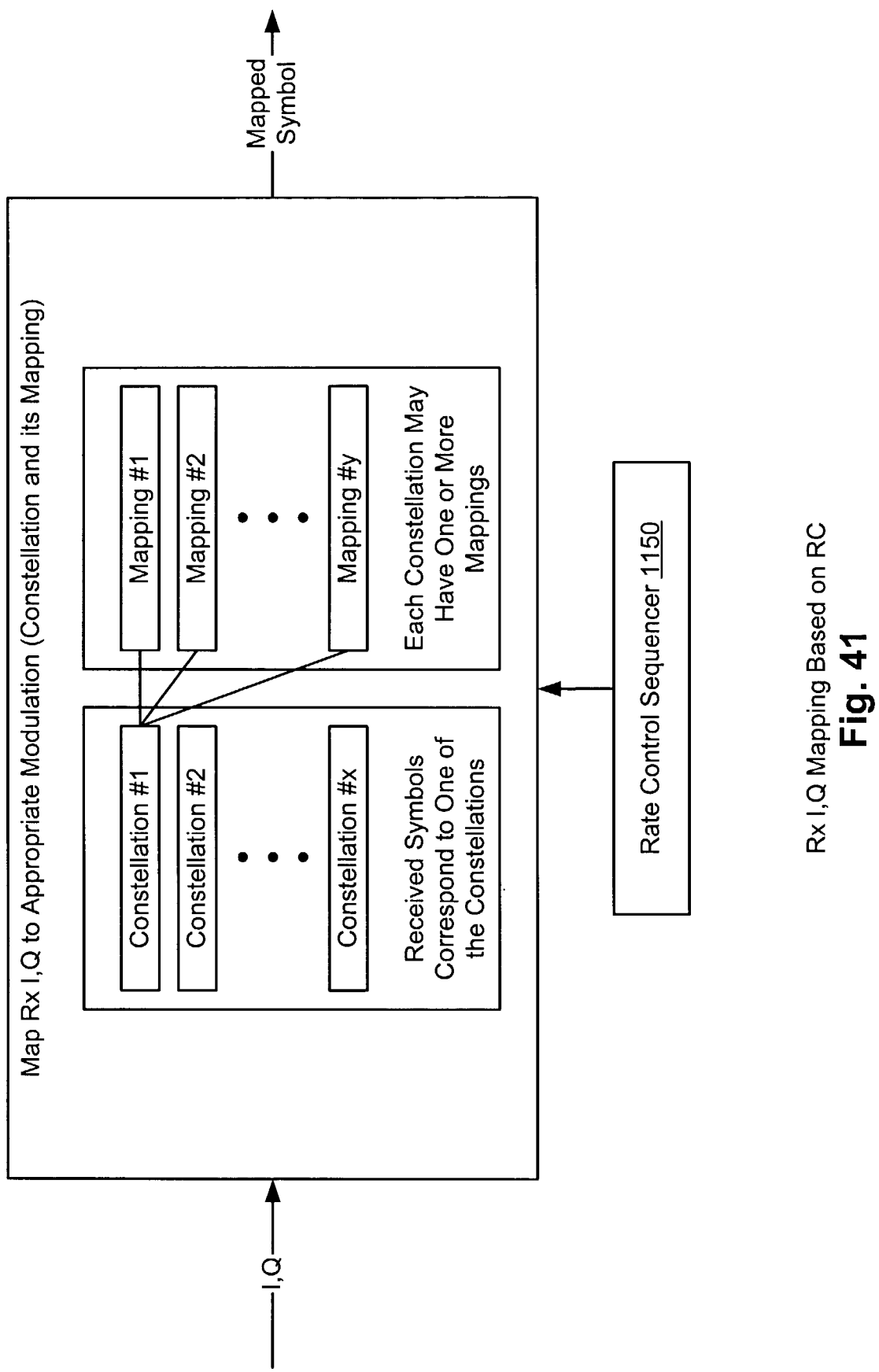
FIG. 41 is a diagram illustrating an embodiment of received I,Q mapping performed based on rate control according to the invention.

FIG. 41 is a diagram illustrating an embodiment of received I,Q mapping performed based on RC according to the invention. After the I,Qs are provided, then according to the RC provided by the rate control sequencer 1150, the received I,Q are mapped according to one of the modulation's constellations corresponding to the RC. Then, after the appropriate constellation has been selected, and the mapping has been determined based on the RC of the rate control sequence, the I,Q is mapped to a symbol in the appropriate modulation (with its particular constellation and mapping). Afterwards, a mapped symbol is provided as output from the FIG. 40.

Figure 42:
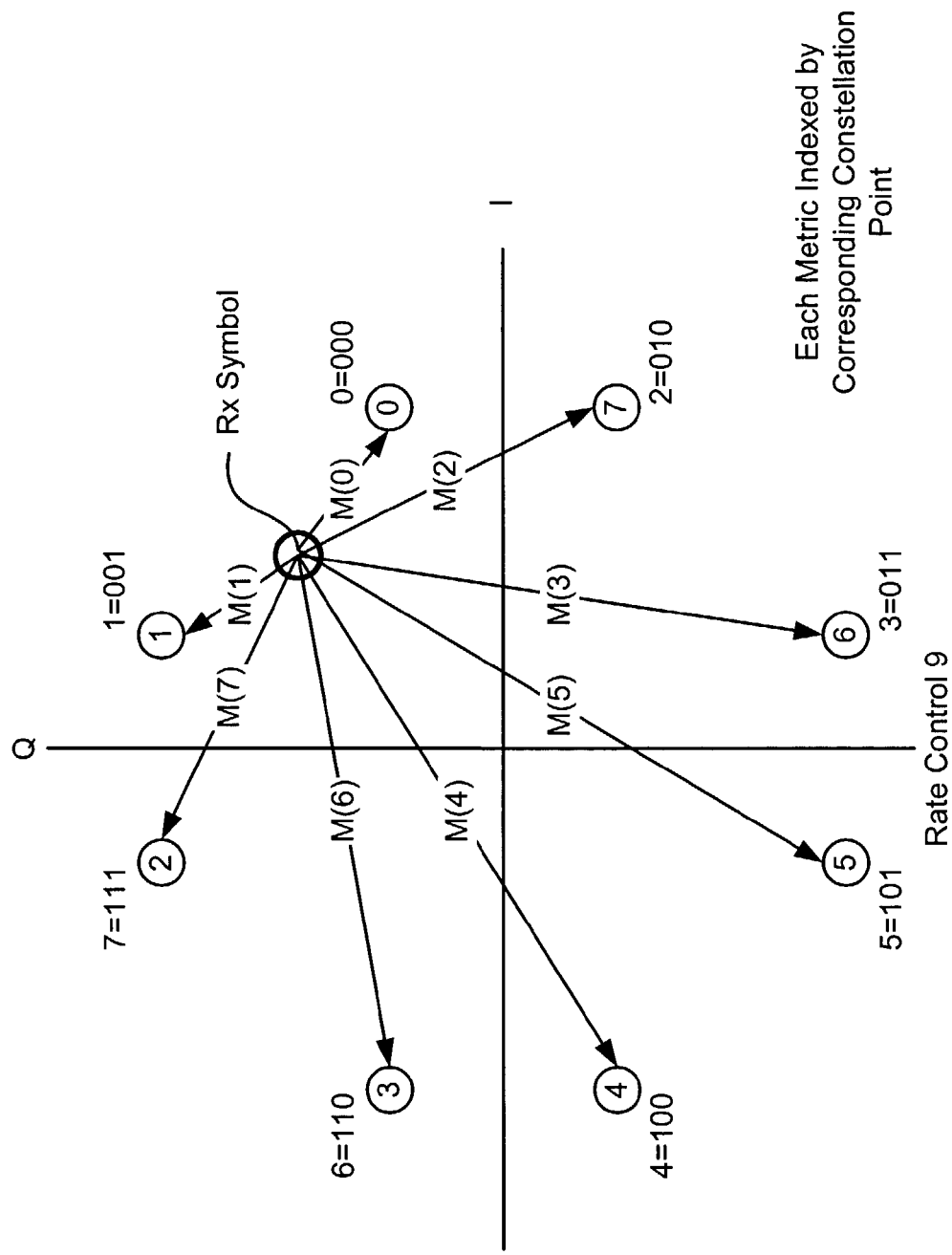
FIG. 42 is a diagram illustrating an embodiment of metric calculation performed by one of the metric generators shown in the FIG. 38 and the FIG. 39.

FIG. 42 is a diagram illustrating an embodiment of metric calculation performed by a metric generator 3733 according to the invention. A specific example is provided in the FIG. 42 using the RC 9, and it will then be understood how the metric calculation is performed for the other various modulations (constellations and mappings). The metric calculation may be performed in a similar manner in the other rate control sequences with their respective RCs.

The received symbol is mapped within this modulation (constellation and mapping). Then, the metric (scaled Euclidian distance) to each of the constellation points, from the received symbol, is calculated and indexed according to the mapping of the respective constellation points. This distance corresponds to the calculation in the metric generator that may be performed as follows:

Metric($U\!\times\!2\!\times\!1\!\times\!0$)=1/(2sigma$^2$)*[($Rx\_I$–$I\_$Coef)2+ ($Rx\_Q$–$Q\_$Coef)2]

Here, the scaling of the distance by [1/(2sigma$^2$)] (where sigma is the standard deviation of the normalized noise of the received symbol) accommodates for the normalized noise of the received symbol in determining this distance. The I_Coef and the Q_Coef are the expected locations (in terms of I,Q) at which the received symbol is expected to be mapped (constellation point location), and Rx_I and Rx_Q are the actual locations at which the received symbol is mapped.

For example, the metric corresponds to the distance from the received symbol to the constellation point associated with the symbol 1=(001 in binary) is shown as M(1); . . . ; and the metric corresponding to the distance from the received symbol to the constellation point associated with the symbol 3=(011 in binary) is shown as M(3). These metrics are output from the metric generator 3733.

Figure 43:
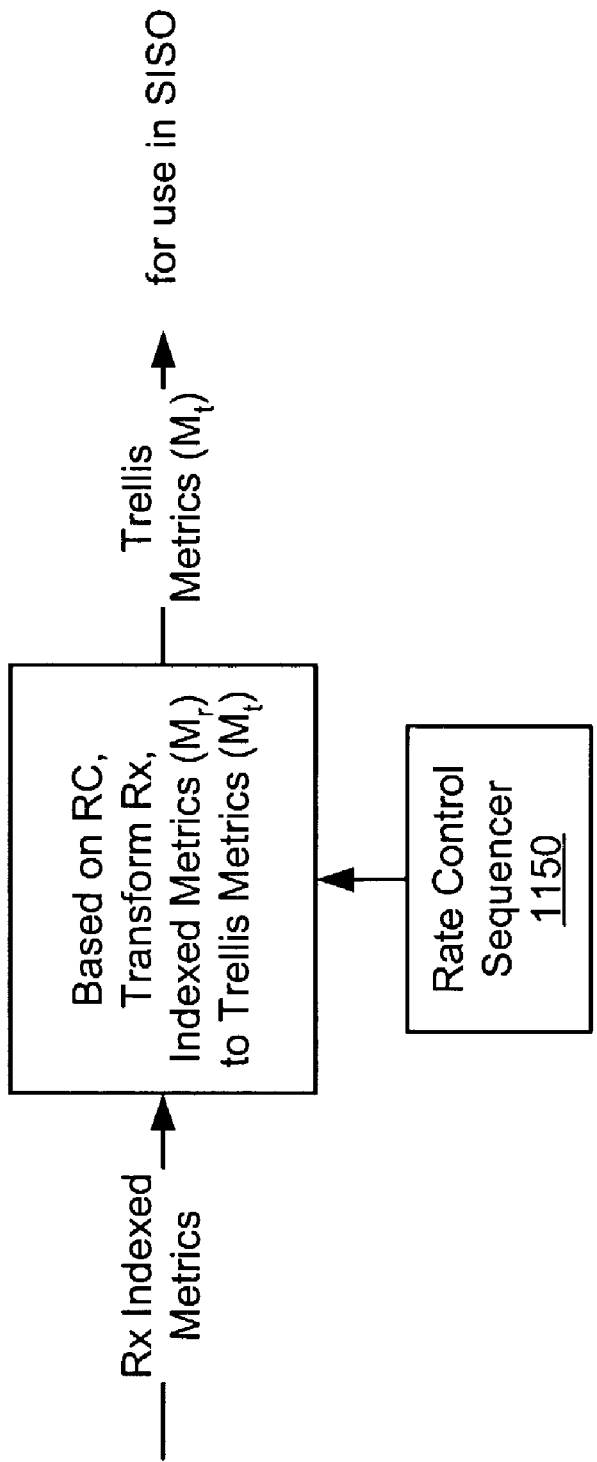
FIG. 43 is a functional block diagram illustrating an embodiment of metric mapping functionality that is performed according to the invention.

FIG. 43 is a functional block diagram illustrating an embodiment of metric mapping functionality that is performed according to the invention. The received symbol metrics (received metric=$M_r$), indexed according to the modulation (constellation and mapping) according to the RC (as provided by the rate control sequencer 1150), are then passed to a functional block that transforms these received metrics to trellis metrics (trellis metric=$M_t$). These trellis metrics are then used to calculate the alphas, betas, and extrinsics within the SISO. These alphas, betas, and extrinsics may be calculated using a min* approach according to the invention. Again, a max* approach may alternatively be used.

From the received I,Q values, a 2-bit metric for QPSK, a 3-bit metric $M_r(x_2x_1x_0)$ for 8-PSK, and a 4-bit metric $M_r(x_3x_2x_1x_0)$ for 16-QAM and 16-APSK can be computed. With either of these metrics, we may form a 3-bit metric $M_t$ that is to be sent to the SISO decoder with possible uncoded bit information. However, metric used in the SISO decoder depends on the trellis output that is a 5-bit symbol in general (using the rate 2/5 prototype encoder 2000). Some additional intelligence must be employed for proper assigning of these metrics to the trellis.

In order to have a universal decoder for all the RC number, some transforms from the received metric $M_r(x_3x_2x_1x_0)$ to $M_s(x_2x_1x_0)$ and from the trellis metric $M_t(c_4c_3c_2c_1c_0)$ to $M_s$(abc) need to be introduced.

As an example, the transformation of the follow RCs are shown below.

For RC 0: the received metric $M_r(x_2x_1x_0)$ is mapped to an intermediate metric $M_s(c_3c_2c_1)$. This intermediate metric $Ms(c_3c_2c_1)$ is mapped to the trellis metric $M_t(c_4c_3c_2c_1c_0)$. The last three bits of the intermediate metric $M_s(c_3c_2c_1)$ are mapped to the four possible trellis metrics $M_t(c_4c_3c_2c_1c_0)$ where the bits and may be treated as don't care. For example, the four metrics $M_t(0c_3c_2c_10)$, $M_t(0c_3c_2c_11)$, $M_t(1c_3c_2c_10)$, and $M_t(1c_3c_2c_11)$ are all mapped to have the very same value for the metrics within the trellis 2300.

These operations may be described below as follows:

$M_s(x_2x_1x_0)=M_r(x_2x_1x_0)$ $M_t(c_4c_3c_2c_1c_0)=M_s(c_3c_2c_1)$

For RC 1: the received metric $M_r(ux_1x_0)$ that includes an uncoded bit is initially mapped using a min* operation to generate the following intermediate received metric $\overline{M}_r(x_1x_0)$=min*{$M_r(0x_1x_0),M_r(1x_1x_0)$}. The uncoded bit is dealt with via the min* operation to deal with the both of the possible values by which u may take.

These operations may be described below as follows:

$\overline{M}_r(x_1x_0)$=min* {$M_r(0x_1x_0),M_r(1x_1x_0)$}

$M_s(x_2x_1\mathbf{0})=M_s(x_2x_1\mathbf{1})=\overline{M}_r(x_2x_1)$ $M_t(c_4c_3c_2c_1c_0)=M_s(c_4c_3c_2)$ Now, each of the following metrics would all be assigned the same value according to the trellis. $M_t(c_4c_3c_2\mathbf{00})=M_t(c_4c_3c_2\mathbf{01})=M_t(c_4c_3c_2\mathbf{10})=M_t(c_4c_3c_2\mathbf{11})$ The possible value of the uncoded bit indexed by $(x_1x_0)$ will be 0 if $M_r(0x_1x_0)<M_r(1x_1x_0)$, otherwise the possible value of the uncoded bit indexed by $(x_1x_0)$ will be 1 if $M_r(0x_1x_0)\geq M_r(1x_1x_0)$.

For RCs 2,3,6,C&E: for the received metric $M_r(x_2x_1)$, the following transformations are performed.

$M_s(x_2x_10)=M_s(x_2x_11)=M_r(x_2x_1)$
$M_t(c_4c_3c_2c_1c_0)=M_s(c_4c_3c_2)$

Now, each of the following metrics would all be assigned the same value according to the trellis. $M_t(c_4c_3c_2\mathbf{00})=M_t(c_4c_3c_2\mathbf{01})=M_t(c_4c_3c_2\mathbf{10})=M_t(c_4c_3c_2\mathbf{11})$ For RCs 4&B: for the received metric $M_r(ux_2x_1x_0)$ that includes an uncoded bit, the min* operation is again employed. The following transformations are performed.

$M_s(x_2x_1x_0)=\min^*\{M_r(0x_2x_1x_0),M_r(1x_2x_1x_0)\}$
$M_t(c_4c_3c_2c_1c_0)=M_s(c_3c_2c_1)$ Now, each of the following metrics would all be assigned the same value according to the trellis. $M_t(\mathbf{0}c_3c_2c_1\mathbf{0})=M_t(\mathbf{0}c_3c_2c_1\mathbf{1})=M_t(\mathbf{1}c_3c_2c_1\mathbf{0})=M_t(\mathbf{1}c_3c_2c_1\mathbf{1})$ The possible value of the uncoded bit indexed by $(x_2x_1x_0)$ will be 0 if $M_r(0x_2x_1x_0)<M_r(1x_2x_1x_0)$, otherwise the possible value of the uncoded bit indexed by $(x_2x_1x_0)$ will be 1 if $M_r(0x_2x_1x_0)\geq M_r(1x_2x_1x_0)$.

For RCs 7,A&D: for the received metric $M_r(x_1x_0)$, the following transformations are performed.

$M_s(x_2x_1x_0)=M_r(x_1x_0)$, when $x_2=0$
$M_s(x_2x_1x_0)=$MAX, when $x_2=1$. MAX is the maximum metric that is employed in the decoding system.

$M_t(c_4c_3c_2c_1c_0)=M_s(c_4c_2c_1)$

For RC 9: for the received metric $M_r(x_2x_1x_0)$, the following transformations are performed.

$M_s(x_2x_1x_0)=M_r(x_2x_1x_0)$
$M_t(c_4c_3c_2c_1c_0)=M_s(c_2c_1c_0)$, when $c_4=0$.
$M_t(c_4c_3c_2c_1c_0)=$MAX, when $c_4=1$.

For RC 5: for the received metric $M_r(ux_2x_1x_0)$ that includes an uncoded bit, the min* operation is again employed. The following transformations are performed.

$M_s(x_2x_1x_0)=\min^*\{M_r(0x_2x_1x_0),M_r(1x_2x_1x_0)\}$
$M_t(c_4c_3c_2c_1c_0)=M_s(c_2c_1c_0)$, when $c_4=0$.
$M_t(c_4c_3c_2c_1c_0)=$MAX, when $c_4=1$.

The possible value of the uncoded bit indexed by $(x_2x_1x_0)$ will be 0 if $M_r(0x_2x_1x_0)<M_r(1x_2x_1x_0)$, otherwise the possible value of the uncoded bit indexed by $(x_2x_1x_0)$ will be 1 if $M_r(0x_2x_1x_0)\geq M_r(1x_2x_1x_0)$.

For RC 8: for the received metric $M_r(x_1x_0)$, the following transformations are performed.

$M_s(x_2x_1x_0)=M_r(x_1x_0)$, when $x_2=0$
$M_s(x_2x_1x_0)=$MAX, when $x_2=1$. MAX is the maximum metric that is employed in the decoding system.

$M_t(c_4c_3c_2c_1c_0)=M_s(c_3c_2c_0)$, when $c_4=0$.
$M_t(c_4c_3c_2c_1c_0)=$MAX, when $c_4=1$.

For even greater understanding of the mapping of these metric functions to the trellis 2300 employed by the rate 2/5 prototype encoder 2000, we will walk through the following example. We use the outputs of the trellis 2300 to perform this assigning of the metrics. The following table is used to show how this mapping to the trellis is performed according to RC 8.

| state | output | output | output | output |
|---|---|---|---|---|
| 0 = 000 | 0 | 14 | 31 | 25 |
| | x00000 octal | x01100 octal | x11001 octal | x10101 octal |
| | Met(0) | Met(6) | Met(5) | Met(7) |
| | | MAX: as $x_2 = c_4 = 1$ | MAX: as $x_2 = c_4 = 1$ | MAX: as $x_2 = c_4 = 1$ |
| 1 = 001 | 31 | 25 | 0 | 14 |
| | x11001 octal | x10101 octal | x00000 octal | x01100 octal |
| | Met(5) | Met(7) | Met(0) | Met(6) |
| | MAX: as $x_2 = c_4 = 1$ | MAX: as $x_2 = c_4 = 1$ | | MAX: as $x_2 = c_4 = 1$ |
| 2 = 010 | 12 | 6 | 23 | 37 |
| | x01010 octal | x00110 octal | x10011 octal | x11111 octal |
| | Met(4) | Met(2) | Met(5) | Met(7) |
| | MAX: as $x_2 = c_4 = 1$ | | MAX: as $x_2 = c_4 = 1$ | MAX: as $x_2 = c_4 = 1$ |
| 3 = 011 | 23 | 37 | 12 | 6 |
| | x10011 octal | x11111 octal | x01010 octal | x00110 octal |
| | Met(5) | Met(7) | Met(4) | Met(2) |
| | MAX: as $x_2 = c_4 = 1$ | MAX: as $x_2 = c_4 = 1$ | MAX: as $x_2 = c_4 = 1$ | |
| 4-100 | 24 | 30 | 15 | 1 |
| | x10100 octal | x11000 octal | x01101 octal | x0000 octal |
| | Met(6) | Met(4) | Met(7) | Met(1) |
| | MAX: as $x_2 = c_4 = 1$ | MAX: as $x_2 = c_4 = 1$ | MAX: as $x_2 = c_4 = 1$ | |
| 5 = 101 | 15 | 1 | 24 | 30 |
| | x01101 octal | x00001 octal | x10100 octal | x11000 octal |
| | Met(7) | Met(1) | Met(6) | Met(4) |
| | MAX: as $x_2 = c_4 = 1$ | | MAX: as $x_2 = c_4 = 1$ | MAX: as $x_2 = c_4 = 1$ |
| 6 = 110 | 36 | 22 | 7 | 13 |
| | x11110 octal | x10010 octal | x00111 octal | x01011 octal |
| | Met(6) | Met(4) | Met(3) | Met(5) |
| | MAX: as $x_2 = c_4 = 1$ | MAX: as $x_2 = c_4 = 1$ | | MAX: as $x_2 = c_4 = 1$ |
| 7 = 111 | 7 | 13 | 36 | 22 |
| | x00111 octal | x04011 octal | x11110 octal | x10010 octal |
| | Met(3) | Met(5) | Met(6) | Met(4) |
| | | MAX: as $x_2 = c_4 = 1$ | MAX: as $x_2 = c_4 = 1$ | MAX: as $x_2 = c_4 = 1$ |

Now, each of the following metrics would all be assigned the same value according to the trellis. $M_t(c_4\mathbf{0}c_2c_1\mathbf{0})=M_t(c_4\mathbf{0}c_2c_1\mathbf{1})=M_t(c_4\mathbf{1}c_2c_1\mathbf{0})=M_t(c_4\mathbf{1}c_2c_1\mathbf{1})$ It is seen in this example that there are only 4 distinct valued metrics that need to be provided from the metric generator to a SISO in the RC 8. MAX (the maximum metric value) is used to define the "least likelihood probability." A great deal of memory may be saved by passing only a flag bit (for those metrics who will use the MAX value) that indicates such information to the SISO.

It is also noted that for the states 0=000 and 1=001, the metrics are all the same values only swapped. This is the case also for the state groupings {2=010, 3=011}, {4=100, 5=101}, and {6=110, 7=111}. Such efficiency may be similarly achieved with respect to each of the RCs, and efficient hardware implementations may capitalize thereon to provide for savings.

Figure 44:
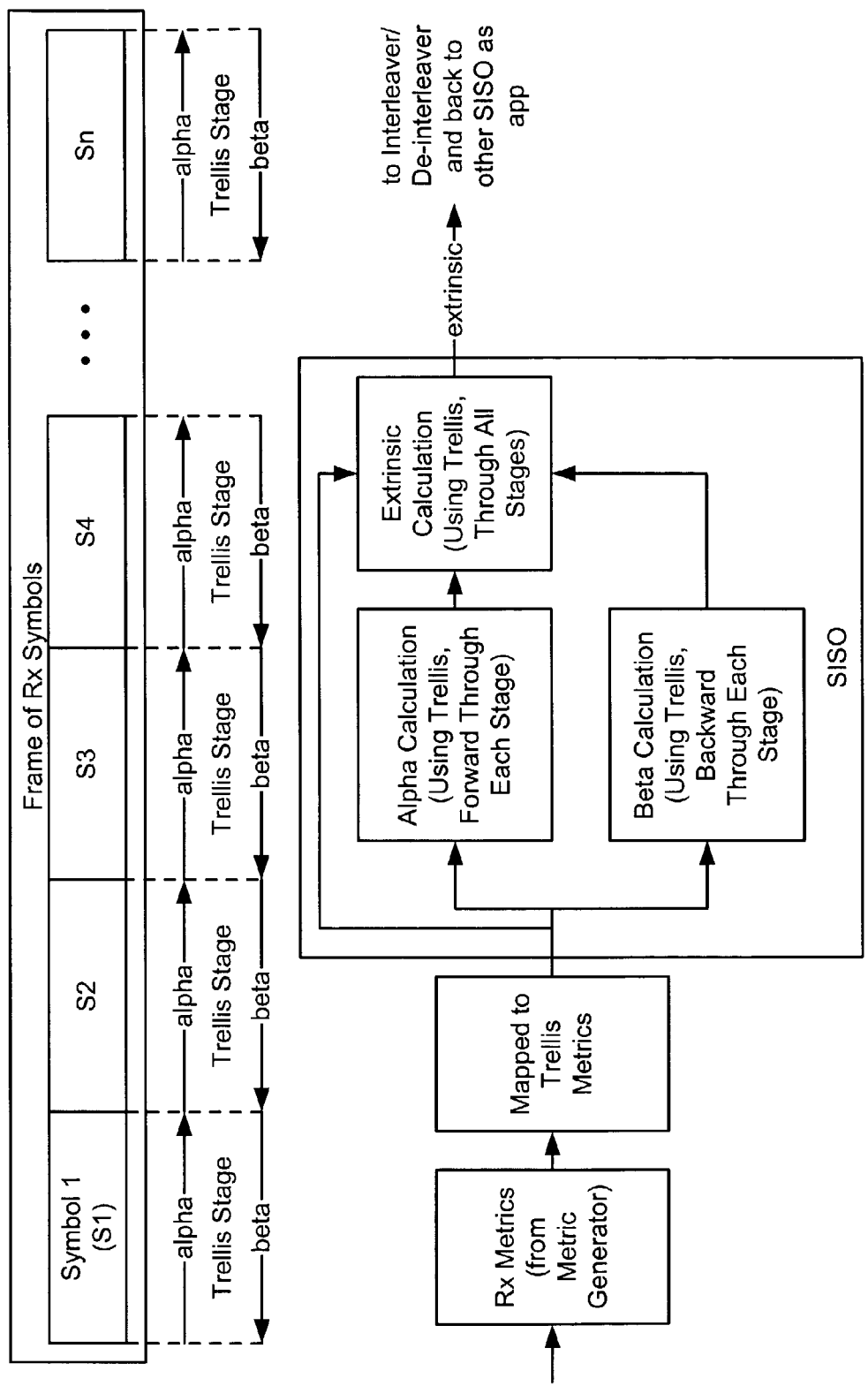
FIG. 44 is a diagram illustrating an embodiment of SISO calculations and operations that are performed according to the invention.

FIG. 44 is a diagram illustrating an embodiment of SISO calculations and operations that are performed according to the invention. For each stage (or each symbol) within a frame of received symbols (or sequence of received symbols), the forward metrics (alphas), the backward metrics (betas), and the extrinsics are calculated. The extrinsics value of a stage is a function of the alphas, betas, metrics, and apps ("a priori" probabilities) of that stage. The metrics (that have been mapped according to the trellis and according to the rate control sequence from the metric generator 3733 and as also described in greater detail above within the discussion of the FIG. 43) are provided to the SISO within the FIG. 44. The SISO employs these metrics to calculate the alphas, and the betas. Then, the alphas, betas, and metrics are used to calculate the extrinsics that are provided back to the other SISO through the other interleaver/de-interleaver as appropriate in the particular situation. It is noted that the values of metrics, alphas, betas, and extrinsics are all used to perform the TTCM decoding of the information bits that have been encoded by the TTCM encoder.

For even greater understanding of the calculation of these variables according to the trellis 2300 that is employed by the rate 2/5 prototype encoder 2000, we show the following steps of calculations. It is noted that this is one particular example of how these variables may be calculated, and other means are also envisioned within the scope and spirit of the invention that supports the variable code rate functionality described herein.

As mentioned above, the trellis 2300 may be represented using 8 distinct metric values in an efficient implementation. Therefore, for each stage (or symbol) of a received frame of symbols (I,Qs), we will have 8 different metrics, 8 different alphas, and 8 different betas. As also mentioned above, some savings may be achieved when more than one of the metrics has the same value according to the coding and the trellis 2300. Similar savings may also be achieved within other trellises that inherently support such redundancy.

We use the trellis to calculate the values for alpha. In this particular embodiment, a value of 0 is associated with a high likelihood and a value of N is associated with a value of less likelihood. However, if desired in a particular embodiment, the association may be reversed without departing from the scope and spirit of the invention.

When calculating the 8 alphas for the first symbol of the trellis 2300, we initially set the values to be as follows:

$\alpha_0(0)=0$; the value of 0 is assigned to be a high likelihood, and we set the other alphas to be the value of N, associated with the less likelihood.

$$\alpha_2(0)=\alpha_3(0)=\alpha_4(0)=\alpha_5(0)=\alpha_6(0)=\alpha_7(0)=N$$

We will show the manner in which we calculate the alphas for a first received symbol within a frame.

The alpha associated with the state 0 may be calculated as follows:

$$\alpha_n(0)=\min^*\{A_0, A_1, A_2, A_3\}$$

where, $A_0=\alpha_{n-1}(0)+\text{Met}(0)+\text{app}(i_1=0)+\text{app}(i_0=0)$, input 0=00, output=0=x00000

$A_1=\alpha_{n-1}(1)+\text{Met}(14)+\text{app}(i_1=0)+\text{app}(i_0=1)$, input 1=01, output=14=x01100

$A_2=\alpha_{n-1}(2)+\text{Met}(31)+\text{app}(i_1=1)+\text{app}(i_0=0)$, input 2=10, output=31=x11001

$A_3=\alpha_{n-1}(3)+\text{Met}(25)+\text{app}(i_1=1)+\text{app}(i_0=1)$, input 3=11, output=25=x10101

Similarly, the alpha associated with the state 1 may be calculated as follows:

$$\alpha_n(1)=\min^*\{AA_0, AA_1, AA_2, AA_3\}$$

where, $AA_0=\alpha_{n-1}(2)+\text{Met}(31)+\text{app}(i_1=1)+\text{app}(i_0=0)$, input 2=10, output=31=x11001

$AA_1=\alpha_{n-1}(3)+\text{Met}(25)+\text{app}(i_1=1)+\text{app}(i_0=1)$, input 3=11, output=25=x10101

$AA_2=\alpha_{n-1}(0)+\text{Met}(0)+\text{app}(i_1=0)+\text{app}(i_0=0)$, input 0=00, output=00=x00000

$AA_3=\alpha_{n-1}(1)+\text{Met}(14)+\text{app}(i_1=0)+\text{app}(i_0=1)$, input 1=01, output=14=x01100

This process will continue until all of the alphas are calculated for the symbol. The beta values are calculated in the backwards direction in a similar manner according to the same trellis. The same min* design, replicated many times in hardware, may be employed to perform simultaneous calculation of both the alphas and the betas. However, in slower data rate applications where throughput is not such a high priority, the same min* hardware element may be used to perform the alpha and beta calculations sequentially.

Once that the alphas and betas have been calculated at any stage, we can proceed to calculate for the extrinsic values so that we may decode the input bits of the input symbol, namely the two input bits ($i_0 i_1$), for that stage.

The following table may be used to illustrate how we calculate these values according to the trellis 2300 that is employed by the rate 2/5 prototype encoder 2000. In this embodiment, since we have two input bits ($i_0 i_1$), we need to calculate the extrinsic values for the possibility that each of the bits within the symbol may be 0 or may be 1. We will do this by calculating the following extrinsic values: ext(00), ext(01), ext(10), and ext(11).

The following table is used to show the 4 extrinsics that we need to calculate to perform proper decoding of the input symbol having the two input bits ($i_0 i_1$).

| Extrinsic value | bit of concern | possible two input bits [symbol = ($i_0 i_1$)] |
| --- | --- | --- |
| ext(00) = ext($i_0$ = 0) | bit $i_0$ = 0 | 0 = 00 or 2 = 10 |
| ext(10) = ext($i_0$ = 1) | bit $i_0$ = 1 | 1 = 01 or 3 = 11 |
| ext(01) = ext($i_1$ = 0) | bit $i_1$ = 0 | 0 = 00 or 1 = 01 |
| ext(11) = ext($i_1$ = 1) | bit $i_1$ = 1 | 2 = 10 or 3 = 11 |

In this embodiment, we perform a min* calculation to calculate our four extrinsic values. It is noted, however, that other embodiments may perform a min only calculation, a max only calculation, or a max* calculation without departing from the scope and spirit of the invention. The variable code rate functionality of using multiple modulations (constellations and mappings), and cycling through rate control sequences thereof may still be performed when using other such functions to calculate the extrinsic values within the SISO functional blocks.

We perform the min* operation on a host of values to calculate these various extrinsic values.

First, we look at all branches within the trellis where ($i_0$=0), and we find that we get 16 branches. We do a min* operation across those branches to calculate this the extrinsic value.

ext(00)=ext($i_0$=0)=min*{[beta_0+ alpha_0+ a priori (01)+met(0)]; [beta_0+alpha_1+ a priori(11)+ met(31)]; [beta_1+ alpha_6+ a priori(11)+met (36)]; [beta_1+alpha_7+ a priori(01)+met(7)]; [beta_2+ alpha_4+ a priori(11)+met(30)]; [beta_2+alpha_5+ a priori(11)+met(1)]; [beta_3+ alpha_2+ a priori(01)+met(6)]; [beta_3+ alpha_3+ a priori(01)+met(37)]; [beta_4+ alpha_0+ a priori(11)+met(31)]; [beta_4+alpha_1+ a priori(11)+met(0)]; [beta_5+ alpha_6+ a priori(01)+met(7)]; [beta_5+alpha_7+ a priori(01)+met(36)]; [beta_6+ alpha_4+ a priori(01)+met(1)]; [beta_6+alpha_5+ a priori (11)+met(30)]; [beta_7+ alpha_2+ a priori (11)+met(37)]; [beta_7+alpha_3+ a priori(01)+ met(6)]}

Second, we now look at all branches within the trellis where ($i_0$=1), and we find that we also get 16 branches. We do a min* operation across those branches to calculate this the extrinsic value.

ext(10)=ext($i_0$=1)=min*{[beta_0+ alpha_4+ a priori (11)+met(24)]; [beta_0+alpha_5+ a priori(01)+ met(15)]; [beta_1+ alpha_2+ a priori(01)+met (12)]; [beta_1+alpha_3+ a priori(11)+met(23)]; [beta_2+ alpha_0+ a priori(01)+met(14)]; [beta_2+alpha_1+ a priori(01)+met(25)]; [beta_3+ alpha_6+ a priori(11)+met(22)]; [beta_3+alpha_7+ a priori(01)+met(13)]; [beta_4+ alpha_4+ a priori(01)+met(15)]; [beta_4+alpha_5+ a priori(11)+met(24)]; [beta_5+ alpha_2+ a priori(11)+met(23)]; [beta_5+alpha_3+ a priori(01)+met(12)]; [beta_6+ alpha_0+ a priori(11)+met(25)]; [beta_6+alpha_1+ a priori(01)+met(14)]; [beta_7+ alpha_6+ a priori(01)+met(13)]; [beta_7+alpha_7+ a priori(11)+met(22)]}

We may use these two extrinsic values calculated above to decode for the first bit of the input symbol that was encoded, namely $i_0$. We use the following equation to do the final decode for $i_0$.

$i_0$=sgn{−[ext($i_0$=0)+app($i_0$=0)]+[ext($i_0$=1)+app ($i_0$=1)]}

Functionally, we select the smaller one of [ext($i_0$=0)+app ($i_0$=0)] and [ext($i_0$=1)+app($i_0$=1)] in the above equation, and we select the bit value associated with the smaller sum. For example, if [ext($i_0$=0)+app($i_0$=0)]<[ext($i_0$=1)+app($i_0$=1)], then we make $i_0$=0.

We perform similar operations to calculate for the bit value for $i_1$ within the input symbol.

Third, we look at all branches within the trellis where ($i_1$=0), and we find that we get 16 branches. We do a min* operation across those branches to calculate this the extrinsic value.

ext(01)=ext($i_1$=0)=min*{

[beta_0+ alpha_0+ a priori(00)+met(0)]; [beta_0+alpha_5+ a priori(10)+met(15)];

[beta_1+ alpha_2+ a priori(10)+met(12)]; [beta_1+alpha_7+ a priori(00)+met(7)];

[beta_2+ alpha_0+ a priori(10)+met(14)]; [beta_2+alpha_5+ a priori(00)+met(1)];

[beta_3+ alpha_2+ a priori(00)+met(6)]; [beta_3+alpha_7+ a priori(10)+met(13)];

[beta_4+ alpha_1+ a priori(00)+met(0)]; [beta_4+alpha_4+ a priori(10)+met(15)];

[beta_5+ alpha_3+ a priori(10)+met(12)]; [beta_5+alpha_6+ a priori(00)+met(7)];

[beta_6+ alpha_1+ a priori(10)+met(15)]; [beta_6+alpha_4+ a priori(00)+met(1)];

[beta_7+ alpha_3+ a priori(00)+met(6)]; [beta_7+alpha_6+ a priori(10)+met(13)]}

Fourth, we now look at all branches within the trellis where ($i_1$=1), and we find that we also get 16 branches. We do a min* operation across those branches to calculate this the extrinsic value.

ext(11)=ext($i_1$=1)=min*{

[beta_0+ alpha_1+ a priori(00)+met(31)]; [beta_0+alpha_4+ a priori(10)+met(24)];

[beta_1+ alpha_3+ a priori(10)+met(23)]; [beta_1+alpha_6+ a priori(00)+met(36)];

[beta_2+ alpha_1+ a priori(10)+met(25)]; [beta_2+alpha_4+ a priori(00)+met(30)];

[beta_3+ alpha_3+ a priori(00)+met(37)]; [beta_3+alpha_6+ a priori(10)+met(22)];

[beta_4+ alpha_0+ a priori(00)+met(31)]; [beta_4+alpha_5+ a priori(10)+met(24)];

[beta_5+ alpha_2+ a priori(10)+met(23)]; [beta_5+alpha_7+ a priori(00)+met(36)];

[beta_6+ alpha_0+ a priori(10)+met(25)]; [beta_6+alpha_5+ a priori(00)+met(30)];

[beta_7+ alpha_2+ a priori(00)+met(37)]; [beta_7+alpha_7+ a priori(10)+met(22)]}

We may use these two extrinsic values calculated above to decode for the first bit of the input symbol that was encoded, namely $i_0$. We use the following equation to do the final decode for $i_0$.

$i_1$=sgn{[ext($i_1$=1)+app($i_1$=1)]−[ext($i_1$=0)+app($i_1$=0)]}

Functionally, we select the smaller one of [ext($i_{1=0}$)+app ($i_1$=0)] and [ext($i_{1=1}$)+app($i_1$=1)] in the above equation, and we select the bit value associated with the smaller sum. For example, if [ext($i_1$=0)+app($i_1$=0)]<[ext($i_1$=1)+app($i_1$=1)], then we make $i_1$=0.

Now we have decoder the individual bits for the input symbol, ($i_0 i_1$), as being one of either 0=01, 1=01, 2=10, or 3=11.

In addition, we need to perform a little additional computation in the situation where we have a RC that includes an uncoded bit.

We continue on to use the RC 5 to illustrate this situation. The other RCs would undergo analogous calculations to determine the final value of the uncoded bit. The puncturing for the RC 5 may be seen in the FIG. 26, and its mapping may be seen in the FIG. 36. We use the earlier extrinsic calculated information to decode the uncoded bit for RC 5, whose punctured output takes the form of $uc_2c_1c_0$. We can narrow our input selection somewhat to have the form of only one of two input symbols, 0 and 1, or 0=($i_0 i_1$=00) and $1=(i_0 i_1 = 01)$, because we know that this RC 5 always provides the bit $i_0$ as value 0. Therefore, we need only to decode the other input bit $i_1$ within this RC 5. The following table is employed to generate the indexing of the uncoded bit so that, after we have decoded the input bits, $i_0 i_1$, we will be able to decode the uncoded bit u properly.

| input symbol | Trellis output $c_4 c_3 c_2 c_1 c_0$ (octal) | $c_2 c_1 c_0$ | min* operation (metric indexed by $c_2 c_1 c_0$) |
|---|---|---|---|
| 0 ($i_0 i_1 = 00$) | 0 | 0 | min*{[alpha__0 + beta__0 + met(0)]; [alpha__1 + beta_4 + met(0)]} |
| 0 ($i_0 i_1 = 00$) | 1 | 1 | min*{[alpha__4 + beta__6 + met(1)]; [alpha 5 + beta 2 + met(1)]} |
| 0 ($i_0 i_1 = 00$) | 6 | 6 | min*{[alpha__2 + beta__3 + met(6)]; [alpha 3 + beta 7 + met(6)]} |
| 0 ($i_0 i_1 = 00$) | 7 | 7 | min*{[alpha__6 + beta__5 + met(7)]; [alpha 7 + beta__1 + met(7)]} |
| 1 ($i_0 i_1 = 01$) | 12 | 2 | min*{[alpha__2 + beta__1 + met(2)]; [alpha 3 + beta 5 + met(2)]} |
| 1 ($i_0 i_1 = 01$) | 13 | 3 | min*{[alpha__6 + beta__7 + met(3)]; [alpha 7 + beta__3 + met(3)]} |
| 1 ($i_0 i_1 = 01$) | 14 | 4 | min*{[alpha__0 + beta__2 + met(4)]; [alpha 1 + beta__6 + met(4)]} |
| 1 ($i_0 i_1 = 01$) | 15 | 5 | min*{[alpha__4 + beta__4 + met(5)]; [alpha 5 + beta__0 + met(5)]} |

From the decoder input, such as input bit symbol 0, ($i_0 i_1 = 00$), we then determine which one of the four min* results above is the smallest. This is then the index that we use to select the one of the possible 8 values for the uncoded bit. As an example, if the min* of the metric for 6 {the min* calculation associated with met(6)} is the smallest, then we will use this index to select the value of the uncoded bit u from the previously stored values.

Figure 45:
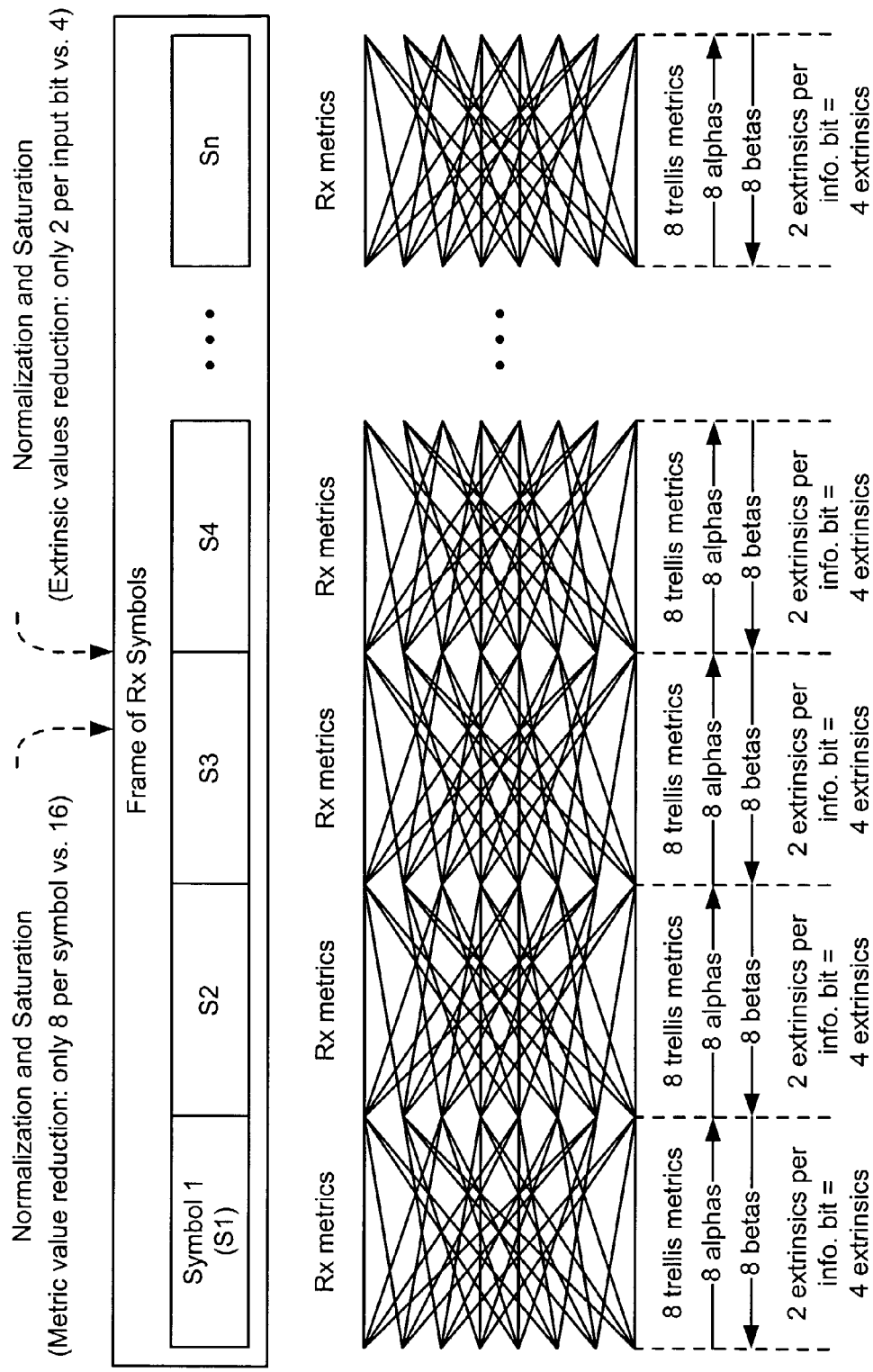
FIG. 45 is a diagram illustrating an embodiment of alpha, beta, and extrinsic calculation, based on the trellis of the FIG. 23 of the rate 2/5 non-systematic prototype encoder of the FIG. 20 according to the invention.

FIG. 45 is a diagram illustrating an embodiment of alpha, beta, and extrinsic calculation, based on a trellis 2300 of a rate 2/5 non-systematic prototype encoder 2000, that is performed according to the invention. The FIG. 45 shows how the trellis 2300 may be effectively overlaid at each symbol location within a frame of received symbols and how this particular trellis 2300 inherently provides an efficiency, in that, regardless of the RC that is being employed in a given instance, the received metrics associated with that RC may be mapped into the same trellis 2300 and reduced to a maximum of 8 trellis metrics in certain embodiments as opposed to storing all 16 metric values for each of the possible branches of the trellis 2300. This is performed using normalization and saturation in order to reduce the total number of trellis metrics that need to be stored; by reducing the required memory storage from 16 down to 8, a memory savings of a factor of 2 is achieved. Similarly, normalization and saturation is performed in order to reduce the total number of extrinsic values that need to be stored for each input bit that is encoded. In prior art systems, there would be a need for 4 extrinsic values per information bit thereby requiring 8 extrinsic values for this embodiment which has 2 input bits (4 extrinsic values each for the 2 bits). However, the invention is able to reduce the total number of extrinsic values that need to be stored to only 2 per bit thereby achieving a memory savings by a factor of 2. The received metrics are calculated for each symbol, these metrics are transformed into trellis metrics, and the alphas, betas, and extrinsics are all calculated for each symbol according to the invention. Again, it is noted that the trellis 2300 shows one embodiment of how the invention may be implemented. The invention envisions other trellises that also may be implemented to support the variable code rate functionality as well.

Figure 46:
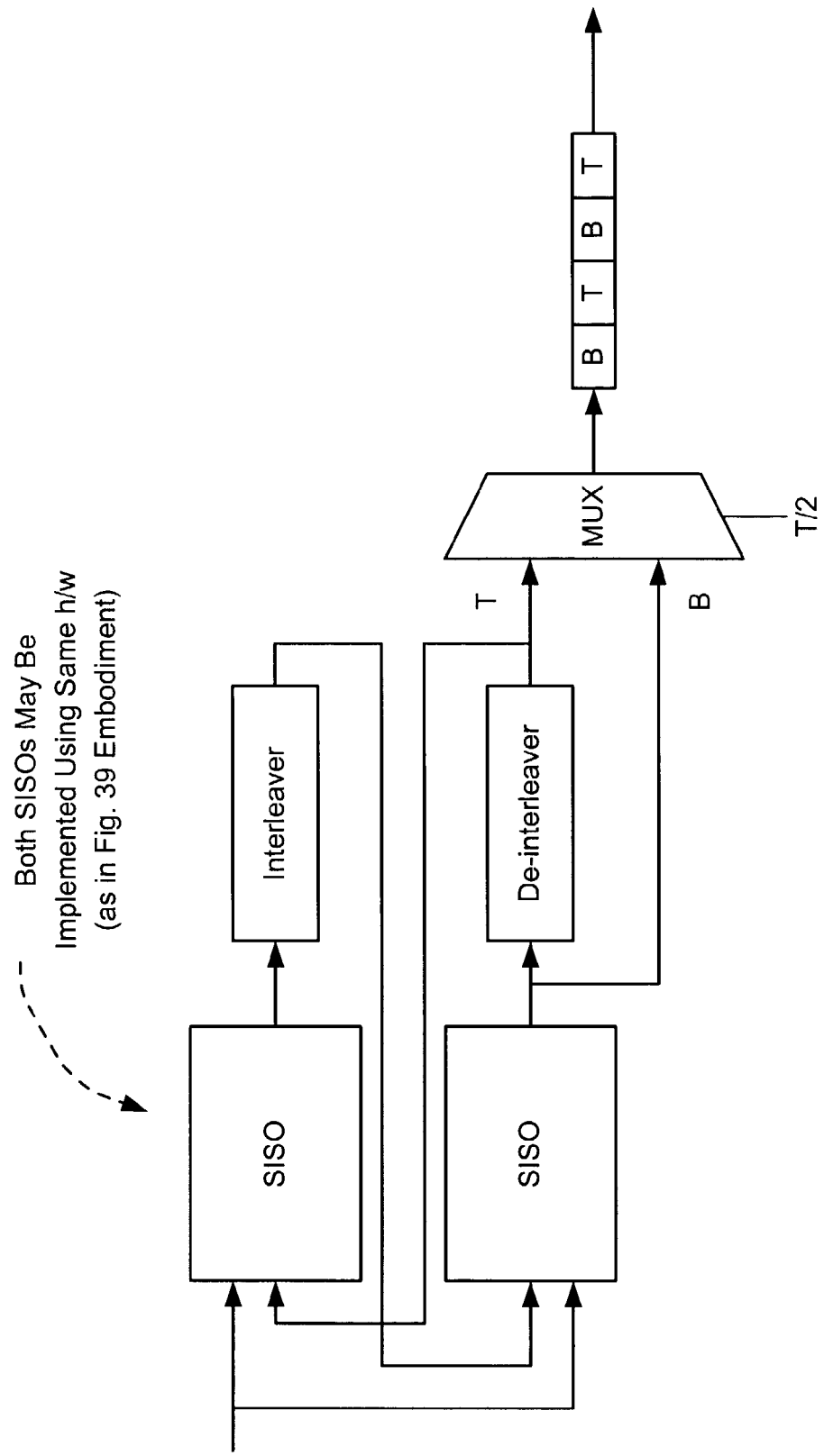
FIG. 46 is a diagram illustrating an embodiment of final output of decoding that is performed according to the invention.

FIG. 46 is a diagram illustrating an embodiment of final output of decoding that is performed according to the invention. In the situation where there may be only one SISO, then the odd symbol should be taken before de-interleave and the even symbol should be taken after de-interleave.

In a similar manner to the ordering in which the encoding may be performed (as described within the embodiment of the FIG. 13, for example), the order of the input symbols should be preserved upon decoding. The final output of decoding ensures the following: when we input a symbol sequence, $S_1 S_2 S_3 S_4$, to the encoder, and then when the following encoded symbols ($S_{1-enc} S_{2-enc} S_{3-enc} S_{4-enc}$) are received by the decoder, then the decoded estimates of these received symbols will maintain this sequential order. A MUX whose selection is provided by a clock signal that is clocked at 1/2 the rate will alternatively select the outputs from the output and input of the de-interleaver that is communicatively coupled to the lower SISO. This MUX in the FIG. 46 may be viewed as being within the output processor 3730 within either of the FIG. 38 or 39. The FIG. 46 shows an embodiment of how this may be performed in the final decoding step.

Figure 47:
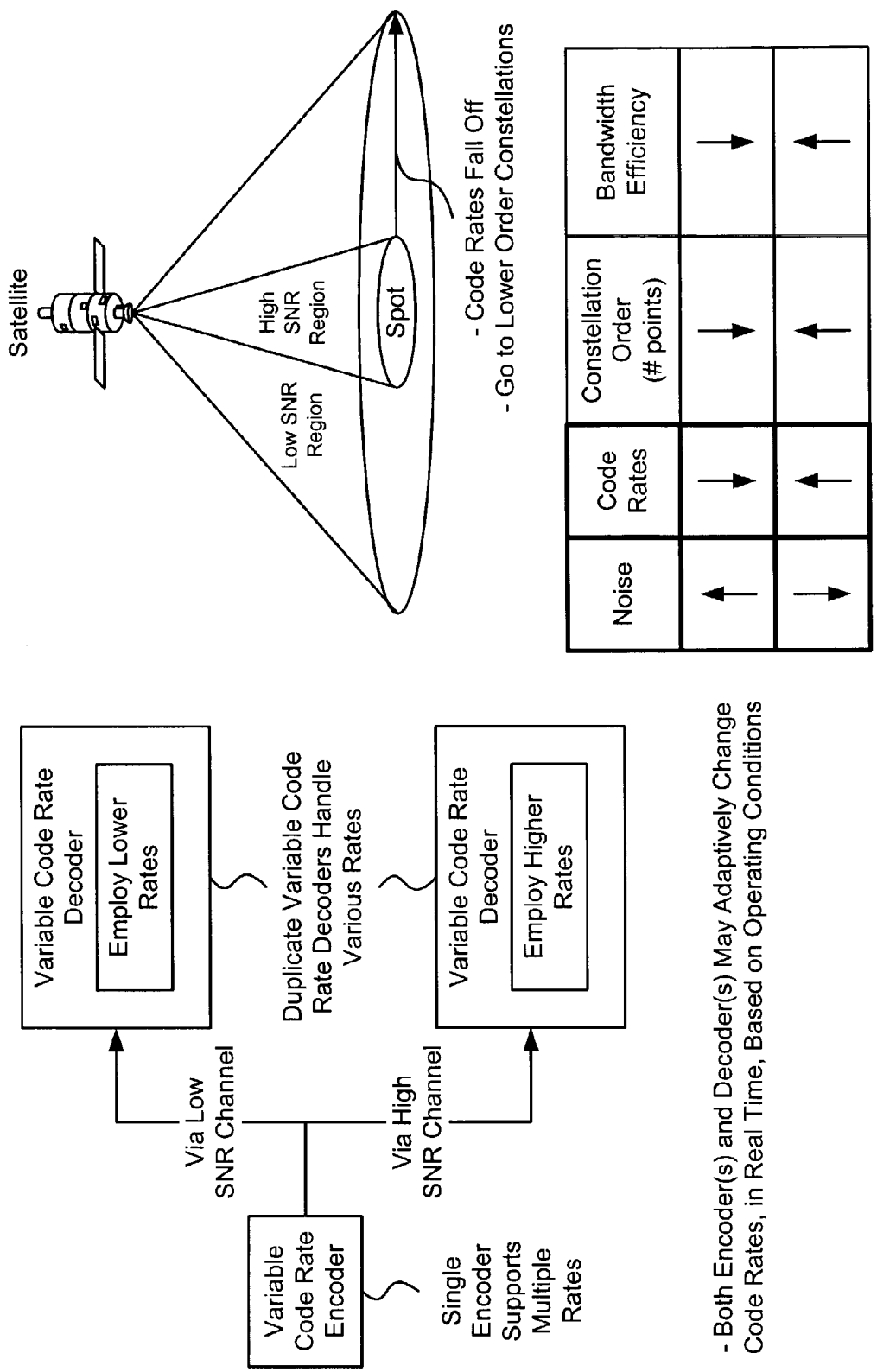
FIG. 47 is a diagram illustrating an embodiment of a variable code rate codec (encoder/decoder) servicing channels of various SNRs according to the invention.

FIG. 47 is a diagram illustrating an embodiment of a variable code rate codec (encoder/decoder) servicing channels of various SNRs according to the invention. A variable code rate encoder is operable to transit/broadcast simultaneously to multiple variable code rate decoders. When the communication channel that communicatively couples to one of the variable code rate decoders is of a low SNR, then the lower code rates may be employed when coding data for use by the variable code rate decoder. Analogously, when the communication channel that communicatively couples to one of the variable code rate decoders is of a high SNR, then the higher code rates may be employed when coding data for use by the variable code rate decoder. In addition, either one or both of the encoder and the decoder employed may adaptively change the rate control sequence, in real-time, based on the operating conditions of the communication channel; after there has been a change to a new rate control sequence, then both the encoder and the decoder will now operate at that new rate control sequence.

The rate control sequence to be employed when encoding and subsequently decoding information may be selected based on the given bandwidth of a communication channel. The rate control sequence is then selected, based on the bandwidth of the communication channel, as including the RCs that provide for the best performance (such as the grouping of RCs that provides for the lowest Bit Error Rate (BER)). This selection of which rate control sequence to employ may also be performed based on the application that is being used. For example, in some data applications, a slight latency in the delivery of information may sometimes be tolerated. However, in other applications, such as video or Voice over Internet Protocol (VOIP) applications, the latency will degrade the performance significantly. The inclusion of such parameters may be employed when selecting which RCs to be employed within a given rate control sequence.

Generally speaking, as the noise of the channel increases, the coding may select a new code rate as provided by a new rate control sequence. This new code rate (when channel noise increases) may employ employs RCs with constellations of lower order (having a fewer number of constellation points) and/or operate at lower bandwidth efficiencies (fewer information bits per symbol). Similarly, as the noise of the channel decreases, the coding may select a new rate control sequence. This new code rate (when channel noise decreases) may employ employs RCs with constellations of higher order (having a larger number of constellation points) and/or operate at higher bandwidth efficiencies (more information bits per symbol).

This variable code rate functionality, including the adaptive functionality thereof, may be implemented in a variety of contexts to provide for overall improvement in the communication system. One embodiment may include varying the rates to accommodate the different SNR regions within wireless transmission from a satellite to subscribers on the earth. A direct path from the satellite may be viewed as generating a beam spot that would likely have a SNR that is higher than the evanescent regions of the wireless transmission where the field will fall off. The variable code rate functionality, according to the invention, may be used to support different rates to these various regions. In such an implementation, a maximal throughput may be achieved by tailoring the code rate to the communication to a particular receiver based on the highest SNR that the channel to that receiver may support.

Moreover, the invention envisions modifying the code rate based on changes to the SNR of the channel as well; the device at either end of the communication channel may perform the measurement of the communication system's operating conditions including the SNR of various portions of the channel. This is also described above wherein either one or both of the transmitter and the receiver may be employed to monitor such parameters and to change the rate control sequence to be employed based on these parameters. Both the encoder and decoder then will move to the new rate control sequence synchronously to ensure proper communication of information.

FIG. 48 is a table illustrating an embodiment of a mapping of trellis output vs. metric index 4800 according to the present invention. In this embodiment, the trellis outputs are those associated with the trellis 2300 of the FIG. 23. The table of the FIG. 48 shows the mapping for all of the RCs that are described above in greater detail. As mentioned above, the received symbol metrics (received metric=$M_r$), indexed according to the modulation (constellation and mapping) according to the RC (as provided by the rate control sequencer 1150), are then passed to a functional block that transforms these received metrics to trellis metrics (trellis metric=$M_t$). These trellis metrics are then used to calculate the alphas, betas, and extrinsics within the SISO. These alphas, betas, and extrinsics may be calculated using a min* approach according to the invention. Alternatively, these alphas, betas, and extrinsics may be calculated using a min, max, and/or max* approach according to the invention.

A specific example is given above that shows how this mapping to the trellis is performed according to RC 8. By extension, the FIG. 48 shows how the mapping is performed for all 16 of the RCs supported by the rate 2/5 prototype encoder 2000 that employs the trellis 2300. Within the FIG. 48, M denotes the MAX (the maximum metric value) for the metrics, and this is used to define the "least likelihood probability" according to this embodiment's convention. It is noted that such a table that maps trellis metric outputs vs. metric index may also be constructed for an alternative embodiment that employs another encoder and another trellis within the TTCM context.

FIG. 49 is a table illustrating an embodiment of trellis outputs mapped to metric outputs (without flags) 4900 according to the present invention. FIG. 50 is a table illustrating an embodiment of trellis outputs mapped to metric outputs (with flags) according to the present invention. Each of the FIGS. 49 and 50 are embodiments of the table within the FIG. 48. The FIG. 49 shows those RCs that do not employ flags, and the FIG. 50 shows those RCs that employ flags; these RCs are specifically those RCs 8,9&5. By employing these flags, we need not send the RC information to the SISO. This will allow savings of memory.

As mentioned above, we compare the metric associated with uncoded bit (u=0) with the metric associated with uncoded bit (u=1), and we select the smaller metric value. The smaller metric value is deemed a higher likelihood than the larger metric value according to this embodiment's convention. We also select value of u based on which metric has the smaller value. We select the possible value of the uncoded bit u to be 1 or 0 as determined by which of the associated metrics has the smaller value (metric associated with uncoded bit (u=0) or the metric associated with uncoded bit (u=1)). In many of these embodiments that follow, we perform a min* operation that includes a logarithmic correction in selecting the smaller metric. Alternatively, a min, max, or max* approach may be used without departing from the scope and spirit of the invention. Several of the following embodiments and possible implementation in hardware show how these operations may actually be performed.

Figure 51:
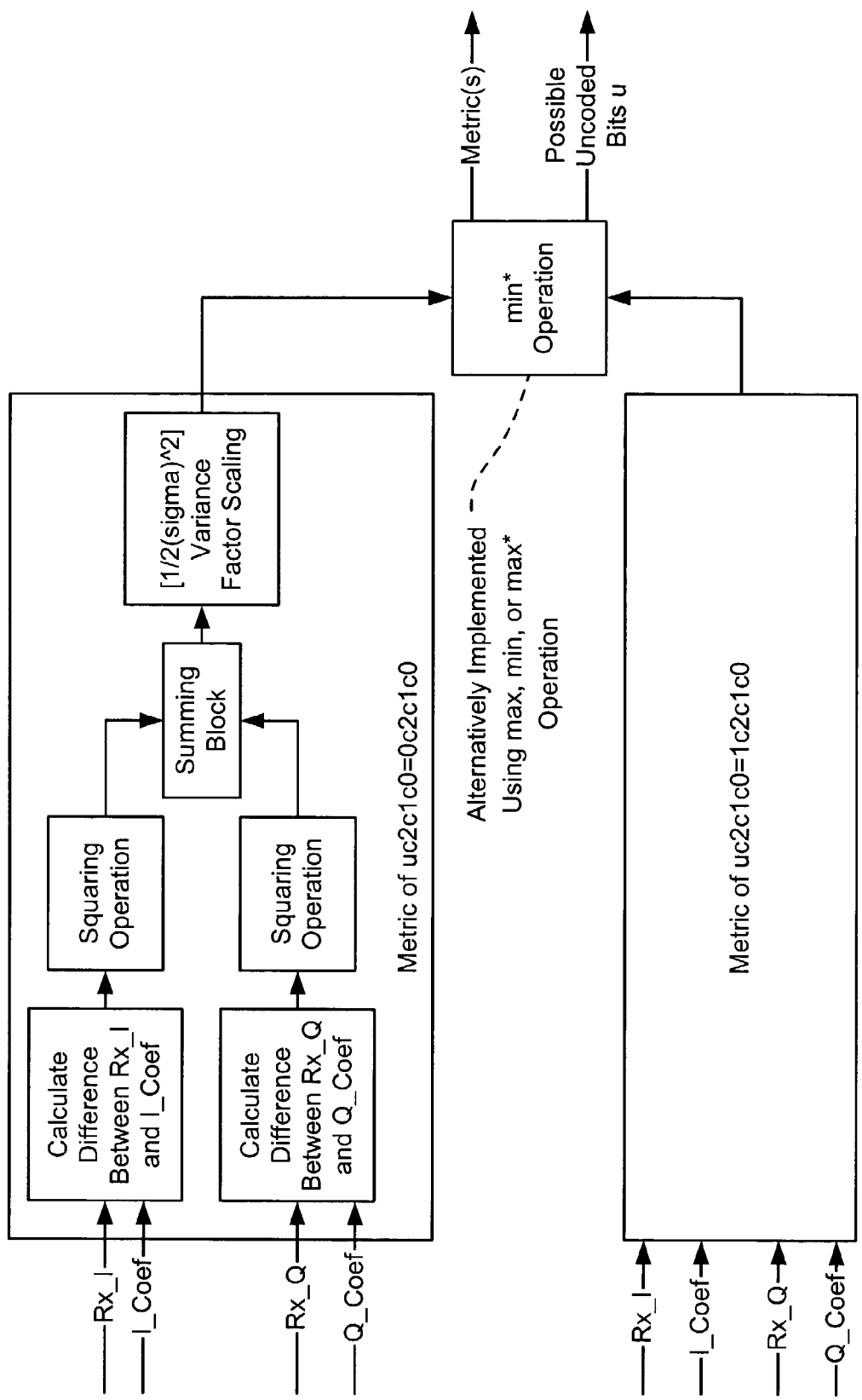
FIG. 51 is a metric generator functional block diagram (embodiment 1) that is built according to the invention.

FIG. 51 is a metric generator functional block diagram (embodiment 1) 5100 that is built according to the invention. For the two possible metrics (one associated with uncoded bit (u=1) and the other with uncoded bit (u=0)), we calculate the metrics thereof and pass these outputs to a min* processing block to perform the min* operation. Alternatively, a min, max, or max* processing block may be implemented to perform a min, max, and/or max* operation. The received I,Qs are provided simultaneously to a block that calculates the metric of uc2c1c0=0c2c1c0 and also to a block that calculates the metric of uc2c1c0=1c2c1c0. Each of these two blocks also receives the coefficients corresponding to an expected location of an I,Q of a received symbol within a constellation. Each of these coefficients are also provided to these two blocks. In the FIG. 51, I_Coef and Q_Coef, respectively, correspond to the I,Q values of a particular constellation point within a modulation.

The differences between the received I,Qs (Rx_I and Rx_Q) and the coefficients (I_Coef and Q_Coef) are initially calculated. The magnitude of these differences are then squared using a squaring operation. The resulting squared values are then summed together in a summing block. Afterwards, a factor of [1/2sigma^2] is employed to scale this result to accommodate for the SNR of the received symbol in determining this metric. The resulting output of this top block in the FIG. 50 then provides the following result.

Metric(0c2c1c0)=1/(2sigma^2)*[(*Rx_I–I*_Coef)^2+ (*Rx_Q–Q*_Coef)^2]

Again, the scaling of this distance is made using variance factor scaling [1/(2sigma^2)] (where sigma is the standard deviation of the normalized noise of the received symbol). The I_Coef and the Q_Coef are the expected locations (in terms of I,Q) at which the received symbol is expected to be mapped (constellation point location), and Rx_I and Rx_Q are the actual I,Q locations at which the received symbol is mapped.

This operation is analogously performed for the metric of uc2c1c0=1c2c1c0. The result for the bottom block is as follows:

Metric(1c2c1c0)=1/(2sigma^2)*[(Rx_I-I_Coef)^2+ (Rx_Q-Q_Coef)^2]

These two metrics undergo a min* operation to generate the following metric to determine the smaller metric while also including the log correction provided by the min* operation. In addition, we also have identified the possible uncoded bit value that is indexed by this metric.

Figure 52:
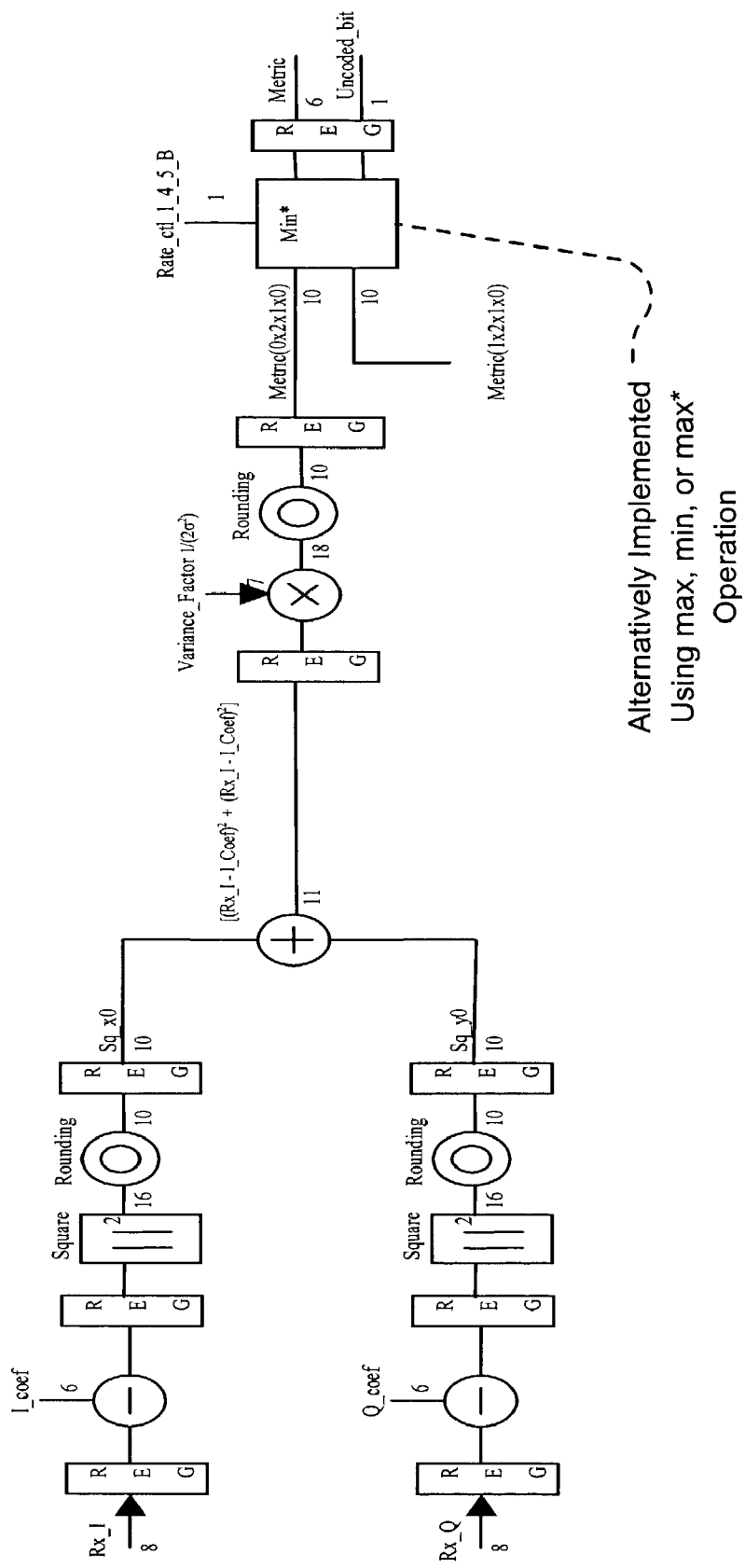
FIG. 52 is a diagram illustrating a possible implementation of the metric generator functional block diagram (embodiment 1) shown within the FIG. 51.

FIG. 52 is a diagram illustrating a possible implementation of the metric generator functional block diagram (embodiment 1) 5100 shown within the FIG. 51. Here, we show only the metric used to calculate the metric of uc2c1c0=0c2c1c0, and the metric of uc2c1c0=1c2c1c0 may be understood as analogous in representation and whose output is provided to the min* block on the right hand side of the FIG. 52. Alternatively, a min, max, and/or max* block may be implemented to perform a min, max, and/or max* operation.

In this implementation as well as others described below, the element REG refers to a register that may be used to buffer and store data temporarily.

Herein, we receive Rx_I and Rx_Q which are the actual I,Q locations at which the received symbol is mapped. Subtraction blocks are employed to find the difference between the I_Coef and the Q_Coef and the Rx_I and Rx_Q, namely, the terms (Rx_I-I_Coef) and (Rx_Q-Q_Coef). These resulting differences are squared in value to generate the terms (Rx_I-I_Coef)^2 and (Rx_Q-Q_Coef)^2, and they are maintained at a predetermined precision. These results may be rounded to a number of less precision. Then, a summing block is used to calculate the sum of (Rx_I-I_Coef)^2+(Rx_Q-Q_Coef)^2.

We employ a scaling factor of Variance Factor [1/(2sigma^2)] to scale this result of [(Rx_I-I_Coef)^2+(Rx_Q-Q_Coef)^2] to accommodate for the SNR of the received symbol in determining this metric. Again, rounding of this term may also be performed. This will again result in the metric of uc2c1c0=0c2c1c0.

Similar operations are performed below of the metric of uc2c1c0=1c2c1c0. These two metrics undergo a min* operation to generate a metric for uc2c1c0 and also a possible uncoded bit value that is indexed by this metric.

Figure 53:
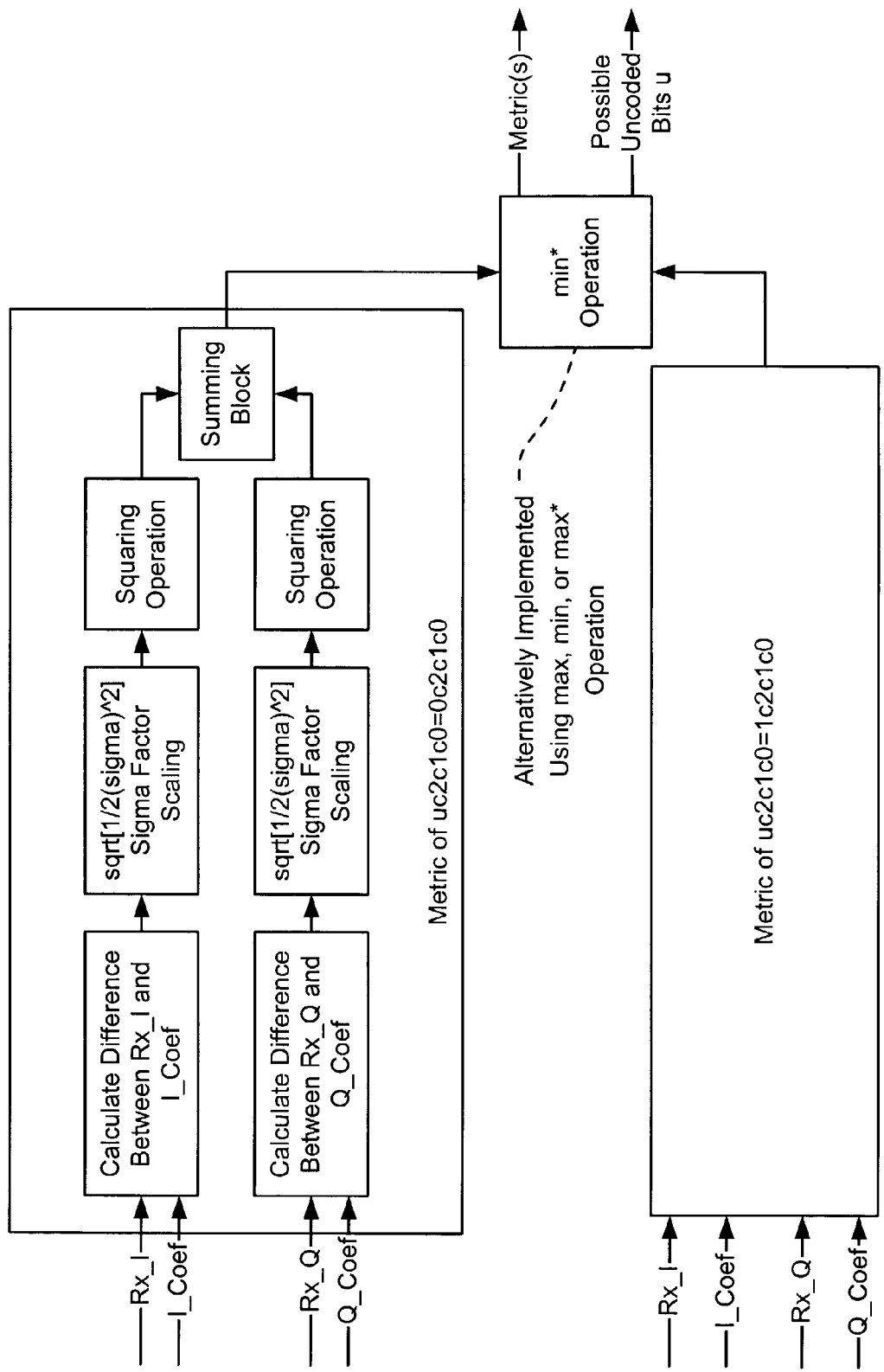
FIG. 53 is a metric generator functional block diagram (embodiment 2) that is built according to the invention.

FIG. 53 is a metric generator functional block diagram (embodiment 2) 5300 that is built according to the invention. Mathematically, we employ this embodiment 2 of FIG. 53 to determine the same metric that we determined above in the embodiment 1 of FIG. 51. However, we employ our scaling to accommodate for the SNR of the received symbol at a different location in determining the metrics in this embodiment. This relocation of the processing step provides hardware savings. Other embodiments also manipulate the location of where they employ the scaling to accommodate for the SNR of the received symbol will also provides hardware savings.

Similarly, for the two possible metrics (one associated with uncoded bit (u=1) and the other with uncoded bit (u=0)), we calculate the metrics thereof and pass these outputs to a min* processing block to perform the min* operation. Alternatively, a min, max, and/or max* processing block may be implemented to perform a min, max, and/or max* operation. The received I,Qs are provided simultaneously to a block that calculates the metric of uc2c1c0=0c2c1c0 and also to a block that calculates the metric of uc2c1c0=1c2c1c0. Each of these two blocks also receives the coefficients corresponding to an expected location of an I,Q of a received symbol within a constellation. Each of these coefficients is also provided to these two blocks. In the FIG. 53, I_Coef and Q_Coef, respectively, correspond to the I,Q values of a particular constellation point within a modulation.

The differences between the received I,Qs (Rx_I and Rx_Q) and the coefficients (I_Coef and Q_Coef) are calculated. Each of these differences is then scaled. A sigma factor of sqrt[1/2sigma^2]=[0.7071/sigma] is employed to scale this result to accommodate for the SNR of the received symbol in determining this metric. This sigma factor of sqrt[1/2sigma^2] is the square root, mathematically, of the variance factor of [1/2sigma^2]. The resulting, scaled values are squared, and their results are then summed together in a summing block.

The resulting output of this top block in the FIG. 53 then provides the following result.

Metric(0c2c1c0)=[[0.7071/sigma]*(Rx_I-I_Coef)]^2+[[0.7071/sigma]*(Rx_Q-Q_Coef)]^2

Again, the scaling of this distance has been made by a factor of [1/(2sigma^2)] (where sigma is the standard deviation of the normalized noise of the received symbol). The scaling is performed before the squaring operation, yet the squaring operation ensures that we have a similar result as we did in the FIG. 51 for the metric of uc2c1c0=0c2c1c0.

This operation is analogously performed for the metric of uc2c1c0=1c2c1c0. The result for the bottom block is again as follows:

Metric(1c2c1c0)=[[0.7071/sigma]*(Rx_I-I_Coef)]^2+[[0.7071/sigma]*(Rx_Q-Q_Coef)]^2

These two metrics undergo a min* operation to generate the following metric to determine the smaller metric while also including the log correction provided by the min* operation. In addition, we also have identified the possible uncoded bit value that is indexed by this metric.

Figure 54:
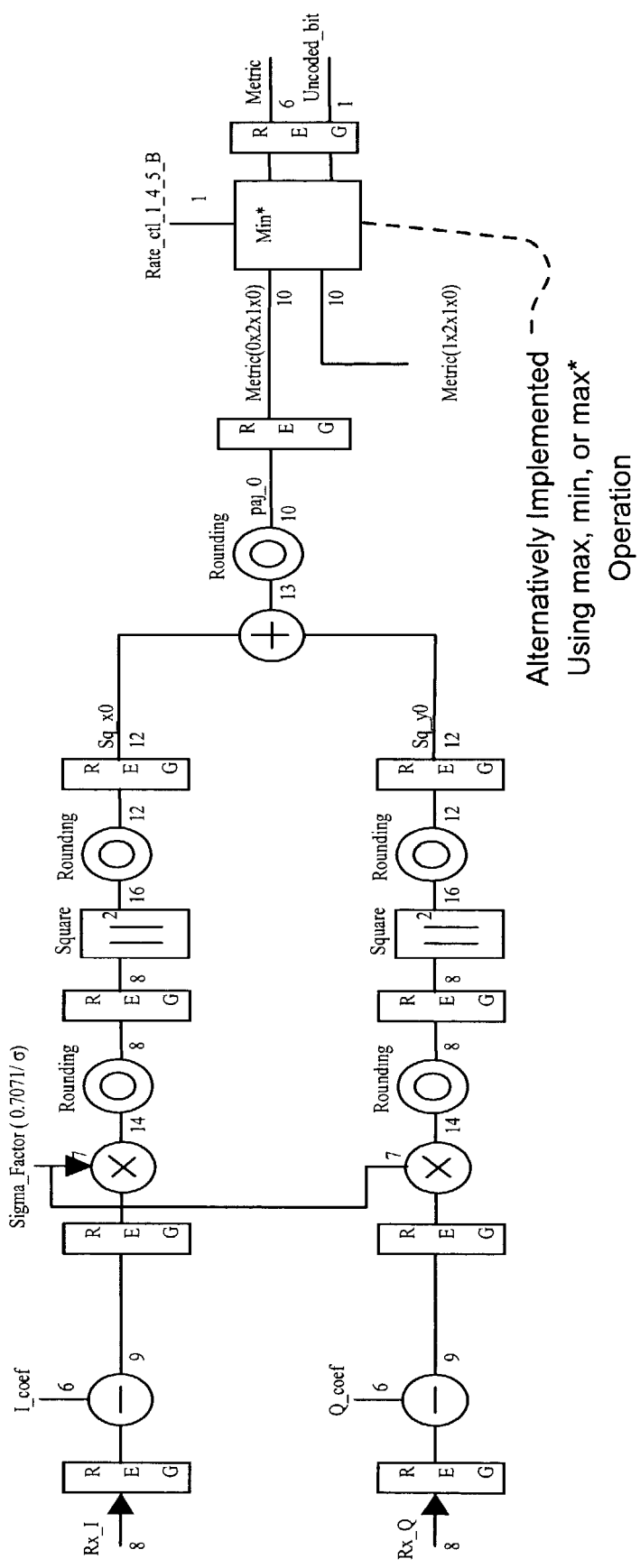
FIG. 54 is a diagram illustrating a possible implementation of the metric generator functional block diagram (embodiment 2) shown within the FIG. 53.

FIG. 54 is a diagram illustrating a possible implementation of the metric generator functional block diagram (embodiment 2) 5300 shown within the FIG. 53. The hardware implementation of the FIG. 54 is similar to the embodiment of FIG. 52, with the exception that a value of Sigma_Factor [0.7071/sigma] is employed to perform the scaling after the differences of (Rx_I-I_Coef) and (Rx_Q-Q_Coef) have been calculated. Again, this may provide hardware savings in certain embodiments. A number of gates may be saved in a hardware implementation that has a much lower complexity than the embodiment of the FIG. 52.

Figure 55:
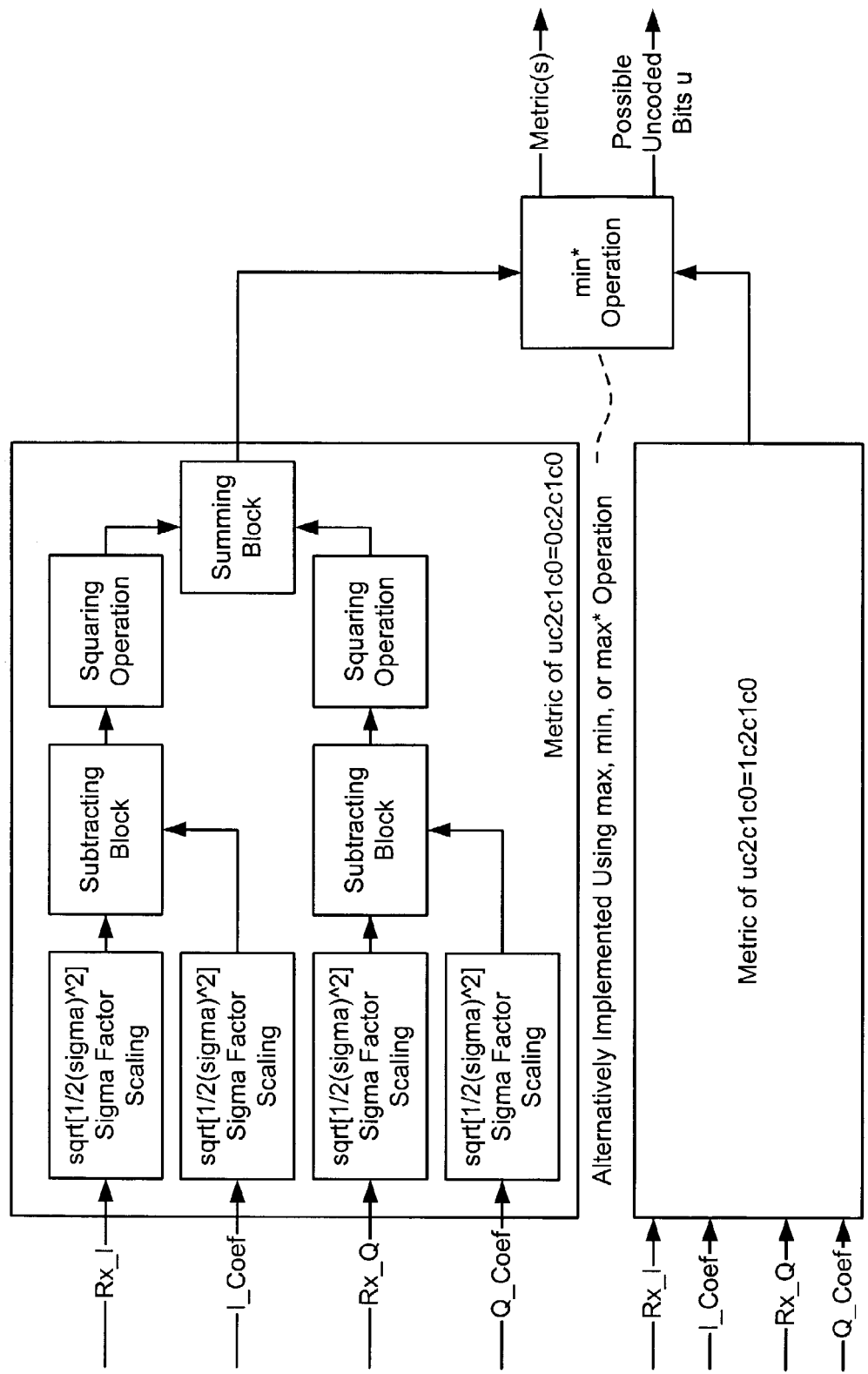
FIG. 55 is a metric generator functional block diagram (embodiment 3) that is built according to the invention.

FIG. 55 is a metric generator functional block diagram (embodiment 3) 5500 that is built according to the invention. Mathematically, we employ this embodiment 3 of FIG. 55 to determine the same metric that we determined above in the embodiment 1 of FIG. 51 and the in the embodiment 2 of FIG. 53. However, we employ our scaling to accommodate for the SNR of the received symbol at a different location in determining the metrics in this embodiment. This relocation of the processing step may provide some degree of hardware savings.

Similarly, for the two possible metrics (one associated with uncoded bit (u=1) and the other with uncoded bit (u=0)), we calculate the metrics thereof and pass these outputs to a min* processing block to perform the min* operation. Alternatively, a min, max, and/or max* processing block may be implemented to perform a min, max and/or max* operation. The received I,Qs are provided simultaneously to a block that calculates the metric of uc2c1c0=0c2c1c0 and also to a block that calculates the metric of uc2c1c0=1c2c1c0. Each of these two blocks also receives the coefficients corresponding to an expected location of an I,Q of a received symbol within a constellation. Each of these coefficients is also provided to these two blocks. In the FIG. 55, I_Coef and Q_Coef, respectively, correspond to the I,Q values of a particular constellation point within a modulation.

We immediately scale all of these input values, namely, the received I,Qs (Rx_I and Rx_Q) and the coefficients (I_Coef and Q_Coef) are all scaled using a sigma factor of sqrt[1/2sigma^2]=[0.7071/sigma] that is employed to scale this result to accommodate for the SNR of the received symbol in determining this metric. By performing the scaling here, this correction factor will be carried through in all of the remaining operations. If desired, this scaling may be performed within a receiver that includes this decoder functionality; this scaling may be performed during pre-processing before initiating the decoding operations shown here.

The differences between the now-scaled received I,Qs (Rx_I and Rx_Q) and the now-scaled coefficients (I_Coef and Q_Coef) are then calculated. The resulting, scaled values are squared, and their results are then summed together in a summing block.

The resulting output of this top block in the FIG. 55 then provides the following result.

Metric(0c2c1c0)=[0.7071/sigma*Rx_I−0.7071/sigma*I_Coef]^2+[0.7071/sigma*Rx_Q−0.7071/sigma*Q_Coef)]^2

Again, the scaling of this distance has been made by a factor of [1/(2sigma^2)] (where sigma is the standard deviation of the normalized noise of the received symbol). The scaling is performed before the squaring operation, yet the squaring operation ensure we have a similar result as we did in the FIG. 51 for the metric of uc2c1c0=0c2c1c0.

This operation is analogously performed for the metric of uc2c1c0=1c2c1c0. The result for the bottom block is again as follows:

Metric(1c2c1c0)=[0.7071/sigma*Rx_I−0.7071/sigma*I_Coef]^2+[0.7071/sigma*Rx_Q−0.7071/sigma*Q_Coef)]^2

These two metrics undergo a min* operation to generate the following metric to determine the smaller metric while also including the log correction provided by the min* operation. In addition, we also have identified the possible uncoded bit value that is indexed by this metric.

Figure 56:
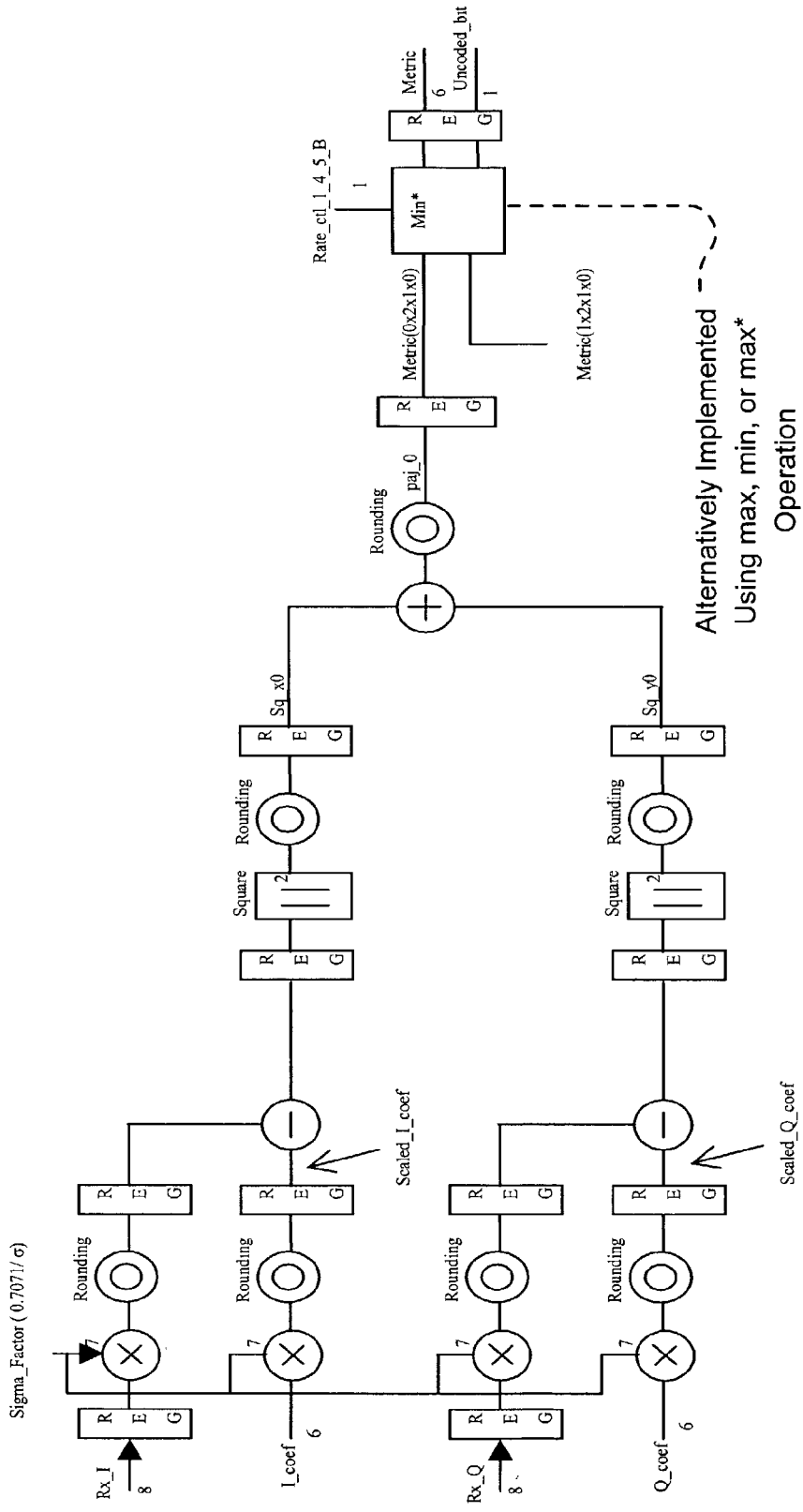
FIG. 56 is a diagram illustrating a possible implementation of the metric generator functional block diagram (embodiment 3) shown within the FIG. 55.

FIG. 56 is a diagram illustrating a possible implementation of the metric generator functional block diagram (embodiment 3) 5500 shown within the FIG. 55. The hardware implementation of the FIG. 56 is similar to the embodiment 1 of FIG. 52 and the embodiment 2 of FIG. 54, with the exception that a value of Sigma_Factor [0.7071/sigma] is employed to perform the scaling of each of the values, Rx_I, I_Coef, Rx_Q, and Q_Coef. Again, this may provide hardware savings in certain embodiments. A number of gates may be saved in a hardware implementation that has a lower complexity than the either of the embodiments of the FIG. 52 and the FIG. 54.

Figure 57:
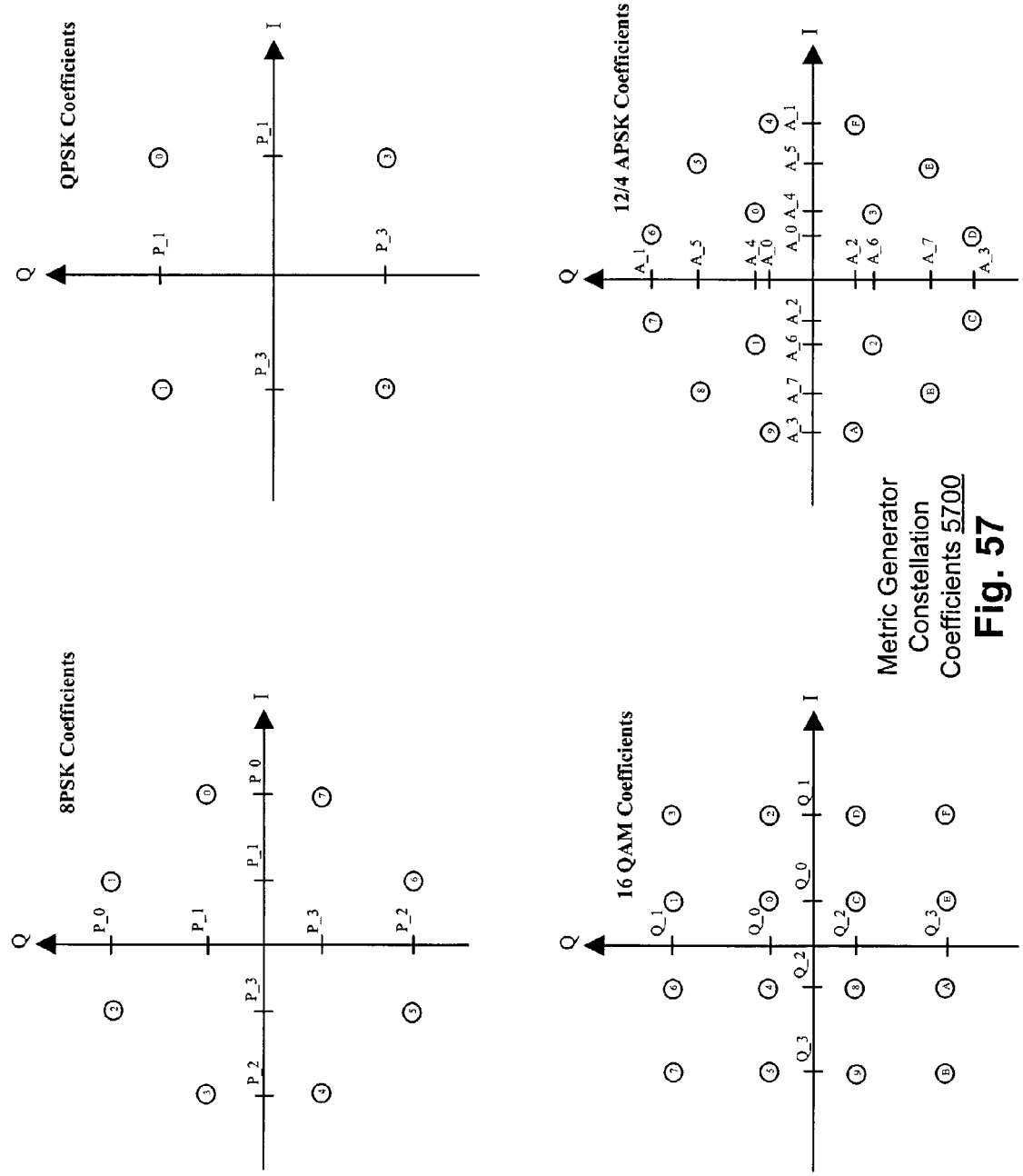
FIG. 57 is a diagram illustrating metric generator constellation coefficients that are used for 8 PSK, QPSK, 16 QAM, and 12/4 APSK modulations according to the invention.

FIG. 57 is a diagram illustrating metric generator constellation coefficients 5700 that are used for 8 PSK, QPSK, 16 QAM, and 12/4 APSK modulations according to the invention. FIG. 58 is a table illustrating an embodiment of constellation coefficient selection based on RC according to the invention. The FIGS. 57 and 58 may be viewed together for a clearer understanding of the coefficients selected for the various RCs.

Here, we employ the symmetry of the constellation points, with respect to the I,Q axes of the I,Q plane, so that we may subsequently perform only addition when determining the "differences" that are necessary within the context of performing metric calculations according to the invention. These differences being the differences between the I_Coef and the Q_Coef (the expected locations, in terms of I,Q, at which the received symbol is expected to be mapped), and Rx_I and Rx_Q (which are the actual I,Q locations at which the received symbol is mapped).

In the above embodiments, if we could capitalize on the symmetry of a constellation point with another constellation point within a given modulation, then we could properly determine the "difference" between the two points by performing addition instead of subtraction.

For example: If we assume we can find a value that is the negative of I_Coef within the constellation (where y=−I_Coef), then the difference of (Rx_I−I_Coef) may be calculated as the sum (Rx_I+y). In doing this, we can reduce the gate count of hardware used to implement this thereby providing a lower complexity. As one example, we see in the QPSK modulation of the FIG. 57 that the 4 constellation points are symmetrically arranged around the origin, and the values of P_1 and P_3 along the I axis are opposites of one another (P_1=−P_3). In addition, given the symmetry of the constellation, we may also use the same values for these coefficients along the Q axis as well. For example, all 4 of the constellation points in the QPSK modulation of the FIG. 57 may be represented using the two values of P_1 and P_3. The symmetry within other modulations may similarly be capitalized upon as shown within the modulations of the FIG. 57 and the table within the FIG. 58.

Figure 59:
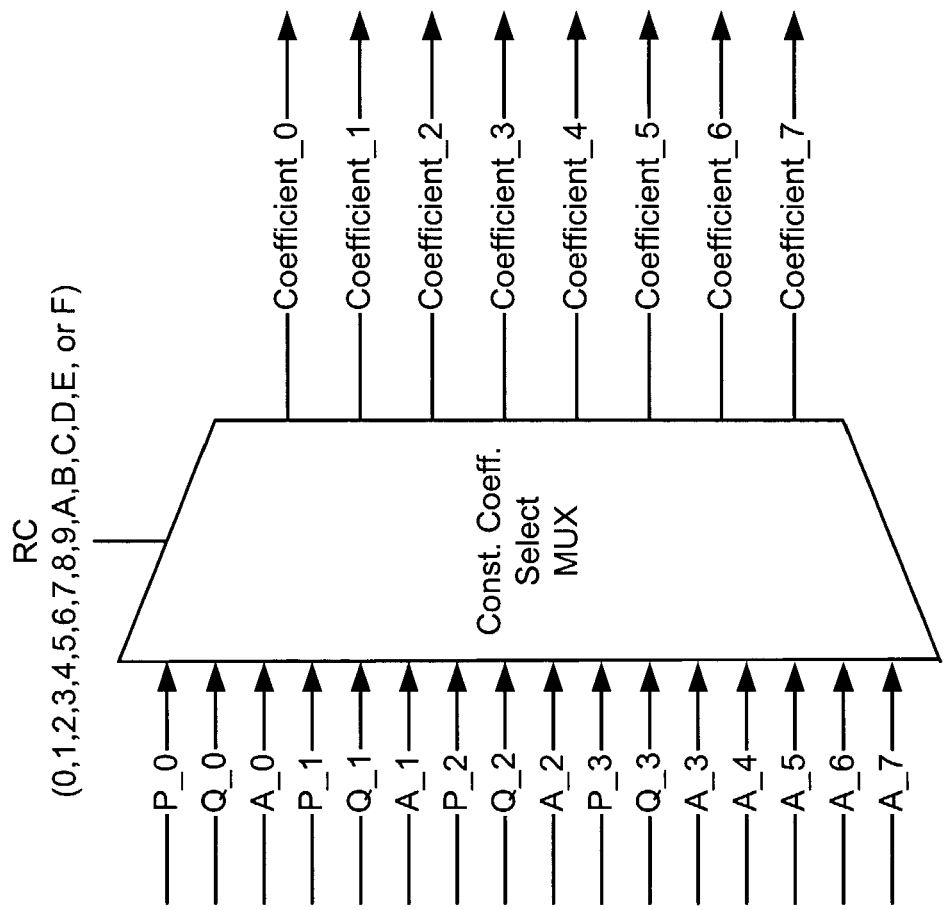
FIG. 59 is a diagram illustrating an implementation of constellation coefficient selection, based on the table of the FIG. 58, that is performed according to certain aspects the invention.

FIG. 59 is a diagram illustrating an implementation of constellation coefficient selection, based on the table of the FIG. 58, that is performed according to certain aspects the invention. A constellation coefficient MUX selects the appropriate constellation coefficients to be used to decode a particular symbol based on the RC provided to decode a particular symbol. The constellation coefficient MUX selects the constellation coefficients (shown as Coefficient_0 Coefficient_1, Coefficient_2, Coefficient_3, Coefficient_4, Coefficient_5, Coefficient_6, and Coefficient_7) from among the available, appropriately provided constellation coefficients shown within the table of the FIG. 58 (P_0, Q_0, A_0, P_1, Q_1, A_1, P_2, Q_2, A_2, A_3, A_3, and A_4). The multiplexed implementation of the constellation coefficient selection, capitalizing on the inherent symmetry of the constellation points within the various modulations, provides for much improved processing.

Each of the embodiments shown below in the FIGS. 60 and 61 may be viewed as being multiplexed implementations of the embodiments of the FIGS. 51 and 52.

Figure 60:
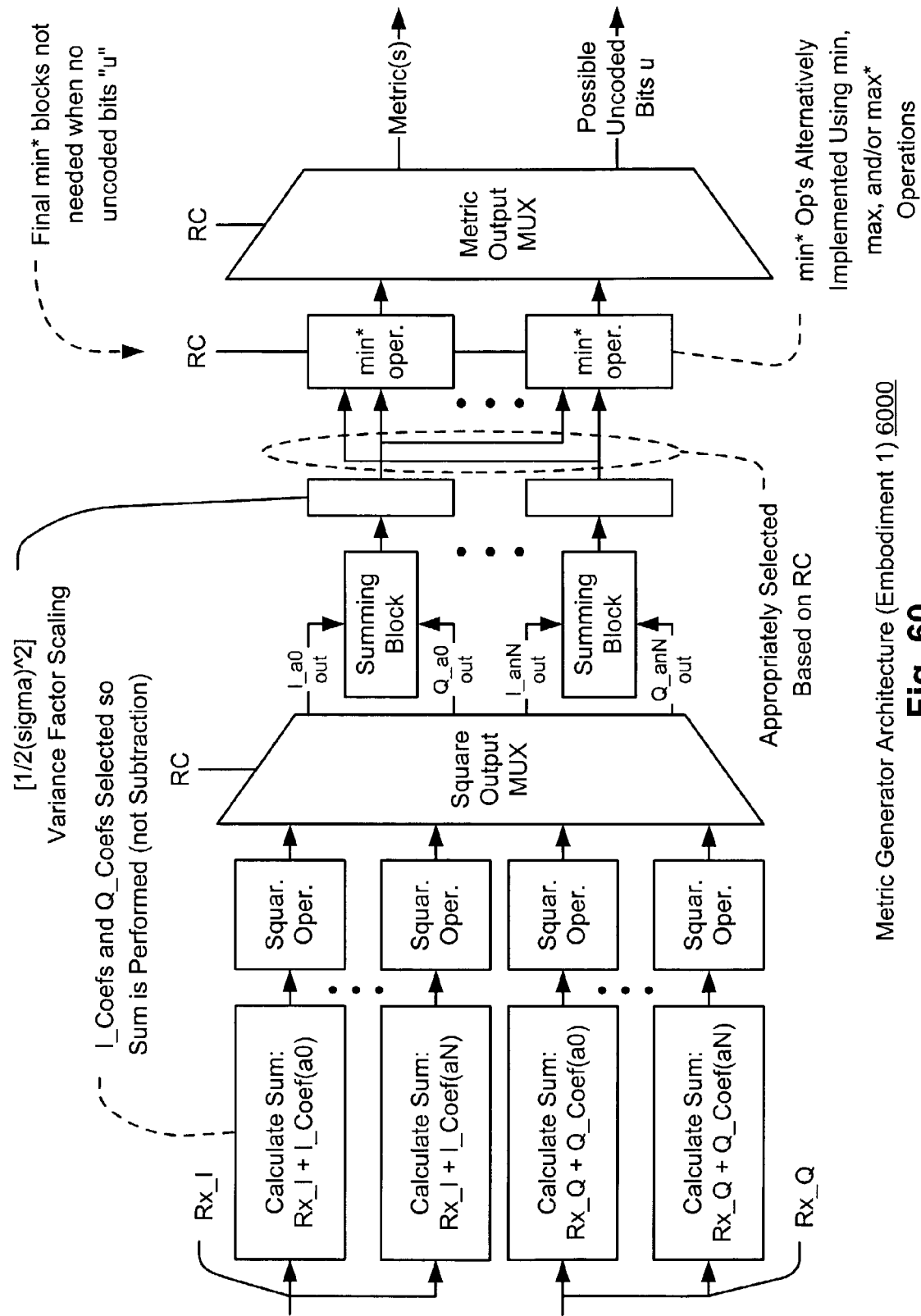
FIG. 60 is a diagram illustrating a metric generator architecture (embodiment 1) that is built according to the invention.

FIG. 60 is a diagram illustrating a metric generator architecture (embodiment 1) 6000 that is built according to the invention. To support a variety RCs according to the variable code rate functionality of the invention, a number of I,Q coefficients are employed, and the "differences" between a received symbol's I value (Rx_I) and a number of I coefficients (shown as an I_Coef(a0), . . . , and I_Coef(aN),) are all simultaneously calculated. Similarly, the "differences" between a received symbol's Q value (Rx_Q) and a number of Q coefficients (shown as an Q_Coef(a0), . . . , and Q_Coef(aN),) are all simultaneously calculated. It is noted that these "differences" are all calculated by using the symmetry of the constellations described above wherein only addition may be performed, and not subtraction, thereby providing hardware savings.

Each of these "differences" (generated by performing additions) undergoes a squaring operation, and these results are all provided to a square output MUX whose selector is governed by the RC. The appropriate terms are then selected to be summed together from the square output MUX. For example, the term (Rx_I+I_Coef(a0))^2, shown as I_a0 out, and term (Rx_Q+Q_Coef(a0))^2, shown as Q_a0 out, are summed together. These I-related outputs from the square output MUX may be viewed as being indicative of I-axis distances separating an I component of the received symbol and the predetermined I coefficients corresponding to the constellation points of the appropriate constellation based on the RC. Similarly, the Q-related outputs from the square output MUX may be viewed as being indicative of Q-axis distances separating a Q component of the received symbol and the predetermined Q coefficients corresponding to the constellation points of the appropriate constellation based on the RC. As will be seen in this embodiment and within other embodiments described below, these outputs from the square output MUX may undergo Variance factor scaling (as within this embodiment of the FIG. 60), or they may already include this correction by using Sigma factor scaling early ahead within the processing (as within this embodiments of the FIGS. 62 and 64).

This term, along with all of the other appropriate combinations undergo Variance factor scaling. These now-scaled values are then appropriately selected, using a metric output MUX, based on the RC to perform the min* processing for all of the appropriate combinations. Alternatively, min, max, and/or max* processing may be performed for all the appropriate combinations. It is noted here that these final min* blocks that precede the metric output MUX may be bypassed when decoding symbols that do not include any uncoded bits u; alternatively, one of the inputs to the min* blocks may simply be passed through these final min* blocks (for example, for min*(a,b), then a could simply be passed through to the metric output MUX). We then output a number of metrics (for all of the constellation points in the modulation) and possible uncoded bit values, when needed, indexed by each of those metrics.

The FIG. 60 shows a multiplexed embodiment that employs replicated versions of the embodiment 1 of the FIG. 51 support a variety of RCs and to simultaneously calculate all of the metrics during every clock cycle according to the invention. The multiplexing allows the supporting of different RCs that can each share the same hardware in the implementations.

Figure 61:
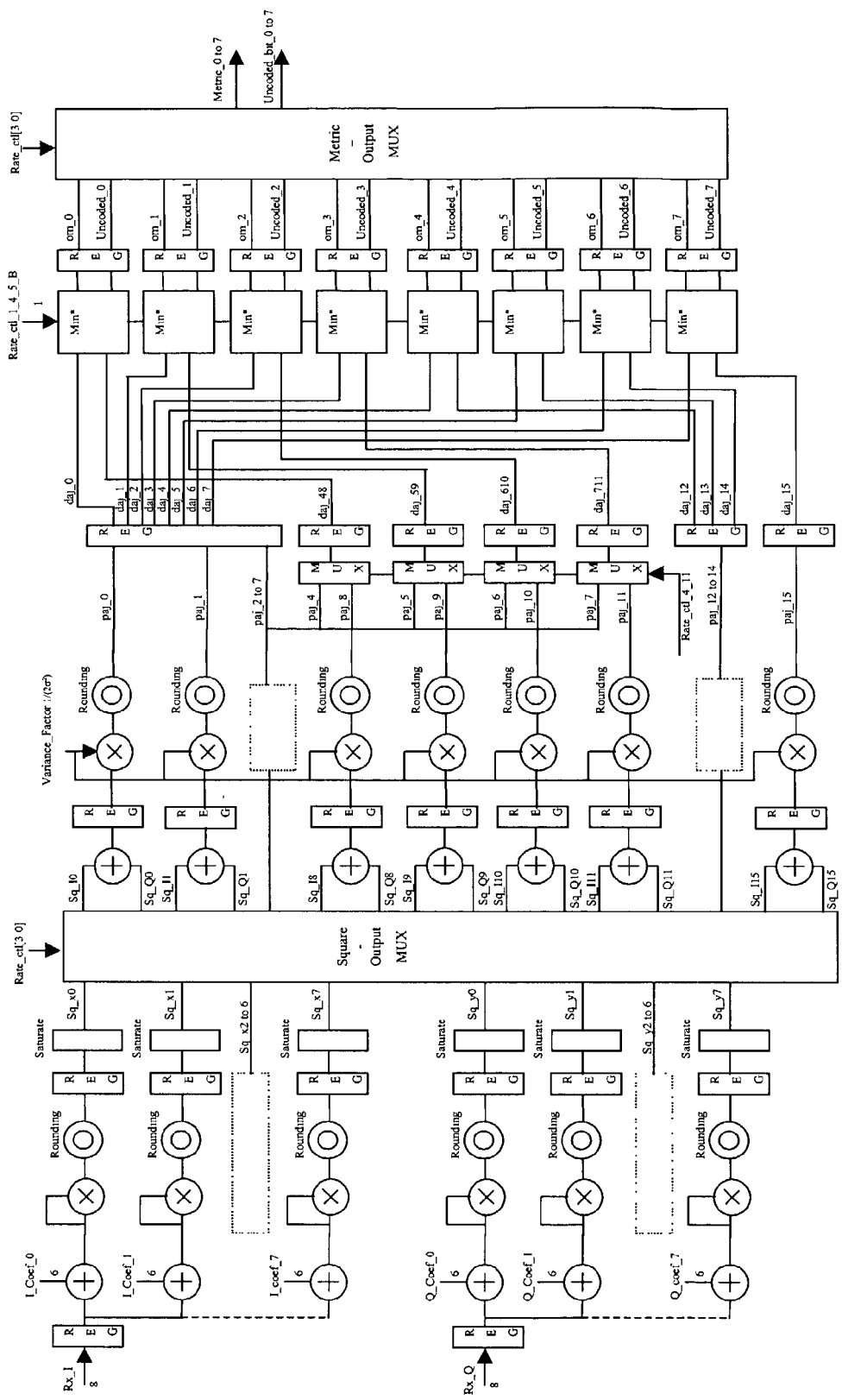
FIG. 61 is a diagram illustrating a possible implementation of the metric generator architecture (embodiment 1) shown within the FIG. 60.

FIG. 61 is a diagram illustrating a possible implementation of the metric generator architecture (embodiment 1) 6000 shown within the FIG. 60. The FIG. 61 shows a multiplexed embodiment that employs replicated versions of the implementation embodiment 1 of the FIG. 52 to support a variety of RCs and to simultaneously calculate all of the metrics during every clock cycle according to the invention. The multiplexing allows the supporting of different RCs that can each share the same hardware in the implementations.

However, this embodiment does not perform subtraction, but rather addition while borrowing on the constellation point symmetry according to the invention. In addition, the FIGS. 66, 67, 68, and 69 below show the selections which may be made within each of these particular embodiments of the square output MUX and the metric output MUX so that the appropriate combinations may be provided to the number of min* operation blocks. Each of these min* operation blocks outputs the metric and the possible uncoded bit value indexed by that metric.

The embodiment of the FIG. 61 employs the Variance Factor scaling to each of the outputs of the square output MUX, after the I,Q pairs have been grouped and summed together after being output from the square output MUX. This may be viewed as performing the Variance Factor scaling described above in the FIG. 52 to each of the outputs of the square output MUX, again, after the I,Q pairs have been grouped and summed together after being output from the square output MUX.

Each of the embodiments shown below in the FIGS. 62 and 63 may be viewed as being multiplexed implementations of the embodiments of the FIGS. 53 and 54.

Figure 62:
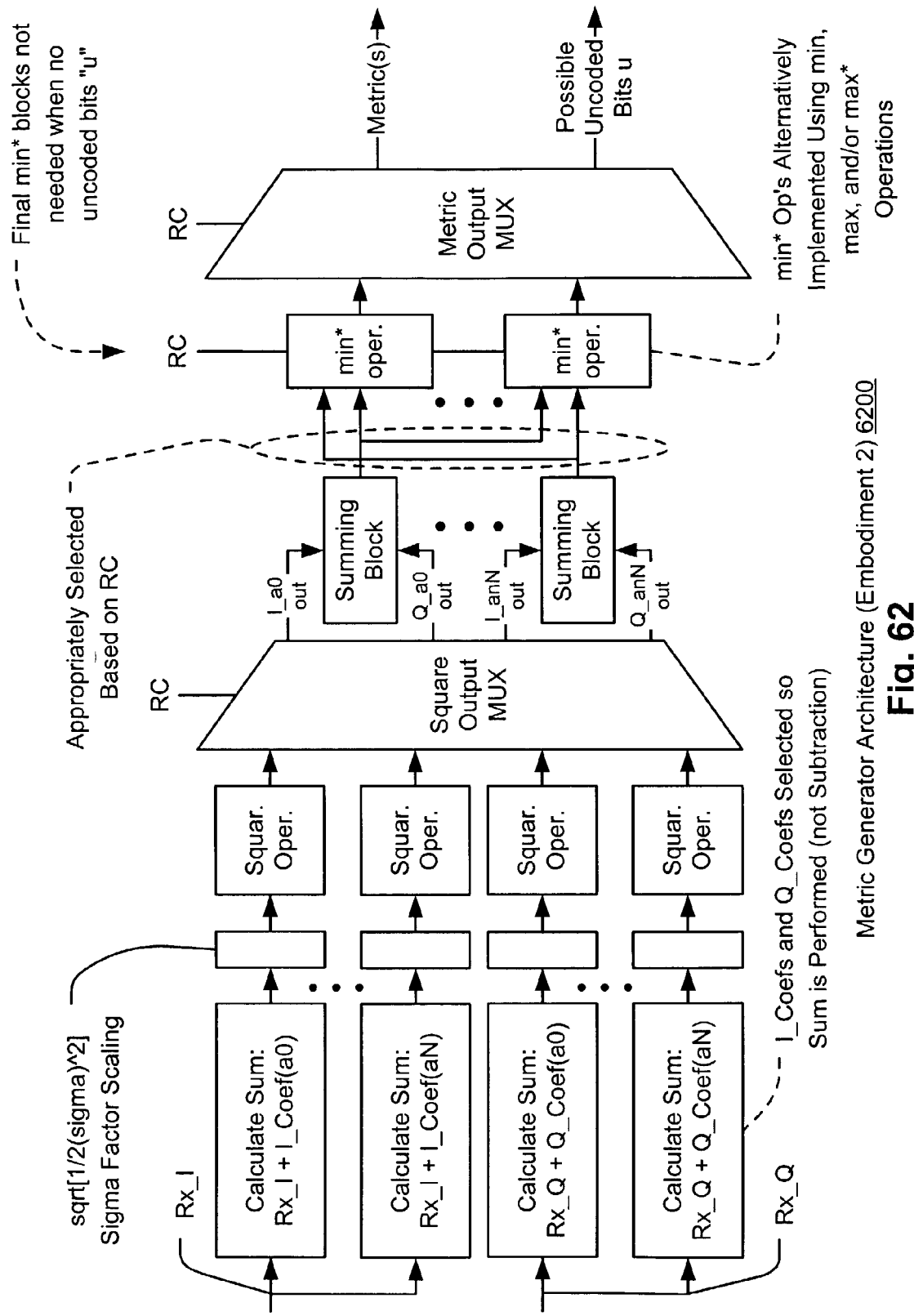
FIG. 62 is a diagram illustrating a metric generator architecture (embodiment 2) that is built according to the invention.

FIG. 62 is a diagram illustrating a metric generator architecture (embodiment 2) 6200 that is built according to the invention. The embodiment of the FIG. 62 shows a multiplexed version of the embodiment 2 of the FIG. 53 to support a variety of RCs. Similar to the embodiment of the FIG. 53, Sigma Factor scaling is performed to the "differences" of the terms (Rx_I+I_Coef(a0)), and the term (Rx_Q+Q_Coef(a0)) is performed before performing the squaring operation. The output of the FIG. 62 is functionally equivalent to the embodiment of the FIG. 60, with the exception that hardware savings may be achieved by performing the scaling earlier upstream in the processing.

As above with the embodiment of the FIG. 60, it is also noted here that these final min* blocks that precede the metric output MUX may be bypassed when decoding symbols that do not include any uncoded bits u; alternatively, one of the inputs to the min* blocks may simply be passed through these final min* blocks (for example, for min*(a,b), then a could simply be passed through to the metric output MUX).

Figure 63:
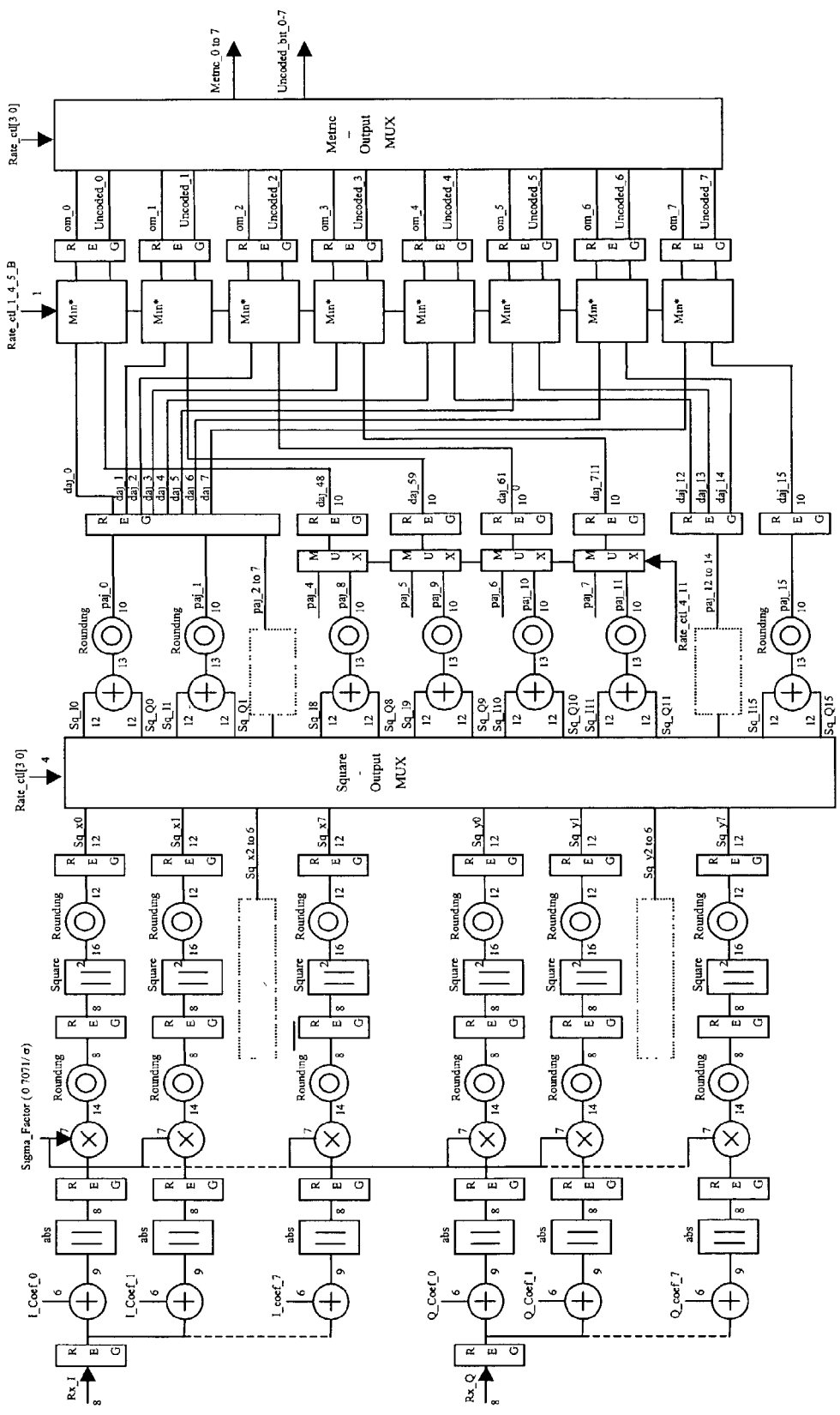
FIG. 63 is a diagram illustrating a possible implementation of the metric generator architecture (embodiment 2) shown within the FIG. 62.

FIG. 63 is a diagram illustrating a possible implementation of the metric generator architecture (embodiment 2) 6200 shown within the FIG. 62. The embodiment of the FIG. 61 employs the Sigma Factor scaling to each of the sums of the terms (Rx_I+I_Coef_0) . . . (Rx_I+I_Coef_7) and (Rx_Q+Q_Coef_1) . . . (Rx_Q+Q_Coef_7). This may be viewed as performing the Sigma Factor scaling described above in the FIG. 54 along each of these paths before performing the squaring operation to their respective results. FIG. 63, when compared to FIG. 61, will achieve a hardware savings of 16 multipliers in performing the Sigma Factor scaling that accommodates for the SNR of the received symbol. For example, FIG. 61 employs 32 multipliers to do this, and FIG. 63 employs only 16 multipliers to do this.

Each of the embodiments shown below in the FIGS. 64 and 65 may be viewed as being multiplexed implementations of the embodiments of the FIGS. 55 and 56.

Figure 64:
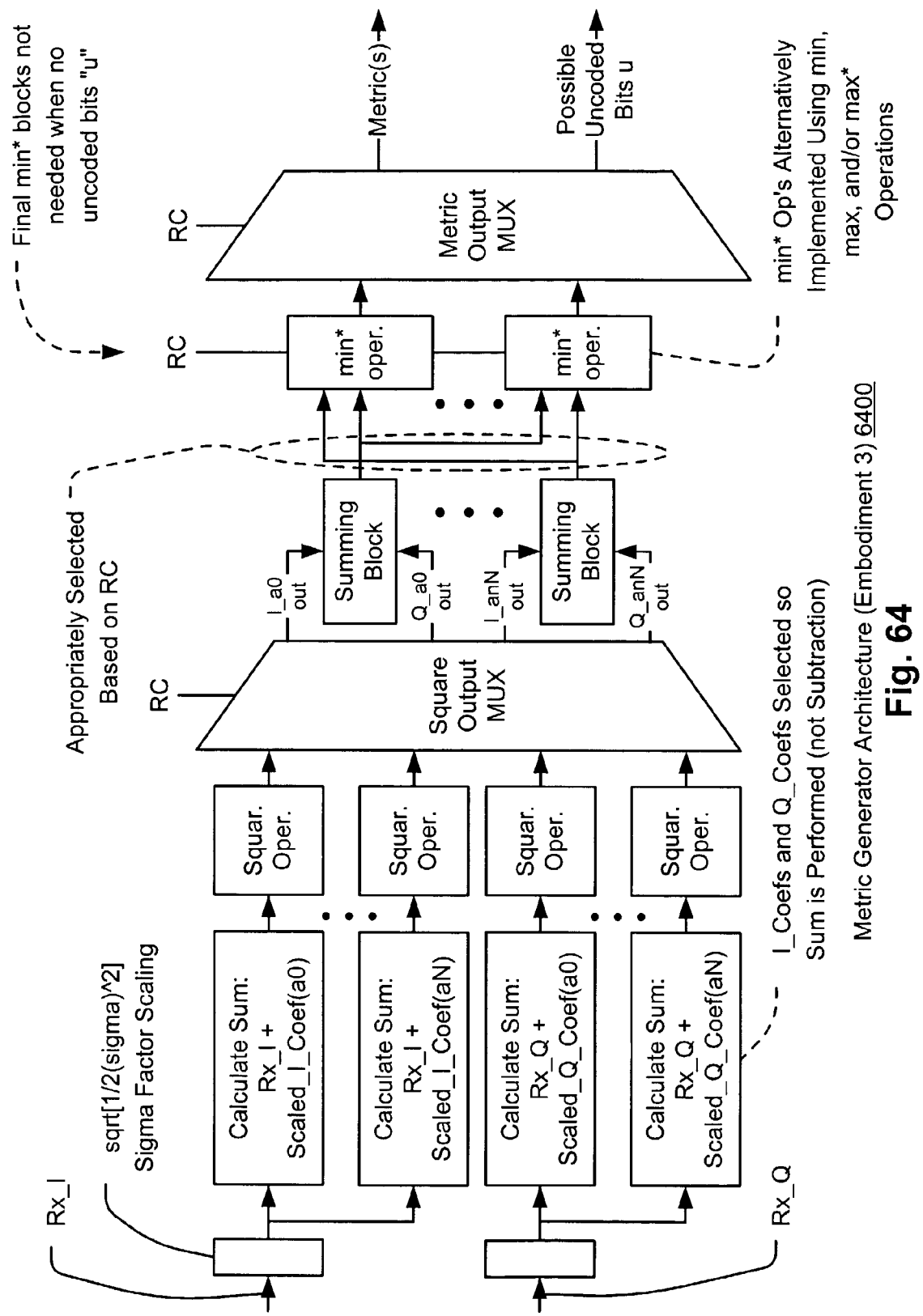
FIG. 64 is a diagram illustrating a metric generator architecture (embodiment 3) that is built according to the invention.

FIG. 64 is a diagram illustrating a metric generator architecture (embodiment 3) 6400 that is built according to the invention. In this embodiment, Sigma Factor scaling is performed to the received I,Q values and also to each of the I,Q coefficients of the constellations using the Sigma Factor scaling.

As above with the embodiment of the FIGS. 60 and 62, it is also noted here that these final min* blocks that precede the metric output MUX may be bypassed when decoding symbols that do not include any uncoded bits u; alternatively, one of the inputs to the min* blocks may simply be passed through these final min* blocks (for example, for min*(a,b), then a could simply be passed through to the metric output MUX).

FIG. 65 is a diagram illustrating a possible implementation of the metric generator architecture (embodiment 3) 6400 shown within the FIG. 64. In this embodiment, Sigma Factor scaling is performed to the received I,Q values to generate the values of [0.7071/sigma*Rx_I] and [0.7071/sigma*Rx_Q]. In addition, each of the I,Q coefficients of the constellations are scaled using the Sigma Factor scaling to generate the following coefficients (Scaled_I_Coef_0=0.7071/sigma*I_Coef_0) . . . (Scaled_I_Coef_7=0.7071/sigma*I_Coef_7). Similar Sigma Factor scaling is performed for the Q values to generate the following coefficients: (Scaled_Q_Coef_0 =0.7071/sigma*Q_Coef_0) . . . (Scaled_Q_Coef_7=0.7071/sigma*Q_Coef_7). In this embodiment, the scaled versions of the I,Q coefficients may be pre-calculated and stored for rapid selection with the scaled received I,Q values.

The FIG. 65 allows for the elimination of 14 more multipliers compared to embodiment within the FIG. 63 (and also for a total hardware savings of 30 multipliers when compared to FIG. 61) if the decoding system uses a CPU (or other external device) to multiply or pre-compute the I,Q coefficients of the constellation that are to be scaled using the Sigma Factor scaling.

In addition, it is also understood that this savings will vary as a function of the order of the constellations supported by the modulations within the RC. For example, when constellation whose I,Q coefficients align with one another, even greater savings can be made using these embodiments by capitalizing on the symmetry contained therein.

As mentioned above, the FIG. 66 is the table illustrating an embodiment of square output MUX selections 6600 that may be made according to the invention, and the FIG. 68 is the table illustrating an embodiment of metric output MUX selections 6800 that may be made according to the invention.

Specifically, the table shown within the FIG. 66 shows a way to perform the selection of the outputs of the square output MUXes within the FIGS. 60, 61, 62, 63, 64, and 65. The RC will serve as the selector for the square output MUX thereby directing which outputs to combine from the available inputs of Sq_I0, Sq_Q0, . . . , and Sq_I15, Sq_Q15. Similarly, the table shown within the FIG. 68 shows a way to perform the selection of the outputs of the metric output MUXes within the FIGS. 60, 61, 62, 63, 64, and 65. Again within the metric output MUX, the RC will serve as the selector for the metric output MUX thereby directing which outputs to combine from the available inputs of metric outputs of 0, 1, 2, 3, 4, 5, 6, and 7 generated by the min* functional blocks that precede the metric output MUX. However, in the case where a symbol is encoded with no uncoded bit "u," then the input to the min* functional blocks that is associated with an uncoded bit value of "0" (u=0) will be used as the available input to the metric output MUX.

FIG. 67 is a diagram illustrating an implementation of square output MUX selection, based on the table of the FIG. 66, that is performed according to certain aspects the invention. A square output MUX selects the appropriate output values to be summed according, based on the RC that is provided for use in decoding a particular symbol. The square output MUX selects the squared values outputs (shown as Sq_I0, Sq_Q0, Sq_I1, Sq_Q1, . . . , and Sq_I15, Sq_Q15) from among the available, appropriately provided square value inputs shown within the table of the FIG. 66 (Sq_x0, Sq_x1, . . . , and Sq_x7 as well as Sq_y0, Sq_y1, . . . , and Sq_y7). The multiplexed implementation of performing this square output multiplexing, based on the selection as governed by the RC that corresponds to a particular symbol, provides for a very efficient implementation and also enables the simultaneously calculation of the metrics for all of the possible constellations employed within the communication system.

Again, as briefly above, FIG. 68 is a table illustrating an embodiment of metric output MUX selections that may be made according to the invention.

Figure 69:
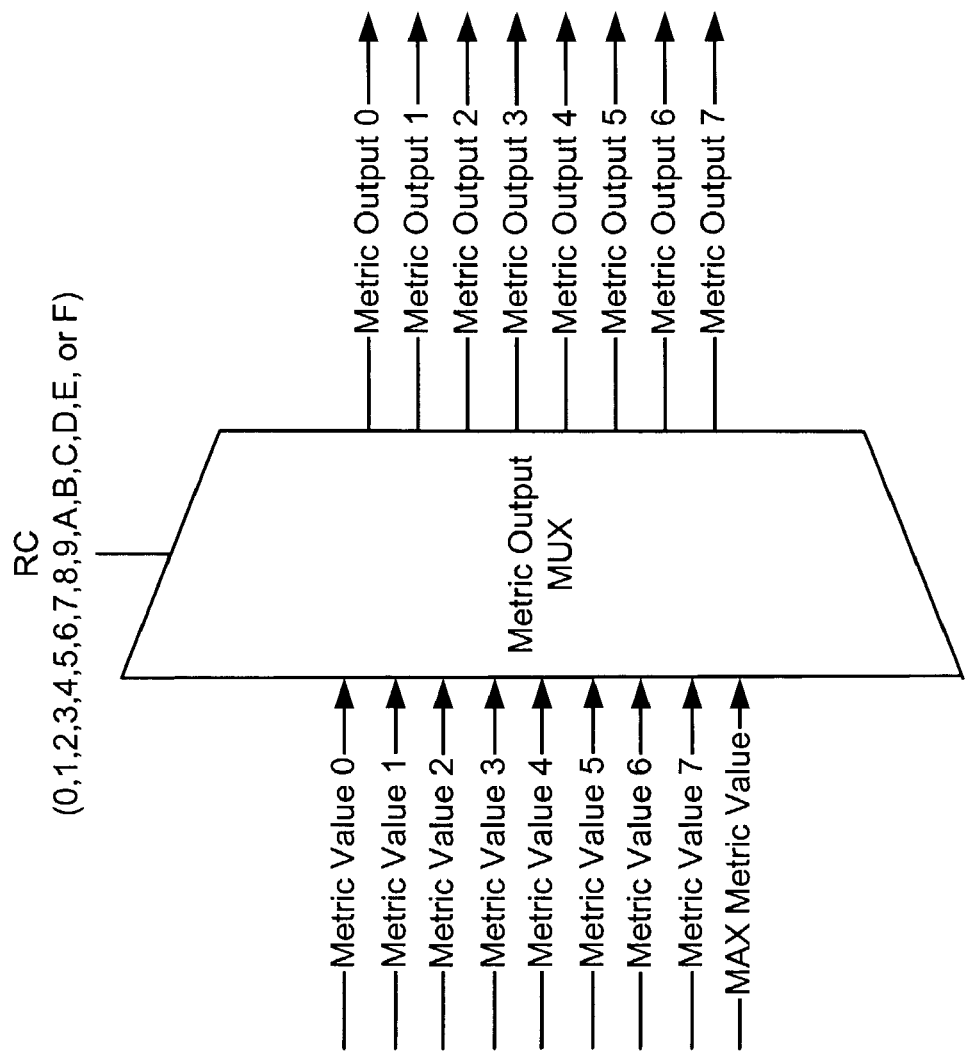
FIG. 69 is a diagram illustrating an implementation of metric output MUX selection, based on the table of the FIG. 68, that is performed according to certain aspects the invention.

FIG. 69 is a diagram illustrating an implementation of metric output MUX selection, based on the table of the FIG. 68, that is performed according to certain aspects the invention.

A metric output MUX selects the appropriate output values to be ultimately output based on the RC that corresponds to a particular symbol. The metric output MUX selects the ultimate 8 metric values to be finally used (shown as Metric Output 0, Metric Output 1, Metric Output 2, . . . , and Metric Output 7 as well as the max metric value possible—shown as MAX Metric Value) from among the available, appropriately provided 8 metric values provided to the metric output MUX. It is again noted that only 8 metrics need ever be employed borrowing upon the normalization and saturation techniques that allow for a reduction of the total number of metric to be used by a factor of 2. For example, in the context of the trellis 2300 that has 16 distinct possible transitions within a given stage, only 8 need be employed to represent all of those 16 metrics as described above. For RCs that do not require even these 8 possible values of metrics, then the MAX Metric Value may be used for those who are least likely to be the possible metric values. This will provide for even greater efficiency in memory storage and speed of processing.

The multiplexed implementation of performing this metric output multiplexing, based on the selection as governed by the RC that corresponds to a particular symbol, provides for a very efficient implementation and also enables the simultaneously calculation of the metrics for all of the possible constellations employed within the communication system. There are many elements of the metric generation functionality described herein that operate using various multiplexing arrangements. Together, they provide for a very fast and simultaneous calculation of many of the parameters that are required to perform decoding of symbols within a data sequence (for example, one type of sequence is a data frame).

Figure 70:
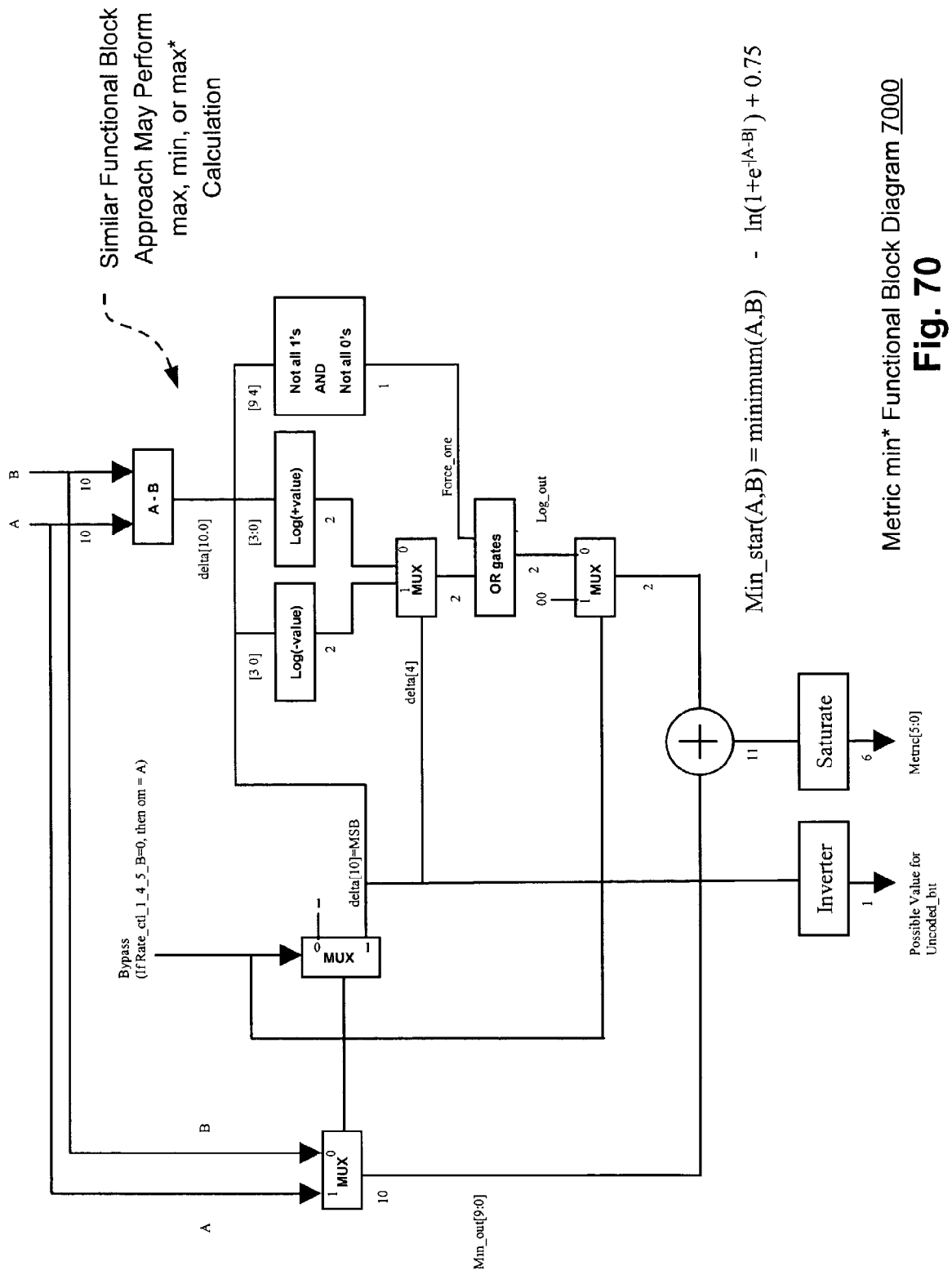
FIG. 70 is a metric min* functional block diagram that is constructed according to an embodiment of the invention.

FIG. 70 is a metric min* functional block diagram 7000 that is constructed according to an embodiment of the invention. The min* processing within the FIG. 70 may be employed throughout the various embodiments of the invention where min* processing is performed. It is understood that analogous approaches may be implemented that perform max, min, and/or max* processing without departing from the scope and spirit of the invention. The functional operations operation shows how the min* operation on two values involves determining not only a minimum of those two values, but also provides for a log correction factor as well as a constant offset.

In the FIG. 70, the min* calculation is shown as being the following calculation:

$$\min{}^*(A,B)=\min(A,B)-\ln(1+e^{-|A-B|})$$

In addition, an offset correction may also be employed to avoid operating using 2's complement thereby saving one bit (the sign bit). This offset correction value may be appropriately selected for the given application. One embodiment employs a offset correction of 0.75 that will avoid the need to employ 2's complement processing in certain embodiments; a table that is operable to support this functionality with the 0.75 offset is shown within the FIG. 71. Such a modified min* equation, having an offset correction of 0.75, will is shown below.

$$\min*(A,B)=\min(A,B)-\ln(1+e^{-|A-B|})+0.75 \qquad 5$$

However, it is also understood that a max* operation may also be employed, without departing from the scope and spirit of the invention, as shown below.

$$\max*(A,B)=\max(A,B)+\ln(1+e^{-|A-B|})$$

Similarly, an offset correction may similarly be employed as desired in a given embodiment.

FIG. 71 is a log table illustrating an embodiment of log(+value) and log(−value) values that may be used according to the invention. The 2 bit log(+value) and log(−value) values correspond to those functional blocks within the FIG. 70. It is clear that these log(+value) and log(−value) values are approximated (saturated) at the ends of the region of interest of the 4 bit value of Delta(3:0) in this embodiment. For example, for every value of Delta(3:0) that exceeds a value of 9=1001, then the 2 bit log(+value) is saturated at 3=11. Similarly, for every value of Delta(3:0) that is less than a value of 8=1000, then the 2 bit log(−value) is saturated at 3=11. By understanding the nature of the log correction factor and its behavior in the region of interest, then the appropriate saturation, provided by using an appropriately chosen offset, may be employed to avoid the need for 2's complement mathematics. This embodiment shows how a constant offset of 0.75 is sufficient to achieve this. However, other embodiments may require different offset to avoid the need for 2's complement mathematics.

Figure 72:
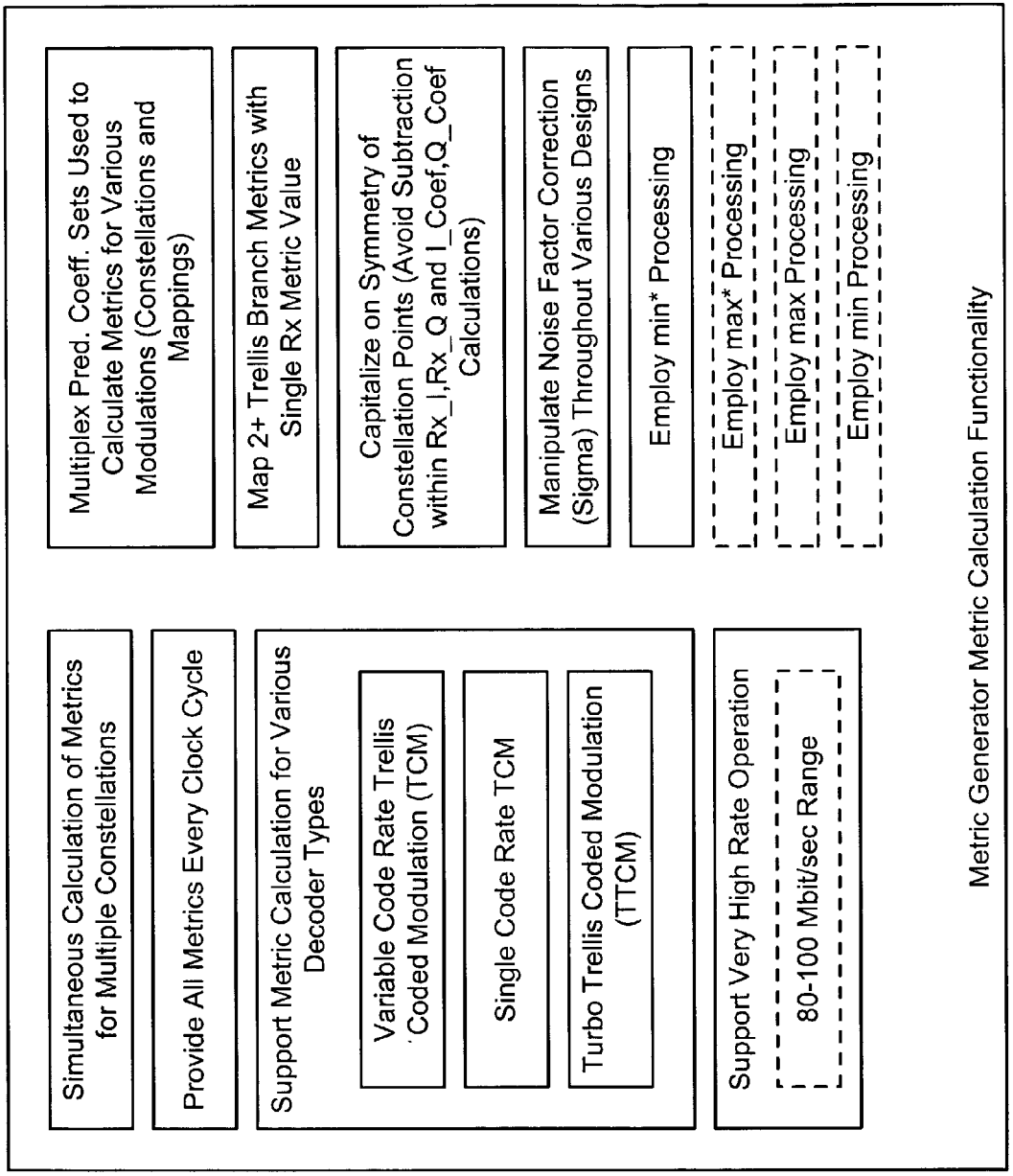
FIG. 72 is a diagram illustrating an embodiment of metric generator metric generation functionality that is supported according to the invention.

FIG. 72 is a diagram illustrating an embodiment of metric generator metric generation functionality 7200 that is supported according to the invention. Calculate simultaneously metrics of all constellation points to support high input data rate. The various designs of performing metric calculations may perform simultaneous calculation of metrics for multiple constellations. This may be performed for the various RCs supported by the decoder. The metric generator metric generation functionality 7200 is operable to provide all metric outputs in every clock cycle. In addition, it may calculate the metrics needed for decoding a variety of encoding/decoding types including a variable-code rate trellis, TCM and TTCM. It also provides an efficient design to reduce the number of multipliers and adders needed to process different constellations where each has individual bandwidth efficiency.

In the various multiplexed embodiments, a predetermined coefficient set that is used to calculate metrics for various modulations (constellations and mappings) may all be supported simultaneously. For example, it may multiplex different set of coefficients so that the same circuit can be used for different constellations (e.g., QAM, 8PSK, QPSK, APSK, among other constellations).

The invention may employ only 8 metric values plus flags instead of 16 metric values to represent the trellis metric outputs to reduce the amount of memory required to decode data; this trellis being referred to as the trellis 2300 of the FIG. 23. Generically, this may be viewed as mapping at least two trellis branch metrics a single received metric value. The invention is able to take advantage of (capitalize on) the symmetry of constellation coefficients (positive vs. negative values and I vs. Q) to have only adders (instead of subtractors). This may significantly reduce gate count (by sharing the same coefficient for both I and Q).

The adaptability of the invention allows for an improve architecture and design complexity by manipulate the noise factor $[1/2\text{sigma}^2]=(1/2\sigma^2)$ in the metric-calculation equation:

$$\text{Metric}(U\times2\times1\times0)=1/(2\sigma^2)*[(Rx\_I-I\_\text{Coef})^2+(Rx\_I-I\_\text{Coef})^2]$$

Alternative architectures and designs are provided to reduce further design complexity. For instance, the implementation of the embodiment #3 of the FIG. 63 can be used to eliminate 16 multipliers compared to solution #2 of the FIG. 59 if the decoding system uses a CPU to multiply or pre-compute the coefficients with the Sigma_Factor (0.7071/σ).

It is also noted that the min* processing that has been described above may alternatively be replaced using min, max, and/or max* processing while still benefiting from the many other benefits of the invention.

For each of the methods described below in the FIGS. 68, 69, and 70, the operations may be performed for the metric of uc2c1c0=0c2c1c0 and for the metric of uc2c1c0=1c2c1c0.

In addition, the metric generator metric generation functionality 7200 provides for a solution that enables very high rate applications. In some instances, these rates of communication approach the 80–100 Mbit/sec range. The invention is able to accommodate extremely high data rates (for example those employed within satellite communication systems), in addition to being backward compatible and able to support lower rate operations (such as those employed within cellular communication systems).

Figure 73:
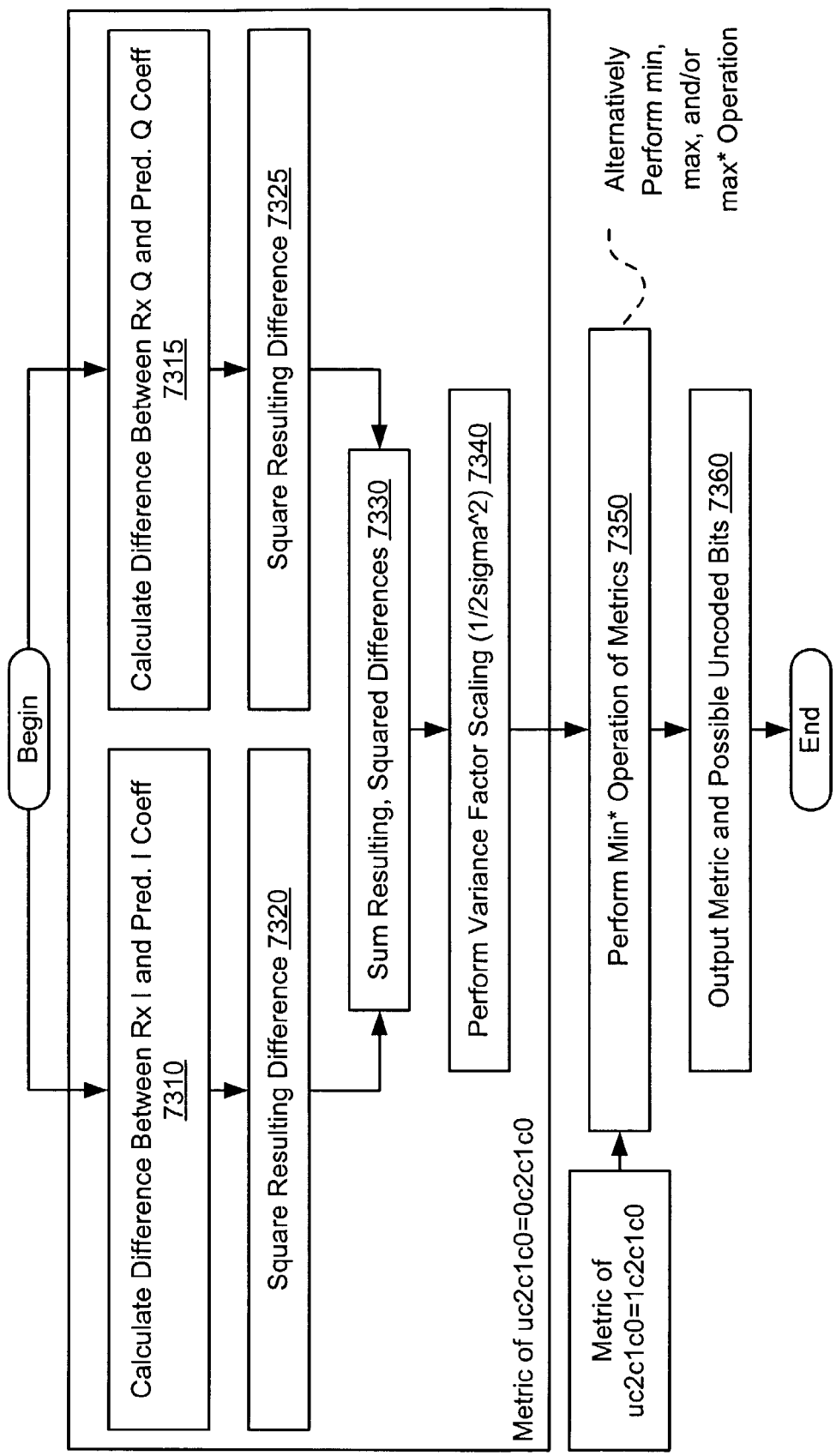
FIG. 73 is an operational flow diagram illustrating an embodiment of metric generator method that is performed according to the invention.

FIG. 73 is an operational flow diagram illustrating an embodiment of metric generator method 7300 that is performed according to the invention. In a block 7310, the difference between a received I value and a predetermined I coefficient is calculated. Then, this difference is squared in a block 7320. Similarly, in a block 7315, the difference between a received Q value and a predetermined Q coefficient is calculated. Then, this difference is squared in a block 7325. The results of the two differences (from the blocks 7320 and 7325) are summed together as shown in a block 7330. Variance Factor scaling is performed on this summed result as shown in a block 7340. These above operations are performed for the metric of uc2c1c0=0c2c1c0. Analogous operations are performed for the metric of uc2c1c0=1c2c1c0.

Min* processing is performed on these two metrics to determine which is of a lesser value as shown in a block 7350. Alternatively, min, max, and/or max* processing may be performed without departing from the scope and spirit of the invention. An output metric and possible values for the any uncoded bits are output as shown in a block 7360; these outputs may be viewed as being the outputs of the min* operation of the block 7350.

Figure 74:
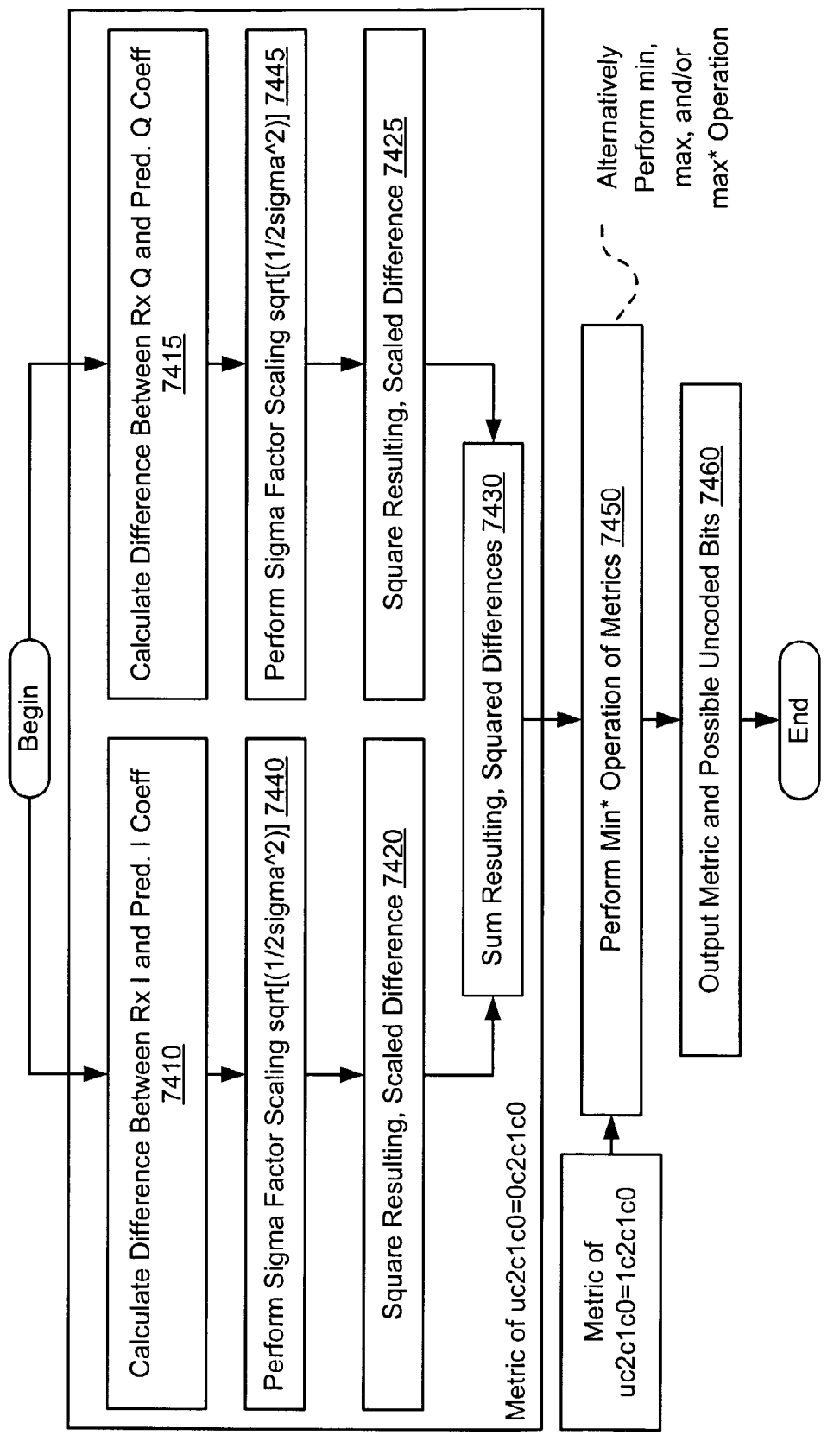
FIG. 74 is an operational flow diagram illustrating another embodiment of metric generator method that is performed according to the invention.

FIG. 74 is an operational flow diagram illustrating another embodiment of metric generator method 7400 that is performed according to the invention. In a block 7410, the difference between a received I value and a predetermined I coefficient is calculated. Then, Sigma Factor scaling is performed on this difference as shown in a block 7440. Then, this scaled difference is squared in a block 7420.

Similarly, in a block 7415, the difference between a received Q value and a predetermined Q coefficient is calculated. Sigma Factor scaling is performed on this difference as shown in a block 7445. Then, this scaled difference is squared in a block 7425. The results of the two, scaled differences (from the blocks 7420 and 7425) are summed together as shown in a block 7430. These above operations are performed for the metric of uc2c1c0=0c2c1c0. Analogous operations are performed for the metric of uc2c1c0=1c2c1c0.

Min* processing is performed on these two metrics to determine which is of a lesser value as shown in a block 7450. Alternatively, min, max, and/or max* processing may be performed without departing from the scope and spirit of the invention. An output metric and possible values for the any uncoded bits are output as shown in a block 7460; these outputs may be viewed as being the outputs of the min* operation of the block 7450.

Figure 75:
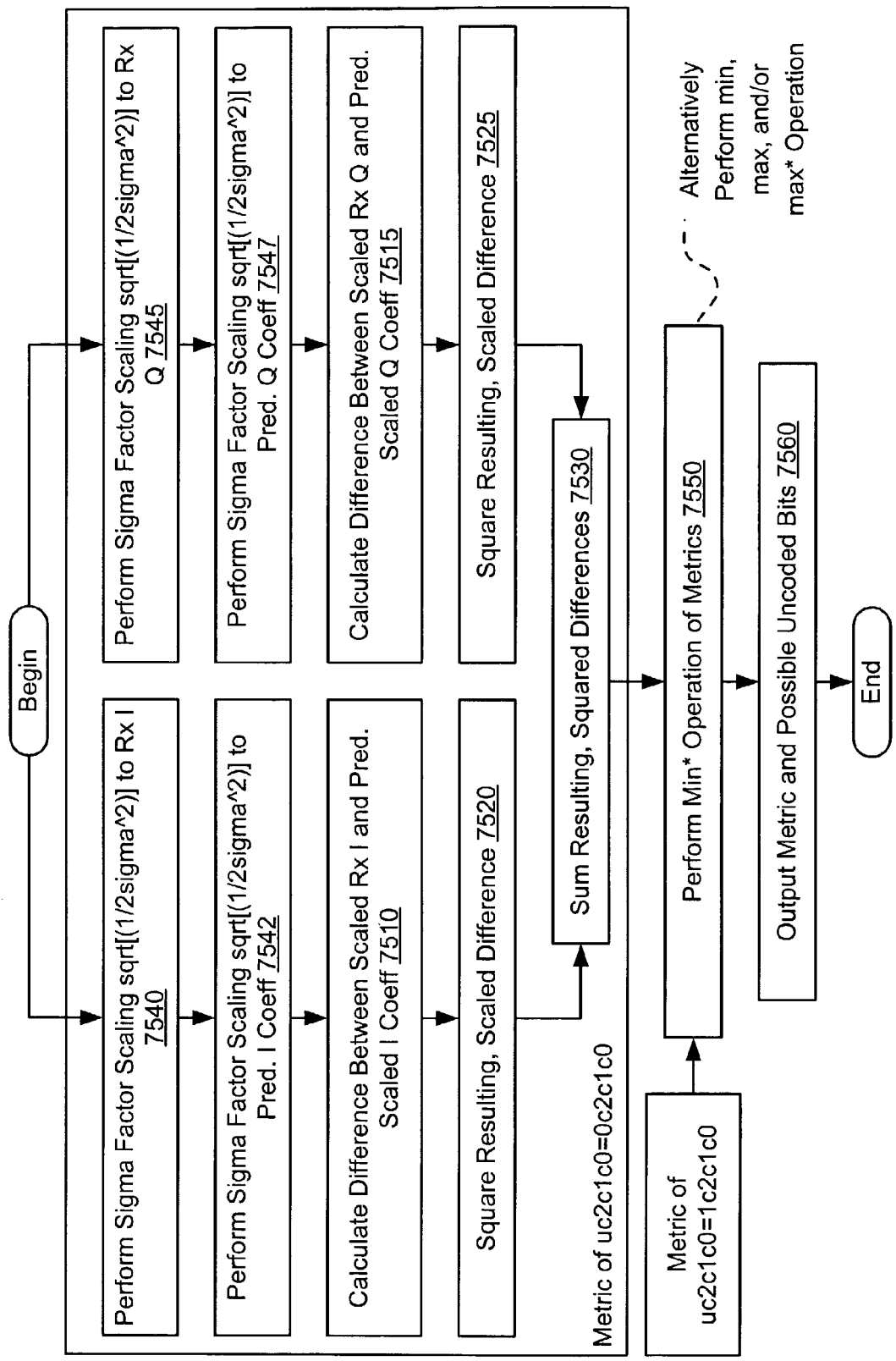
FIG. 75 is an operational flow diagram illustrating another embodiment of metric generator method that is performed according to the invention.

FIG. 75 is an operational flow diagram illustrating another embodiment of metric generator method 7500 that is performed according to the invention. Sigma Factor scaling is performed on a received I value as shown in a block 7540. Sigma Factor scaling is also performed on a predetermined I coefficient as shown in a block 7542. In a block 7510, the difference between the scaled received I value and the scaled predetermined I coefficient is calculated. Then, this scaled difference is squared in a block 7520.

Sigma Factor scaling is performed on a received Q value as shown in a block 7545. Sigma Factor scaling is also performed on a predetermined Q coefficient as shown in a block 7547. In a block 7515, the difference between the scaled received I value and the scaled predetermined I coefficient is calculated. Then, this scaled difference is squared in a block 7525.

The results of the two, scaled differences (from the blocks 7520 and 7525) are summed together as shown in a block 7530. These above operations are performed for the metric of uc2c1c0=0c2c1c0. Analogous operations are performed for the metric of uc2c1c0=1c2c1c0.

Min* processing is performed on these two metrics to determine which is of a lesser value as shown in a block 7550. Alternatively, min, max, and/or max* processing may be performed without departing from the scope and spirit of the invention. An output metric and possible values for the any uncoded bits are output as shown in a block 7560; these outputs may be viewed as being the outputs of the min* operation of the block 7550.

Figure 76:
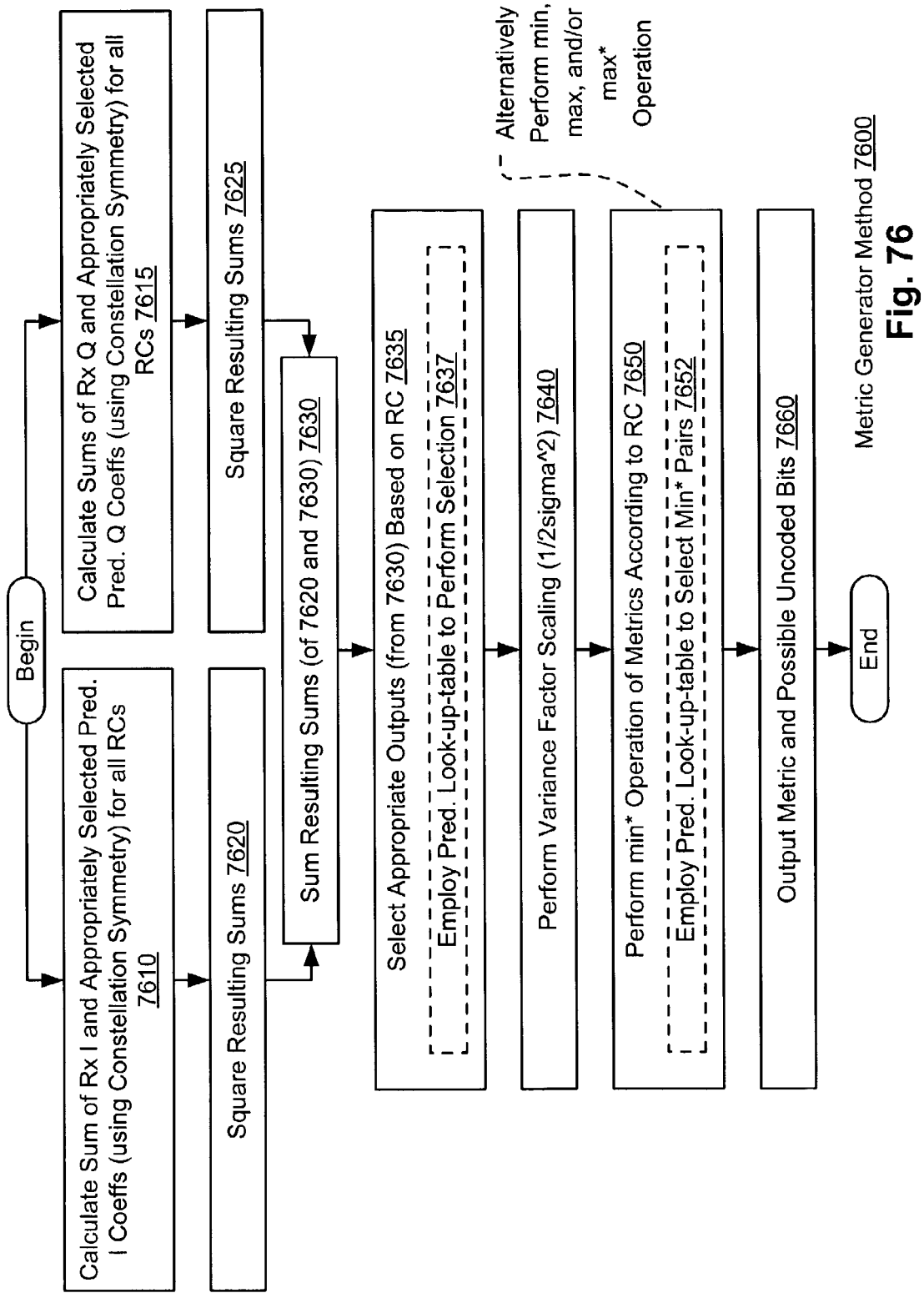
FIG. 76 is an operational flow diagram illustrating another embodiment of metric generator method that is performed according to the invention.

FIG. 76 is an operational flow diagram illustrating another embodiment of metric generator method 7600 that is performed according to the invention. In a block 7610, all of the sums of a received I value and appropriately selected predetermined I coefficients are calculated for all RCs. Summing is performed in this embodiment borrowing upon the constellation symmetry described above (as opposed to subtraction). These resulting sums from the block 7610 are all squared as shown in a block 7620.

Similarly, in a block 7615, all of the sums of a received Q value and appropriately selected predetermined Q coefficients are calculated for all RCs. Again, summing is performed in this embodiment borrowing upon the constellation symmetry described above (as opposed to subtraction). These resulting sums from the block 7615 are all squared as shown in a block 7625.

The resulting sums from the blocks 7620 and 7625 are summed together in a block 7630. Then, the appropriate outputs, for both I,Q, from the block 7630 are selected into pairs and summed together based on the RC as shown in a block 7635. This selection may be performed using a predetermined look up table as shown in a block 7637; for example, the selection may be performed using the embodiment of square output MUX selections 6600 in the FIG. 66 and, if desired, the square output MUX shown in the FIG. 67.

Variance Factor scaling is performed to these selected outputs as shown in a block 7640. Min* processing is selectively performed on these metrics to determine which is of a lesser value of selected pairs as shown in a block 7650. Alternatively, min, max, and/or max* processing may be performed without departing from the scope and spirit of the invention. This selection of which min* pairs should be employed may be performed using a predetermined look up table as shown in a block 7650; for example, the selection may be performed using the embodiment of metric output MUX selections 6800 in the FIG. 68 and, if desire, the metric output MUX shown in the FIG. 69.

An output metric and possible values for the any uncoded bits are output as shown in a block 7660; these outputs may be viewed as being the outputs of the various min* operations performed on the selected pairs within the block 7650. Again, it is noted that this min* operation shown within the block 7350 need only be performed when a symbol includes an uncoded bit "u."

Figure 77:
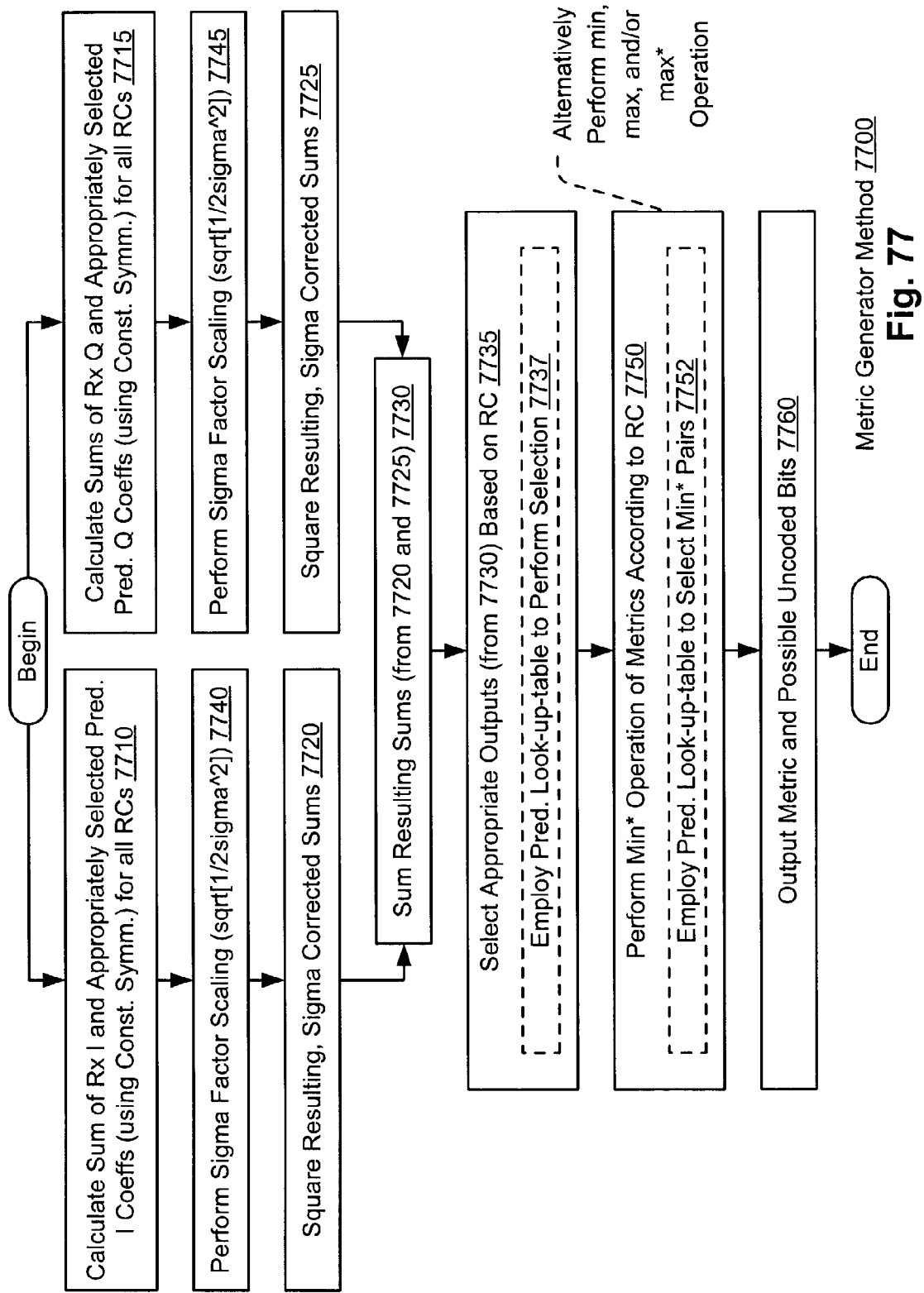
FIG. 77 is an operational flow diagram illustrating another embodiment of metric generator method that is performed according to the invention.

FIG. 77 is an operational flow diagram illustrating another embodiment of metric generator method 7700 that is performed according to the invention. In a block 7710, all of the sums of a received I value and appropriately selected predetermined I coefficients are calculated for all RCs. Summing is performed in this embodiment borrowing upon the constellation symmetry described above (as opposed to subtraction). These resulting sums from the block 7710 are all scaled using Sigma Factor scaling that is performed in a block 7140. Then, these resulting, sigma corrected sums are all squared as shown in a block 7720.

In a block 7715, all of the sums of a received Q value and appropriately selected predetermined Q coefficients are calculated for all RCs. Summing is performed in this embodiment borrowing upon the constellation symmetry described above (as opposed to subtraction). These resulting sums from the block 7715 are all scaled using Sigma Factor scaling that is performed in a block 7145. Then, these resulting, sigma corrected sums are all squared as shown in a block 7725.

The resulting sums from the blocks 7720 and 7725 are summed together in a block 7730. Then, the appropriate outputs, for both I,Q, from the block 7735 are selected into pairs and summed together based on the RC as shown in a block 7735. This selection may be performed using a predetermined look up table as shown in a block 7737; for example, the selection may be performed using the embodiment of square output MUX selections 6600 in the FIG. 66 and, if desired, the square output MUX shown in the FIG. 67.

Min* processing is selectively performed on these metrics to determine which is of a lesser value of selected pairs as shown in a block 7750. Alternatively, min, max, and/or max* processing may be performed without departing from the scope and spirit of the invention. This selection of which min* pairs should be employed may be performed using a predetermined look up table as shown in a block 7750; for example, the selection may be performed using the embodiment of metric output MUX selections 6800 in the FIG. 68 and, if desired, the metric output MUX shown in the FIG. 69.

An output metric and possible values for the any uncoded bits are output as shown in a block 7760; these outputs may be viewed as being the outputs of the various min* operations performed on the selected pairs within the block 7750. Again, it is noted that this min* operation shown within the block 7750 need only be performed when a symbol includes an uncoded bit "u."

FIG. 78 is an operational flow diagram illustrating another embodiment of metric generator method 7800 that is performed according to the invention. Sigma factor scaling is performed on a received I value as shown in a block 7040. Sigma Factor scaling is also performed on appropriately selected predetermined I coefficients for all RCs as shown in a block 7842. Then, in a block 7810, all of the sums of the scaled, received I value and appropriately selected scaled, predetermined I coefficients are calculated for all RCs. Summing is performed in this embodiment borrowing upon the constellation symmetry described above (as opposed to subtraction). These resulting sums from the block 7810 are all squared as shown in a block 7820.

Sigma factor scaling is performed on a received Q value as shown in a block 7045. Sigma Factor scaling is also performed on appropriately selected predetermined Q coefficients for all RCs as shown in a block 7842. Then, in a block 7815, all of the sums of the scaled, received Q value and appropriately selected scaled, predetermined Q coefficients are calculated for all RCs. Summing is performed in this embodiment borrowing upon the constellation symmetry described above (as opposed to subtraction). These resulting sums from the block 7815 are all squared as shown in a block 7825.

The resulting sums from the blocks 7820 and 7825 are summed together in a block 7830. Then, the appropriate outputs, for both I,Q, from the block 7830 are selected into pairs and summed together based on the RC as shown in a block 7835. This selection may be performed using a predetermined look up table as shown in a block 7837; for example, the selection may be performed using the embodiment of square output MUX selections 6600 in the FIG. 66 and, if desired, the square output MUX shown in the FIG. 67.

Min* processing is selectively performed on these metrics to determine which is of a lesser value of selected pairs as shown in a block 7850. Alternatively, min, max, and/or max* processing may be performed without departing from the scope and spirit of the invention. This selection of which min* pairs should be employed may be performed using a predetermined look up table as shown in a block 7850; for example, the selection may be performed using the embodiment of metric output MUX selections 6800 in the FIG. 68 and, if desired, the metric output MUX shown in the FIG. 69.

An output metric and possible values for the any uncoded bits are output as shown in a block 7860; these outputs may be viewed as being the outputs of the various min* operations performed on the selected pairs within the block 7850. Again, it is noted that this min* operation shown within the block 7850 need only be performed when a symbol includes an uncoded bit "u."

In view of the above detailed description of the invention and associated drawings, other modifications and variations will now become apparent. It should also be apparent that such other modifications and variations may be effected without departing from the spirit and scope of the invention.

What is claimed is:

1. A metric generator that determines a metric associated with a received symbol according to a rate control sequence, the metric generator comprising:
    a plurality of predetermined in-phase (I) coefficients;
    a plurality of predetermined quadrature (Q) coefficients;
    a plurality of I summing blocks that selectively sums an I component of the received symbol with each of the predetermined I coefficients thereby generating a plurality of I sums;
    a plurality of Q summing blocks that selectively sums a Q component of the received symbol with each of the predetermined Q coefficients thereby generating a plurality of Q sums;
    a plurality of I squaring blocks that squares each I sum of the plurality of I sums thereby generating a plurality of squared I sums;
    a plurality of Q squaring blocks that squares each Q sum of the plurality of Q sums thereby generating a plurality of squared Q sums;
    a square output multiplexor that receives the plurality of squared I sums and the plurality of squared Q sums and outputs a plurality of I outputs and a plurality of Q outputs;
    a plurality of I,Q summing blocks that selectively sums the plurality of I outputs and the plurality of Q outputs from the square output multiplexor according to the rate control sequence thereby generating a plurality of I,Q outputs;
    a plurality of min* processing blocks that processes the plurality of I,Q outputs according to the rate control sequence thereby generating a plurality of output metrics; and
    a metric output multiplexor that selects an output metric from the plurality of output metrics according to the rate control sequence.

2. The metric generator of claim 1, wherein the rate control sequence comprises a plurality of modulations; and each modulation of the plurality of modulations comprises a constellation and a mapping.

3. The metric generator of claim 2, wherein:
    the plurality of predetermined I coefficients and the plurality of predetermined Q coefficients comprise symmetry along I and Q axes of the constellation;
    the plurality of I summing blocks selectively sums the I component of the received symbol with each of the predetermined I coefficients by employing the symmetry; and
    the plurality of Q summing blocks selectively sums the Q component of the received symbol with each of the predetermined Q coefficients by employing the symmetry.

4. The metric generator of claim 2, wherein one modulation of the plurality of modulations comprises at least one of 8 Phase Shift Keying (PSK) modulation, Quadrature Phase Shift Keying (QPSK) modulation, 16 Quadrature Amplitude Modulation (QAM), and 16 Amplitude Phase Shift Keying (APSK) modulation.

5. The metric generator of claim 1, further comprising a plurality of variance scaling blocks that scales the plurality of I,Q outputs based on a signal to noise ratio of the received symbol.

6. The metric generator of claim 1, further comprising a plurality of sigma scaling blocks that scales the plurality of I sums and the plurality of Q sums based on a signal to noise ratio of the received symbol.

7. The metric generator of claim 1, further comprising a plurality of sigma scaling blocks that scales the plurality of predetermined I coefficients and the plurality of predetermined Q coefficients based on a signal to noise ratio of the received symbol.

8. The metric generator of claim 1, further comprising a plurality of sigma scaling blocks that scales the I component of the received symbol and the Q component of the received symbol based on a signal to noise ratio of the received symbol.

9. The metric generator of claim 1, further comprising a plurality of at least one of mm processing blocks, max processing blocks, and max* processing blocks that processes the plurality of I,Q outputs according to the rate control sequence thereby generating a plurality of output metrics.

10. The metric generator of claim 1, wherein the square output multiplexor employs a look up table that comprises a plurality of predetermined square output MUX selections defined according to the rate control sequence.

11. The metric generator of claim 1, wherein the metric output multiplexor employs a look up table that comprises a plurality of predetermined metric output MUX selections defined according to the rate control sequence.

12. The metric generator of claim 1, wherein the metric generator is contained within a turbo trellis coded modulation (TTCM) decoder.

13. The metric generator of claim 12, wherein the TTCM decoder comprises a variable code rate TTCM decoder.

14. The metric generator of claim 1, wherein the metric generator is contained within at least one of a satellite receiver, a high definition television (HDTV) set top box receiver, a mobile receiver, a base station receiver, a receiver, and a transceiver.

15. The metric generator of claim 1, wherein the metric generator is contained within a decoder that decodes information that is received at a rate greater than substantially 80 mega-bits per second.

16. The metric generator of claim 1, wherein the received symbol is encoded using a systematic encoder.

17. The metric generator of claim 1, wherein the received symbol is encoded using a non-systematic encoder.

18. A metric generator that determines a metric associated with a received symbol according to a rate control sequence, the metric generator comprising:
a square output multiplexor that selectively outputs a plurality of in-phase (I) associated outputs and a plurality of quadrature (Q) associated outputs according to the rate control sequence;
wherein the rate control sequence comprises a plurality of modulations;
wherein each modulation of the plurality of modulations comprises a constellation and a mapping;
wherein the plurality of I associated outputs being indicative of I-axis distances separating an I component of the received symbol and a plurality of predetermined I coefficients corresponding to the constellation; and
wherein the plurality of Q associated outputs being indicative of Q-axis distances separating a Q component of the received symbol and a plurality of predetermined Q coefficients corresponding to the constellation; and
a plurality of min* processing blocks that processes selected I,Q sums according to the rate control sequence to generate a plurality of output metrics, wherein the selected I,Q sums comprising sums of an I associated output from the plurality of I associated outputs and a Q associated output from the plurality of Q associated outputs; and
a metric output multiplexor that selects an output metric from the plurality of output metrics according to the rate control sequence.

19. The metric generator of claim 18, further comprising a plurality of variance scaling blocks that scales the selected I,Q sums based on a signal to noise ratio of the received symbol.

20. The metric generator of claim 18, further comprising:
a plurality of predetermined in-phase (I) coefficients;
a plurality of predetermined quadrature (Q) coefficients;
a plurality of I summing blocks that selectively sums an I component of the received symbol with each of the predetermined I coefficients thereby generating a plurality of I sums;
a plurality of Q summing blocks that selectively sums a Q component of the received symbol with each of the predetermined Q coefficients thereby generating a plurality of Q sums;
a plurality of I squaring blocks that squares each I sum of the plurality of I sums thereby generating the plurality of I associated outputs; and
a plurality of Q squaring blocks that squares each Q sum of the plurality of Q sums thereby generating the plurality of Q associated outputs.

21. The metric generator of claim 20, wherein:
the plurality of predetermined I coefficients and the plurality of predetermined Q coefficients comprise symmetry along I and Q axes of the constellation;
the plurality of I summing blocks selectively sums the I component of the received symbol with each of the predetermined I coefficients by employing the symmetry; and
the plurality of Q summing blocks selectively sums the Q component of the received symbol with each of the predetermined Q coefficients by employing the symmetry.

22. The metric generator of claim 20, further comprising a plurality of sigma scaling blocks that scales the plurality of I sums and the plurality of Q sums based on a signal to noise ratio of the received symbol.

23. The metric generator of claim 20, further comprising a plurality of sigma scaling blocks that scales the plurality of predetermined I coefficients and the plurality of predetermined Q coefficients based on a signal to noise ratio of the received symbol.

24. The metric generator of claim 20, further comprising a plurality of sigma scaling blocks that scales the I component of the received symbol and the Q component of the received symbol based on a signal to noise ratio of the received symbol.

25. The metric generator of claim 18, further comprising a plurality of at least one of mm processing blocks, max processing blocks, and max* processing blocks that processes selected I,Q sums according to the rate control sequence to generate the plurality of output metrics.

26. The metric generator of claim 18, wherein the square output multiplexor employs a look up table that comprises a plurality of predetermined square output MUX selections defined according to the rate control sequence.

27. The metric generator of claim 18, wherein the metric output multiplexor employs a look up table that comprises a plurality of predetermined metric output MUX selections defined according to the rate control sequence.

28. The metric generator of claim 18, wherein one modulation of the plurality of modulations comprises at least one of 8 Phase Shift Keying (PSK) modulation, Quadrature Phase Shift Keying (QPSK) modulation, 16 Quadrature Amplitude Modulation (QAM), and 16 Amplitude Phase Shift Keying (APSK) modulation.

29. The metric generator of claim 18, wherein the metric generator is contained within a turbo trellis coded modulation (TTCM) decoder.

30. The metric generator of claim 29, wherein the TTCM decoder comprises a variable code rate TTCM decoder.

31. The metric generator of claim 18, wherein the metric generator is contained within at least one of a satellite receiver, a high definition television (HDTV) set top box receiver, a mobile receiver, a base station receiver, a receiver, and a transceiver.

32. The metric generator of claim 18, wherein the metric generator is contained within a decoder that decodes information that is received at a rate greater than substantially 80 mega-bits per second.

33. The metric generator of claim 18, wherein the received symbol is encoded using a systematic encoder.

34. The metric generator of claim 18, wherein the received symbol is encoded using a non-systematic encoder.

35. A metric generator that determines a metric associated with a received symbol according to a rate control sequence, the metric generator comprising:
   a plurality of sigma scaling blocks that scales an in-phase (I) component of the received symbol and a quadrature (Q) component of the received symbol based on a signal to noise ratio of the received symbol;
   a plurality of predetermined, scaled I coefficients that are scaled based on the signal to noise ratio of the received symbol; and
   a plurality of predetermined, scaled Q coefficients that are scaled based on the signal to noise ratio of the received symbol;
   a plurality of I summing blocks that selectively sums the scaled I component of the received symbol with each of the predetermined, scaled I coefficients thereby generating a plurality of I sums;
   a plurality of Q summing blocks that selectively sums the scaled Q component of the received symbol with each of the predetermined, scaled Q coefficients thereby generating a plurality of Q sums;
   a plurality of I squaring blocks that squares each I sum of the plurality of I sums thereby generating a plurality of squared I sums;
   a plurality of Q squaring blocks that squares each Q sum of the plurality of Q sums thereby generating a plurality of squared Q sums;
   a square output multiplexor that receives the plurality of squared I sums and the plurality of squared Q sums and outputs a plurality of I outputs and a plurality of Q outputs;
   a plurality of I,Q summing blocks that selectively sums the plurality of I outputs and the plurality of Q outputs from the square output multiplexor according to the rate control sequence thereby generating a plurality of I,Q outputs;
   a plurality of min* processing blocks that processes the plurality of I,Q outputs thereby generating a plurality of output metrics according to the rate control sequence; and
   a metric output multiplexor that selects an output metric from the plurality of output metrics according to the rate control sequence.

36. The metric generator of claim 35, wherein the rate control sequence comprises a plurality of modulations; and each modulation of the plurality of modulations comprises a constellation and a mapping.

37. The metric generator of claim 36, wherein:
   the plurality of predetermined, scaled I coefficients and the plurality of predetermined, scaled Q coefficients comprise symmetry along I and Q axes of the constellation;
   the plurality of I summing blocks selectively sums the scaled I component of the received symbol with each of the predetermined, scaled I coefficients by employing the symmetry; and
   the plurality of Q summing blocks selectively sums the scaled Q component of the received symbol with each of the predetermined, scaled Q coefficients by employing the symmetry.

38. The metric generator of claim 36, wherein one modulation of the plurality of modulations comprises at least one of 8 Phase Shift Keying (PSK) modulation, Quadrature Phase Shift Keying (QPSK) modulation, 16 Quadrature Amplitude Modulation (QAM), and 16 Amplitude Phase Shift Keying (APSK) modulation.

39. The metric generator of claim 35, further comprising a plurality of at least one of mm processing blocks, max processing blocks, and max* processing blocks that processes the plurality of I,Q outputs thereby generating the plurality of output metrics according to the rate control sequence.

40. The metric generator of claim 35, wherein the square output multiplexor employs a look up table that comprises a plurality of predetermined square output MUX selections defined according to the rate control sequence.

41. The metric generator of claim 35, wherein the metric output multiplexor employs a look up table that comprises a plurality of predetermined metric output MUX selections defined according to the rate control sequence.

42. The metric generator of claim 35, wherein the metric generator is contained within a turbo trellis coded modulation (TTCM) decoder.

43. The metric generator of claim 42, wherein the TTCM decoder comprises a variable code rate TTCM decoder.

44. The metric generator of claim 35, wherein the metric generator is contained within at least one of a satellite receiver, a high definition television (HDTV) set top box receiver, a mobile receiver, a base station receiver, a receiver, and a transceiver.

45. The metric generator of claim 35, wherein the metric generator is contained within a decoder that decodes information that is received at a rate greater than substantially 80 mega-bits per second.

46. The metric generator of claim 35, wherein the received symbol is encoded using a systematic encoder.

47. The metric generator of claim 35, wherein the received symbol is encoded using a non-systematic encoder.

48. A metric generator method that calculates a metric associated with a received symbol according to a rate control sequence, the method comprising:
   calculating a plurality of in-phase (I) sums using an I component of a received symbol and a plurality of predetermined I coefficients;
   calculating a plurality of quadrature (Q) sums using a Q component of the received symbol and a plurality of predetermined Q coefficients;
   squaring each I sum of the plurality of I sums;
   squaring each Q sum of the plurality of Q sums;
   selectively summing an I sum of the plurality of I sums with a Q sum of the plurality of Q sums thereby generating a plurality of I,Q outputs according to the rate control sequence;
   performing min* processing on the plurality of I,Q outputs to generate a plurality of output metrics according to the rate control sequence; and
   outputting one metric from the plurality of output metrics according to the rate control sequence.

49. The method of claim 48, further comprising performing variance factor scaling on the plurality of I,Q outputs based on a signal to noise ratio of the received symbol.

50. The method of claim 48, further comprising performing sigma factor scaling on the I component of the received symbol and the Q component of the received symbol based on a signal to noise ratio of the received symbol.

51. The method of claim 48, further comprising performing sigma factor scaling on the plurality of predetermined I coefficients and the plurality of predetermined Q coefficients based on a signal to noise ratio of the received symbol.

52. The method of claim 48, further comprising performing sigma factor scaling on the plurality of I sums and the plurality of Q sums based on a signal to noise ratio of the received symbol.

53. The method of claim 48, wherein the rate control sequence comprises a plurality of modulations; and
each modulation of the plurality of modulations comprises a constellation and a mapping.

54. The method of claim 53, wherein:
the plurality of predetermined I coefficients and the plurality of predetermined Q coefficients comprise symmetry along I and Q axes of the constellation; and
further comprising employing the symmetry when calculating the plurality of I sums and when calculating the plurality of Q sums.

55. The method of claim 53, wherein one modulation of the plurality of modulations comprises at least one of 8 Phase Shift Keying (PSK) modulation, Quadrature Phase Shift Keying (QPSK) modulation, 16 Quadrature Amplitude Modulation (QAM), and 16 Amplitude Phase Shift Keying (APSK) modulation.

56. The method of claim 53, further comprising performing min* processing on the plurality of I,Q outputs to generate the plurality of plurality of output metrics according to the rate control sequence.

57. The method of claim 53, wherein the method is performed within a turbo trellis coded modulation (TTCM) decoder.

58. The method of claim 57, wherein the TTCM decoder comprises a variable code rate TTCM decoder.

59. The method of claim 53, wherein the method is performed within at least one of a satellite receiver, a high definition television (HDTV) set top box receiver, a mobile receiver, a base station receiver, a receiver, and a transceiver.

60. The metric generator of claim 48, wherein the metric generator is contained within a decoder that decodes information that is received at a rate greater than substantially 80 mega-bits per second.

61. The metric generator of claim 48, wherein the received symbol is encoded using a systematic encoder.

62. The metric generator of claim 48, wherein the received symbol is encoded using a non-systematic encoder.

* * * * *

UNITED STATES PATENT AND TRADEMARK OFFICE
CERTIFICATE OF CORRECTION

| | | |
|---|---|---|
| PATENT NO. | : 7,065,695 B2 | Page 1 of 1 |
| APPLICATION NO. | : 10/264647 | |
| DATED | : June 20, 2006 | |
| INVENTOR(S) | : Kelly Brian Cameron et al. | |

It is certified that error appears in the above-identified patent and that said Letters Patent is hereby corrected as shown below:

Column 57, line 2, in Claim 9: replace "mm" with --min--

Column 58, line 45, in Claim 25: replace "mm" with --min--

Column 60, line 16, in Claim 39: replace "mm" with --min--

Signed and Sealed this

First Day of July, 2008

JON W. DUDAS
*Director of the United States Patent and Trademark Office*